(12) United States Patent
Fleming et al.

(10) Patent No.: US 10,445,451 B2
(45) Date of Patent: Oct. 15, 2019

(54) PROCESSORS, METHODS, AND SYSTEMS FOR A CONFIGURABLE SPATIAL ACCELERATOR WITH PERFORMANCE, CORRECTNESS, AND POWER REDUCTION FEATURES

(71) Applicant: Intel Corporation, Santa Clara, CA (US)

(72) Inventors: Kermin Fleming, Hudson, MA (US); Kent D. Glossop, Merrimack, NH (US); Simon C. Steely, Jr., Hudson, NH (US); Ping Tak Peter Tang, Edison, NJ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/640,535

(22) Filed: Jul. 1, 2017

(65) Prior Publication Data
US 2019/0005161 A1    Jan. 3, 2019

(51) Int. Cl.
*G06F 17/50* (2006.01)
*G06F 12/0802* (2016.01)
(Continued)

(52) U.S. Cl.
CPC ........ *G06F 17/505* (2013.01); *G06F 12/0802* (2013.01); *G06F 15/7867* (2013.01);
(Continued)

(58) Field of Classification Search
CPC ............... G06F 12/0802; G06F 17/505; G06F 15/7867; G06F 15/8015; H03K 19/17736;
(Continued)

(56) References Cited

U.S. PATENT DOCUMENTS

| 672,177 A | 4/1901 | William |
| 5,560,032 A | 9/1996 | Nguyen et al. |

(Continued)

FOREIGN PATENT DOCUMENTS

| EP | 2660716 A1 | 11/2013 |
| EP | 2854026 A1 | 4/2015 |

(Continued)

OTHER PUBLICATIONS

Abandonment from U.S. Appl. No. 15/640,544, dated Mar. 20, 2018, 2 pages.

(Continued)

*Primary Examiner* — Daniel D Chang
(74) *Attorney, Agent, or Firm* — Nicholson De Vos Webster & Elliott LLP

(57) ABSTRACT

Systems, methods, and apparatuses relating to a configurable spatial accelerator are described. In one embodiment, a processor includes a plurality of processing elements; and an interconnect network between the plurality of processing elements to receive an input of a dataflow graph comprising a plurality of nodes, wherein the dataflow graph is to be overlaid into the interconnect network and the plurality of processing elements with each node represented as a dataflow operator in the plurality of processing elements, and the plurality of processing elements is to perform an operation when an incoming operand set arrives at the plurality of processing elements. At least one of the plurality of processing elements includes a plurality of control inputs.

2 Claims, 73 Drawing Sheets

(51) Int. Cl.
*H03K 19/177* (2006.01)
*G06F 15/78* (2006.01)
*G06F 15/80* (2006.01)
*G11C 8/12* (2006.01)

(52) U.S. Cl.
CPC ............ *G06F 15/8015* (2013.01); *G11C 8/12* (2013.01); *H03K 19/1778* (2013.01); *H03K 19/17736* (2013.01); *H03K 19/17756* (2013.01); *H03K 19/17764* (2013.01); *H03K 19/17776* (2013.01)

(58) Field of Classification Search
CPC ......... H03K 19/1776; H03K 19/17756; H03K 19/17764; H03K 19/17776; H03K 19/1778; G11C 8/12
USPC ...................................... 326/38; 712/10, 24
See application file for complete search history.

(56) References Cited

U.S. PATENT DOCUMENTS

| | | | |
|---|---|---|---|
| 5,574,944 A | 11/1996 | Stager | |
| 5,581,767 A | 12/1996 | Katsuki et al. | |
| 5,787,029 A | 7/1998 | De Angel | |
| 5,805,827 A | 9/1998 | Chau et al. | |
| 5,930,484 A | 7/1999 | Tran et al. | |
| 6,020,139 A | 2/2000 | Schwartz et al. | |
| 6,088,780 A | 7/2000 | Yamada et al. | |
| 6,141,747 A | 10/2000 | Witt | |
| 6,205,533 B1 | 3/2001 | Margolus et al. | |
| 6,314,503 B1 | 11/2001 | D'Errico et al. | |
| 6,393,454 B1 | 5/2002 | Chu | |
| 6,393,536 B1 | 5/2002 | Hughes et al. | |
| 6,604,120 B1 | 8/2003 | De | |
| 6,615,333 B1 | 9/2003 | Hoogerbrugge et al. | |
| 6,725,364 B1 | 4/2004 | Crabill | |
| 7,000,072 B1 | 2/2006 | Aisaka et al. | |
| 7,181,578 B1 | 2/2007 | Guha et al. | |
| 7,257,665 B2 | 8/2007 | Niell et al. | |
| 7,290,096 B2 | 10/2007 | Jeter, Jr. et al. | |
| 7,379,067 B2 | 5/2008 | Deering et al. | |
| 7,486,678 B1 | 2/2009 | Devanagondi et al. | |
| 7,509,484 B1 | 3/2009 | Golla et al. | |
| 7,546,331 B2 | 6/2009 | Islam et al. | |
| 7,630,324 B2 | 12/2009 | Li et al. | |
| 7,660,911 B2 | 2/2010 | McDaniel | |
| 7,911,960 B1 | 3/2011 | Aydemir et al. | |
| 7,987,479 B1 | 7/2011 | Day | |
| 8,001,510 B1 | 8/2011 | Miller et al. | |
| 8,010,766 B2 | 8/2011 | Bhattacharjee et al. | |
| 8,055,880 B2 | 11/2011 | Fujisawa et al. | |
| 8,156,284 B2 | 4/2012 | Vorbach et al. | |
| 8,160,975 B2 | 4/2012 | Tang et al. | |
| 8,225,073 B2 * | 7/2012 | Master | G06F 15/7867 712/15 |
| 8,495,341 B2 | 7/2013 | Busaba et al. | |
| 8,561,194 B2 | 10/2013 | Lee | |
| 8,578,117 B2 | 11/2013 | Burda et al. | |
| 8,812,820 B2 | 8/2014 | Vorbach et al. | |
| 8,935,515 B2 | 1/2015 | Colavin et al. | |
| 8,966,457 B2 | 2/2015 | Ebcioglu et al. | |
| 8,990,452 B2 | 3/2015 | Branson et al. | |
| 9,026,769 B1 | 5/2015 | Jamil et al. | |
| 9,104,474 B2 | 8/2015 | Kaul et al. | |
| 9,135,057 B2 | 9/2015 | Branson et al. | |
| 9,170,846 B2 | 10/2015 | Delling et al. | |
| 9,213,571 B2 | 12/2015 | Ristovski et al. | |
| 9,268,528 B2 | 2/2016 | Tannenbaum et al. | |
| 9,473,144 B1 | 10/2016 | Thiagarajan et al. | |
| 9,594,521 B2 | 3/2017 | Blagodurov et al. | |
| 9,658,676 B1 | 5/2017 | Witek et al. | |
| 9,696,928 B2 | 7/2017 | Cain, III et al. | |
| 9,760,291 B2 | 9/2017 | Beale et al. | |
| 9,762,563 B2 | 9/2017 | Davis et al. | |
| 9,847,783 B1 | 12/2017 | Teh et al. | |
| 9,923,905 B2 | 3/2018 | Amiri et al. | |
| 9,946,718 B2 | 4/2018 | Bowman et al. | |
| 10,108,417 B2 | 10/2018 | Krishna et al. | |
| 10,187,467 B2 | 1/2019 | Nagai | |
| 2002/0026493 A1 | 2/2002 | Scardamalia et al. | |
| 2002/0090751 A1 | 7/2002 | Grigg et al. | |
| 2002/0178285 A1 | 11/2002 | Donaldson et al. | |
| 2002/0184291 A1* | 12/2002 | Hogenauer | G06F 9/4881 718/102 |
| 2003/0023830 A1* | 1/2003 | Hogenauer | G06F 9/30145 712/24 |
| 2003/0028750 A1 | 2/2003 | Hogenauer | |
| 2003/0163649 A1 | 8/2003 | Kapur et al. | |
| 2003/0177320 A1 | 9/2003 | Sah et al. | |
| 2003/0225814 A1 | 12/2003 | Saito et al. | |
| 2003/0233643 A1 | 12/2003 | Thompson et al. | |
| 2004/0001458 A1 | 1/2004 | Dorenbosch et al. | |
| 2004/0022094 A1 | 2/2004 | Radhakrishnan et al. | |
| 2004/0022107 A1 | 2/2004 | Zaidi et al. | |
| 2004/0124877 A1 | 7/2004 | Parkes | |
| 2004/0263524 A1 | 12/2004 | Lippincott | |
| 2005/0025120 A1 | 2/2005 | O'Toole et al. | |
| 2005/0076187 A1 | 4/2005 | Claydon | |
| 2005/0108776 A1 | 5/2005 | Carver et al. | |
| 2005/0134308 A1 | 6/2005 | Okada et al. | |
| 2005/0138323 A1 | 6/2005 | Snyder | |
| 2005/0166038 A1 | 7/2005 | Wang et al. | |
| 2005/0172103 A1 | 8/2005 | Inuo et al. | |
| 2006/0041872 A1 | 2/2006 | Poznanovic et al. | |
| 2006/0130030 A1 | 6/2006 | Kwiat et al. | |
| 2006/0179255 A1 | 8/2006 | Yamazaki | |
| 2006/0179429 A1 | 8/2006 | Eggers et al. | |
| 2007/0011436 A1 | 1/2007 | Bittner, Jr. et al. | |
| 2007/0033369 A1 | 2/2007 | Kasama et al. | |
| 2007/0118332 A1 | 5/2007 | Meyers et al. | |
| 2007/0143546 A1 | 6/2007 | Narad | |
| 2007/0180315 A1 | 8/2007 | Aizawa et al. | |
| 2007/0203967 A1 | 8/2007 | Dockser et al. | |
| 2007/0226458 A1 | 9/2007 | Stuttard et al. | |
| 2007/0276976 A1 | 11/2007 | Gower et al. | |
| 2008/0082794 A1 | 4/2008 | Yu et al. | |
| 2008/0133889 A1 | 6/2008 | Glew | |
| 2008/0133895 A1 | 6/2008 | Sivtsov et al. | |
| 2008/0184255 A1 | 7/2008 | Watanabe et al. | |
| 2008/0218203 A1 | 9/2008 | Arriens et al. | |
| 2008/0263330 A1 | 10/2008 | May et al. | |
| 2008/0270689 A1 | 10/2008 | Gotoh | |
| 2008/0307258 A1 | 12/2008 | Challenger et al. | |
| 2009/0013329 A1 | 1/2009 | May et al. | |
| 2009/0037697 A1 | 2/2009 | Ramani et al. | |
| 2009/0063665 A1 | 3/2009 | Bagepalli et al. | |
| 2009/0113169 A1 | 4/2009 | Yang et al. | |
| 2009/0119456 A1 | 5/2009 | Park, II et al. | |
| 2009/0182993 A1 | 7/2009 | Fant | |
| 2009/0300324 A1 | 12/2009 | Inuo | |
| 2009/0300325 A1 | 12/2009 | Paver et al. | |
| 2009/0309884 A1 | 12/2009 | Lippincott et al. | |
| 2009/0328048 A1 | 12/2009 | Khan et al. | |
| 2010/0017761 A1 | 1/2010 | Higuchi et al. | |
| 2010/0115168 A1 | 5/2010 | Bekooij | |
| 2010/0180105 A1 | 7/2010 | Asnaashari | |
| 2010/0191911 A1 | 7/2010 | Heddes et al. | |
| 2010/0217915 A1 | 8/2010 | O'Connor et al. | |
| 2010/0228885 A1 | 9/2010 | McDaniel et al. | |
| 2010/0262721 A1 | 10/2010 | Asnaashari et al. | |
| 2010/0302946 A1 | 12/2010 | Yang et al. | |
| 2011/0004742 A1 | 1/2011 | Hassan | |
| 2011/0008300 A1 | 1/2011 | Wouters et al. | |
| 2011/0040822 A1 | 2/2011 | Eichenberger et al. | |
| 2011/0083000 A1 | 4/2011 | Rhoades et al. | |
| 2011/0099295 A1 | 4/2011 | Wegener | |
| 2011/0107337 A1 | 5/2011 | Cambonie et al. | |
| 2011/0202747 A1 | 8/2011 | Busaba et al. | |
| 2011/0302358 A1 | 12/2011 | Yu et al. | |
| 2011/0314238 A1 | 12/2011 | Finkler et al. | |
| 2011/0320724 A1 | 12/2011 | Mejdrich et al. | |
| 2012/0017066 A1 | 1/2012 | Vorbach et al. | |
| 2012/0066483 A1 | 3/2012 | Boury et al. | |

(56) References Cited

U.S. PATENT DOCUMENTS

| | | |
|---|---|---|
| 2012/0079168 A1 | 3/2012 | Chou et al. |
| 2012/0089812 A1 | 4/2012 | Smith |
| 2012/0124117 A1 | 5/2012 | Yu et al. |
| 2012/0126851 A1 | 5/2012 | Kelem et al. |
| 2012/0174118 A1 | 7/2012 | Watanabe et al. |
| 2012/0239853 A1 | 9/2012 | Moshayedi |
| 2012/0260239 A1 | 10/2012 | Martinez et al. |
| 2012/0278543 A1 | 11/2012 | Yu et al. |
| 2012/0278587 A1 | 11/2012 | Caufield et al. |
| 2012/0303932 A1 | 11/2012 | Farabet et al. |
| 2012/0303933 A1 | 11/2012 | Manet et al. |
| 2012/0317388 A1 | 12/2012 | Driever et al. |
| 2012/0324180 A1 | 12/2012 | Asnaashari et al. |
| 2012/0330701 A1 | 12/2012 | Hyder et al. |
| 2013/0036287 A1 | 2/2013 | Chu et al. |
| 2013/0067138 A1 | 3/2013 | Schuette et al. |
| 2013/0080652 A1 | 3/2013 | Cradick et al. |
| 2013/0080993 A1 | 3/2013 | Stravers et al. |
| 2013/0081042 A1 | 3/2013 | Branson et al. |
| 2013/0125127 A1 | 5/2013 | Mital et al. |
| 2013/0145203 A1 | 6/2013 | Fawcett et al. |
| 2013/0151919 A1 | 6/2013 | Huynh |
| 2013/0315211 A1 | 11/2013 | Balan et al. |
| 2014/0098890 A1 | 4/2014 | Sermadevi et al. |
| 2014/0115300 A1 | 4/2014 | Bodine |
| 2014/0188968 A1 | 7/2014 | Kaul et al. |
| 2014/0281409 A1 | 9/2014 | Abdallah et al. |
| 2014/0380024 A1 | 12/2014 | Spadini et al. |
| 2015/0007182 A1 | 1/2015 | Rossbach et al. |
| 2015/0026434 A1 | 1/2015 | Basant et al. |
| 2015/0033001 A1 | 1/2015 | Ivanov et al. |
| 2015/0067305 A1 | 3/2015 | Olson et al. |
| 2015/0082011 A1 | 3/2015 | Mellinger et al. |
| 2015/0089162 A1 | 3/2015 | Ahsan et al. |
| 2015/0089186 A1 | 3/2015 | Kim et al. |
| 2015/0100757 A1 | 4/2015 | Burger et al. |
| 2015/0106596 A1 | 4/2015 | Vorbach et al. |
| 2015/0113184 A1 | 4/2015 | Stanford-Jason et al. |
| 2015/0261528 A1 | 9/2015 | Ho et al. |
| 2015/0317134 A1 | 11/2015 | Kim et al. |
| 2016/0098279 A1 | 4/2016 | Glew |
| 2016/0098420 A1 | 4/2016 | Dickie et al. |
| 2016/0239265 A1 | 8/2016 | Duong et al. |
| 2017/0031866 A1 | 2/2017 | Nowatzki et al. |
| 2017/0083313 A1 | 3/2017 | Sankaralingam et al. |
| 2017/0092371 A1 | 3/2017 | Harari |
| 2017/0163543 A1 | 6/2017 | Wang et al. |
| 2017/0255414 A1 | 9/2017 | Gerhart et al. |
| 2017/0262383 A1 | 9/2017 | Lee et al. |
| 2017/0286169 A1 | 10/2017 | Ravindran et al. |
| 2017/0293766 A1 | 10/2017 | Schnjakin et al. |
| 2017/0315815 A1 | 11/2017 | Smith et al. |
| 2017/0315978 A1 | 11/2017 | Boucher et al. |
| 2017/0371836 A1 | 12/2017 | Langhammer |
| 2018/0081806 A1 | 3/2018 | Kothinti et al. |
| 2018/0081834 A1 | 3/2018 | Wang et al. |
| 2018/0088647 A1 | 3/2018 | Suryanarayanan et al. |
| 2018/0095728 A1 | 4/2018 | Hasenplaugh et al. |
| 2018/0188983 A1 | 7/2018 | Fleming, Jr. et al. |
| 2018/0188997 A1 | 7/2018 | Fleming, Jr. et al. |
| 2018/0189063 A1 | 7/2018 | Fleming et al. |
| 2018/0189231 A1 | 7/2018 | Fleming, Jr. et al. |
| 2018/0189239 A1 | 7/2018 | Nurvitadhi et al. |
| 2018/0189675 A1 | 7/2018 | Nurvitadhi et al. |
| 2018/0218767 A1 | 8/2018 | Wolff |
| 2018/0248994 A1 | 8/2018 | Lee et al. |
| 2018/0285385 A1 | 10/2018 | West et al. |
| 2018/0293162 A1 | 10/2018 | Tsai et al. |
| 2018/0300181 A1 | 10/2018 | Hetzel et al. |
| 2018/0373509 A1 | 12/2018 | Zhang et al. |
| 2019/0004878 A1 | 1/2019 | Adler et al. |
| 2019/0004945 A1 | 1/2019 | Fleming et al. |
| 2019/0004955 A1 | 1/2019 | Adler et al. |
| 2019/0004994 A1 | 1/2019 | Fleming et al. |
| 2019/0007332 A1 | 1/2019 | Fleming et al. |
| 2019/0018815 A1 | 1/2019 | Fleming et al. |
| 2019/0042217 A1 | 2/2019 | Glossop et al. |
| 2019/0042218 A1 | 2/2019 | Zhang |
| 2019/0042513 A1 | 2/2019 | Fleming, Jr. et al. |
| 2019/0095369 A1 | 3/2019 | Fleming et al. |
| 2019/0095383 A1 | 3/2019 | Fleming et al. |
| 2019/0101952 A1 | 4/2019 | Diamond et al. |
| 2019/0102179 A1 | 4/2019 | Fleming et al. |
| 2019/0102338 A1 | 4/2019 | Tang et al. |
| 2019/0129720 A1 | 5/2019 | Ivanov |
| 2019/0205263 A1 | 7/2019 | Fleming et al. |
| 2019/0205269 A1 | 7/2019 | Fleming, Jr. et al. |
| 2019/0205284 A1 | 7/2019 | Fleming et al. |

FOREIGN PATENT DOCUMENTS

| | | |
|---|---|---|
| RU | 2374684 C1 | 11/2009 |
| WO | 2007031696 A1 | 3/2007 |
| WO | 2014035449 A1 | 3/2014 |

OTHER PUBLICATIONS

Advisory Action from U.S. Appl. No. 14/037,468, dated Aug. 11, 2017, 3 pages.

Arvind., et al., "Executing a Program on the MIT Tagged-Token Dataflow Architecture," Mar. 1990, IEEE Transactions on Computers, vol. 39 (3), pp. 300-318.

Asanovic K, et al., "The Landscape of Parallel Computing Research: A View from Berkeley," Dec. 18, 2006, Electrical Engineering and Computer Sciences University of California at Berkeley, Technical Report No. UCB/EECS-2006-183, http://www.eecs.berkeley.edu/Pubs/TechRpts/2006/EECS-2006-183.html, 56 pages.

Ball T., "What's in a Region? or Computing Control Dependence Regions in Near-Linear Time for Reducible Control Flow," Dec. 1993, ACM Letters on Programming Languages and Systems, 2(1-4):1-16, 24 pages.

Bluespec, "Bluespec System Verilog Reference Guide," Jun. 16, 2010, Bluespec, Inc, 453 pages.

Bohm I., "Configurable Flow Accelerators," Mar. 3, 2016, XP055475839. retrieved from http://groups.inf.ed.ac.uk/pasta/rareas_cfa.html on Oct. 25, 2018, 3 pages.

Carloni L.P., et al., "The Theory of Latency Insensitive Design," Sep. 2001, IEEE Transactions on Computer-Aided Design of Integrated Circuits and Systems, vol. 20 (9), 18 pages.

Chandy K.M., et al., "Parallel Program Design: A Foundation," Addison-Wesley Publishing Company, Aug. 1988, 552 pages.

Compton K., et al., "Reconfigurable Computing: A Survey of Systems and Software," ACM Computing Surveys, Jun. 2002, vol. 34 (2), pp. 171-210.

Cong J., et al., "Supporting Address Translation for Accelerator-Centric Architectures," Feb. 2017, IEEE International Symposium on High Performance Computer Architecture (HPCA), 12 pages.

Corrected Notice of Allowance from U.S. Appl. No. 15/721,802, dated Dec. 18, 2018, 8 pages.

Dally W.J., et al., "Principles and Practices of Interconnection Networks," Morgan Kaufmann, 2003, 584 pages.

Dennis J.B., et al., "A Preliminary Architecture for a Basic Data-Flow Processor," 1975, in Proceedings of the 2nd Annual Symposium on Computer Architecture, pp. 125-131.

Dijkstra E.W., "Guarded Commands, Nondeterminacy and Formal Derivation of Programs," Aug. 1975, communications of the ACM, vol. 18 (8), pp. 453-457.

Eisenhardt S., et al., "Optimizing Partial Reconfiguration of Multi-Context Architectures," Dec. 2008, 2008 International Conference on Reconfigurable Computing and FPGAs, 6 pages.

Emer J., et al., "Asim: A Performance Model Framework," Feb. 2002, Computer, vol. 35 (2), pp. 68-76.

Emer J.S., et al., "A Characterization of Processor Performance in the VAX-11/780," In Proceedings of the 11th Annual International Symposium on Computer Architecture, Jun. 1984, vol. 12 (3), pp. 274-283.

Extended European Search Report for Application No. 17207172.2, dated Oct. 1, 2018, 14 pages.

(56) References Cited

OTHER PUBLICATIONS

Extended European Search Report for Application No. 17210484.6, dated May 29, 2018, 8 pages.
Final Office Action from U.S. Appl. No. 13/994,582, dated Oct. 3, 2017, 11 pages.
Final Office Action from U.S. Appl. No. 14/037,468, dated Jun. 1, 2017, 18 pages.
Final Office Action from U.S. Appl. No. 14/037,468, dated Jun. 15, 2018, 7 pages.
Final Office Action from U.S. Appl. No. 14/037,468, dated May 16, 2016, 24 pages.
Final Office Action from U.S. Appl. No. 14/037,468, dated Oct. 5, 2016, 17 pages.
Final Office Action from U.S. Appl. No. 15/396,049, dated Dec. 27, 2018, 38 pages.
Final Office Action from U.S. Appl. No. 15/721,809, dated Dec. 26, 2018, 46 pages.
Fleming K.E., et al., "Leveraging Latency-Insensitive Channels to Achieve Scalable Reconfigurable Computation," Feb. 2013, 197 pages.
Fleming et al., U.S. Appl. No. 15/396,038, titled "Memory Ordering in Acceleration Hardware," 81 pages, filed Dec. 30, 2016.
Fleming et al., U.S. Appl. No. 15/396,049, titled "Runtime Address Disambiguation in Acceleration Hardware," filed Dec. 30, 2016, 97 pages.
Govindaraju V., et al., "Dynamically Specialized Datapaths for Energy Efficient Computing," 2011, In Proceedings of the 17th International Conference on High Performance Computer Architecture, 12 pages.
Hauser J.R., et al., "Garp: a MIPS processor with a Reconfigurable Coprocessor," Proceedings of the 5th Annual IEEE Symposium on Field-Programmable Custom Computing Machines, 1997, 10 pages.
Hoogerbrugge J., et al., "Transport-Triggering vs. Operation-Triggering," 1994, In Compiler Construction, Lecture Notes in Computer Science, vol. 786, Springer, pp. 435-449.
Ibrahim Eng., Walaa Abd El Aziz, "Binary Floating Point Fused Multiply Add Unit", Faculty of Engineering, Cairo University Giza, Egypt, 2012, 100 Pages.
Intel® Architecture, "Instruction Set Extensions and Future Features Programming Reference," 319433-034, May 2018, 145 pages.
Intel, "Intel® 64 and IA-32 Architectures Software Developer Manuals," Oct. 12, 2016, Updated—May 18, 2018, 19 pages.
International Preliminary Report on Patentability for Application No. PCT/RU2011/001049, dated Jul. 10, 2014, 6 pages.
International Search Report and Written Opinion for Application No. PCT/RU2011/001049, dated Sep. 20, 2012, 6 pages.
International Search Report and Written Opinion received for PCT Patent Application No. PCT/US2017/050663, dated Dec. 28, 2017, 14 pages.
Kalte H., et al., "Context Saving and Restoring for Multitasking in Reconfigurable Systems," International Conference on Field Programmable Logic and Applications, Aug. 2005, pp. 223-228.
Kim et al., "Energy-Efficient and High Performance CGRA-based Multi-Core Architecture," Journal of Semiconductor Technology and Science, vol. 14 (3), Jun. 2014, 16 pages.
Knuth D.E., et al., "Fast Pattern Matching in Strings," Jun. 1977, SIAM Journal of Computing, vol. 6(2), pp. 323-350.
Lee T., et al., "Hardware Context-Switch Methodology for Dynamically Partially Reconfigurable Systems," Journal of Information Science and Engineering, vol. 26, Jul. 2010, pp. 1289-1305.
Lewis D., et al., "The Stratix™10 Highly Pipelined FPGA Architecture," FPGA 2016, Altera, Feb. 23, 2016, 26 pages.
Lewis D., et al., "The Stratix™10 Highly Pipelined FPGA Architecture," FPGA'16, ACM, Feb. 21-23, 2016, pp. 159-168.
Li S., et al., "Case Study: Computing Black-Scholes with Intel® Advanced Vector Extensions," Sep. 6, 2012, 20 pages.
Marquardt A., et al., "Speed and Area Trade-Offs in Cluster-Based FPGA Architectures," Feb. 2000, IEEE Transactions on Very Large Scale Integration (VLSI) Systems, vol. 8 (1), 10 pages.
Mei B., et al., "Adres: An Architecture with Tightly Coupled VLIW Processor and Coarse-Grained Reconfigurable Matrix," 2003, In Proceedings of International Conference on Field-Programmable Logic and Applications, 10 pages.
Mirsky E., at al., "Matrix: A Reconfigurable Computing Architecture with Configurable Instruction Distribution and Deployable Resources," 1996, In Proceedings of the IEEE Symposium on FPGAs for Custom Computing Machines, pp. 157-166.
Natalie E.J., et al., "On-Chip Networks," Synthesis Lectures on Computer Architecture, Morgan and Claypool Pubfishers, 2009, 148 pages.
Non-Final Office Action from U.S. Appl. No. 14/037,468, dated Oct. 19, 2017, 19 pages.
Non-Final Office Action from U.S. Appl. No. 15/396,402, dated Nov. 1, 2018, 22 pages.
Non-Final Office Action from U.S. Appl. No. 15/640,540, dated Oct. 26, 2018, 8 pages.
Non-Final Office Action from U.S. Appl. No. 15/396,038, dated Oct. 5, 2018, 38 pages.
Non-Final Office Action from U.S. Appl. No. 15/396,049, dated Jun. 15, 2018, 33 pages.
Non-Final Office Action from U.S. Appl. No. 15/859,473, dated Oct. 15, 2018, 10 pages.
Non-Final Office Action from U.S. Appl. No. 13/994,582, dated Mar. 23, 2017, 9 pages.
Non-Final Office Action from U.S. Appl. No. 13/994,582, dated Feb. 7, 2018, 12 pages.
Non-Final Office Action from U.S. Appl. No. 14/037,468, dated Aug. 27, 2015, 10 pages.
Non-Final Office Action from U.S. Appl. No. 14/037,468, dated Dec. 2, 2016, 16 pages.
Non-Final Office Action from U.S. Appl. No. 15/283,295, dated Apr. 30, 2018, 18 pages.
Non-Final Office Action from U.S. Appl. No. 15/396,395, dated Jul. 20, 2018, 18 pages.
Non-Final Office Action from U.S. Appl. No. 15/640,533, dated Apr. 19, 2018, 8 pages.
Non-Final Office Action from U.S. Appl. No. 15/640,534, dated Apr. 26, 2018, 8 pages.
Non-Final Office Action from U.S. Appl.No. 15/721,802, dated Mar. 8, 2018, 8 pages.
Non-Final Office Action from U.S. Appl. No. 15/721,809, dated Jun. 14, 2018, 12 pages.
Notice of Allowance from U.S. Appl. No. 15/721,802, dated Nov. 30, 2018, 30 pages.
Notice of Allowance from U.S. Appl. No.15/640,533, dated Oct. 10, 2018, 8 pages.
Notice of Allowance from U.S. Appl. No. 15/640,538, dated Oct. 17, 2018, 10 pages.
Notice of Allowance from U.S. Appl. No. 13/994,582, dated Aug. 7, 2018, 8 pages.
Notice of Allowance from U.S. Appl. No. 14/037,468, dated Aug. 28, 2018, 9 pages.
Notice of Allowance from U.S. Appl. No. 15/396,395, dated Dec. 28, 2018, 36 pages.
Notice of Allowance from U.S. Appl. No. 15/640,534, dated Sep. 12, 2018, 7 pages.
Notice of Allowance from U.S. Appl. No. 15/721,802, dated Jul. 31, 2018, 6 pages.
Parashar A., et al., "Efficient Spatial Processing Element Control via Triggered Instructions," IEEE Micro, vol. 34 (3), Mar. 10, 2014, pp. 120-137.
Parashar et al., "Leap: A Virtual Platform Architecture for FPGAs," Intel Corporation, 2010, 6 pages.
Pellauer M., et al., "Efficient Control and Communication Paradigms for Coarse-Grained Spatial Architectures," Sep. 2015, ACM Transactions on Computer Systems, vol. 33 (3), Article 10, 32 pages.
Pellauer M., et al., "Soft Connections: Addressing the Hardware-Design Modularity Problem," 2009, In Proceedings of the 46th ACM/IEEE Design Automation Conference (DAC'09), pp. 276-281.

(56) References Cited

OTHER PUBLICATIONS

Raaijmakers S., "Run-Time Partial Reconfiguration on the Virtex-11 Pro," 2007, 69 pages.
Schmit H., et al., "PipeRench: A Virtualized Programmable Datapath in 0.18 Micron Technology," 2002, IEEE 2002 Custom Integrated Circuits Conference, pp. 63-66.
Shin T., et al., "Minimizing Buffer Requirements for Throughput Constrained Parallel Execution of Synchronous Dataflow Graph," ASPDAC '11 Proceedings of the 16th Asia and South Pacific Design Automation Conference, Jan. 2011, 6 pages.
Smith A., et al., "Dataflow Predication," 2006, In Proceedings of the 39th Annual IEEE/ACM International Symposium on Microarchitecture, 12 pages.
Swanson S., et al., "The WaveScalar Architecture," May 2007, ACM Transactions on Computer Systems, vol. 25 (2), Article No. 4, 35 pages.
Taylor M.B., et al., "The Raw Microprocessor: A Computational Fabric for Software Circuits and General-Purpose Programs," 2002, IEEE Micro, vol. 22 (2), pp. 25-35.
Truong D.N., et al., "A 167-Processor Computational Platform in 65 nm CMOS," IEEE Journal of Solid-State Circuits, Apr. 2009, vol. 44 (4), pp. 1130-1144.
Van De Geijn R.A., et al., "Summa: Scalable Universal Matrix Multiplication Algorithm," 1997, 19 pages.
Vijayaraghavan M., et al., "Bounded Dataflow Networks and Latency-Insensitive Circuits," In Proceedings of the 7th IEEE/ACM International Conference on Formal Methods and Models for Codesign (MEMOCODE'09), Jul. 13-15, 2009, pp. 171-180.
Wikipedia, The Free Encyclopedia, "Priority encoder," https://en.wikipedia.org/w/index.php?Title=Priority_encoder&oldid=746908667, revised Oct. 30, 2016, 2 pages.
Wikipedia, The Free Encyclopedia, "Truth table," Logical Implication Table, https://enwikipedia.org/wiki/Truth_table#Logical_implication, revised Nov. 18, 2016, 1 page.
Wikipedia, "TRIPS Architecture," retrieved from https://en.wikipedia.org/wiki/TRIPS_architecture on Oct. 14, 2018, 4 pages.
Williston, Roving Reporter, Intel® Embedded Alliance, "Roving Reporter: FPGA + Intel® Atom TM = Configurable Processor," Dec. 2010, 5 pages.
Yu Z., et al., "An Asynchronous Array of Simple Processors for DSP Applications," IEEE International Solid-State Circuits Conference, ISSCC'06, Feb. 8, 2006, 10 pages.
Burger D., et al., "Scaling to the End of Silicon with EDGE Architectures," Jul. 12, 2004, vol. 37 (7), pp. 44-55.
"CORAL Collaboration: Oak Ridge, Argonne, Livermore," Benchmark codes, downloaded from https://asc.llnl.gov/ CORAL-benchmarks/ on Nov. 16, 2018, 6 pages.
Fleming K., et al., "Leveraging Latency-Insensitivity to Ease Multiple FPGA Design," In Proceedings of the ACM/SIGDA International Symposium on Field Programmable Gate Arrays, FPGA'12, Feb. 22-24, 2012, pp. 175-184.
King M., et al., "Automatic Generation of Hardware/Software Interfaces," Proceedings of the 17th International Conference on Architectural Support for Programming Languages and Operating Systems, ASPLOS'12, Mar. 2012, 12 pages.
Matsen F.A., et al., "The CMU warp processor," In Supercomputers: Algorithms, Architectures, and Scientific computation, 1986, pp. 235-247.
McCalpin J.D., "Memory Bandwidth and Machine Balance in Current High Performance Computers," IEEE Computer Society Technical Committee on Computer Architecture (TCCA) Newsletter, Dec. 1995, 7 pages.
McCalpin J.D., "Stream: Sustainable memory bandwidth in high performance computers," 2016, 4 pages.
Merrill D., et al., "Revisiting sorting for GPGPU stream architectures," In Proceedings of the 19th International Conference on Parallel Architectures and Compilation Techniques (PACT'10), Feb. 2010, 17 pages.

Panesar G., et al., "Deterministic Parallel Processing," International Journal of Parallel Programming, Aug. 2006, vol. 34 (4), pp. 323-341.
Ye Z.A., et al., "Chimaera: A High-Performance Architecture with a Tightly-Coupled Reconfigurable Functional Unit," Proceedings of the 27th International Symposium on Computer Architecture (ISCA'00), 2000, 11 pages.
Non-Final Office Action from U.S. Appl. No. 15/640,543, dated Jan. 2, 2019, 46 pages.
Notice of Allowance from U.S. Appl. No. 15/283,295, dated Jan. 3, 2019, 7 pages.
Notice of Allowance from U.S. Appl. No. 15/640,534, dated Jan. 4, 2019, 37 pages.
Notice of Allowance from U.S. Appl. No. 15/719,28, dated Jan. 24, 2019, 36 pages.
Canis A., et al., "LegUp: An Open-Source High-Level Synthesis Tool for FPGA-Based Processor/Accelerator Systems," ACM Transactions on Embedded Computing Systems, vol. 1(1), Article 1, Jul. 2012, 25 pages.
Chen Y., et al., "Eyeriss: A Spacial Architecture for Energy-Efficient Dataflow for Convolutional Neural Networks," Jun. 2016, 53 pages.
Chen Y., et al., "Eyeriss: A Spacial Architecture for Energy-Efficient Dataflow for Convolutional Neural Networks," International Symposium on Computer Architecture (ISCA), Jun. 2016, pp. 367-379.
Chen Y., et al., "Eyeriss: An Energy-Efficient Reconfigurable Accelerator for Deep Convolutional Neural Networks," IEEE International Conference on Solid-State Circuits (ISSCC), Feb. 2016, pp. 262-264.
Chen Y., et al., "Eyeriss: An Energy-Efficient Reconfigurable Accelerator for Deep Convolutional Neural Networks," IEEE International Solid-State Circuits Conference, ISSCC, 2016, 9 pages.
Chen Y., et al., "Eyeriss: An Energy-Efficient Reconfigurable Accelerator for Deep Convolutional Neural Networks," IEEE International Solid-State Circuits Conference, ISSCC 2016, Digest of Technical Papers, retrieved from eyeriss-isscc2016, spreadsheet, http://eyeriss.mit.edu/benchmarking.html, 2016, 7 pages.
Chen Y., et al., "Eyeriss v2: A Flexible and High-Performance Accelerator for Emerging Deep Neural Networks," Jul. 2018, 14 pages.
Chen Y., et al., "Understanding the Limitations of Existing Energy-Efficient Design Approaches for Deep Neural Networks," Feb. 2018, 3 pages.
Chen Y., et al., "Using Dataflow to Optimize Energy Efficiency of Deep Neural Network Accelerators," IEEE Micro's Top Picks from the Computer Architecture Conferences, May/Jun. 2017, pp. 12-21.
Chen Y.H., et al., "Eyeriss: An Energy-Efficient Reconfigurable Accelerator for Deep Convolutional Neural Networks," 2016 IEEE International Solid-State Circuits Conference (ISSCC), Jan. 2016, 12 page.
Corrected Notice of Allowance from U.S. Appl. No. 14/037,468, dated Apr. 1, 2019, 10 pages.
Corrected Notice of Allowance from U.S. Appl. No. 15/640,534, dated Apr. 26, 2019, 21 pages.
Emer J., et al., "Hardware Architectures for Deep Neural Networks at CICS/MTL Tutorial," Mar. 27, 2017, 258 pages.
Emer J., et al., "Hardware Architectures for Deep Neural Networks at ISCA Tutorial," Jun. 24, 2017, 290 pages.
Emer J., et al., "Hardware Architectures for Deep Neural Networks at MICRO-49 Tutorial," Oct. 16, 2016, 300 pages.
Emer J., et al., "Tutorial on Hardware Architectures for Deep Neural Networks," Nov. 2016, 8 pages.
Final Office Action from U.S. Appl. No. 15/396,038, dated Mar. 11, 2019, 36 pages.
Final Office Action from U.S. Appl. No. 15/859,473, dated Feb. 26, 2019, 13 pages.
Govindaraju et al.,"DySER: Unifying Functionality and Parallelism Specialization for Energy-Efficient Computing," 3ublished by the IEEE Computer Society, Sep./Oct. 2012, pp. 38-51.
Han S., et al., "Deep Compression: Compressing Deep Neural Networks with Pruning, Trained Quantization and Huffman Coding," ICLR, Feb. 2016, 14 pages.

(56) References Cited

OTHER PUBLICATIONS

Han S., et al., "Eie: Efficient Inference Engine on Compressed Deep Neural Network," 43rd ACM/IEEE Annual International Symposium on Computer Architecture, ISCA 2016, Seoul, South Korea, Jun. 18-22, 2016, retrieved from eie-isca2016, spreadsheet, http://eyeriss.mit.edu/benchmarking.html, 7 pages.
Han S., et al., "Eie: Efficient Inference Engine on Compressed Deep Neural Network," ISCA, May 2016, 12 pages.
International Preliminary Report on Patentability for Application No. PCT/US2017/050663, dated Apr. 11, 2019, 11 pages.
Non-Final Office Action from U.S. Appl. No. 15/640,541, dated Apr. 12, 2019, 61 pages.
Non-Final Office Action from U.S. Appl. No. 15/640,542, dated Apr. 2, 2019, 59 pages.
Non-Final Office Action from U.S. Appl. No. 15/719,285, dated Feb. 25, 2019, 47 pages.
Non-Final Office Action from U.S. Appl. No. 15/855,964, dated Dec. 13, 2018, 13 pages.
Notice of Allowance from U.S. Appl. No. 14/037,468, dated Mar. 7, 2019, 51 pages.
Notice of Allowance from U.S. Appl. No. 15/283,295, dated Apr. 10, 2019, 49 pages.
Notice of Allowance from U.S. Appl. No. 15/640,533, dated Feb. 14, 2019, 43 pages.
Notice of Allowance from U.S. Appl. No. 15/640,534, dated Apr. 2, 2019, 9 pages.
Notice of Allowance from U.S. Appl. No. 15/640,540, dated Mar. 14, 2019, 39 pages.
Notice of Allowance from U.S. Appl. No. 15/721,802, dated Mar. 18, 2019, 23 pages.
Notice of Allowance from U.S. Appl. No. 15/855,964, dated Apr. 24, 2019, 15 pages.
Smith A., et al., "Compiling for Edge Architectures," Appears in the Proceedings of the 4th International Symposium on code Generation and Optimization, 2006, 11 pages.
Suleiman A., et al., "Towards Closing the Energy Gap Between HOG and CNN Features for Embedded Vision," IEEE International Symposium of Circuits and Systems (ISCAS), May 2017, 4 pages.
Sze V., et al., "Efficient Processing of Deep Neural Networks: A Tutorial and Survey," Mar. 2017, 32 pages.
Sze V., et al., "Efficient Processing of Deep Neural Networks: A Tutorial and Survey," Proceedings of the IEEE, Dec. 2017, vol. 105 (12), pp. 2295-2329.
Sze V., et al., "Hardware for Machine Learning: Challenges and Opportunities," IEEE Custom Integrated Circuits conference (CICC), Oct. 2017, 9 pages.
"The LLVM Compiler Infrastructure," retrieved from http://www.llvm.org/, on May 1, 2018, maintained by the llvm-admin team, 4 pages.
Yang T., et al., "A Method to Estimate the Energy Consumption of Deep Neural Networks," Asilomar Conference on Signals, Systems and Computers, Oct. 2017, 5 pages.
Yang T., et al., "Designing Energy-Efficient Convolutional Neural Networks using Energy-Aware Pruning," IEEE Conference on Computer Vision and Pattern Recognition (CVPR), Jul. 2017, 9 pages.
Yang T., et al., "Designing Energy-Efficient Convolutional Neural Networks using Energy-Aware Pruning," IEEE CVPR, Mar. 2017, 6 pages.
Yang T., et al., "NetAdapt: Platform-Aware Neural Network Adaptation for Mobile Applications," European Conference on Computer Vision (ECCV), Version 2, Sep. 28, 2018, 16 pages.
"Benchmarking DNN Processors," Nov. 2016, 2 pages.
"Full Day Tutorial Held at MICRO-49," Oct. 15-19, 2016, retrieved from https://www.microarch.org/micro49/ on Feb. 14, 2019, 2 pages.
Hsin Y., "Building Energy-Efficient Accelerators for Deep Learning," at Deep Learning Summit Boston, May 2016, retrieved from https://www.re-work.co/events/deep-learning-boston-2016 on Feb. 14, 2019, 10 pages.
Hsin Y., "Deep Learning & Artificial Intelligence," at GPU Technology Conference, Mar. 26-29, 2018, retrieved from http://www.gputechconf.com/resources/poster-gallery/2016/deep-learning-artificial-intelligence on Feb. 14, 2019, 4 pages.
Sze V., "Designing Efficient Deep Learning Systems," in Mountain View, CA, Mar. 27-28, 2019, retrieved from https://professional.mit.edu/programs/short-programs/designing-efficient-deep-learning-systems-OC on Feb. 14, 2019, 2 pages.
"Tutorial at MICRO-50," The 50th Annual IEEE/ACM International Symposium on Microarchitecture, Oct. 14-18, 2017, retrieved from https://www.microarch.org/micro50/ on Feb. 14, 2019, 3 pages.
"Tutorial on Hardware Architectures for Deep Neural Networks at ISCA 2017," The 44th International Symposium on Computer Architecture, Jun. 24-28, 2017, retrieved from http://isca17.ece.utoronto.ca/doku.php on Feb. 14, 2019, 2 pages.
Yang T., et al., "Deep Neural Network Energy Estimation Tool," IEEE Conference on Computer Vision and Pattern Recognition CVPR 2017, Jul. 21-26, 2017, retrieved from https://energyestimation.mit.edu/ on Feb. 21, 2019, 4 pages.
Yang T., et al., "NetAdapt: Platform-Aware Neural Network Adaptation for Mobile Applications," European Conference on Computer Vision (ECCV), Version 1, Apr. 9, 2018, 16 pages.
Yang T., et al., "Designing Energy-Efficient Convolutional Neural Networks using Energy-Aware Pruning," IEEE Conference on Computer Vision and Pattern Recognition CVPR 2017, Jul. 21-26, 2017, retrieved from http://www.rle.mit.edu/eems/wp-content/uploads/2017/07/2017_cypr_poster.pdf on Feb. 21, 2019, 1 page.
Final Office Action from U.S. Appl. No. 15/396,402, dated May 17, 2019, 85 pages.
Notice of Allowance from U.S. Appl. No. 15/396,395, dated May 15, 2019, 23 pages.
Notice of Allowance from U.S. Appl. No. 15/640,533, dated May 22, 2019, 19 pages.
Notice of Allowance from U.S. Appl. No. 15/859,466, dated May 17, 2019, 56 pages.
Corrected Notice of Allowance from U.S. Appl. No. 14/037,468, dated May 29, 2019, 12 pages.
Corrected Notice of Allowance from U.S. Appl. No. 15/396,395, dated Jun. 7, 2019, 8 pages.
Corrected Notice of Allowance from U.S. Appl. No. 15/721,802, dated Jun. 12, 2019, 11 pages.
Corrected Notice of Allowance from U.S. Appl. No. 15/855,964, dated Jun. 25, 2019, 7 pages.
Corrected Notice of Allowance from U.S. Appl. No. 15/640,534, dated Jul. 2, 2019, 12 pages.
Notice of Allowance from U.S. Appl. No. 15/640,534, dated May 31, 2019, 3 pages.
Notice of Allowance from U.S. Appl. No. 15/721,809, dated Jun. 6, 2019, 32 pages.
Notice of Allowance from U.S. Appl. No. 15/859,454, dated Jun. 7, 2019, 55 pages.
Notice of Allowance from U.S. Appl. No. 16/024,801, dated Jun. 5, 2019, 64 pages.
Notice of Allowance from U.S. Appl. No. 15/396,049, dated Jul. 2, 2019, 70 pages.
Notice of Allowance from U.S. Appl. No. 15/640,538, dated Jul. 3, 2019, 76 pages.
Notice of Allowance from U.S. Appl. No. 15/640,540, dated Jul. 1, 2019, 36 pages.
Notice of Allowance from U.S. Appl. No. 15/640,543, dated Jul. 29, 2019, 43 pages.
Notice of Allowance from U.S. Appl. No. 15/719,285, dated Jul. 23, 2019, 26 pages.
International Search Report and Written Opinion for Application No. PCT/US2019/020243, dated Jun. 19, 2019, 11 pages.
International Search Report and Written Opinion for Application No. PCT/US2019/020270, dated Jun. 14, 2019, 11 pages.
International Search Report and Written Opinion for Application No. PCT/US2019/019965, dated Jun. 13, 2019, 9 pages.
International Search Report and Written Opinion for Application No. PCT/US2019/020287, dated Jun. 12, 2019, 9 pages.

\* cited by examiner

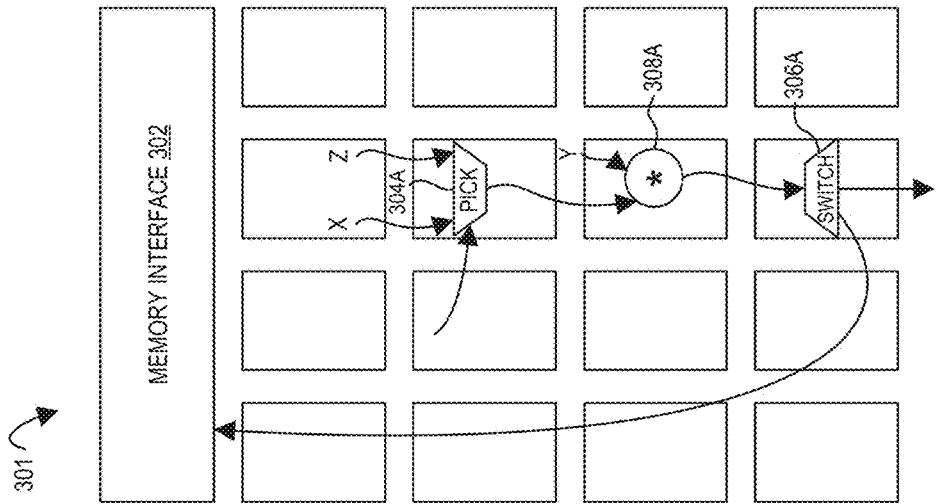
CONFIGURED CSA
FIG. 3C
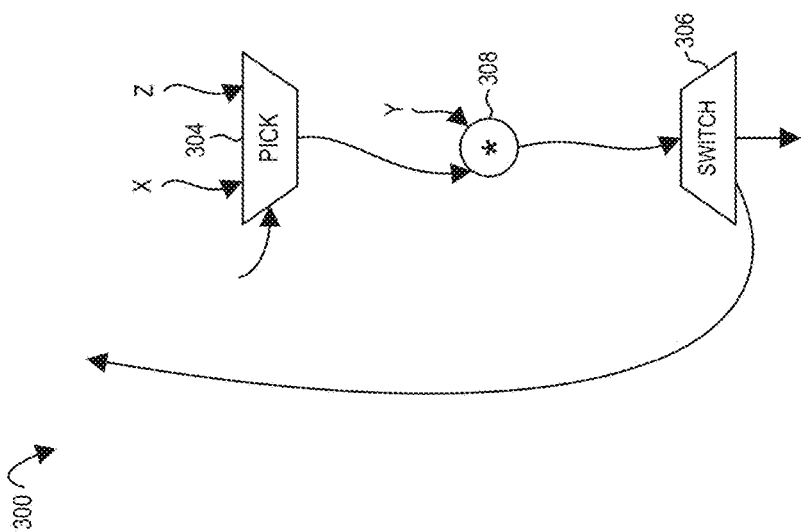
DATAFLOW GRAPH
FIG. 3B
```
void func (int x,y) {
    x = x * y;
    return x;
}
```
PROGRAM SOURCE
FIG. 3A

```
void memcpy(void *A, void *B, int N) {
    for(int index = 0; index < N; index++) {
        a[index] = b[index]
    }
}
```

FIG. 5

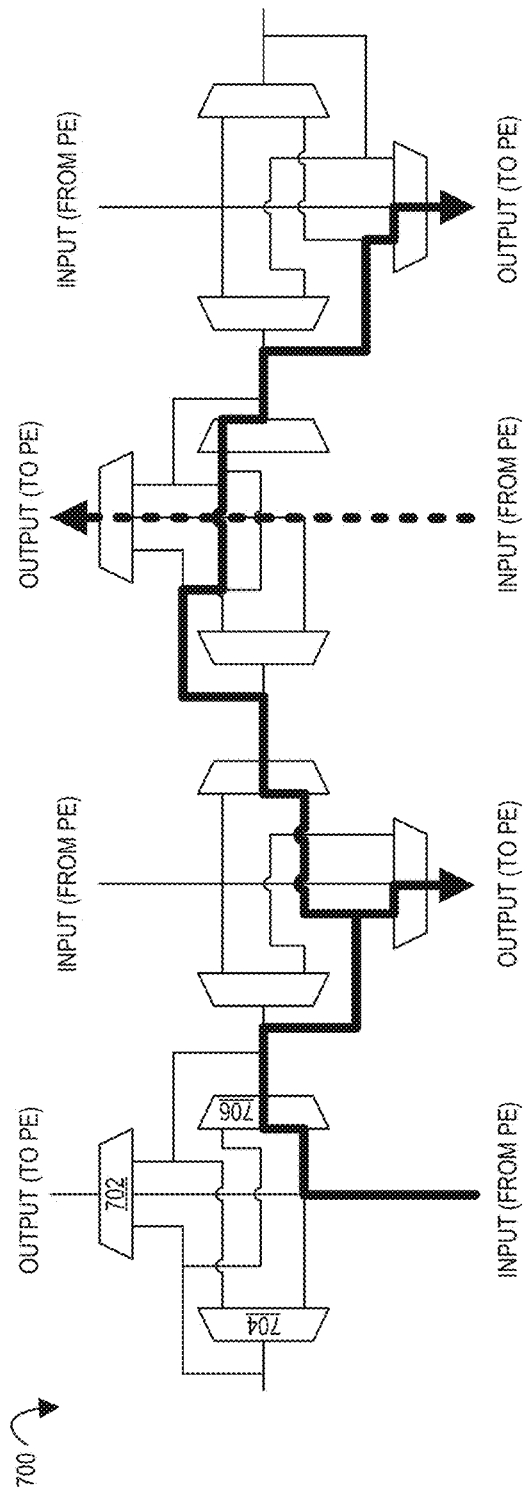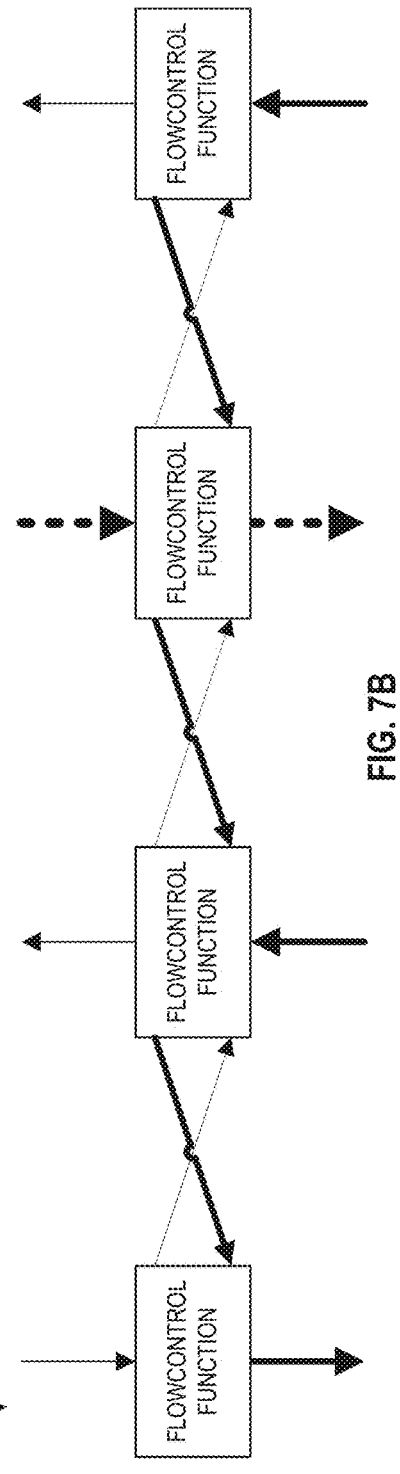
FIG. 7A
FIG. 7B

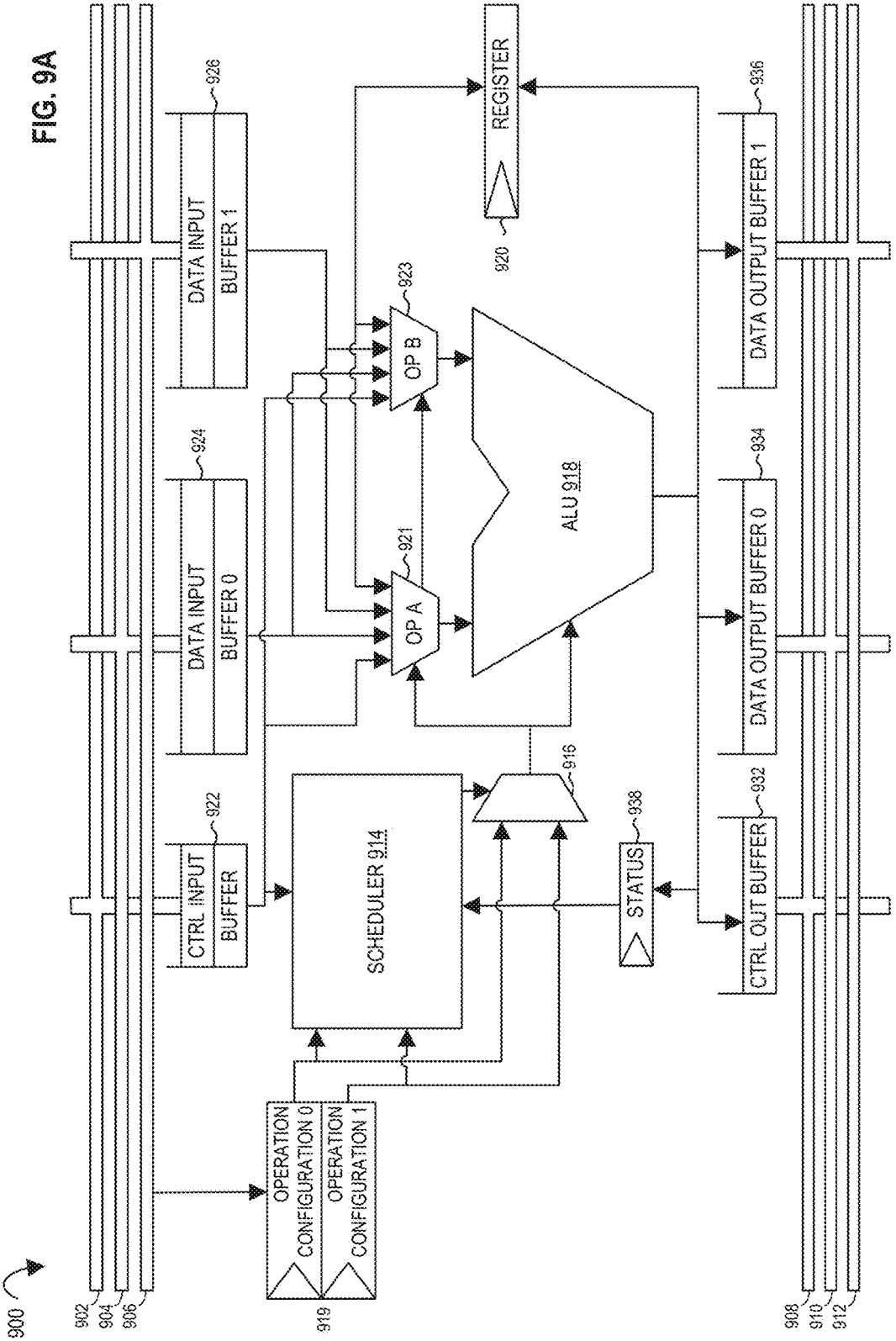

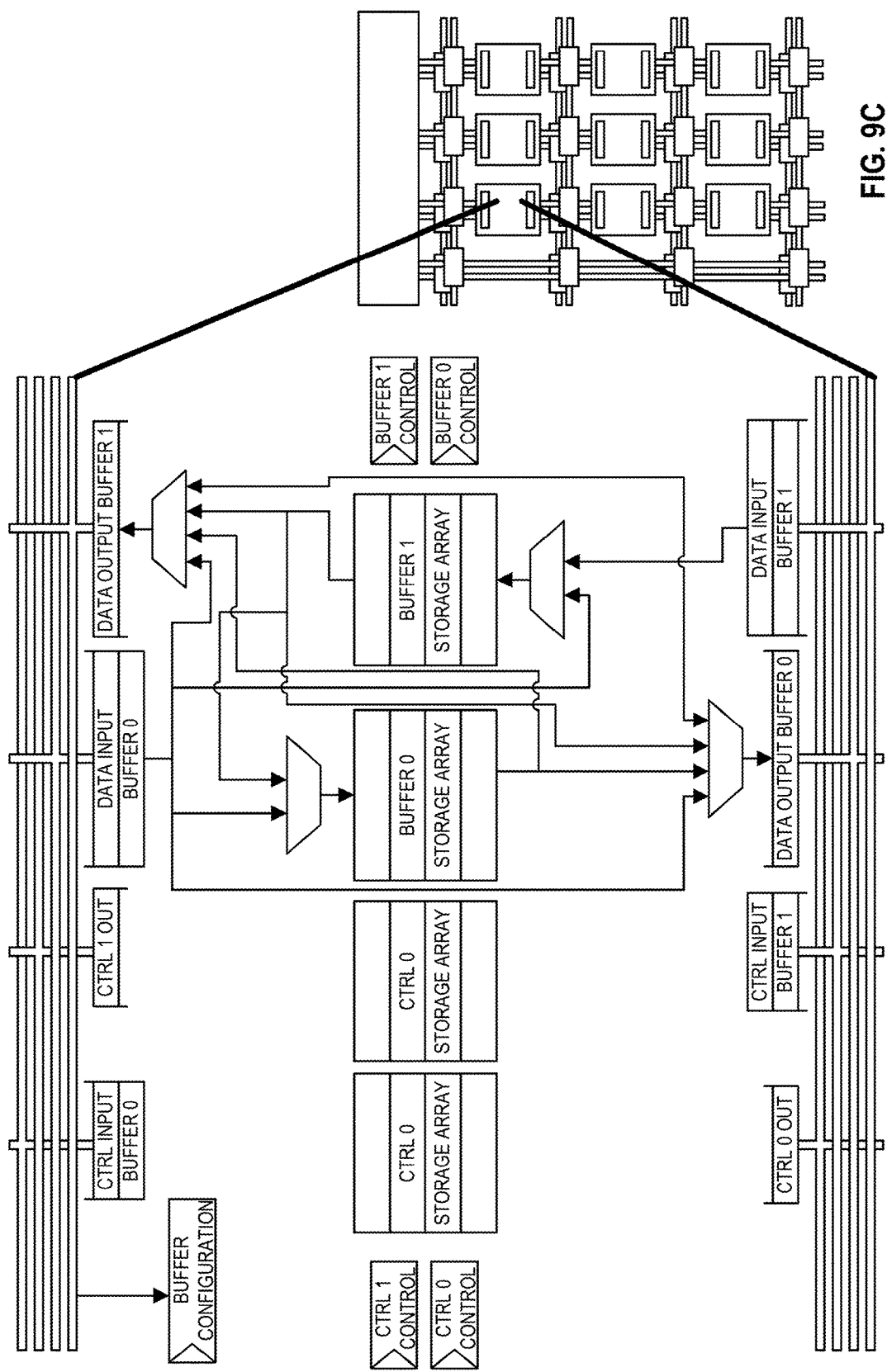

| Function | Methods | Wide In | Wide Out | Narrow In | Narrow Out | Notes |
|---|---|---|---|---|---|---|
| FIFO | enqueue | 1 | | | | |
| | dequeue | | 1 | | | |
| ROM | read | 1 | 1 | | | |
| Scratchpad | read | 1 | 1 | | | |
| | write | 2 | | | | |
| | fused read/write | 2 | 1 | 1 | | Narrow channel used to switch reads and writes |
| RISO | allocate slot | | 1 | | | We can just stream the slots out in FIFO order, and use the network to implement a sort of distributed free list. |
| | enqueue | 2 | | | | Second input is used for the allocated slot |
| | dequeue | | 1 | | | |

FIG. 9D

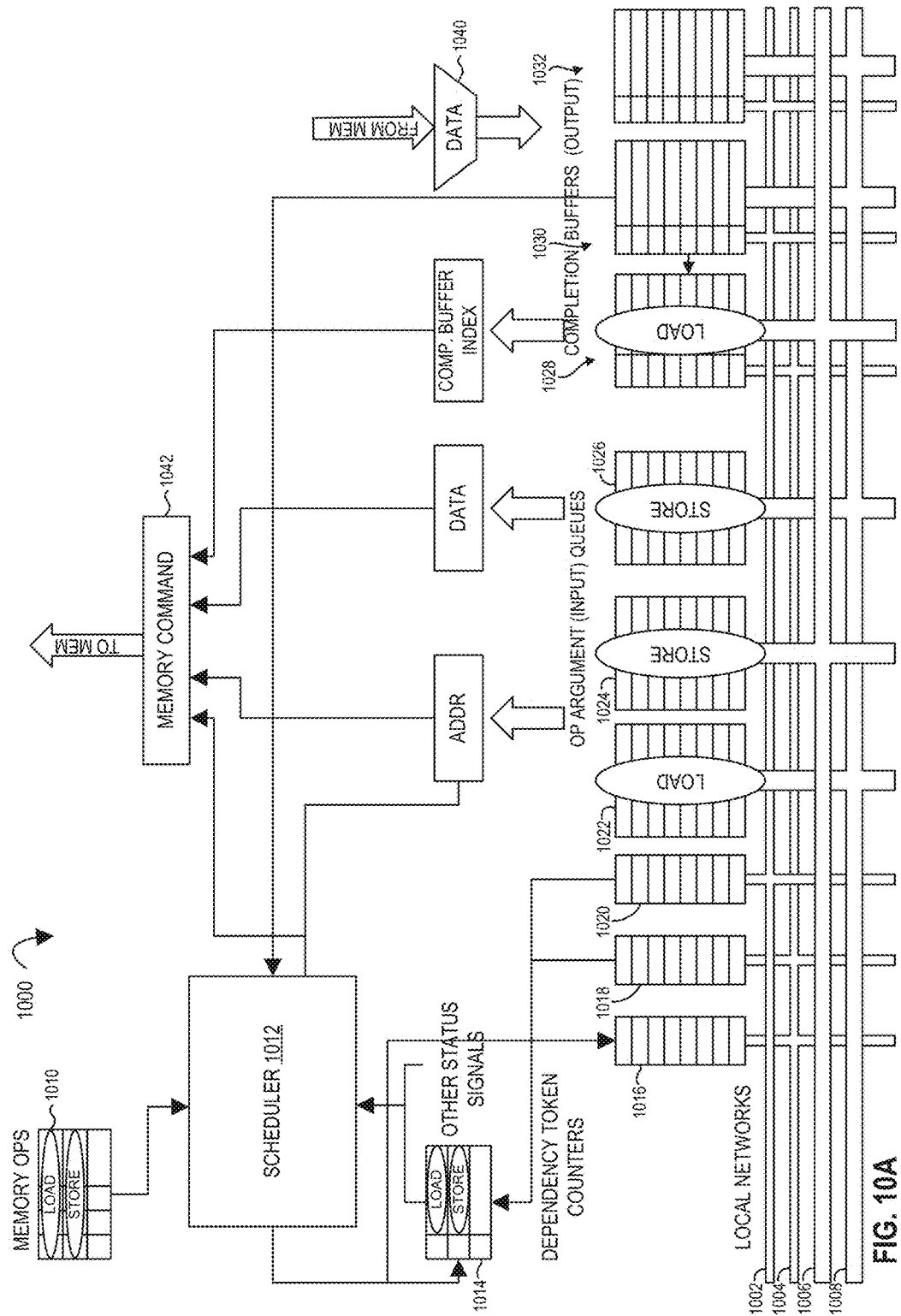

```
for I= ...
    if (cond1) then
        ------------------(A)
    else
        ------------------(B)
        if (cond2) then
            if (cond3) then
                ------------------(C)
            else
                ------------------(D)
            end if
        end if
    end if
    if (cond4) then
        ------------------(F)
        if (cond5) then
            ------------------(G)
        end if
    else
        ------------------(H)
        if (cond6) then
            ------------------(I)
        end if
    end if
end for
```

FIG. 10D (A) cond1
(B) !cond1
(C) !cond1 && cond2 && cond3
(D) !cond1 && cond2 && !cond3
(E) !cond1 && cond2
(F) cond4
(G) cond4 && cond5
(H) !cond4
(I) !cond4 && cond6

FIG. 10E

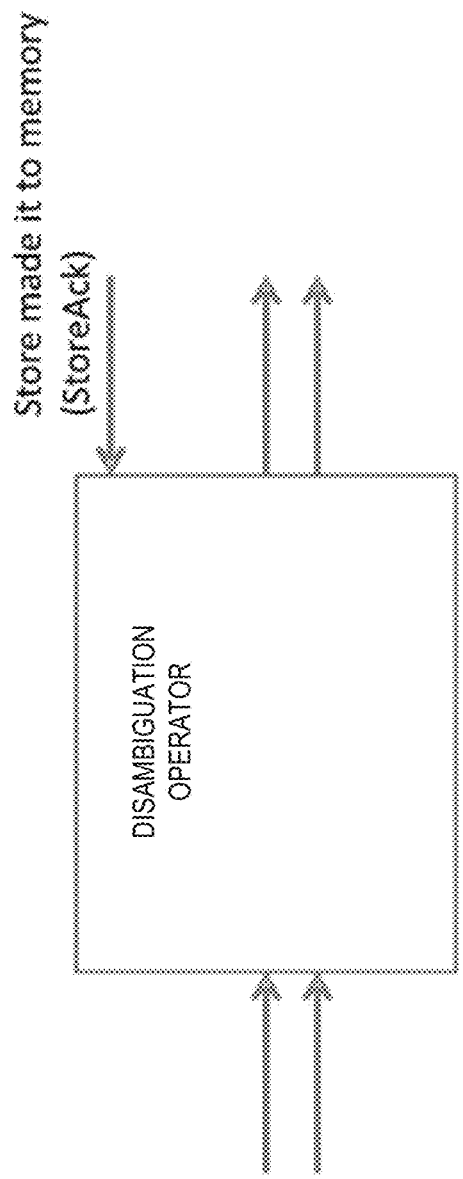

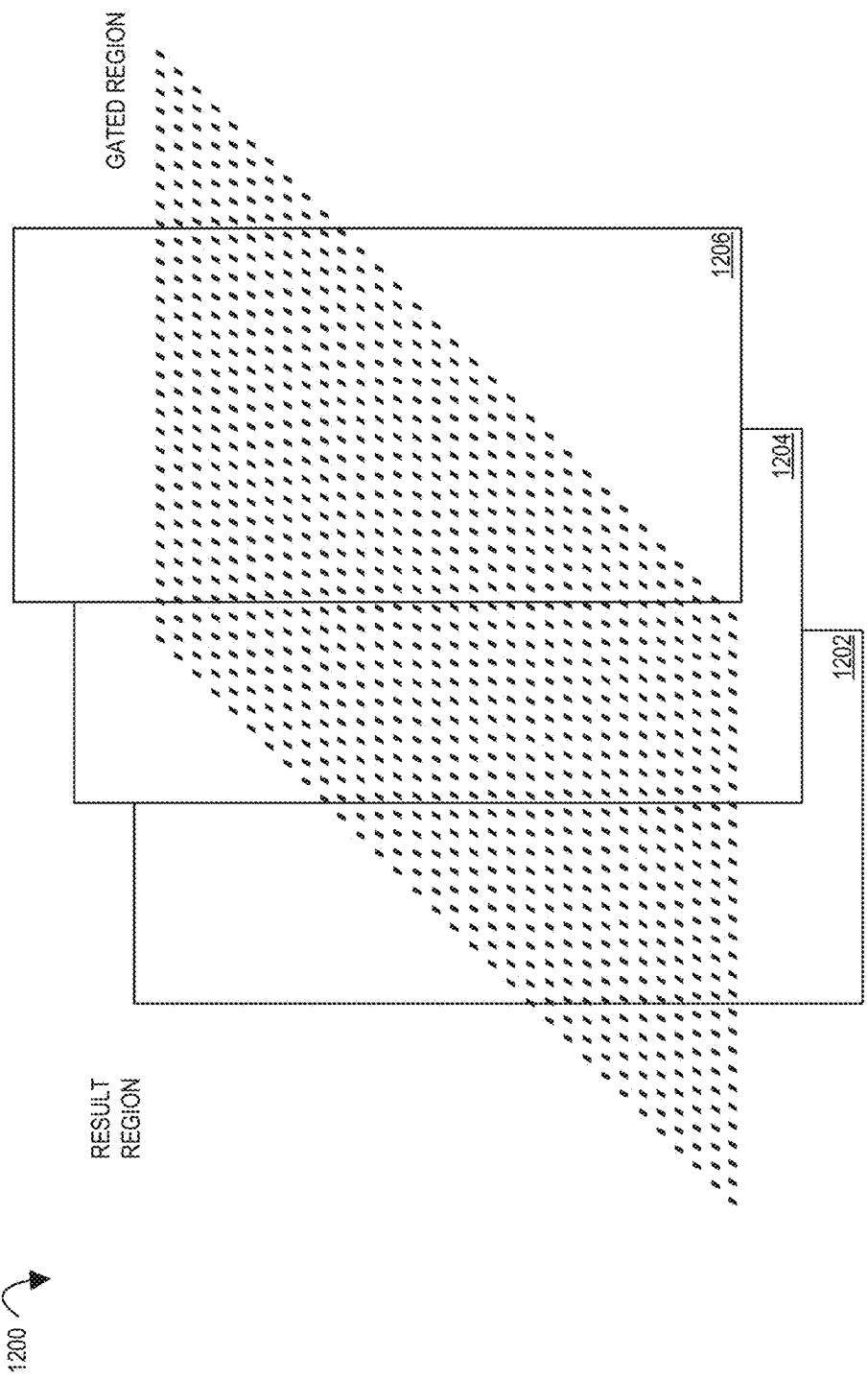

```
ld32 Rdata, Raddr
ld32 Rdata2, Raddr2
mul32 Rv0, Rdata, 17
mul32 Rv1, Rdata2, Rdata2
add32 Rres, Rv0, Rv1
st32 Raddr, Rres
ld32 Rdata3, Raddr3
```

SEQUENTIAL ASSEMBLY 1702

FIG. 17A

```
.lic .i32 data;  .lic .i64 addr;
.lic .i32 data2; .lic .i64 addr2;
.lic .i32 data3; .lic .i64 addr3;
.lic .i32 v0; .lic .i32 v1; .lic .i32 res
ld32 data, addr
ld32 data2, addr2
mul32 v0, data, 17
mul32 v1, data2, data2
add32 res, v0, v1
st32 addr, res, done, %ign
ld32 data3, addr3, %ign, done
```

DATAFLOW ASSEMBLY 1704

FIG. 17B

DATAFLOW GRAPH 1706

```
if (i < n)
    y = x + a;
else
    y = i + x;
```

C SOURCE CODE 1802

FIG. 18A

```
.lic .il test
cmplts32 test, i, n
switch32 %ign, aT, test, a
switch32 iF, %ign, test, i
switch32 xF, xT, test, x
add32 yT, xT, aT     # True path
add32 yF, iF, xF     # False path
pick32 y, test, yF, yT
add32 z, y, 1
```

DATAFLOW ASSEMBLY 1804

FIG. 18B

DATAFLOW GRAPH 1806

```
int i = 0;
int sum = 0;
do {
    sum = sum + i;
    i = i + 1;
} while (i < n);
return sum;
```

C SOURCE CODE 1902
FIG. 19A

```
# Loop control channels.
.lic .il picker
.lic .il switcher

# Offset values in picker with an initial 0.
.curr picker; .value 0; .avail 0

# Generate value of i for each loop iteration
pick32 top_i, picker, init_i, loopback_i
add32 bottom_i, top_i, 1
switch32 %ign, loopback_i, switcher, bottom_i

# Repeat value of n for each execution of the loop.
pick32 loop_n, picker, init_n, loopback_n
switch32 %ign, loopback_n, switcher, loop_n

# Comparison at the bottom of the loop.
cmplts32 switcher, bottom_i, loop_n
movi picker, switcher

# Add up the sum around the loop iteration.
pick32 top_sum, picker, init_sum, loopback_sum
add32 bottom_sum, top_sum, top_i
switch32 out_sum, loopback_sum, switcher, bottom_sum
```

DATAFLOW ASSEMBLY 1904
FIG. 19B

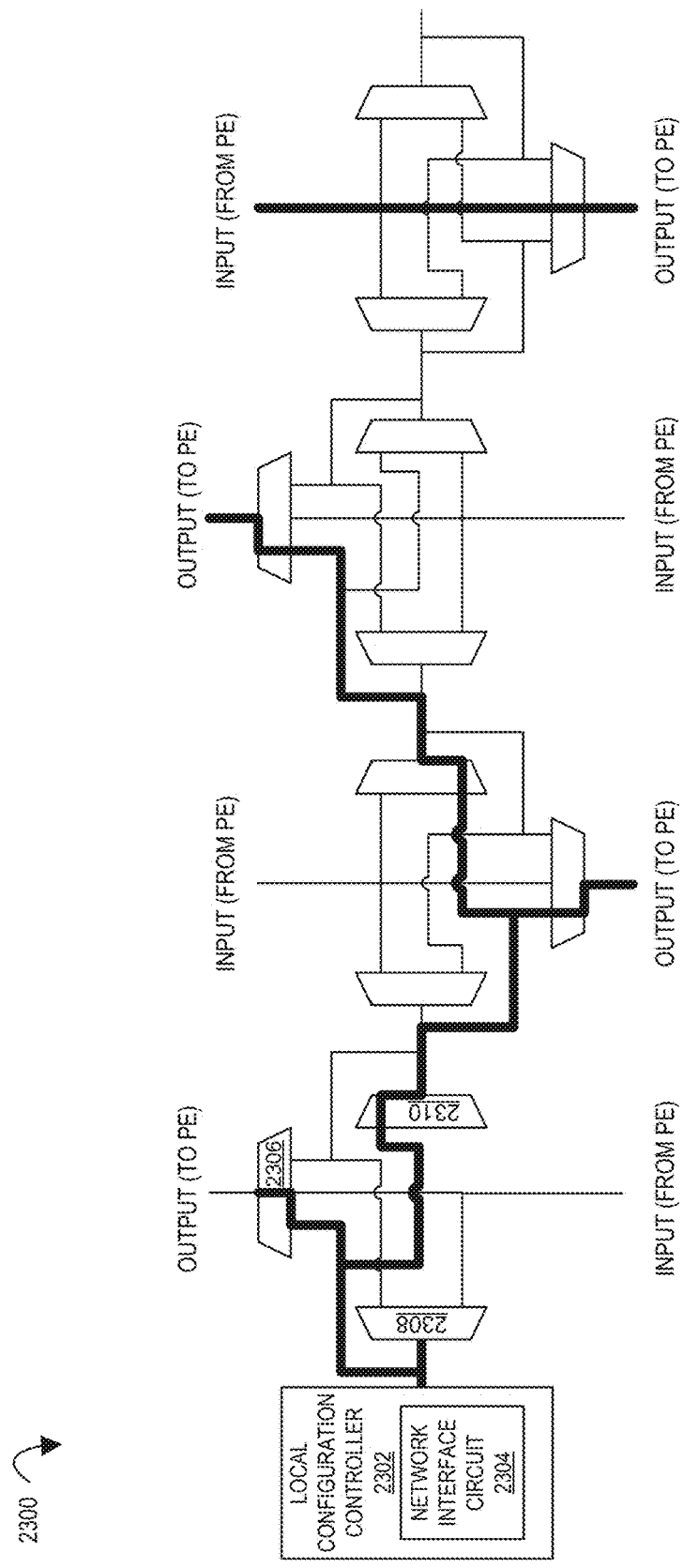

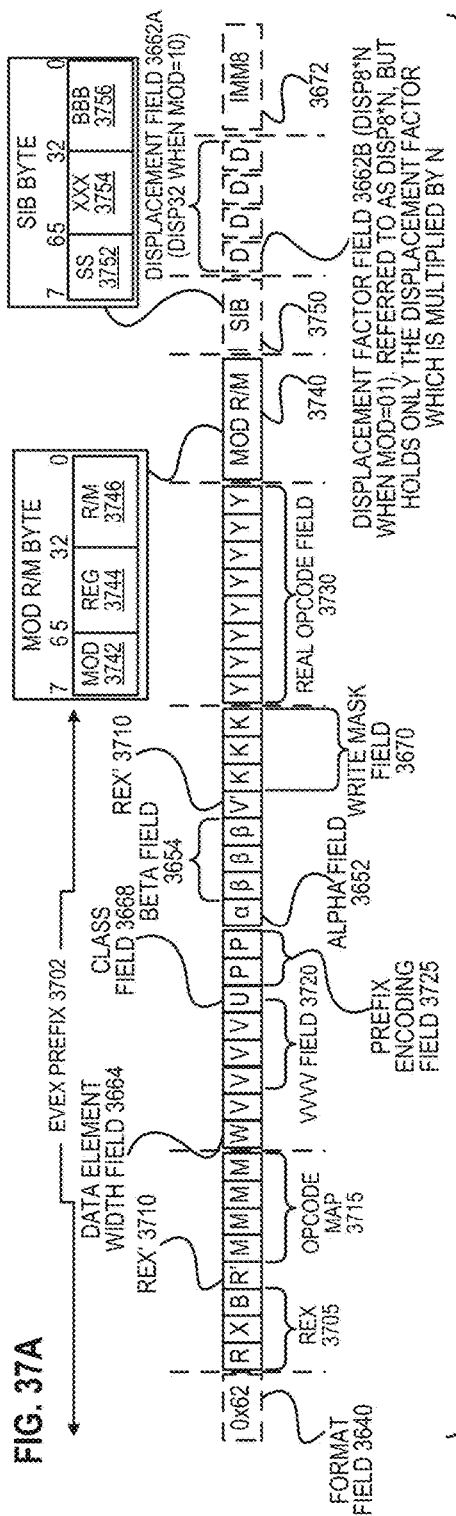
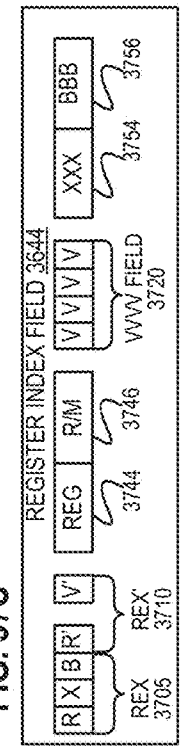
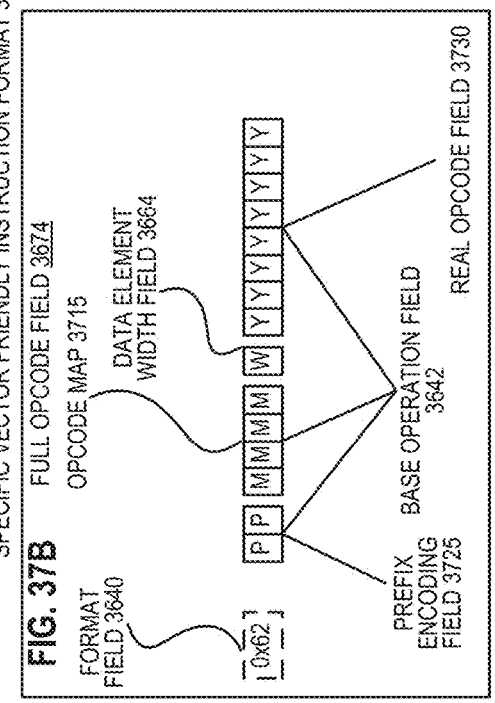
FIG. 37A
FIG. 37B
FIG. 37C

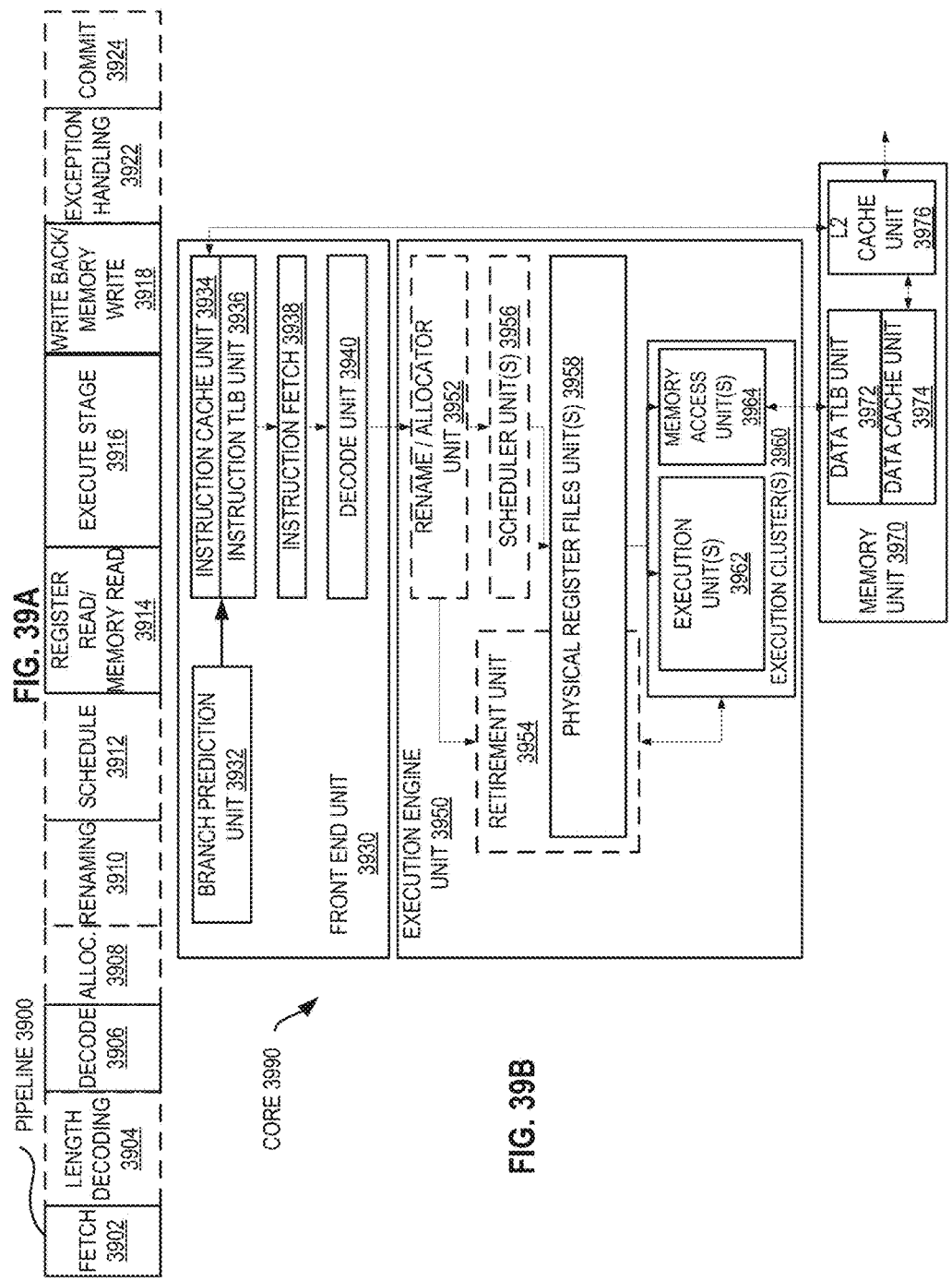

PROCESSORS, METHODS, AND SYSTEMS FOR A CONFIGURABLE SPATIAL ACCELERATOR WITH PERFORMANCE, CORRECTNESS, AND POWER REDUCTION FEATURES

STATEMENT REGARDING FEDERALLY SPONSORED RESEARCH AND DEVELOPMENT

This invention was made with Government support under contract number H98230-13-D-0124 awarded by the Department of Defense. The Government has certain rights in this invention.

TECHNICAL FIELD

The disclosure relates generally to electronics, and, more specifically, an embodiment of the disclosure relates to a configurable spatial accelerator.

BACKGROUND

A processor, or set of processors, executes instructions from an instruction set, e.g., the instruction set architecture (ISA). The instruction set is the part of the computer architecture related to programming, and generally includes the native data types, instructions, register architecture, addressing modes, memory architecture, interrupt and exception handling, and external input and output (I/O). It should be noted that the term instruction herein may refer to a macro-instruction, e.g., an instruction that is provided to the processor for execution, or to a micro-instruction, e.g., an instruction that results from a processor's decoder decoding macro-instructions.

BRIEF DESCRIPTION OF THE DRAWINGS

The present disclosure is illustrated by way of example and not limitation in the figures of the accompanying drawings, in which like references indicate similar elements and in which:

FIG. 3A illustrates a program source according to embodiments of the disclosure.

FIG. 3B illustrates a dataflow graph for the program source of FIG. 3A according to embodiments of the disclosure.

FIG. 3C illustrates an accelerator with a plurality of processing elements configured to execute the dataflow graph of FIG. 3B according to embodiments of the disclosure.

FIG. 5 illustrates a program source according to embodiments of the disclosure.

FIG. 7A illustrates a configurable data path network according to embodiments of the disclosure.

FIG. 7B illustrates a configurable flow control path network according to embodiments of the disclosure.

FIGS. 9A-B illustrate processing elements according to embodiments of the disclosure.

FIG. 9C-D relate to a buffer box according to embodiments of the disclosure.

FIG. 10A illustrates a request address file (RAF) circuit according to embodiments of the disclosure.

FIGS. 10B-M illustrate a technique for achieving program order in a spatial computing fabric according to embodiments of the disclosure.

FIG. 12A illustrates a floating-point multiplier partitioned into three regions (the result region, three potential carry regions, and the gated region) according to embodiments of the disclosure.

FIG. 17A illustrates sequential assembly code according to embodiments of the disclosure.

FIG. 17B illustrates dataflow assembly code for the sequential assembly code of FIG. 17A according to embodiments of the disclosure.

FIG. 18A illustrates C source code according to embodiments of the disclosure.

FIG. 18B illustrates dataflow assembly code for the C source code of FIG. 18A according to embodiments of the disclosure.

FIG. 19A illustrates C source code according to embodiments of the disclosure.

FIG. 19B illustrates dataflow assembly code for the C source code of FIG. 19A according to embodiments of the disclosure.

FIGS. 23A-23C illustrate a local configuration controller configuring a data path network according to embodiments of the disclosure.

FIG. 37A is a block diagram illustrating fields for the generic vector friendly instruction formats in FIGS. 36A and 36B according to embodiments of the disclosure.

FIG. 37B is a block diagram illustrating the fields of the specific vector friendly instruction format in FIG. 37A that make up a full opcode field according to one embodiment of the disclosure.

FIG. 37C is a block diagram illustrating the fields of the specific vector friendly instruction format in FIG. 37A that make up a register index field according to one embodiment of the disclosure.

FIG. 39A is a block diagram illustrating both an exemplary in-order pipeline and an exemplary register renaming, out-of-order issue/execution pipeline according to embodiments of the disclosure.

FIG. 39B is a block diagram illustrating both an exemplary embodiment of an in-order architecture core and an exemplary register renaming, out-of-order issue/execution architecture core to be included in a processor according to embodiments of the disclosure.

DETAILED DESCRIPTION

In the following description, numerous specific details are set forth. However, it is understood that embodiments of the disclosure may be practiced without these specific details. In other instances, well-known circuits, structures and techniques have not been shown in detail in order not to obscure the understanding of this description.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

A processor (e.g., having one or more cores) may execute instructions (e.g., a thread of instructions) to operate on data, for example, to perform arithmetic, logic, or other functions. For example, software may request an operation and a hardware processor (e.g., a core or cores thereof) may perform the operation in response to the request. One non-limiting example of an operation is a blend operation to input a plurality of vectors elements and output a vector with a blended plurality of elements. In certain embodiments, multiple operations are accomplished with the execution of a single instruction.

Exascale performance, e.g., as defined by the Department of Energy, may require system-level floating point performance to exceed $10^{18}$ floating point operations per second (exaFLOPs) or more within a given (e.g., 20 MW) power budget. Certain embodiments herein are directed to a configurable spatial accelerator (CSA) that targets high performance computing (HPC). Certain embodiments of a CSA target the direct execution of a dataflow graph to yield a computationally dense yet energy-efficient spatial microarchitecture which far exceeds conventional roadmap architectures. Below includes a description of the architectural philosophy of embodiments of a CSA and certain features thereof. As with any revolutionary architecture, programmability may be a risk. To mitigate this issue, embodiments of the CSA architecture have been co-designed with a compilation tool chain, which is also discussed below.

1. Introduction

Figure 1:
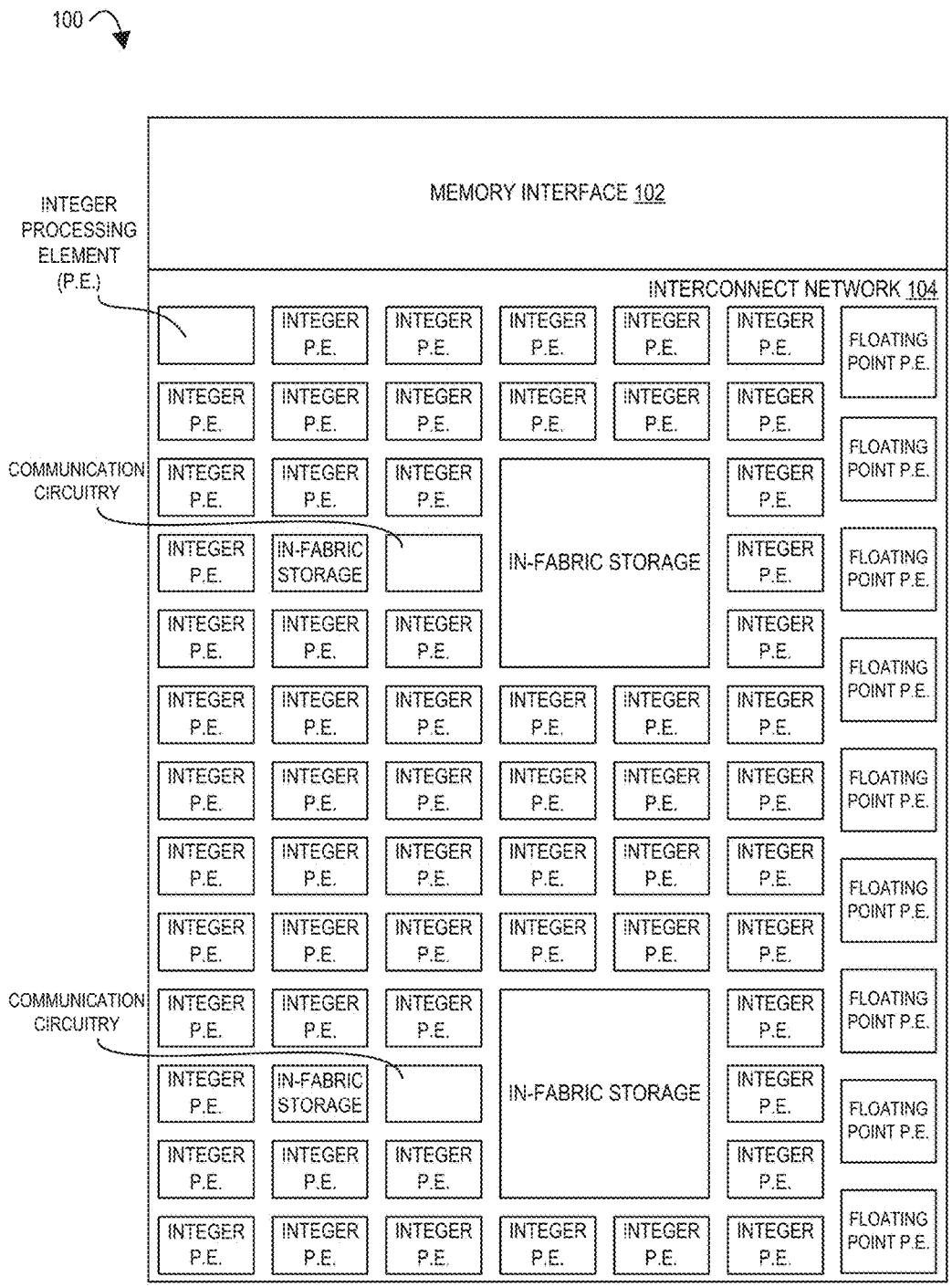
FIG. 1 illustrates an accelerator tile according to embodiments of the disclosure.

Exascale computing goals may require enormous system-level floating point performance (e.g., 1 ExaFLOPs) within an aggressive power budget (e.g., 20 MW). However, simultaneously improving the performance and energy efficiency of program execution with classical von Neumann architectures has become difficult: out-of-order scheduling, simultaneous multi-threading, complex register files, and other structures provide performance, but at high energy cost. Certain embodiments herein achieve performance and energy requirements simultaneously. Exascale computing power-performance targets may demand both high throughput and low energy consumption per operation. Certain embodiments herein provide this by providing for large numbers of low-complexity, energy-efficient processing (e.g., computational) elements which largely eliminate the control overheads of previous processor designs. Guided by this observation, certain embodiments herein include a configurable spatial accelerator (CSA), e.g., comprising an array of processing elements (PEs) connected by a set of lightweight, back-pressured networks. One example of a CSA tile is depicted in FIG. 1. Certain embodiments of processing (e.g., compute) elements are dataflow operators, e.g., multiple of a dataflow operator that only processes input data when both (i) the input data has arrived at the dataflow operator and (ii) there is space available for storing the output data, e.g., otherwise no processing is occurring. Certain embodiments (e.g., of an accelerator or CSA) do not utilize a triggered instruction.

FIG. 1 illustrates an accelerator tile 100 according to embodiments of the disclosure. Accelerator tile 100 may be a portion of a larger tile. Accelerator tile 100 executes a dataflow graph or graphs. A dataflow graph may generally refer to an explicitly parallel program description which arises in the compilation of sequential codes. Certain embodiments herein (e.g., CSAs) allow dataflow graphs to be directly configured onto the CSA array, e.g., rather than being transformed into sequential instruction streams. The derivation of a dataflow graph from a sequential compilation flow allows embodiments of a CSA to support familiar programming models and to directly (e.g., without using a table of work) execute existing high performance computing (HPC) code. CSA processing elements (PEs) may be energy efficient. In FIG. 1, memory interface 102 may couple to a memory (e.g., memory 202 in FIG. 2) to allow accelerator tile 100 to access (e.g., load and/store) data to the (e.g., off die) memory. Depicted accelerator tile 100 is a heterogeneous array comprised of several kinds of PEs coupled together via an interconnect network 104. Accelerator tile 100 may include one or more of integer arithmetic PEs, floating point arithmetic PEs, communication circuitry, and in-fabric storage. Dataflow graphs (e.g., compiled dataflow graphs) may be overlaid on the accelerator tile 100 for execution. In one embodiment, for a particular dataflow graph, each PE handles only one or two operations of the graph. The array of PEs may be heterogeneous, e.g., such that no PE supports the full CSA dataflow architecture and/or one or more PEs are programmed (e.g., customized) to perform only a few, but highly efficient operations. Certain embodiments herein thus yield an accelerator having an array of processing elements that is computationally dense compared to roadmap architectures and yet achieves approximately an order-of-magnitude gain in energy efficiency and performance relative to existing HPC offerings.

Performance increases may result from parallel execution within a (e.g., dense) CSA where each PE may execute simultaneously, e.g., if input data is available. Efficiency increases may result from the efficiency of each PE, e.g., where each PE's operation (e.g., behavior) is fixed once per configuration (e.g., mapping) step and execution occurs on local data arrival at the PE, e.g., without considering other fabric activity. In certain embodiments, a PE is (e.g., each a single) dataflow operator, for example, a dataflow operator that only processes input data when both (i) the input data has arrived at the dataflow operator and (ii) there is space available for storing the output data, e.g., otherwise no processing is occurring. These properties enable embodiments of the CSA to provide paradigm-shifting levels of performance and tremendous improvements in energy efficiency across a broad class of existing single-stream and parallel programs, e.g., all while preserving familiar HPC programming models. Certain embodiments of a CSA may target HPC such that floating-point energy efficiency is extremely important. Certain embodiments of the CSA not only deliver compelling improvements in performance and reductions in energy, they also deliver these gains to existing HPC programs written in mainstream HPC languages and for mainstream HPC frameworks. Certain embodiments of the CSA architecture (e.g., with compilation in mind) provide several extensions in direct support of the control-dataflow internal representations generated by modern compilers. Certain embodiments herein are direct to a CSA dataflow compiler, e.g., which can accept C, C++, and Fortran programming languages, to target a CSA architecture.

Section 2 below discloses embodiments of CSA architecture. In particular, novel embodiments of integrating memory within the dataflow execution model are disclosed. Section 3 delves into the microarchitectural details of embodiments of a CSA. In one embodiment, the main goal of a CSA is to support compiler produced programs. Section 4 below examines embodiments of a CSA compilation tool chain. The advantages of embodiments of a CSA are compared to other architectures in the execution of compiled codes in Section 5. Finally, the performance of embodiments of a CSA microarchitecture is discussed in Section 6, further CSA details are discussed in Section 7, and a summary is provided in Section 8.

2. Architecture

The goal of certain embodiments of a CSA is to rapidly and efficiently execute programs, e.g., programs produced by compilers. Certain embodiments of the CSA architecture provide programming abstractions that support the needs of compiler technologies and programming paradigms. Embodiments of the CSA execute dataflow graphs, e.g., a program manifestation that closely resembles the compiler's own internal representation (IR) of compiled programs. In this model, a program is represented as a dataflow graph comprised of nodes (e.g., vertices) drawn from a set of architecturally-defined dataflow operators (e.g., that encompass both computation and control operations) and edges which represent the transfer of data between dataflow operators. Execution may proceed by injecting dataflow tokens (e.g., that are or represent data values) into the dataflow graph. Tokens may flow between and be transformed at each node (e.g., vertex), for example, forming a complete computation. A sample dataflow graph and its derivation from high-level source code is shown in FIGS. 3A-3C, and FIG. 5 shows an example of the execution of a dataflow graph.

Embodiments of the CSA are configured for dataflow graph execution by providing exactly those dataflow-graph-execution supports required by compilers. In one embodiment, the CSA is an accelerator (e.g., an accelerator in FIG. 2) and it does not seek to provide some of the necessary but infrequently used mechanisms available on general purpose processing cores (e.g., a core in FIG. 2), such as system calls. Therefore, in this embodiment, the CSA can execute many codes, but not all codes. In exchange, the CSA gains significant performance and energy advantages. To enable the acceleration of code written in commonly used sequential languages, embodiments herein also introduce several novel architectural features to assist the compiler. One particular novelty is CSA's treatment of memory, a subject which has been ignored or poorly addressed previously. Embodiments of the CSA are also unique in the use of dataflow operators, e.g., as opposed to lookup tables (LUTs), as their fundamental architectural interface.

Figure 2:
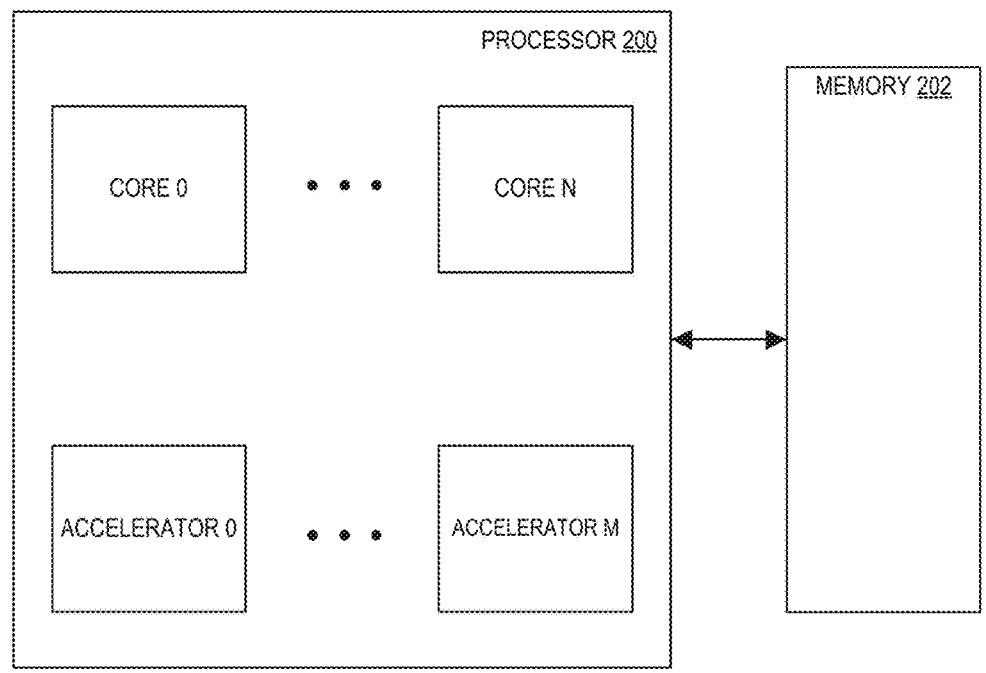
FIG. 2 illustrates a hardware processor coupled to a memory according to embodiments of the disclosure.

FIG. 2 illustrates a hardware processor 200 coupled to (e.g., connected to) a memory 202 according to embodiments of the disclosure. In one embodiment, hardware processor 200 and memory 202 are a computing system 201. In certain embodiments, one or more of accelerators is a CSA according to this disclosure. In certain embodiments, one or more of the cores in a processor are those cores disclosed herein. Hardware processor 200 (e.g., each core thereof) may include a hardware decoder (e.g., decode unit) and a hardware execution unit. Hardware processor 200 may include registers. Note that the figures herein may not depict all data communication couplings (e.g., connections). One of ordinary skill in the art will appreciate that this is to not obscure certain details in the figures. Note that a double headed arrow in the figures may not require two-way communication, for example, it may indicate one-way communication (e.g., to or from that component or device). Any or all combinations of communications paths may be utilized in certain embodiments herein. Depicted hardware processor 200 includes a plurality of cores (0 to N, where N may be 1 or more) and hardware accelerators (0 to M, where M may be 1 or more) according to embodiments of the disclosure. Hardware processor 200 (e.g., accelerator(s) and/or core(s) thereof) may be coupled to memory 202 (e.g., data storage device). Hardware decoder (e.g., of core) may receive an (e.g., single) instruction (e.g., macro-instruction) and decode the instruction, e.g., into micro-instructions and/or micro-operations. Hardware execution unit (e.g., of core) may execute the decoded instruction (e.g., macro-instruction) to perform an operation or operations. Turning back to embodiments of the CSA, dataflow operators are discussed next.

2.1 Dataflow Operators

The key architectural interface of embodiments of the accelerator (e.g., CSA) is the dataflow operator, e.g., as a direct representation of a node in a dataflow graph. From an operational perspective, dataflow operators behave in a streaming or data-driven fashion. Dataflow operators may execute as soon as their incoming operands become available. CSA dataflow execution may depend (e.g., only) on highly localized status, for example, resulting in a highly scalable architecture with a distributed, asynchronous execution model. Dataflow operators may include arithmetic dataflow operators, for example, one or more of floating point addition and multiplication, integer addition, subtraction, and multiplication, various forms of comparison, logical operators, and shift. However, embodiments of the CSA may also include a rich set of control operators which assist in the management of dataflow tokens in the program graph. Examples of these include a "pick" operator, e.g., which multiplexes two or more logical input channels into a single output channel, and a "switch" operator, e.g., which operates as a channel demultiplexor (e.g., outputting a single channel from two or more logical input channels). These operators may enable a compiler to implement control paradigms such as conditional expressions. Certain embodiments of a CSA may include a limited dataflow operator set (e.g., to relatively small number of operations) to yield dense and energy efficient PE microarchitectures. Certain embodiments may include dataflow operators for complex operations that are common in HPC code. The CSA dataflow operator architecture is highly amenable to deployment-specific extensions. For example, more complex mathematical dataflow operators, e.g., trigonometry functions, may be included in certain embodiments to accelerate certain mathematics-intensive HPC workloads. Similarly, a neural-network tuned extension may include dataflow operators for vectorized, low precision arithmetic.

FIG. 3A illustrates a program source according to embodiments of the disclosure. Program source code includes a multiplication function (func). FIG. 3B illustrates a dataflow graph 300 for the program source of FIG. 3A according to embodiments of the disclosure. Dataflow graph 300 includes a pick node 304, switch node 306, and multiplication node 308. A buffer may optionally be included along one or more of the communication paths. Depicted dataflow graph 300 may perform an operation of selecting input X with pick node 304, multiplying X by Y (e.g., multiplication node 308), and then outputting the result from the left output of the switch node 306. FIG. 3C illustrates an accelerator (e.g., CSA) with a plurality of processing elements 301 configured to execute the dataflow graph of FIG. 3B according to embodiments of the disclosure. More particularly, the dataflow graph 300 is overlaid into the array of processing elements 301 (e.g., and the (e.g., interconnect) network(s) therebetween), for example, such that each node of the dataflow graph 300 is represented as a dataflow operator in the array of processing elements 301. In one embodiment, one or more of the processing elements in the array of processing elements 301 is to access memory through memory interface 302). In one embodiment, pick node 304 of dataflow graph 300 thus corresponds (e.g., is represented by) to pick operator 304A, switch node 306 of dataflow graph 300 thus corresponds (e.g., is represented by) to switch operator 306A, and multiplier node 308 of dataflow graph 300 thus corresponds (e.g., is represented by) to multiplier operator 308A. Another processing element and/or a flow control path network may provide the control signals (e.g., control tokens) to the pick operator 304A and switch operator 306A to perform the operation in FIG. 3A. In one embodiment, array of processing elements 301 is configured to execute the dataflow graph 300 of FIG. 3B before execution begins. In one embodiment, compiler performs the conversion from FIG. 3A-3B. In one embodiment, the input of the dataflow graph nodes into the array of processing elements logically embeds the dataflow graph into the array of processing elements, e.g., as discussed further below, such that the input/output paths are configured to produce the desired result.

2.2 Latency Insensitive Channels

Communications arcs are the second major component of the dataflow graph. Certain embodiments of a CSA describe these arcs as latency insensitive channels, for example, in-order, back-pressured (e.g., not producing or sending output until there is a place to store the output), point-to-point communications channels. As with dataflow operators, latency insensitive channels are fundamentally asynchronous, giving the freedom to compose many types of networks to implement the channels of a particular graph. Latency insensitive channels may have arbitrarily long latencies and still faithfully implement the CSA architecture. However, in certain embodiments there is strong incentive in terms of performance and energy to make latencies as small as possible. Section 3.2 herein discloses a network microarchitecture in which dataflow graph channels are implemented in a pipelined fashion with no more than one cycle of latency. Embodiments of latency-insensitive channels provide a critical abstraction layer which may be leveraged with the CSA architecture to provide a number of runtime services to the applications programmer. For example, a CSA may leverage latency-insensitive channels in the implementation of the CSA configuration (the loading of a program onto the CSA array).

Figure 4:
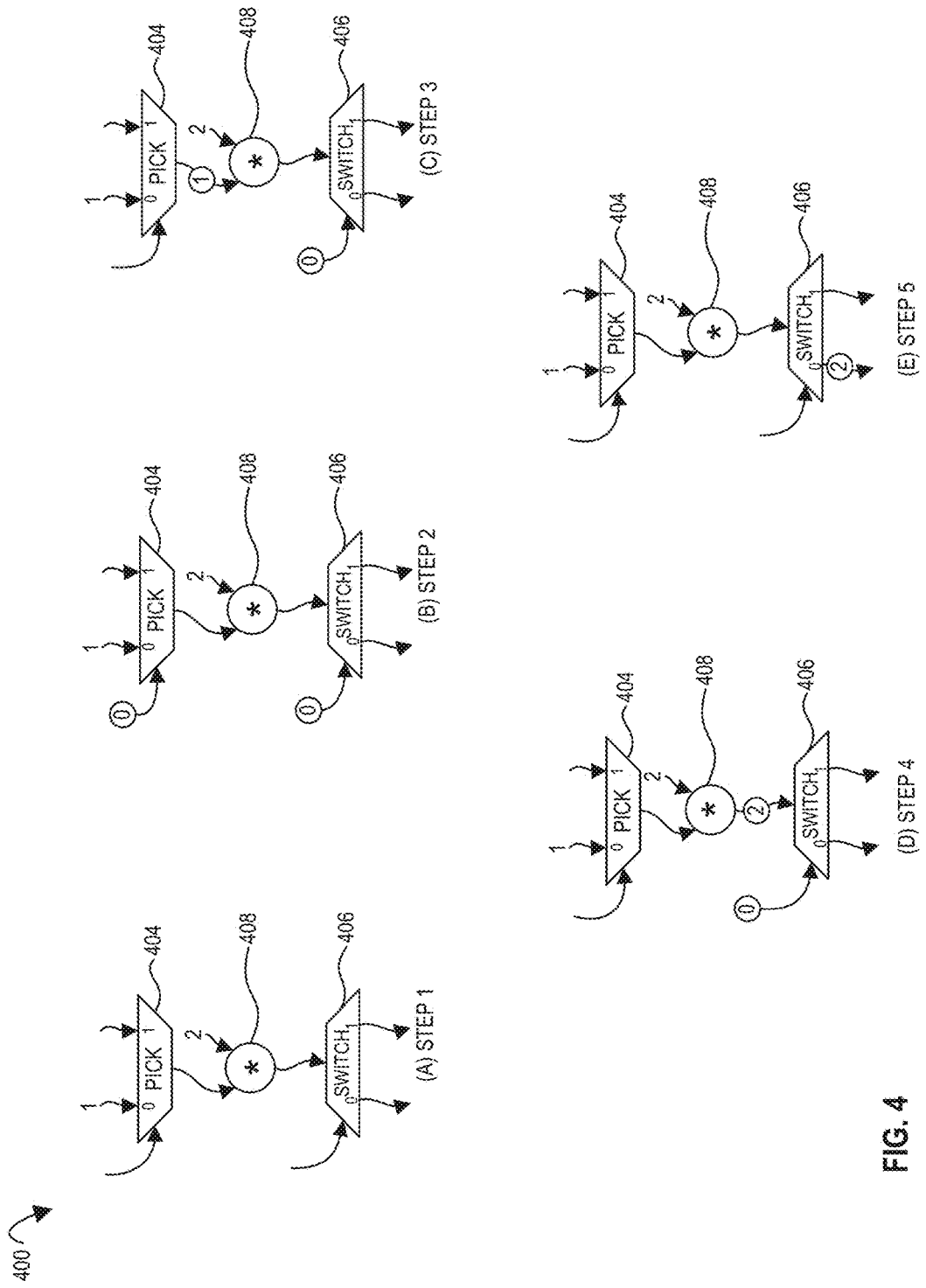
FIG. 4 illustrates an example execution of a dataflow graph according to embodiments of the disclosure.

FIG. 4 illustrates an example execution of a dataflow graph 400 according to embodiments of the disclosure. At step 1, input values (e.g., 1 for X in FIG. 3B and 2 for Y in FIG. 3B) may be loaded in dataflow graph 400 to perform a 1*2 multiplication operation. One or more of the data input values may be static (e.g., constant) in the operation (e.g., 1 for X and 2 for Y in reference to FIG. 3B) or updated during the operation. At step 2, a processing element (e.g., on a flow control path network) or other circuit outputs a zero to control input (e.g., mux control signal) of pick node 404 (e.g., to source a one from port "0" to its output) and outputs a zero to control input (e.g., mux control signal) of switch node 406 (e.g., to provide its input out of port "0" to a destination (e.g., a downstream processing element). At step 3, the data value of 1 is output from pick node 404 (e.g., and consumes its control signal "0" at the pick node 404) to multiplier node 408 to be multiplied with the data value of 2 at step 4. At step 4, the output of multiplier node 408 arrives at switch node 406, e.g., which causes switch node 406 to consume a control signal "0" to output the value of 2 from port "0" of switch node 406 at step 5. The operation is then complete. A CSA may thus be programmed accordingly such that a corresponding dataflow operator for each node performs the operations in FIG. 4. Although execution is serialized in this example, in principle all dataflow operations may execute in parallel. Steps are used in FIG. 4 to differentiate dataflow execution from any physical microarchitectural manifestation. In one embodiment, a downstream processing element is to send a signal (or not send a ready signal) (for example, on a flow control path network) to the switch 406 to stall the output from the switch 406, e.g., until the downstream processing element is ready (e.g., has storage room) for the output.

2.3 Memory

Dataflow architectures generally focus on communication and data manipulation with less attention paid to state. However, enabling real software, especially programs written in legacy sequential languages, requires significant attention to interfacing with memory. Certain embodiments of a CSA use architectural memory operations as their primary interface to (e.g., large) stateful storage. From the perspective of the dataflow graph, memory operations are similar to other dataflow operations, except that they have the side effect of updating a shared store. In particular, memory operations of certain embodiments herein have the same semantics as every other dataflow operator, for example, they "execute" when their operands, e.g., an address, are available and, after some latency, a response is produced. Certain embodiments herein explicitly decouple the operand input and result output such that memory operators are naturally pipelined and have the potential to produce many simultaneous outstanding requests, e.g., making them exceptionally well suited to the latency and bandwidth characteristics of a memory subsystem. Embodiments of a CSA provide basic memory operations such as load, which takes an address channel and populates a response channel with the values corresponding to the addresses, and a store. Embodiments of a CSA may also provide more advanced operations such as in-memory atomics and consistency operators. These operations may have similar semantics to their von Neumann counterparts. Embodiments of a CSA may accelerate existing programs described using sequential languages such as C and Fortran. A consequence of supporting these language models is addressing program memory order, e.g., the serial ordering of memory operations typically prescribed by these languages.

FIG. 5 illustrates a program source (e.g., C code) 500 according to embodiments of the disclosure. According to the memory semantics of the C programming language, memory copy (memcpy) should be serialized. However, memcpy may be parallelized with an embodiment of the CSA if arrays A and B are known to be disjoint. FIG. 5 further illustrates the problem of program order. In general, compilers cannot prove that array A is different from array B, e.g., either for the same value of index or different values of index across loop bodies. This is known as pointer or memory aliasing. Since compilers are to generate statically correct code, they are usually forced to serialize memory accesses. Typically, compilers targeting sequential von Neumann architectures use instruction ordering as a natural means of enforcing program order. However, embodiments of the CSA have no notion of instruction or instruction-based program ordering as defined by a program counter. In certain embodiments, incoming dependency tokens, e.g., which contain no architecturally visible information, are like all other dataflow tokens and memory operations may not execute until they have received a dependency token. In certain embodiments, memory operations produce an outgoing dependency token once their operation is visible to all logically subsequent, dependent memory operations. In certain embodiments, dependency tokens are similar to other dataflow tokens in a dataflow graph. For example, since memory operations occur in conditional contexts, dependency tokens may also be manipulated using control operators described in Section 2.1, e.g., like any other tokens. Dependency tokens may have the effect of serializing memory accesses, e.g., providing the compiler a means of architecturally defining the order of memory accesses.

2.4 Runtime Services

A primary architectural considerations of embodiments of the CSA involve the actual execution of user-level programs, but it may also be desirable to provide several support mechanisms which underpin this execution. Chief among these are configuration (in which a dataflow graph is loaded into the CSA), extraction (in which the state of an executing graph is moved to memory), and exceptions (in which mathematical, soft, and other types of errors in the fabric are detected and handled, possibly by an external entity). Section 3.6 below discusses the properties of a latency-insensitive dataflow architecture of an embodiment of a CSA to yield efficient, largely pipelined implementations of these functions. Conceptually, configuration may load the state of a dataflow graph into the interconnect and processing elements (e.g., fabric), e.g., generally from memory. During this step, all structures in the CSA may be loaded with a new dataflow graph and any dataflow tokens live in that graph, for example, as a consequence of a context switch. The latency-insensitive semantics of a CSA may permit a distributed, asynchronous initialization of the fabric, e.g., as soon as PEs are configured, they may begin execution immediately. Unconfigured PEs may backpressure their channels until they are configured, e.g., preventing communications between configured and unconfigured elements. The CSA configuration may be partitioned into privileged and user-level state. Such a two-level partitioning may enable primary configuration of the fabric to occur without invoking the operating system. During one embodiment of extraction, a logical view of the dataflow graph is captured and committed into memory, e.g., including all live control and dataflow tokens and state in the graph.

Extraction may also play a role in providing reliability guarantees through the creation of fabric checkpoints. Exceptions in a CSA may generally be caused by the same events that cause exceptions in processors, such as illegal operator arguments or reliability, availability, and serviceability (RAS) events. In certain embodiments, exceptions are detected at the level of dataflow operators, for example, checking argument values or through modular arithmetic schemes. Upon detecting an exception, a dataflow operator (e.g., circuit) may halt and emit an exception message, e.g., which contains both an operation identifier and some details of the nature of the problem that has occurred. In one embodiment, the dataflow operator will remain halted until it has been reconfigured. The exception message may then be communicated to an associated processor (e.g., core) for service, e.g., which may include extracting the graph for software analysis.

2.5 Tile-Level Architecture

Figure 6:
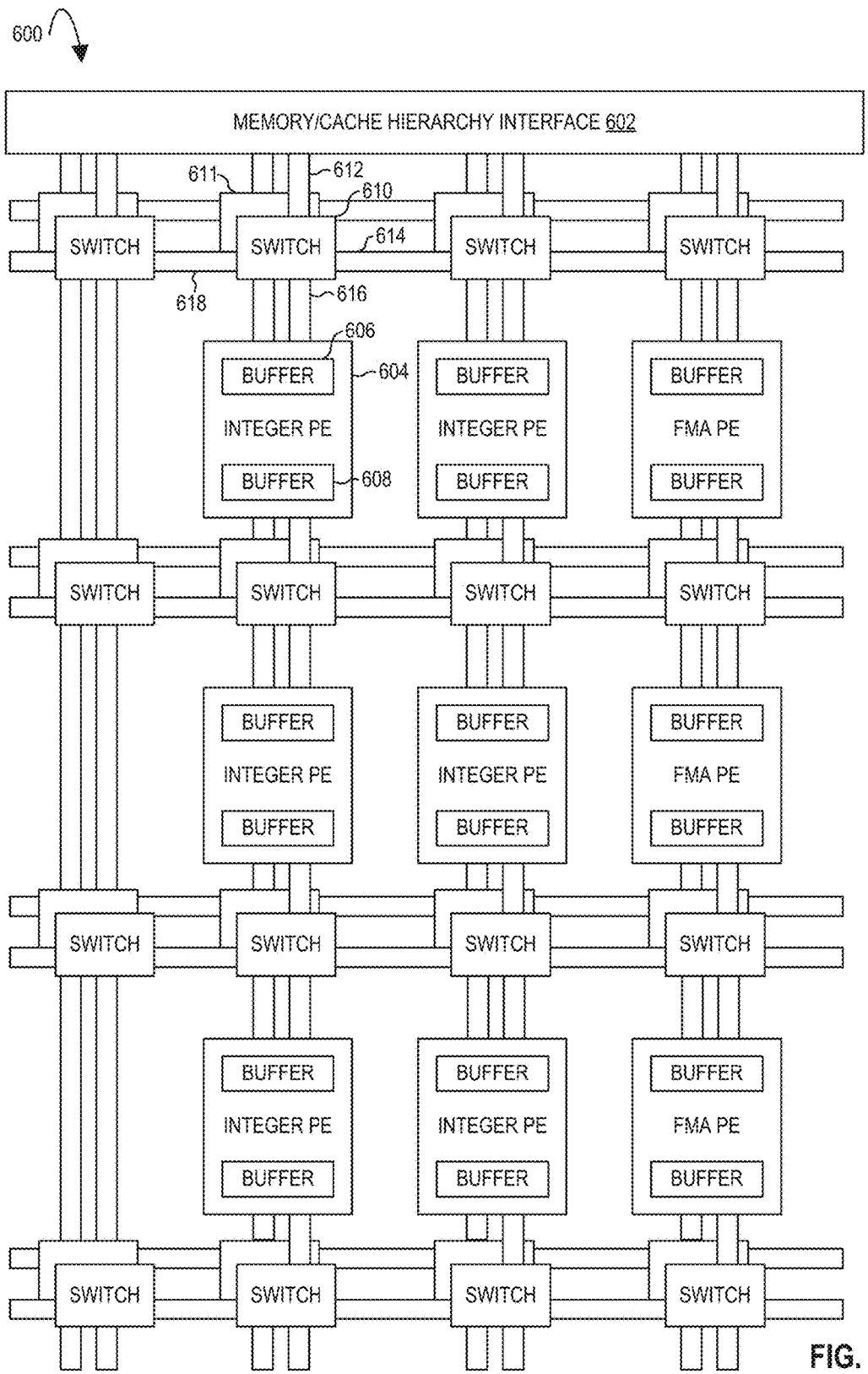
FIG. 6 illustrates an accelerator tile comprising an array of processing elements according to embodiments of the disclosure.
Figure 8:
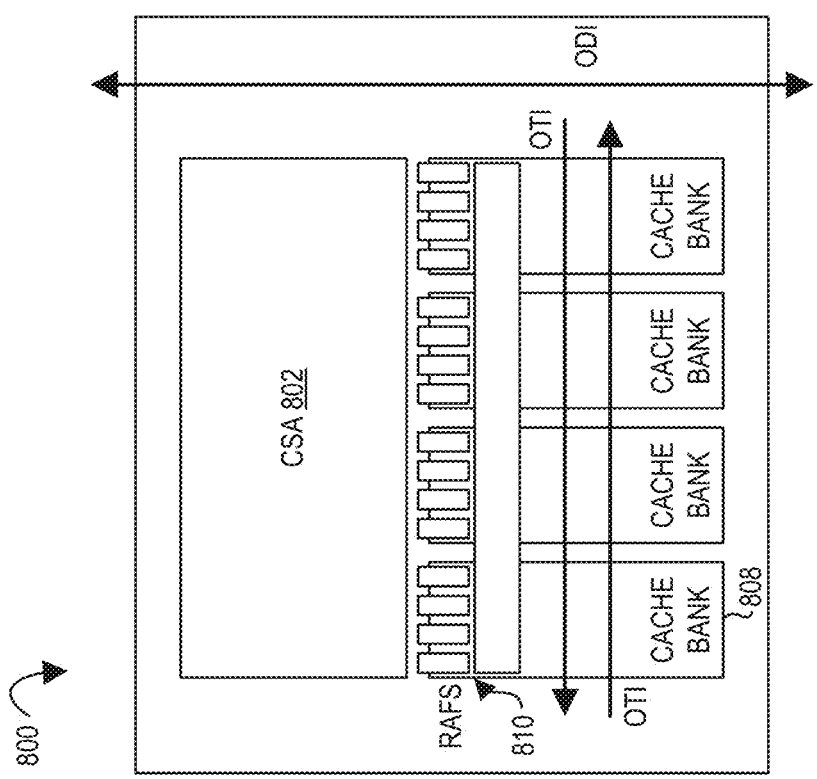
FIG. 8 illustrates a hardware processor tile comprising an accelerator according to embodiments of the disclosure.

Embodiments of the CSA computer architectures (e.g., targeting HPC and datacenter uses) are tiled. FIGS. 6 and 8 show tile-level deployments of a CSA. FIG. 8 shows a full-tile implementation of a CSA, e.g., which may be an accelerator of a processor with a core. A main advantage of this architecture is may be reduced design risk, e.g., such that the CSA and core are completely decoupled in manufacturing. In addition to allowing better component reuse, this may allow the design of components like the CSA Cache to consider only the CSA, e.g., rather than needing to incorporate the stricter latency requirements of the core. Finally, separate tiles may allow for the integration of CSA with small or large cores. One embodiment of the CSA captures most vector-parallel workloads such that most vector-style workloads run directly on the CSA, but in certain embodiments vector-style instructions in the core may be included, e.g., to support legacy binaries.

3. Microarchitecture

In one embodiment, the goal of the CSA microarchitecture is to provide a high quality implementation of each dataflow operator specified by the CSA architecture. Embodiments of the CSA microarchitecture provide that each processing element of the microarchitecture corresponds to approximately one node (e.g., entity) in the architectural dataflow graph. In certain embodiments, this results in microarchitectural elements that are not only compact, resulting in a dense computation array, but also energy efficient, for example, where processing elements (PEs) are both simple and largely unmultiplexed, e.g., executing a single dataflow operator for a configuration (e.g., programming) of the CSA. To further reduce energy and implementation area, a CSA may include a configurable, heterogeneous fabric style in which each PE thereof implements only a subset of dataflow operators. Peripheral and support subsystems, such as the CSA cache, may be provisioned to support the distributed parallelism incumbent in the main CSA processing fabric itself. Implementation of CSA microarchitectures may utilize dataflow and latency-insensitive communications abstractions present in the architecture. In certain embodiments, there is (e.g., substantially) a one-to-one correspondence between nodes in the compiler generated graph and the dataflow operators (e.g., dataflow operator compute elements) in a CSA.

Below is a discussion of an example CSA, followed by a more detailed discussion of the microarchitecture. Certain embodiments herein provide a CSA that allows for easy compilation, e.g., in contrast to an existing FPGA compilers that handle a small subset of a programming language (e.g., C or C++) and require many hours to compile even small programs.

Certain embodiments of a CSA architecture admit of heterogeneous coarse-grained operations, like double precision floating point. Programs may be expressed in fewer coarse grained operations, e.g., such that the disclosed compiler runs faster than traditional spatial compilers. Certain embodiments include a fabric with new processing elements to support sequential concepts like program ordered memory accesses. Certain embodiments implement hardware to support coarse-grained dataflow-style communication channels. This communication model is abstract, and very close to the control-dataflow representation used by the compiler. Certain embodiments herein include a network implementation that supports single-cycle latency communications, e.g., utilizing (e.g., small) PEs which support single control-dataflow operations. In certain embodiments, not only does this improve energy efficiency and performance, it simplifies compilation because the compiler makes a one-to-one mapping between high-level dataflow constructs and the fabric. Certain embodiments herein thus simplify the task of compiling existing (e.g., C, C++, or Fortran) programs to a CSA (e.g., fabric).

Energy efficiency may be a first order concern in modern computer systems. Certain embodiments herein provide a new schema of energy-efficient spatial architectures. In certain embodiments, these architectures form a fabric with a unique composition of a heterogeneous mix of small, energy-efficient, data-flow oriented processing elements (PEs) with a lightweight circuit-switched communications network (e.g., interconnect), e.g., with hardened support for flow control. Due to the energy advantages of each, the combination of these two components may form a spatial accelerator (e.g., as part of a computer) suitable for executing compiler-generated parallel programs in an extremely energy efficient manner. Since this fabric is heterogeneous, certain embodiments may be customized for different application domains by introducing new domain-specific PEs. For example, a fabric for high-performance computing might include some customization for double-precision, fused multiply-add, while a fabric targeting deep neural networks might include low-precision floating point operations.

An embodiment of a spatial architecture schema, e.g., as exemplified in FIG. 6, is the composition of light-weight processing elements (PE) connected by an inter-PE network. Generally, PEs may comprise dataflow operators, e.g., where once all input operands arrive at the dataflow operator, some operation (e.g., micro-instruction or set of micro-instructions) is executed, and the results are forwarded to downstream operators. Control, scheduling, and data storage may therefore be distributed amongst the PEs, e.g., removing the overhead of the centralized structures that dominate classical processors.

Programs may be converted to dataflow graphs that are mapped onto the architecture by configuring PEs and the network to express the control-dataflow graph of the program. Communication channels may be flow-controlled and fully back-pressured, e.g., such that PEs will stall if either source communication channels have no data or destination communication channels are full. In one embodiment, at runtime, data flow through the PEs and channels that have been configured to implement the operation (e.g., an accelerated algorithm). For example, data may be streamed in from memory, through the fabric, and then back out to memory.

Embodiments of such an architecture may achieve remarkable performance efficiency relative to traditional multicore processors: compute (e.g., in the form of PEs) may be simpler, more energy efficient, and more plentiful than in larger cores, and communications may be direct and mostly short-haul, e.g., as opposed to occurring over a wide, full-chip network as in typical multicore processors. Moreover, because embodiments of the architecture are extremely parallel, a number of powerful circuit and device level optimizations are possible without seriously impacting throughput, e.g., low leakage devices and low operating voltage. These lower-level optimizations may enable even greater performance advantages relative to traditional cores. The combination of efficiency at the architectural, circuit, and device levels yields of these embodiments are compelling. Embodiments of this architecture may enable larger active areas as transistor density continues to increase.

Embodiments herein offer a unique combination of dataflow support and circuit switching to enable the fabric to be smaller, more energy-efficient, and provide higher aggregate performance as compared to previous architectures. FPGAs are generally tuned towards fine-grained bit manipulation, whereas embodiments herein are tuned toward the double-precision floating point operations found in HPC applications. Certain embodiments herein may include a FPGA in addition to a CSA according to this disclosure.

Certain embodiments herein combine a light-weight network with energy efficient dataflow processing elements to form a high-throughput, low-latency, energy-efficient HPC fabric. This low-latency network may enable the building of processing elements with fewer functionalities, for example, only one or two instructions and perhaps one architecturally visible register, since it is efficient to gang multiple PEs together to form a complete program.

Relative to a processor core, CSA embodiments herein may provide for more computational density and energy efficiency. For example, when PEs are very small (e.g., compared to a core), the CSA may perform many more operations and have much more computational parallelism than a core, e.g., perhaps as many as 16 times the number of FMAs as a vector processing unit (VPU). To utilize all of these computational elements, the energy per operation is very low in certain embodiments.

The energy advantages our embodiments of this dataflow architecture are many. Parallelism is explicit in dataflow graphs and embodiments of the CSA architecture spend no or minimal energy to extract it, e.g., unlike out-of-order processors which must re-discover parallelism each time an instruction is executed. Since each PE is responsible for a single operation in one embodiment, the register files and ports counts may be small, e.g., often only one, and therefore use less energy than their counterparts in core. Certain CSAs include many PEs, each of which holds live program values, giving the aggregate effect of a huge register file in a traditional architecture, which dramatically reduces memory accesses. In embodiments where the memory is multi-ported and distributed, a CSA may sustain many more outstanding memory requests and utilize more bandwidth than a core. These advantages may combine to yield an energy level per watt that is only a small percentage over the cost of the bare arithmetic circuitry. For example, in the case of an integer multiply, a CSA may consume no more than 25% more energy than the underlying multiplication circuit. Relative to one embodiment of a core, an integer operation in that CSA fabric consumes less than ⅕₀th of the energy per integer operation.

From a programming perspective, the application-specific malleability of embodiments of the CSA architecture yields significant advantages over a vector processing unit (VPU). In traditional, inflexible architectures, the number of functional units, like floating divide or the various transcendental mathematical functions, must be chosen at design time based on some expected use case. In embodiments of the CSA architecture, such functions may be configured (e.g., by a user and not a manufacturer) into the fabric based on the requirement of each application. Application throughput may thereby be further increased. Simultaneously, the compute density of embodiments of the CSA improves by avoiding hardening such functions, and instead provision more instances of primitive functions like floating multiplication. These advantages may be significant in HPC workloads, some of which spend 75% of floating execution time in transcendental functions.

Certain embodiments of the CSA represent a significant advance as a dataflow-oriented spatial architecture, e.g., the PEs of this disclosure may be smaller, but also more energy-efficient. These improvements may directly result from the combination of dataflow-oriented PEs with a lightweight, circuit-switched interconnect, for example, which has single-cycle latency, e.g., in contrast to a packet-switched network (e.g., with, at a minimum, a 300% higher latency). Certain embodiments of PEs support 32-bit or 64-bit operation. Certain embodiments herein permit the introduction of new application-specific PEs, for example, for machine learning or security, and not merely a homogeneous combination. Certain embodiments herein combine lightweight dataflow-oriented processing elements with a lightweight, low-latency network to form an energy efficient computational fabric.

In order for certain spatial architectures to be successful, programmers are to configure them with relatively little effort, e.g., while obtaining significant power and performance superiority over sequential cores. Certain embodiments herein provide for a CSA (e.g., spatial fabric) that is easily programmed (e.g., by a compiler), power efficient, and highly parallel. Certain embodiments herein provide for a (e.g., interconnect) network that achieves these three goals. From a programmability perspective, certain embodiments of the network provide flow controlled channels, e.g., which correspond to the control-dataflow graph (CDFG) model of execution used in compilers. Certain network embodiments utilize dedicated, circuit switched links, such that program performance is easier to reason about, both by a human and a compiler, because performance is predictable. Certain network embodiments offer both high bandwidth and low latency. Certain network embodiments (e.g., static, circuit switching) provides a latency of 0 to 1 cycle (e.g., depending on the transmission distance.) Certain network embodiments provide for a high bandwidth by laying out several networks in parallel, e.g., and in low-level metals. Certain network embodiments communicate in low-level metals and over short distances, and thus are very power efficient.

Certain embodiments of networks include architectural support for flow control. For example, in spatial accelerators composed of small processing elements (PEs), communications latency and bandwidth may be critical to overall program performance. Certain embodiments herein provide for a light-weight, circuit-switched network which facilitates communication between PEs in spatial processing arrays, such as the spatial array shown in FIG. 6, and the micro-architectural control features necessary to support this network. Certain embodiments of a network enable the construction of point-to-point, flow controlled communications channels which support the communications of the dataflow oriented processing elements (PEs). In addition to point-to-point communications, certain networks herein also support multicast communications. Communications channels may be formed by statically configuring the network to from virtual circuits between PEs. Circuit-switching techniques herein may decrease communications latency and commensurately minimize network buffering, e.g., resulting in both high performance and high energy efficiency. In certain embodiments of a network, inter-PE latency may be as low as a zero cycles, meaning that the downstream PE may operate on data in the cycle after it is produced. To obtain even higher bandwidth, and to admit more programs, multiple networks may be laid out in parallel, e.g., as shown in FIG. 6.

Spatial architectures, such as the one shown in FIG. 6, may be the composition of lightweight processing elements connected by an inter-PE network. Programs, viewed as dataflow graphs, may be mapped onto the architecture by configuring PEs and the network. Generally, PEs may be configured as dataflow operators, and once all input operands arrive at the PE, some operation may then occur, and the result are forwarded to the desired downstream PEs. PEs may communicate over dedicated virtual circuits which are formed by statically configuring a circuit-switched communications network. These virtual circuits may be flow controlled and fully back-pressured, e.g., such that PEs will stall if either the source has no data or the destination is full. At runtime, data may flow through the PEs implementing the mapped algorithm. For example, data may be streamed in from memory, through the fabric, and then back out to memory. Embodiments of this architecture may achieve remarkable performance efficiency relative to traditional multicore processors: for example, where compute, in the form of PEs, is simpler and more numerous than larger cores and communication are direct, e.g., as opposed to an extension of the memory system.

FIG. 6 illustrates an accelerator tile 600 comprising an array of processing elements (PEs) according to embodiments of the disclosure. The interconnect network is depicted as circuit-switched, statically configured communications channels. For example, a set of channels coupled together by a switch (e.g., switch 610 in a first network and switch 611 in a second network). The first network and second network may be separate or coupled together. For example, switch 610 may couple one or more of the four data paths (612, 614, 616, 618) together, e.g., as configured to perform an operation according to a dataflow graph. In one embodiment, the number of data paths is any plurality. Processing element (e.g., processing element 604) may be as disclosed herein, for example, as in FIG. 9A. Accelerator tile 600 includes a memory/cache hierarchy interface 602, e.g., to interface the accelerator tile 600 with a memory and/or cache. A data path (e.g., 618) may extend to another tile or terminate, e.g., at the edge of a tile. A processing element may include an input buffer (e.g., buffer 606) and an output buffer (e.g., buffer 608).

Operations may be executed based on the availability of their inputs and the status of the PE. A PE may obtain operands from input channels and write results to output channels, although internal register state may also be used. Certain embodiments herein include a configurable dataflow-friendly PE. FIG. 9A shows a detailed block diagram of one such PE: the integer PE. This PE consists of several I/O buffers, an ALU, a storage register, some instruction registers, and a scheduler. Each cycle, the scheduler may select an instruction for execution based on the availability of the input and output buffers and the status of the PE. The result of the operation may then be written to either an output buffer or to a (e.g., local to the PE) register. Data written to an output buffer may be transported to a downstream PE for further processing. This style of PE may be extremely energy efficient, for example, rather than reading data from a complex, multi-ported register file, a PE reads the data from a register. Similarly, instructions may be stored directly in a register, rather than in a virtualized instruction cache.

Instruction registers may be set during a special configuration step. During this step, auxiliary control wires and state, in addition to the inter-PE network, may be used to stream in configuration across the several PEs comprising the fabric. As result of parallelism, certain embodiments of such a network may provide for rapid reconfiguration, e.g., a tile sized fabric may be configured in less than about 10 microseconds.

FIG. 9A represents one example configuration of a processing element, e.g., in which all architectural elements are minimally sized. In other embodiments, each of the components of a processing element is independently scaled to produce new PEs. For example, to handle more complicated programs, a larger number of instructions that are executable by a PE may be introduced. A second dimension of configurability is in the function of the PE arithmetic logic unit (ALU). In FIG. 9A, an integer PE is depicted which may support addition, subtraction, and various logic operations. Other kinds of PEs may be created by substituting different kinds of functional units into the PE. An integer multiplication PE, for example, might have no registers, a single instruction, and a single output buffer. Certain embodiments of a PE decompose a fused multiply add (FMA) into separate, but tightly coupled floating multiply and floating add units to improve support for multiply-add-heavy workloads. PEs are discussed further below.

FIG. 7A illustrates a configurable data path network 700 (e.g., of network one or network two discussed in reference to FIG. 6) according to embodiments of the disclosure. Network 700 includes a plurality of multiplexers (e.g., multiplexers 702, 704, 706) that may be configured (e.g., via their respective control signals) to connect one or more data paths (e.g., from PEs) together. FIG. 7B illustrates a configurable flow control path network 701 (e.g., network one or network two discussed in reference to FIG. 6) according to embodiments of the disclosure. A network may be a light-weight PE-to-PE network. Certain embodiments of a network may be thought of as a set of composable primitives for the construction of distributed, point-to-point data channels. FIG. 7A shows a network that has two channels enabled, the bold black line and the dotted black line. The bold black line channel is multicast, e.g., a single input is sent to two outputs. Note that channels may cross at some points within a single network, even though dedicated circuit-switched paths are formed between channel endpoints. Furthermore, this crossing may not introduce a structural hazard between the two channels, so that each operates independently and at full bandwidth.

Implementing distributed data channels may include two paths, illustrated in FIGS. 7A-7B. The forward, or data path, carries data from a producer to a consumer. Multiplexors may be configured to steer data and valid bits from the producer to the consumer, e.g., as in FIG. 7A. In the case of multicast, the data will be steered to multiple consumer endpoints. The second portion of this embodiment of a network is the flow control or backpressure path, which flows in reverse of the forward data path, e.g., as in FIG. 7B. Consumer endpoints may assert when they are ready to accept new data. These signals may then be steered back to the producer using configurable logical conjunctions, labelled as (e.g., backflow) flowcontrol function in FIG. 7B. In one embodiment, each flowcontrol function circuit may be a plurality of switches (e.g., muxes), for example, similar to FIG. 7A. The flow control path may handle returning control data from consumer to producer. Conjunctions may enable multicast, e.g., where each consumer is ready to receive data before the producer assumes that it has been received. In one embodiment, a PE is a PE that has a dataflow operator as its architectural interface. Additionally or alternatively, in one embodiment a PE may be any kind of PE (e.g., in the fabric), for example, but not limited to, a PE that has an instruction pointer, triggered instruction, or state machine based architectural interface.

The network may be statically configured, e.g., in addition to PEs being statically configured. During the configuration step, configuration bits may be set at each network component. These bits control, for example, the mux selections and flow control functions. A network may comprise a plurality of networks, e.g., a data path network and a flow control path network. A network or plurality of networks may utilize paths of different widths (e.g., a first width, and a narrower or wider width). In one embodiment, a data path network has a wider (e.g., bit transport) width than the width of a flow control path network. In one embodiment, each of a first network and a second network includes their own data path network and flow control path network, e.g., data path network A and flow control path network A and wider data path network B and flow control path network B.

Certain embodiments of a network are bufferless, and data is to move between producer and consumer in a single cycle. Certain embodiments of a network are also boundless, that is, the network spans the entire fabric. In one embodiment, one PE is to communicate with any other PE in a single cycle. In one embodiment, to improve routing bandwidth, several networks may be laid out in parallel between rows of PEs.

Relative to FPGAs, certain embodiments of networks herein have three advantages: area, frequency, and program expression. Certain embodiments of networks herein operate at a coarse grain, e.g., which reduces the number configuration bits, and thereby the area of the network. Certain embodiments of networks also obtain area reduction by implementing flow control logic directly in circuitry (e.g., silicon). Certain embodiments of hardened network implementations also enjoy a frequency advantage over FPGA. Because of an area and frequency advantage, a power advantage may exist where a lower voltage is used at throughput parity. Finally, certain embodiments of networks provide better high-level semantics than FPGA wires, especially with respect to variable timing, and thus those certain embodiments are more easily targeted by compilers. Certain embodiments of networks herein may be thought of as a set of composable primitives for the construction of distributed, point-to-point data channels.

In certain embodiments, a multicast source may not assert its data valid unless it receives a ready signal from each sink. Therefore, an extra conjunction and control bit may be utilized in the multicast case.

Like certain PEs, the network may be statically configured. During this step, configuration bits are set at each network component. These bits control, for example, the mux selection and flow control function. The forward path of our network requires some bits to swing its muxes. In the example shown in FIG. 7A, four bits per hop are required: the east and west muxes utilize one bit each, while the southbound mux utilize two bits. In this embodiment, four bits may be utilized for the data path, but 7 bits may be utilized for the flow control function (e.g., in the flow control path network). Other embodiments may utilize more bits, for example, if a CSA further utilizes a north-south direction. The flow control function may utilize a control bit for each direction from which flow control can come. This may enable the setting of the sensitivity of the flow control function statically. The table 1 below summarizes the Boolean algebraic implementation of the flow control function for the network in FIG. 7B, with configuration bits capitalized. In this example, seven bits are utilized.

TABLE 1

| | Flow Implementation |
|---|---|
| readyToEast | (EAST_WEST_SENSTIVE+readyFromWest) * (EAST_SOUTH_SENSTIVE+readyFromSouth) |
| readyToWest | (WEST_EAST_SENSITIVE+readyFromEast) * (WEST_SOUTH_SENISITIVE+readyFromSouth) |
| readyToNorth | (NORTH_WEST_SENSITIVE+readyFromWest) * (NORTH_EAST_SENSITIVE+readyFromEast) * (NORTH_SOUTH_SENSITIVE+readyFromSouth) |

For the third flow control box from the left in FIG. 7B, EAST WEST SENSITIVE and NORTH SOUTH SENSITIVE are depicted as set to implement the flow control for the bold line and dotted line channels, respectively.

FIG. 8 illustrates a hardware processor tile 800 comprising an accelerator 802 according to embodiments of the disclosure. Accelerator 802 may be a CSA according to this disclosure. Tile 800 includes a plurality of cache banks (e.g., cache bank 808). Request address file (RAF) circuits 810 may be included, e.g., as discussed below in Section 3.2. ODI may refer to an On Die Interconnect, e.g., an interconnect stretching across an entire die connecting up all the tiles. OTI may refer to an On Tile Interconnect, for example, stretching across a tile, e.g., connecting cache banks on the tile together.

3.1 Processing Elements

In certain embodiments, a CSA includes an array of heterogeneous PEs, in which the fabric is composed of several types of PEs each of which implement only a subset of the dataflow operators. By way of example, FIG. 9A shows a provisional implementation of a PE capable of implementing a broad set of the integer and control operations. Other PEs, including those supporting floating point addition, floating point multiplication, buffering, and certain control operations may have a similar implementation style, e.g., with the appropriate (dataflow operator) circuitry substituted for the ALU. PEs (e.g., dataflow operators) of a CSA may be configured (e.g., programmed) before the beginning of execution to implement a particular dataflow operation from among the set that the PE supports. A configuration may include one or two control words which specify an opcode controlling the ALU, steer the various multiplexors within the PE, and actuate dataflow into and out of the PE channels. Dataflow operators may be implemented by microcoding these configurations bits. The depicted integer PE 900 in FIG. 9A is organized as a single-stage logical pipeline flowing from top to bottom. Data enters PE 900 from one of set of local networks, where it is registered in an input buffer for subsequent operation. Each PE may support a number of wide, data-oriented and narrow, control-oriented channels. The number of provisioned channels may vary based on PE functionality, but one embodiment of an integer-oriented PE has 2 wide and 1-2 narrow input and output channels. Although the integer PE is implemented as a single-cycle pipeline, other pipelining choices may be utilized. For example, multiplication PEs may have multiple pipeline stages.

PE execution may proceed in a dataflow style. Based on the configuration microcode, the scheduler may examine the status of the PE ingress and egress buffers, and, when all the inputs for the configured operation have arrived and the egress buffer of the operation is available, orchestrates the actual execution of the operation by a dataflow operator (e.g., on the ALU). The resulting value may be placed in the configured egress buffer. Transfers between the egress buffer of one PE and the ingress buffer of another PE may occur asynchronously as buffering becomes available. In certain embodiments, PEs are provisioned such that at least one dataflow operation completes per cycle. Section 2 discussed dataflow operator encompassing primitive operations, such as add, xor, or pick. Certain embodiments may provide advantages in energy, area, performance, and latency. In one embodiment, with an extension to a PE control path, more fused combinations may be enabled. In one embodiment, the width of the processing elements is 64 bits, e.g., for the heavy utilization of double-precision floating point computation in HPC and to support 64-bit memory addressing.

3.2 Communications Networks

Embodiments of the CSA microarchitecture provide a hierarchy of networks which together provide an implementation of the architectural abstraction of latency-insensitive channels across multiple communications scales. The lowest level of CSA communications hierarchy may be the local network. The local network may be statically circuit switched, e.g., using configuration registers to swing multiplexor(s) in the local network data-path to form fixed electrical paths between communicating PEs. In one embodiment, the configuration of the local network is set once per dataflow graph, e.g., at the same time as the PE configuration. In one embodiment, static, circuit switching optimizes for energy, e.g., where a large majority (perhaps greater than 95%) of CSA communications traffic will cross the local network. A program may include terms which are used in multiple expressions. To optimize for this case, embodiments herein provide for hardware support for multicast within the local network. Several local networks may be ganged together to form routing channels, e.g., which are interspersed (as a grid) between rows and columns of PEs. As an optimization, several local networks may be included to carry control tokens. In comparison to a FPGA interconnect, a CSA local network may be routed at the granularity of the data-path, and another difference may be a CSA's treatment of control. One embodiment of a CSA local network is explicitly flow controlled (e.g., back-pressured). For example, for each forward data-path and multiplexor set, a CSA is to provide a backward-flowing flow control path that is physically paired with the forward data-path. The combination of the two microarchitectural paths may provide a low-latency, low-energy, low-area, point-to-point implementation of the latency-insensitive channel abstraction. In one embodiment, a CSA's flow control lines are not visible to the user program, but they may be manipulated by the architecture in service of the user program. For example, the exception handling mechanisms described in Section 2.2 may be achieved by pulling flow control lines to a "not present" state upon the detection of an exceptional condition. This action may not only gracefully stall those parts of the pipeline which are involved in the offending computation, but may also preserve the machine state leading up the exception, e.g., for diagnostic analysis. The second network layer, e.g., the mezzanine network, may be a shared, packet-switched network. The mezzanine network (e.g., the network schematically indicated by the dotted box in FIG. 22) may provide more general, long range communications at the cost of latency, bandwidth, and energy. In well-routed programs, most communications may occur on the local network, and thus mezzanine network provisioning will be considerably reduced in comparison, for example, each PE may connect to multiple local networks, but the CSA will provision only one mezzanine endpoint per logical neighborhood of PEs. Since the mezzanine is effectively a shared network, each mezzanine network may carry multiple logically independent channels, e.g., and be provisioned with multiple virtual channels. In one embodiment, the main function of the mezzanine network is to provide wide-range communications in-between PEs and between PEs and memory. In addition to this capability, the mezzanine may also operate as a runtime support network, e.g., by which various services may access the complete fabric in a user-program-transparent manner. In this capacity, the mezzanine endpoint may function as a controller for its local neighborhood, for example, during CSA configuration. To form channels spanning a CSA tile, three subchannels and two local network channels (which carry traffic to and from a single channel in the mezzanine network) may be utilized. In one embodiment, one mezzanine channel is utilized, e.g., one mezzanine and two local=3 total network hops.

The composability of channels across network layers may be extended to higher level network layers at the inter-tile, inter-die, and fabric granularities.

FIG. 9A illustrates a processing element 900 according to embodiments of the disclosure. In one embodiment, operation configuration register 919 is loaded during configuration (e.g., mapping) and specifies the particular operation (or operations) this processing (e.g., compute) element is to perform. Register 920 activity may be controlled by that operation (an output of mux 916, e.g., controlled by the scheduler 914). Scheduler 914 may schedule an operation or operations of processing element 900, for example, when input data and control input arrives. Control input buffer 922 is connected to local network 902 (e.g., and local network 902 may include a data path network as in FIG. 7A and a flow control path network as in FIG. 7B) and is loaded with a value when it arrives (e.g., the network has a data bit(s) and valid bit(s)). Control output buffer 932, data output buffer 934, and/or data output buffer 936 may receive an output of processing element 900, e.g., as controlled by the operation (an output of mux 916). Status register 938 may be loaded whenever the ALU 918 executes (also controlled by output of mux 916). Data in control input buffer 922 and control output buffer 932 may be a single bit. Mux 921 (e.g., operand A) and mux 923 (e.g., operand B) may source inputs.

For example, suppose the operation of this processing (e.g., compute) element is (or includes) what is called call a pick in FIG. 3B. The processing element 900 then is to select data from either data input buffer 924 or data input buffer 926, e.g., to go to data output buffer 934 (e.g., default) or data output buffer 936. The control bit in 922 may thus indicate a 0 if selecting from data input buffer 924 or a 1 if selecting from data input buffer 926.

For example, suppose the operation of this processing (e.g., compute) element is (or includes) what is called call a switch in FIG. 3B. The processing element 900 is to output data to data output buffer 934 or data output buffer 936, e.g., from data input buffer 924 (e.g., default) or data input buffer 926. The control bit in 922 may thus indicate a 0 if outputting to data output buffer 934 or a 1 if outputting to data output buffer 936.

Multiple networks (e.g., interconnects) may be connected to a processing element, e.g., (input) networks 902, 904, 906 and (output) networks 908, 910, 912. The connections may be switches, e.g., as discussed in reference to FIGS. 7A and 7B. In one embodiment, each network includes two sub-networks (or two channels on the network), e.g., one for the data path network in FIG. 7A and one for the flow control (e.g., backpressure) path network in FIG. 7B. As one example, local network 902 (e.g., set up as a control interconnect) is depicted as being switched (e.g., connected) to control input buffer 922. In this embodiment, a data path (e.g., network as in FIG. 7A) may carry the control input value (e.g., bit or bits) (e.g., a control token) and the flow control path (e.g., network) may carry the backpressure signal (e.g., backpressure or no-backpressure token) from control input buffer 922, e.g., to indicate to the upstream producer (e.g., PE) that a new control input value is not to be loaded into (e.g., sent to) control input buffer 922 until the backpressure signal indicates there is room in the control input buffer 922 for the new control input value (e.g., from a control output buffer of the upstream producer). In one embodiment, the new control input value may not enter control input buffer 922 until both (i) the upstream producer receives the "space available" backpressure signal from "control input" buffer 922 and (ii) the new control input value is sent from the upstream producer, e.g., and this may stall the processing element 900 until that happens (and space in the target, output buffer(s) is available).

Data input buffer 924 and data input buffer 926 may perform similarly, e.g., local network 904 (e.g., set up as a data (as opposed to control) interconnect) is depicted as being switched (e.g., connected) to data input buffer 924. In this embodiment, a data path (e.g., network as in FIG. 7A) may carry the data input value (e.g., bit or bits) (e.g., a dataflow token) and the flow control path (e.g., network) may carry the backpressure signal (e.g., backpressure or no-backpressure token) from data input buffer 924, e.g., to indicate to the upstream producer (e.g., PE) that a new data input value is not to be loaded into (e.g., sent to) data input buffer 924 until the backpressure signal indicates there is room in the data input buffer 924 for the new data input value (e.g., from a data output buffer of the upstream producer). In one embodiment, the new data input value may not enter data input buffer 924 until both (i) the upstream producer receives the "space available" backpressure signal from "data input" buffer 924 and (ii) the new data input value is sent from the upstream producer, e.g., and this may stall the processing element 900 until that happens (and space in the target, output buffer(s) is available). A control output value and/or data output value may be stalled in their respective output buffers (e.g., 932, 934, 936) until a backpressure signal indicates there is available space in the input buffer for the downstream processing element(s).

A processing element 900 may be stalled from execution until its operands (e.g., a control input value and its corresponding data input value or values) are received and/or until there is room in the output buffer(s) of the processing element 900 for the data that is to be produced by the execution of the operation on those operands.

Figure 9B:
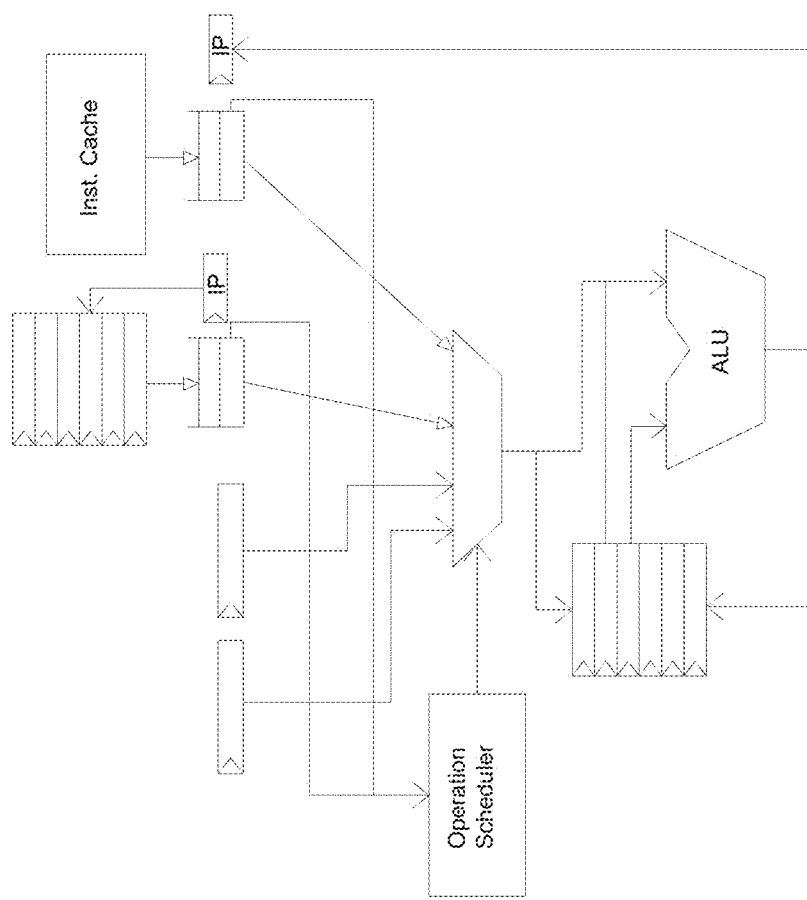

FIG. 9B illustrates an integrated processing element 900 according to embodiments of the invention. Generally, spatial arrays include dense, lightweight PEs, which for parallel applications can supply high performance at low energy levels. However, some portions of applications are either not sufficiently parallel or are relatively infrequent. Implementing these portions of the application in the fabric may result in poor performance, poor area utilization, or both. In these cases, an integrated PE according to embodiments of the invention, capable of handling larger program descriptions, may be desired. This integrated PE is differentiated by its instruction fetching capabilities, which seeks to bridge the gap between fine grained, low instruction complexity PEs and classical instruction-pointer-based processors.

In embodiments, a PE datapath may include several kinds of control selection in combination. PEs may be formed by choosing among the control options. At execution and depending on dynamic operating conditions, the PE may select among these control streams. An integrated control paradigm expands and combines several other control paradigms: triggered instructions, guarded atomic actions, and sequential execution. To this end, designers may construct new PEs featuring any or all of these paradigms, potentially in simultaneous combination, for use in embodiments of the invention.

FIG. 9B illustrates a schema of a PE with variable control paradigms combined together. This PE is an example in which two sequential instruction streams are combined, with two triggered instructions allowing for the description of large programs while retaining some of the asynchronous features of triggered instructions, such as rapid handling of asynchronous events. This schema may also be used to implement a form of a guarded atomic action paradigm. Some embodiments allow only single control stream or sets of control streams that are known to be independent to be simultaneously scheduled.

FIGS. 9C-D relate to a buffer box according to embodiments of the invention. A buffer box is a hardware block that provides buffering between dataflow operators in a dataflow system, for performance and/or correctness. The buffer box provides a programmable set of buffers usable by dataflow graphs. The basic operating mode is a set of queues, which may be composed to form larger buffers. The buffer box may have several other modes in addition to a basic first-in-first-out queue mode.

FIG. 9C illustrates the microarchitecture of the buffer box. Several individually configured buffers are collocated, with configurable control. Multiplexors may be configured to concatenate several buffers to form a contiguous resource. Dataflow operators interface to the storage elements by way of flow controlled buffer interfaces.

In embodiments, features of the buffer box may include: configurability (analogous to configuring of PEs), communication to and from the buffer box is also on the local network (flow-controlled statically configured virtual circuits), and operations are performed by the buffer box when data arrives (addresses and/or data for stores). Multiple buffer boxes may be combined to build larger self-similar structures.

FIG. 9D summarizes the number of input and output channels required for each of the buffer box operating modes. Fused read/write uses a narrow control channel to select between read and write.

3.3 Memory Interface

The request address file (RAF) circuit, a simplified version of which is shown in FIG. 10A, may be responsible for executing memory operations and serves as an intermediary between the CSA fabric and the memory hierarchy. As such, the main microarchitectural task of the RAF may be to rationalize the out-of-order memory subsystem with the in-order semantics of CSA fabric. In this capacity, the RAF circuit may be provisioned with completion buffers, e.g., queue-like structures that re-order memory responses and return them to the fabric in the request order. The second major functionality of the RAF circuit may be to provide support in the form of address translation and a page walker. Incoming virtual addresses may be translated to physical addresses using a channel-associative translation lookaside buffer (TLB). To provide ample memory bandwidth, each CSA tile may include multiple RAF circuits. Like the various PEs of the fabric, the RAF circuits may operate in a dataflow-style by checking for the availability of input arguments and output buffering, if required, before selecting a memory operation to execute. Unlike some PEs, however, the RAF circuit is multiplexed among several co-located memory operations. A multiplexed RAF circuit may be used to minimize the area overhead of its various subcomponents, e.g., to share the Accelerator Cache Interface (ACI) port (described in more detail in Section 3.4), shared virtual memory (SVM) support hardware, mezzanine network interface, and other hardware management facilities. However, there are some program characteristics that may also motivate this choice. In one embodiment, a (e.g., valid) dataflow graph is to poll memory in a shared virtual memory system. Memory-latency-bound programs, like graph traversals, may utilize many separate memory operations to saturate memory bandwidth due to memory-dependent control flow. Although each RAF may be multiplexed, a CSA may include multiple (e.g., between 8 and 32) RAFs at a tile granularity to ensure adequate cache bandwidth. RAFs may communicate with the rest of the fabric via both the local network and the mezzanine network. Where RAFs are multiplexed, each RAF may be provisioned with several ports into the local network. These ports may serve as a minimum-latency, highly-deterministic path to memory for use by latency-sensitive or high-bandwidth memory operations. In addition, a RAF may be provisioned with a mezzanine network endpoint, e.g., which provides memory access to runtime services and distant user-level memory accessors.

FIG. 10A illustrates a request address file (RAF) circuit 1000 according to embodiments of the disclosure. In one embodiment, at configuration time, the memory load and store operations that were in a dataflow graph are specified in registers 1010. The arcs to those memory operations in the dataflow graphs may then be connected to the input queues 1022, 1024, and 1026. The arcs from those memory operations are thus to leave completion buffers 1028, 1030, or 1032. Dependency tokens (which may be single bits) arrive into queues 1018 and 1020. Dependency tokens are to leave from queue 1016. Dependency token counter 1014 may be a compact representation of a queue and track a number of dependency tokens used for any given input queue. If the dependency token counters 1014 saturate, no additional dependency tokens may be generated for new memory operations. Accordingly, a memory ordering circuit (e.g., a RAF in FIG. 11) may stall scheduling new memory operations until the dependency token counters 1014 becomes unsaturated.

As an example for a load, an address arrives into queue 1022 which the scheduler 1012 matches up with a load in 1010. A completion buffer slot for this load is assigned in the order the address arrived. Assuming this particular load in the graph has no dependencies specified, the address and completion buffer slot are sent off to the memory system by the scheduler (e.g., via memory command 1042). When the result returns to mux 1040 (shown schematically), it is stored into the completion buffer slot it specifies (e.g., as it carried the target slot all along though the memory system). The completion buffer sends results back into local network (e.g., local network 1002, 1004, 1006, or 1008) in the order the addresses arrived.

Stores may be similar except both address and data have to arrive before any operation is sent off to the memory system.

FIGS. 10B-M illustrate a technique for achieving program order in a spatial computing fabric according to embodiments of the disclosure. A spatial computing fabric executes graphs. Both data dependencies and control-flow dependencies are represented in the graph and are handled as expected. Memory accesses are different. The only restriction in a graph between two memory accesses is any data or control-flow dependency they might be restricted by. There is no other program-order dependency, which means those two memory accesses may be executed whenever the graph execution has the appropriate addresses and if one or more is a store whenever any data needed to fulfill the store has been obtained. The two memory accesses are not guaranteed to be in an originally expected program order. Therefore, a technique for achieving program order in a spatial computing fabric according to embodiments of the invention may be desired.

Figure 10B:
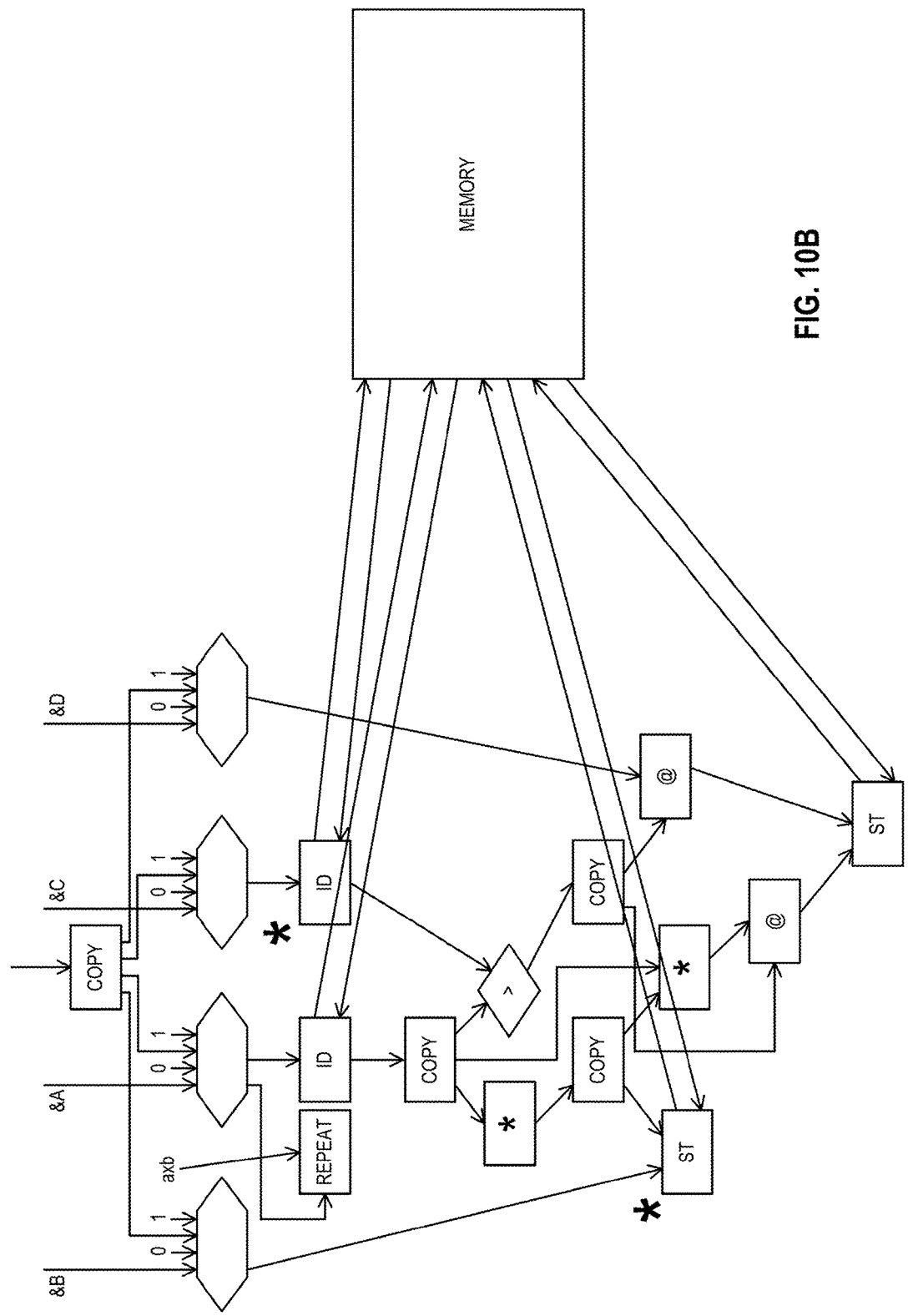
Figure 10C:
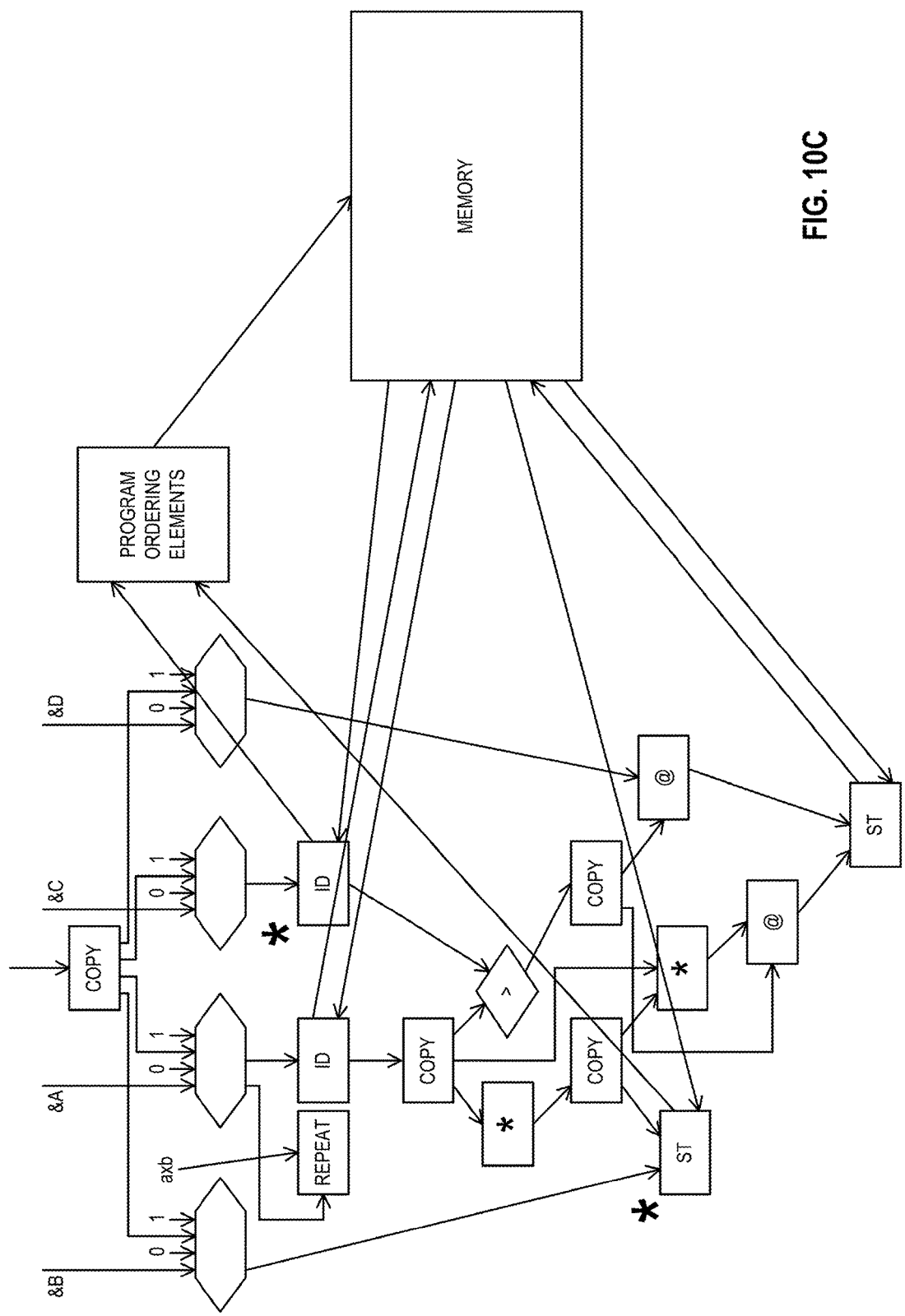

FIG. 10B illustrates a graph running on a spatial computing fabric and the connection to memory for the memory accesses in the graph. Note that in FIG. 10B, there are four memory accesses and two of them are marked with asterisks. Assume that the two memory accesses marked by the asterisks cannot be determined to be independent and at least one of them is a store, the effect of the use of an embodiment of the invention is illustrated in FIG. 10C. FIG. 10C shows that certain memory accesses are processed specially, to preserve any necessary dependencies by running them in program-order. The way this is accomplished is described below.

Embodiments of the invention include three features: a "path will be reached" operator that executes path-reachability equations, an order operator that produces an ordered stream of accesses in program order for the accesses on its inputs, and a memory disambiguation operator that optimizes the ordered stream to produce more performance. In addition, each of the inputs to the order operator will be configured to operate on either a singleton access or a stream of memory accesses. This introduces the concept of an operator that work on streams and not just individual values. This is quite powerful and will show up in other operators in a spatial fabric.

In the code fragment in FIG. 10D, certain basic blocks are labeled (A) to (I). These blocks are straight-line sections of code that may include many expressions. Formulas may be written based upon the conditionals of the corresponding if statements that define whether one of the particular basic blocks (A)-(I) will be executed. This is illustrated in the path reachability equations of FIG. 10E. In FIG. 10D, basic block (G) will be executed if both cond4 and cond5 are true and if, according to FIG. 10E, the reachability formula is in fact "cond4 && cond5".

Figure 10F:
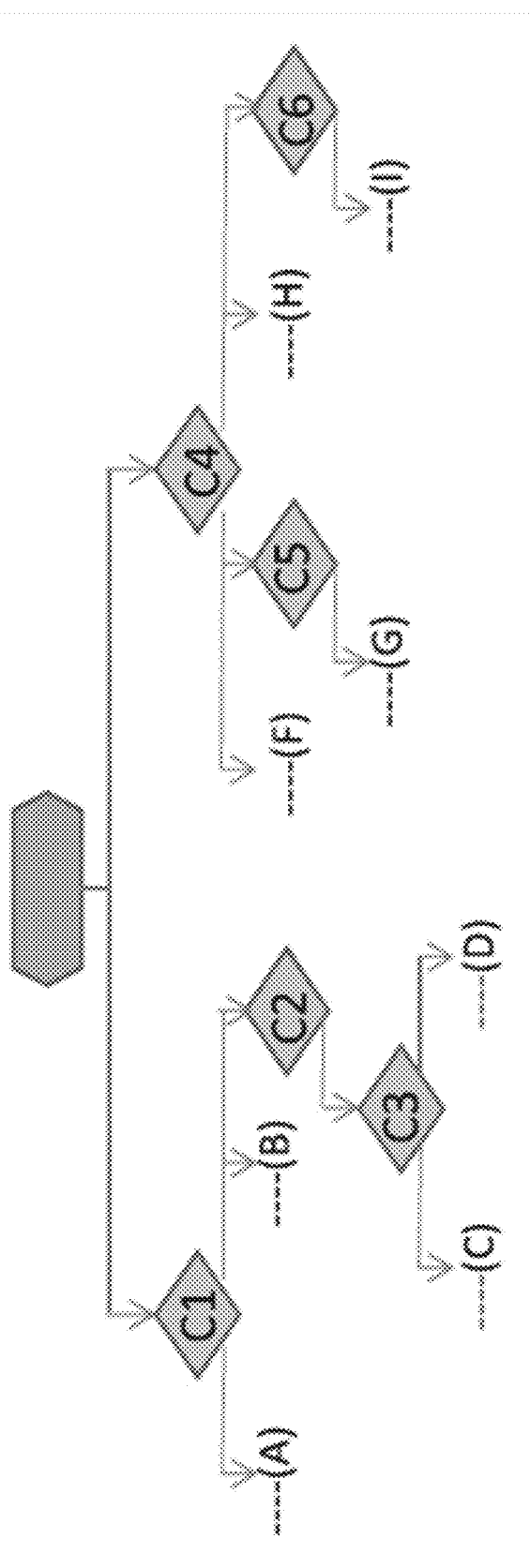

A graph of the code in FIG. 10D is shown in FIG. 10F. Each of the comparison operators (shown as diamonds in FIG. 10F) produces a one-bit result that indicates if the condition calculated by the comparison operator is true or not. These one-bit results may be combined to produce a result that indicates whether a particular path of the graph will be executed in a particular iteration. The operator that combines these one-bit conditional values together is called a "path will reach" operator and is shown in FIG. 10G.

Figure 10G:
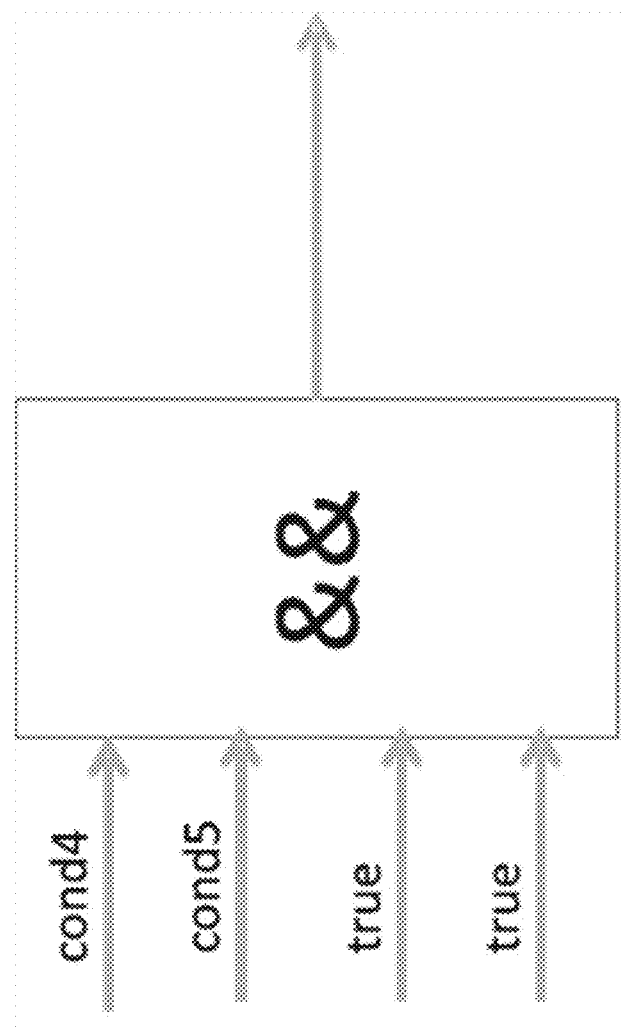

The "&&" operator in FIG. 10G, also known as the "path will reach" operator, will read the condition predicates (indicated by the input arrows) one at a time (removing them from the channel) from top to bottom. The first predicate with a false indication will pass false to the output and quit processing the input predicates. Note that no further predicates will be examined for this iteration, which matches the program control flow of the code by never examining predicates that are on control-flows that will not be executed for a particular iteration. The operator will now start back with the first predicate to execute for the next iteration by waiting for a valid value (true or false) to arrive and initiate processing of that iteration's reachability equation.

Figure 10H:
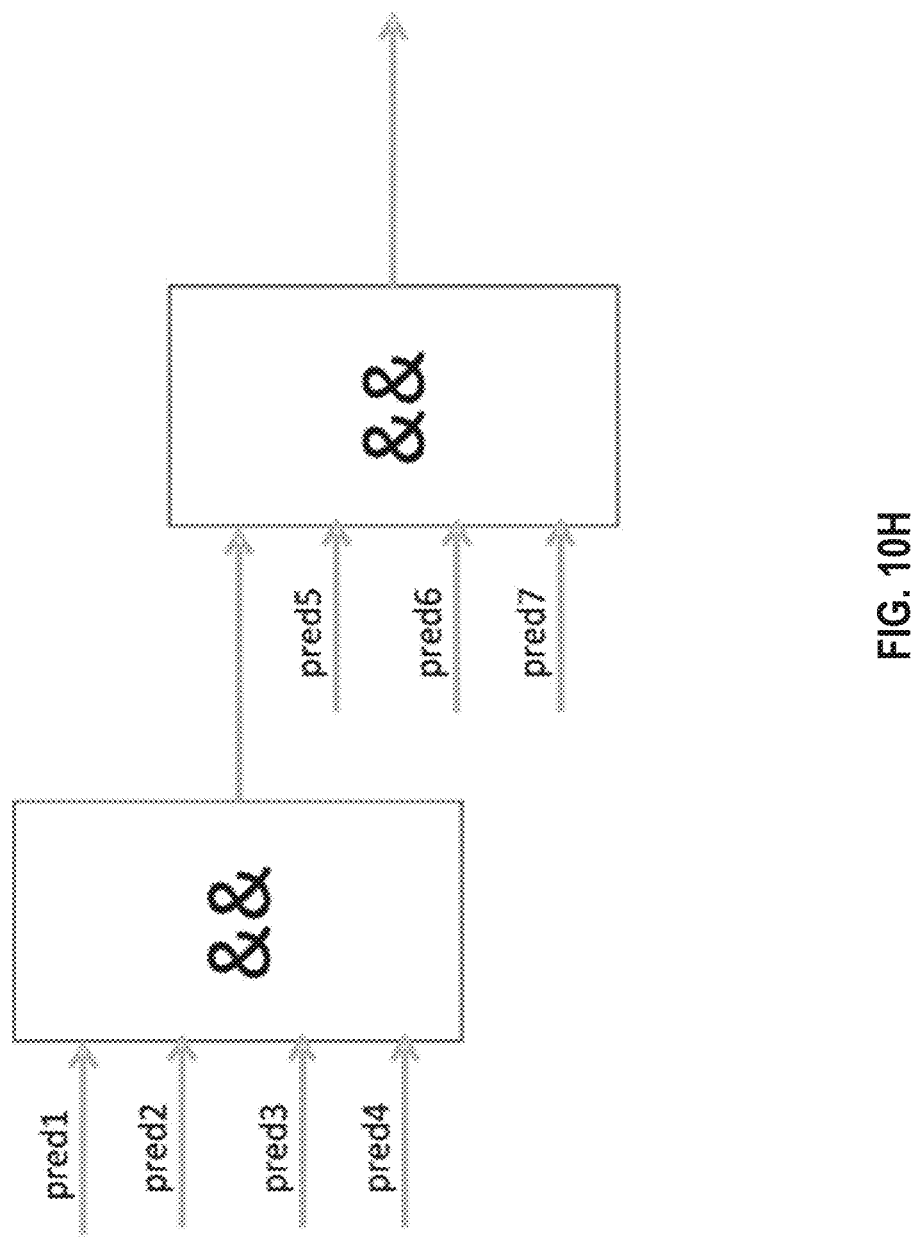
Figure 10I:
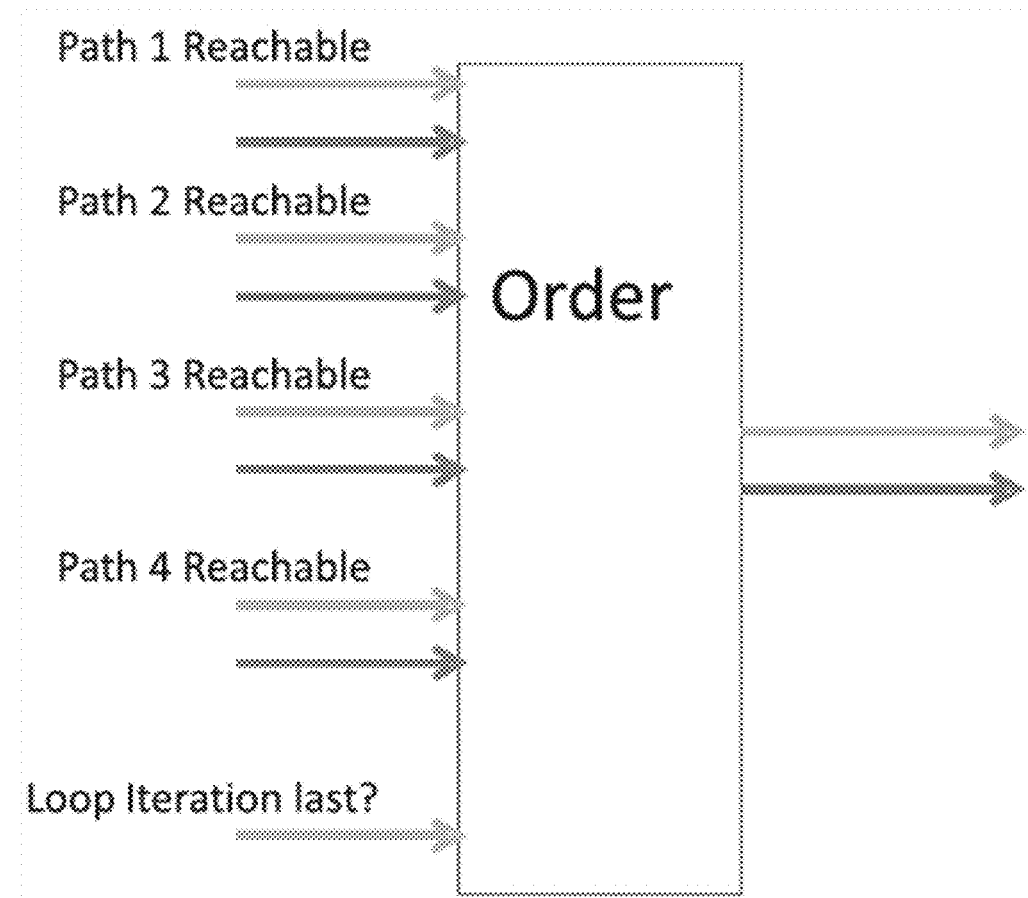

There may be times when the path-reachability equation has more than four terms (conditional predicates) and these "&&" operators can be combined to process larger equations, as shown in FIG. 10H. These one bit "path is reachable" indications, such as the final result of FIG. 10H, are part of the inputs to an order box which produces a stream of program-ordered memory accesses. An order box is illustrated in FIG. 10I. The "path reachable" arrows represent the one-bit output of a corresponding "&&" box and the other arrows represent information about the memory access. This information includes the address, whether the access is a read or write, size of the data item being accessed and, for reads, the target compute box (or target virtual channel).

The order box reads each of the input predicates from top to bottom. Note that since values on these channels include a corresponding valid-bit, the box will wait until the next value arrives. The order box outputs any true items (which are reachable memory accesses on the corresponding arrows) to the output, essentially creating an ordered stream of memory access descriptions that are in program order. Upon the last iteration, a false flag is send on the top output arrow, indicating end of stream.

Any of the input terms can be configured to either expect a single value or a stream of accesses. A single value input uses the "path reachable" input to specify whether an access is created this time or false that indicates no access this time. A stream input has a true signal on the "path reachable" input for each value in the stream with a final false input that indicates end of stream.

Figure 10J:
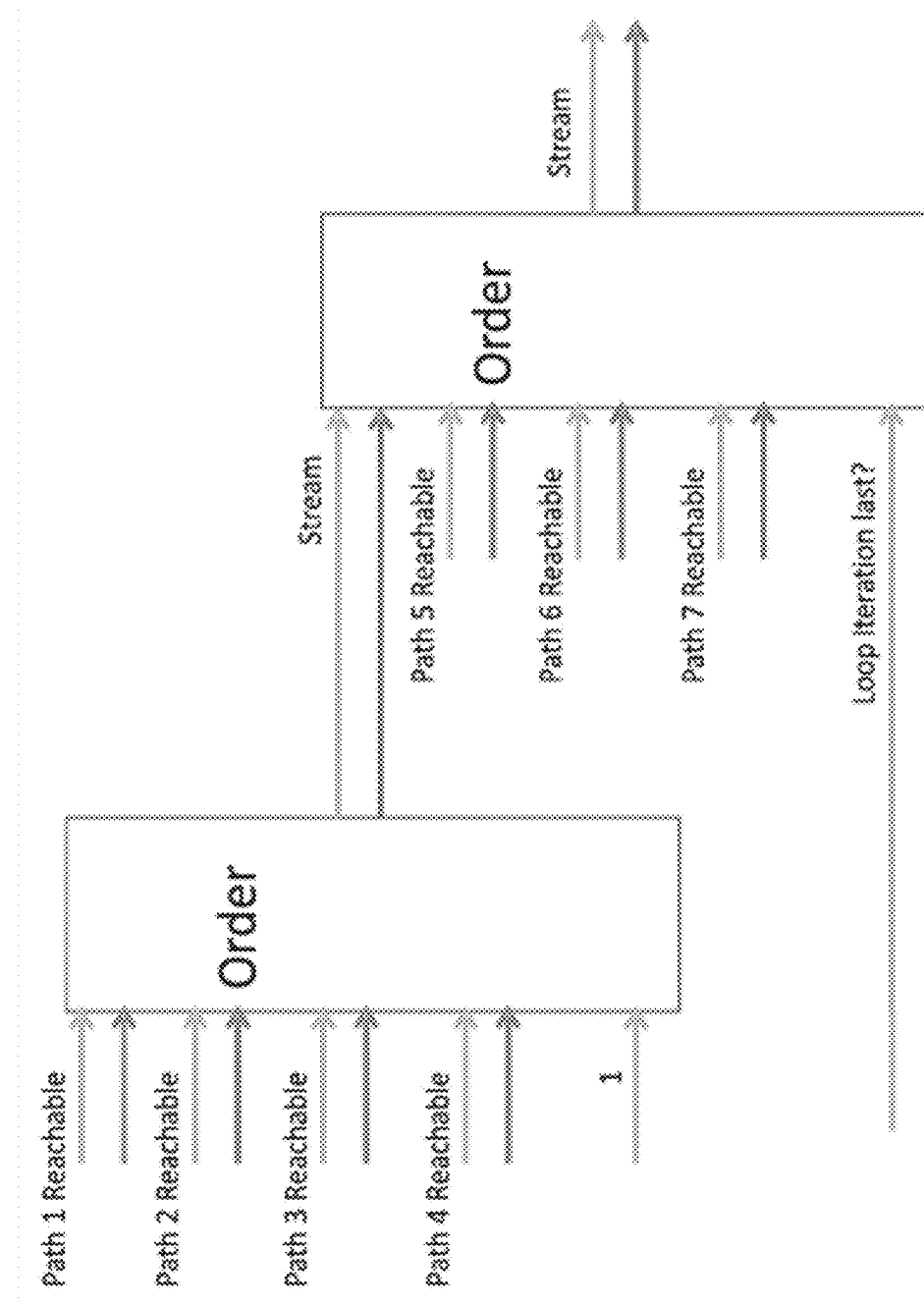
Figure 10K:
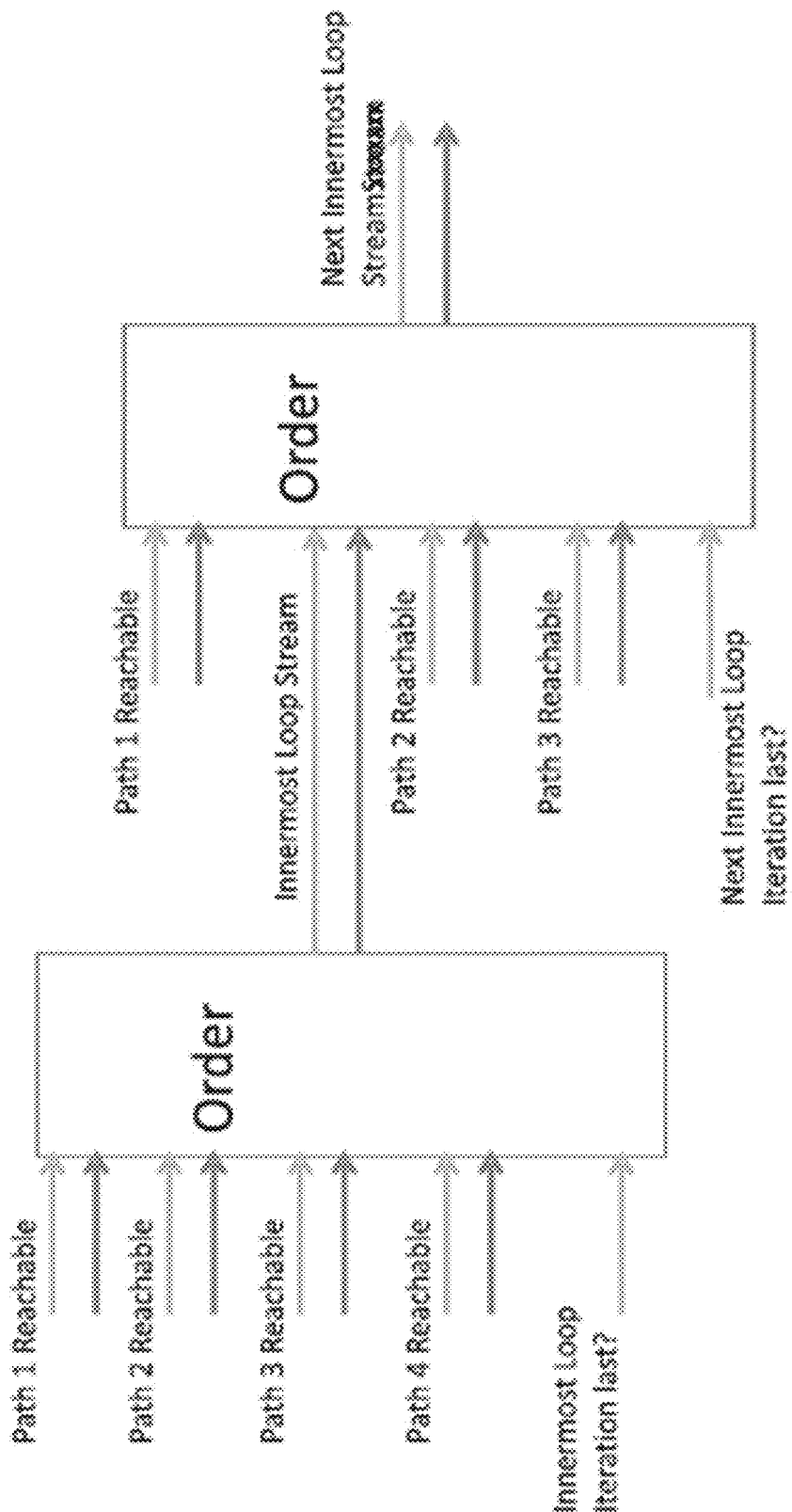

More than four memory accesses in a graph can be ordered by combining the order boxes as shown in FIG. 10J. Nested loops may also be handled as shown in FIG. 10K.

Performance to execute a stream of memory-accesses that has been program-ordered may be increased by passing the stream through a disambiguation operator as illustrated in FIG. 10L. For example, a disambiguation compute box might compare load addresses against store addresses in the ordered stream and allow loads to go around stores to help keep the latency of loads to a minimum.

Figure 10M:
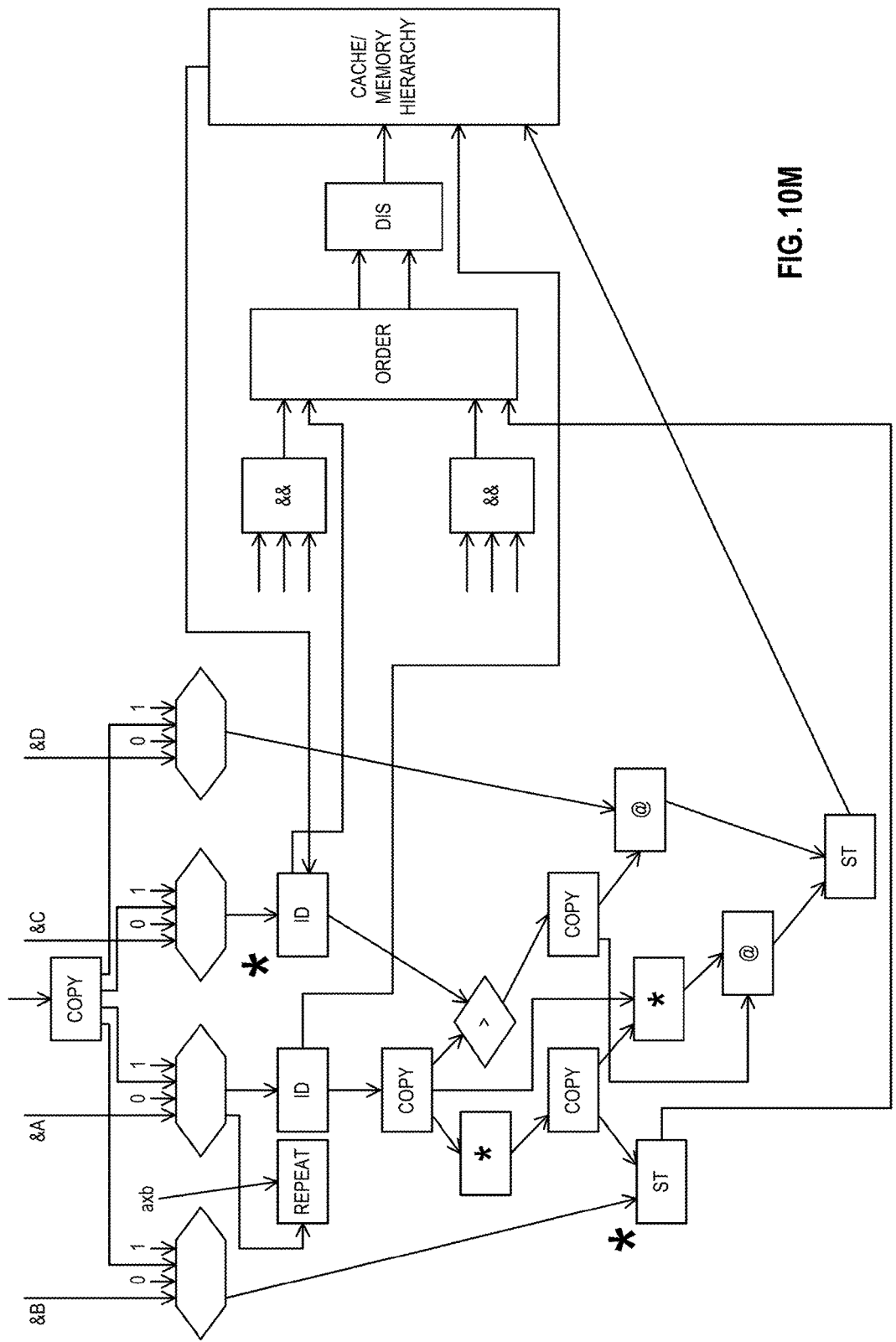

In summary, the graph in FIG. 1 may be executed as the graph shown in FIG. 10M according to the described embodiment.

3.4 Cache

Figure 11:
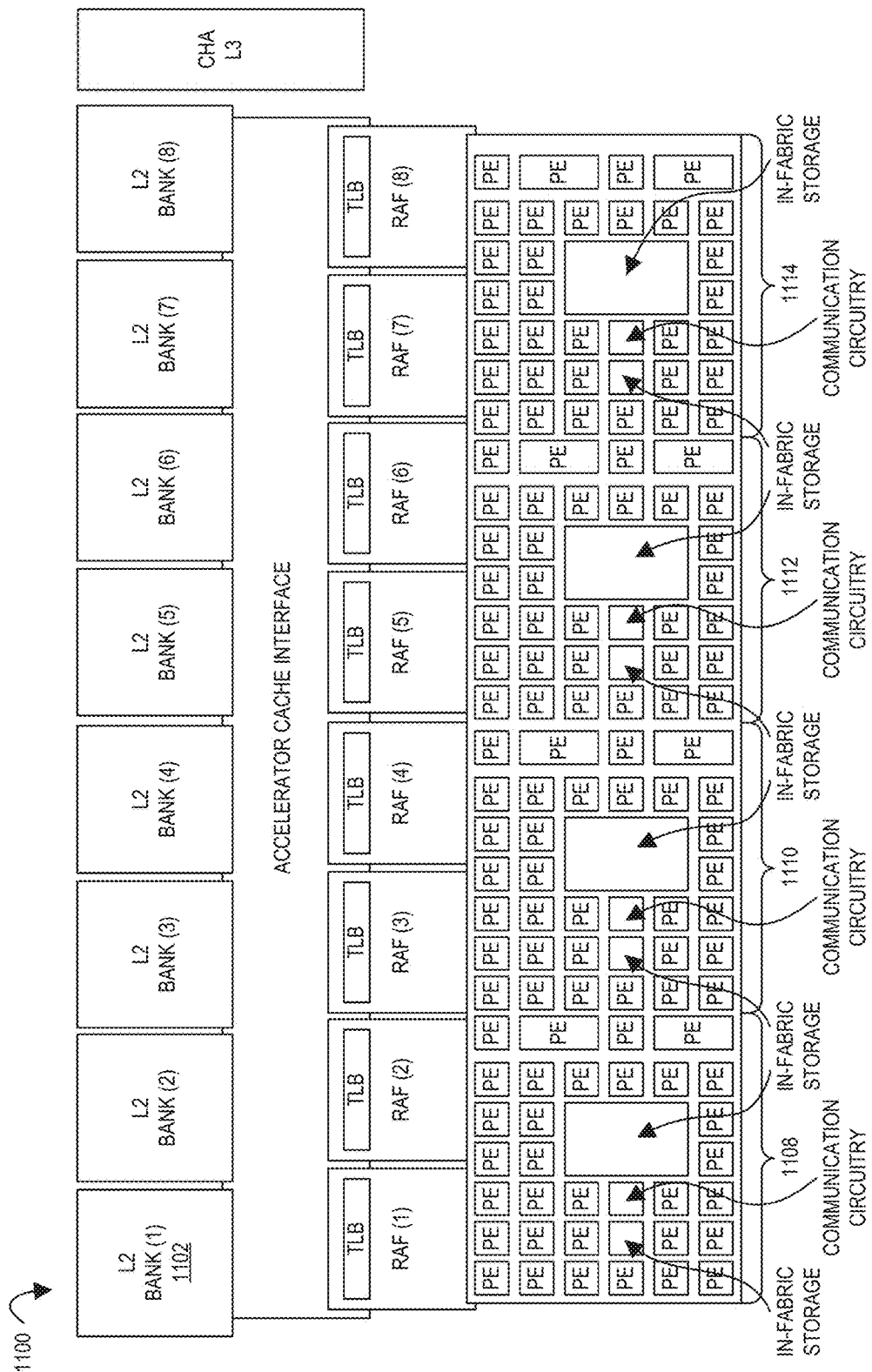
FIG. 11 illustrates a plurality of request address file (RAF) circuits coupled between a plurality of accelerator tiles and a plurality of cache banks according to embodiments of the disclosure.

Dataflow graphs may be capable of generating a profusion of (e.g., word granularity) requests in parallel. Thus, certain embodiments of the CSA provide a cache subsystem with sufficient bandwidth to service the CSA. A heavily banked cache microarchitecture, e.g., as shown in FIG. 11 may be utilized. FIG. 11 illustrates a circuit 1100 with a plurality of request address file (RAF) circuits (e.g., RAF circuit (1)) coupled between a plurality of accelerator tiles (1108, 1110, 1112, 1114) and a plurality of cache banks (e.g., cache bank 1102) according to embodiments of the disclosure. In one embodiment, the number of RAFs and cache banks may be in a ratio of either 1:1 or 1:2. Cache banks may contain full cache lines (e.g., as opposed to sharing by word), with each line having exactly one home in the cache. Cache lines may be mapped to cache banks via a pseudo-random function. The CSA may adopt the SVM model to integrate with other tiled architectures. Certain embodiments include an Accelerator Cache Interconnect (ACI) network connecting the RAFs to the cache banks. This network may carry address and data between the RAFs and the cache. The topology of the ACI may be a cascaded crossbar, e.g., as a compromise between latency and implementation complexity.

3.5 Floating Point Support

Certain HPC applications are characterized by their need for significant floating-point bandwidth. To meet this need, embodiments of a CSA may be provisioned with multiple (e.g., between 128 and 256 each) of floating add and multiplication PEs, e.g., depending on tile configuration. A CSA may provide a few other extended precision modes, e.g., to simplify math library implementation. CSA floating point PEs may support both single and double precision, but lower precision PEs may support machine learning workloads. A CSA may provide an order of magnitude more floating-point performance than a processor core. In one embodiment, in addition to increasing floating point bandwidth, in order to power all of the floating-point units, the energy consumed in floating point operations is reduced. For example, to reduce energy, a CSA may selectively gate the low-order bits of the floating-point multiplier array. In examining the behavior of floating point arithmetic, the low order bits of the multiplication array may often not influence the final, rounded product. FIG. 12A illustrates a floating-point multiplier 1200 partitioned into three regions (the result region, three potential carry regions (1202, 1204, 1206), and the gated region) according to embodiments of the disclosure. In certain embodiments, the carry region is likely to influence the result region and the gated region is unlikely to influence the result region. Considering a gated region of g bits, the maximum carry may be:

$$\text{carry}_g \leq \frac{1}{2^g} \sum_{1}^{g} i 2^{i-1}$$

$$\leq \sum_{1}^{g} \frac{i}{2^g} - \sum_{1}^{g} \frac{1}{2^g} + 1$$

$$\leq g - 1$$

Given this maximum carry, if the result of the carry region is less than $2^c - g$, where the carry region is c bits wide, then the gated region may be ignored since it does not influence the result region. Increasing g means that it is more likely the gated region will be needed, while increasing c means that, under random assumption, the gated region will be unused and may be disabled to avoid energy consumption. In embodiments of a CSA floating multiplication PE, a two-stage pipelined approach is utilized in which first the carry region is determined and then the gated region is determined if it is found to influence the result. If more information about the context of the multiplication is known, a CSA more aggressively tune the size of the gated region. In FMA, the multiplication result may be added to an accumulator, which is often much larger than either of the multiplicands. In this case, the addend exponent may be observed in advance of multiplication and the CSDA may adjust the gated region accordingly. One embodiment of the CSA includes a scheme in which a context value, which bounds the minimum result of a computation, is provided to related multipliers, in order to select minimum energy gating configurations.

Figure 12B:
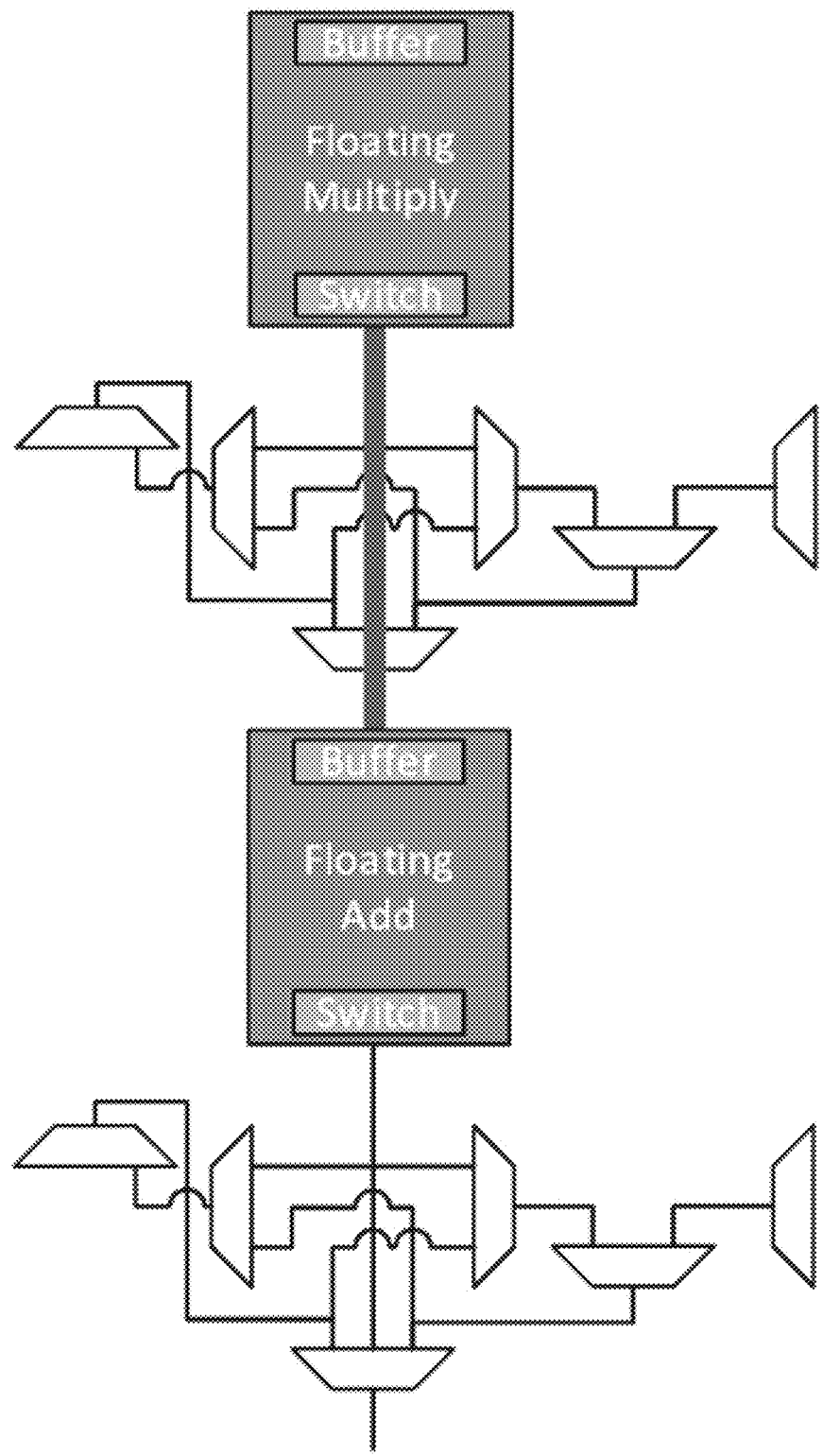
FIG. 12B illustrates a fused multiply-adder according to embodiments of the disclosure.

FIG. 12B illustrates a fused multiply-adder according to embodiments of the invention. In a spatial array, PEs may communicate by means of a statically configured network. Rather than provide a specific fused multiply-add (FMA) block, it may be desired to modify the static network to carry the increased precision between multiply and add blocks. This enables support for add, multiply, and FMA with minimal extra hardware. In an embodiment, a special wide data path, represented by the thick line, is added to carry the wide precision FMA intermediate result. In FMA mode, extra precision is carried on this bus to faithfully perform the FMA. The mode of the switch may be set statically at configuration time.

Figure 12C:
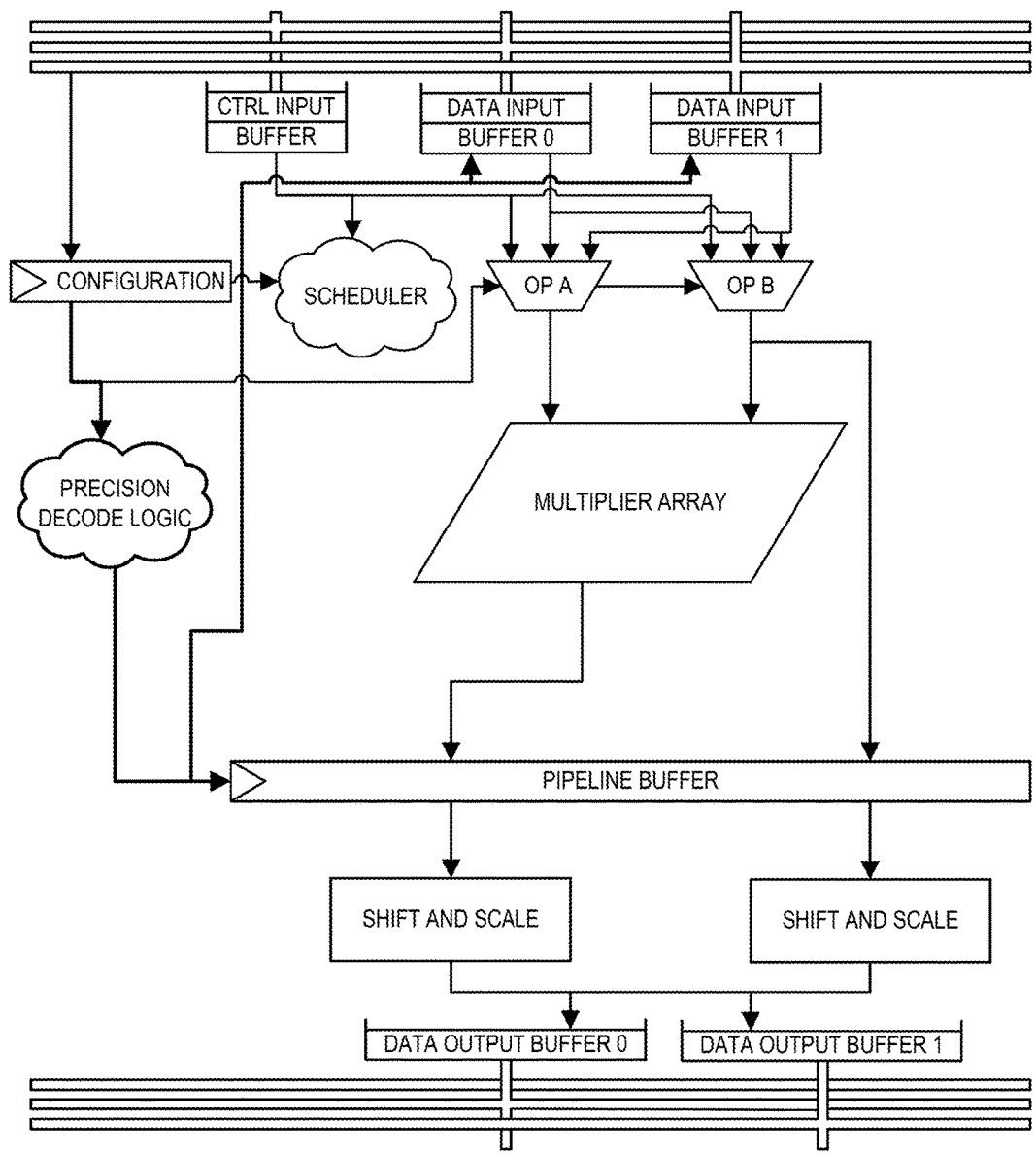
FIG. 12C illustrates a floating-point multiplication array augmented with precision reduction controls according to embodiments of the disclosure.

FIG. 12C illustrates a floating-point multiplication array augmented with precision reduction controls according to embodiments of the disclosure. Spatial architectures are an energy-efficient and high-performance means of accelerating user applications. Although such architectures are more energy efficient than traditional processors in the execution of many loops, some operations, such as double-precision floating point arithmetic remain complex and costly in terms of energy consumption. However, many algorithms are remarkably tolerant of reductions in the precision of floating point operations. Therefore, it may be desired to reduce power consumption by explicitly reducing precision according to embodiments of the invention.

In embodiments, the precision of operations within a spatial array may be specified at a fine grain. This enables programmers and compilers to specify the precision for each operation within the spatial array. By setting precision correctly, applications may obtain up to an 80% energy reduction in energy-expensive operations like floating point arithmetic. Although it is possible to enable these techniques in von Neumann architectures, spatial architectures are uniquely suited to take advantage of instance-specific parameterization, in this case, precision reduction, because they are configured. Spatial architectures do not stream control through a pipeline in a time-multiplexed fashion, and encounter none of decode complexity, control pipelining complexity or cache pressure. This makes spatial arrays uniquely suited to the style of precise configuration control provided by embodiments of the invention.

In embodiments, an architecturally visible control is provided to reduce the precision of certain expensive operations like floating point addition and multiplication. Programs specify some number of bits of precision, for example, in coarse multiples such as 4 or 8 bits. The configuration bits are used to clock gate input and output registers of the operation from the low order bits. Since the operands are held constant, an effective reduction in the transistor-level switching of the operation may be achieved, resulting in a reduction in energy consumption. Precision configuration is per-operation and may be set for each operation independently, according to the needs of the application.

FIG. 12C is block diagram of a floating-point unit as may be included in a CSA. The block diagram shows the additional configuration and gating for precision reduction according to embodiments of the invention. In embodiments, the PE configuration word is augmented with a field indicating the portion of the operand mantissa to be clock gated. This argument is decoded and used to modify clock signals to the appropriate registers. Mantissa gating control may be implemented as a single global control or per operand and output, and any of the input, pipeline, or output registers may be gated. Implementation area may be less than 1% of the total multiplier area. Energy reduction may be achieved by holding large portions of the multiplier array constant, with ancillary reduction from clock gating itself.

Although this approach may be best suited for spatial architectures, there are some possible implementations that may be applied in traditional von Neumann-style architectures. One possibility is to encode precision reduction as part of an opcode. This complicates control and increases instruction size, but gives fine-grained control over each instruction. A second implementation is to use a register-indirect instruction, in which case the low-precision bits are supplied by a register by way of selection bits in the instruction. This approach reduces instruction size, but requires state. Finally, precision could be set as a coarse configuration shared by all instructions, though this loses the ability to configure.

Some algorithms may require variable precision over the course of an execution, or may be otherwise able to adapt precision dynamically based on execution. To assist in this case, an additional input to the operator may be provided to allow for dynamic adjustment of the precision. Here, precision would be determined by a value in a queue, which could be dynamically consumed according to a control operator (referred to as 'repeat' in the CSA dataflow language). Since the queue could also be used to implement the baseline fixed case (i.e., the queue would be set at configuration and never dequeued), there is limited overhead to this approach.

3.6 Runtime Services

Figure 13:
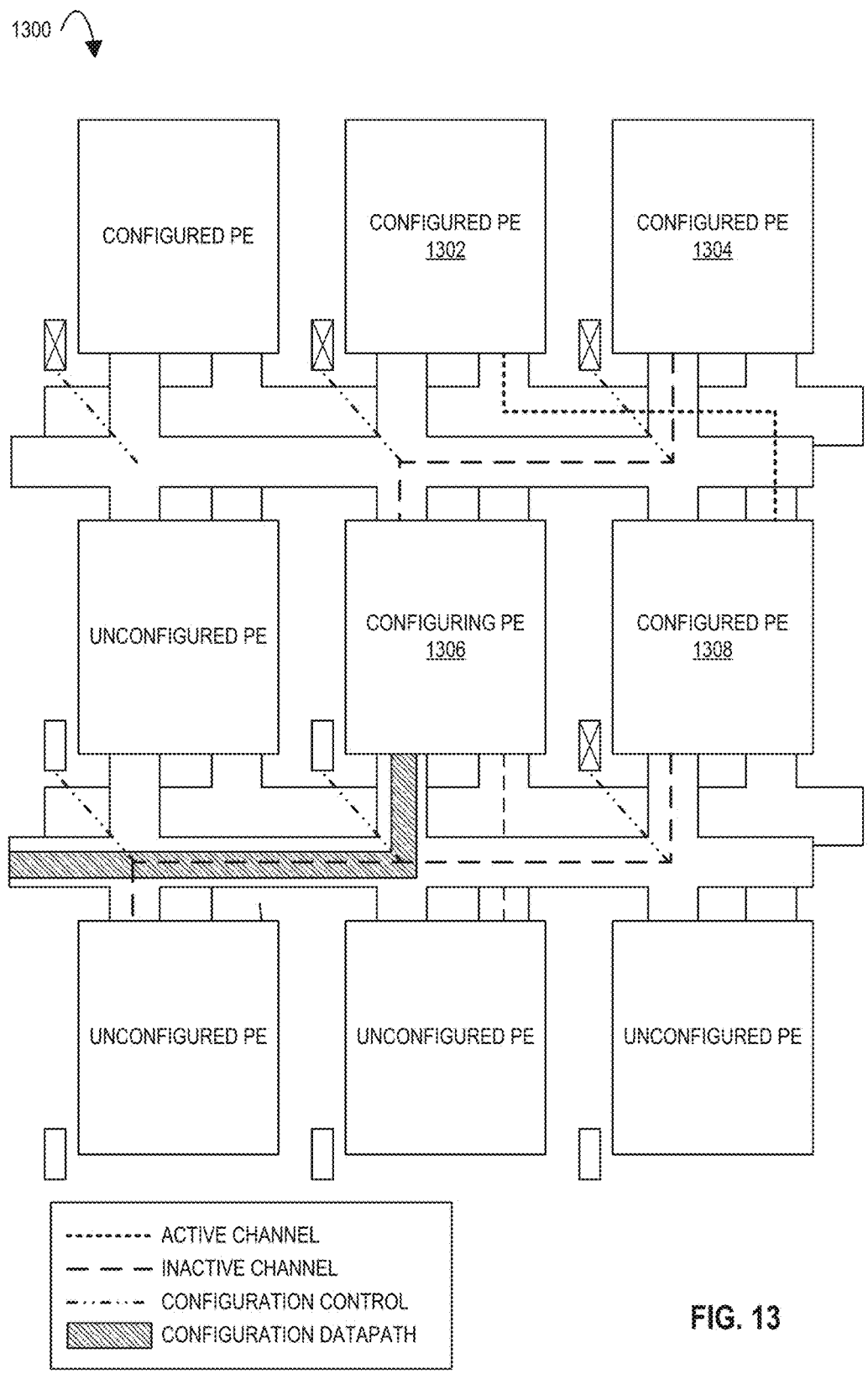
FIG. 13 illustrates an in-flight configuration of an accelerator with a plurality of processing elements according to embodiments of the disclosure.

In certain embodiment, a CSA includes a heterogeneous and distributed fabric, and consequently, runtime service implementations are to accommodate several kinds of PEs in a parallel and distributed fashion. Although runtime services in a CSA may be critical, they may be infrequent relative to user-level computation. Certain implementations, therefore, focus on overlaying services on hardware resources. To meet these goals, CSA runtime services may be cast as a hierarchy, e.g., with each layer corresponding to a CSA network. At the tile level, a single external-facing controller may accept or sends service commands to an associated core with the CSA tile. A tile-level controller may serve to coordinate regional controllers at the RAFs, e.g., using the ACI network. In turn, regional controllers may coordinate local controllers at certain mezzanine network stops. At the lowest level, service specific micro-protocols may execute over the local network, e.g., during a special mode controlled through the mezzanine controllers. The micro-protocols may permit each PE (e.g., PE class by type) to interact with the runtime service according to its own needs. Parallelism is thus implicit in this hierarchical organization, and operations at the lowest levels may occur simultaneously. This parallelism may enable the configuration of a CSA tile in between hundreds of nanoseconds to a few microseconds, e.g., depending on the configuration size and its location in the memory hierarchy. Embodiments of the CSA thus leverage properties of dataflow graphs to improve implementation of each runtime service. One key observation is that runtime services may need only to preserve a legal logical view of the dataflow graph, e.g., a state that can be produced through some ordering of dataflow operator executions. Services may generally not need to guarantee a temporal view of the dataflow graph, e.g., the state of a dataflow graph in a CSA at a specific point in time. This may permit the CSA to conduct most runtime services in a distributed, pipelined, and parallel fashion, e.g., provided that the service is orchestrated to preserve the logical view of the dataflow graph. The local configuration micro-protocol may be a packet-based protocol overlaid on the local network. Configuration targets may be organized into a configuration chain, e.g., which is fixed in the microarchitecture. Fabric (e.g., PE) targets may be configured one at a time, e.g., using a single extra register per target to achieve distributed coordination. To start configuration, a controller may drive an out-of-band signal which places all fabric targets in its neighborhood into an unconfigured, paused state and swings multiplexors in the local network to a pre-defined conformation. As the fabric (e.g., PE) targets are configured, that is they completely receive their configuration packet, they may set their configuration microprotocol registers, notifying the immediately succeeding target (e.g., PE) that it may proceed to configure using the subsequent packet. There is no limitation to the size of a configuration packet, and packets may have dynamically variable length. For example, PEs configuring constant operands may have a configuration packet that is lengthened to include the constant field (e.g., X and Y in FIGS. 3B-3C). FIG. 13 illustrates an in-flight configuration of an accelerator 1300 with a plurality of processing elements (e.g., PEs 1302, 1304, 1306, 1308) according to embodiments of the disclosure. Once configured, PEs may execute subject to dataflow constraints. However, channels involving unconfigured PEs may be disabled by the microarchitecture, e.g., preventing any undefined operations from occurring. These properties allow embodiments of a CSA to initialize and execute in a distributed fashion with no centralized control whatsoever. From an unconfigured state, configuration may occur completely in parallel, e.g., in perhaps as few as 200 nanoseconds. However, due to the distributed initialization of embodiments of a CSA, PEs may become active, for example sending requests to memory, well before the entire fabric is configured. Extraction may proceed in much the same way as configuration. The local network may be conformed to extract data from one target at a time, and state bits used to achieve distributed coordination. A CSA may orchestrate extraction to be non-destructive, that is, at the completion of extraction each extractable target has returned to its starting state. In this implementation, all state in the target may be circulated to an egress register tied to the local network in a scan-like fashion. Although in-place extraction may be achieved by introducing new paths at the register-transfer level (RTL), or using existing lines to provide the same functionalities with lower overhead. Like configuration, hierarchical extraction is achieved in parallel.

Figure 14:
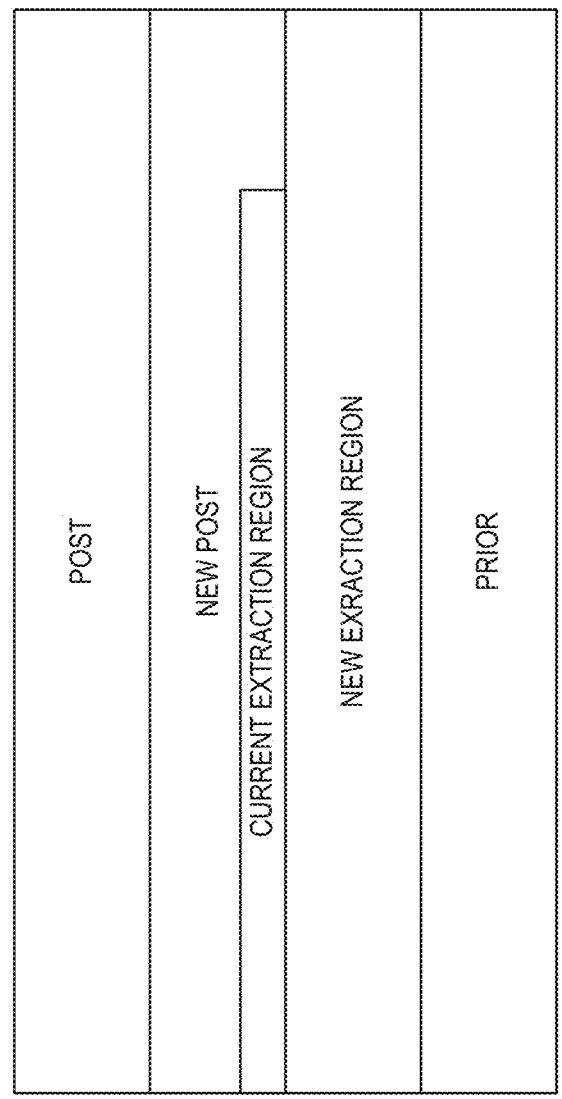
FIG. 14 illustrates a snapshot of an in-flight, pipelined extraction according to embodiments of the disclosure.

FIG. 14 illustrates a snapshot 1400 of an in-flight, pipelined extraction according to embodiments of the disclosure. In some use cases of extraction, such as checkpointing, latency may not be a concern so long as fabric throughput is maintained. In these cases, extraction may be orchestrated in a pipelined fashion. This arrangement, shown in FIG. 14, permits most of the fabric to continue executing, while a narrow region is disabled for extraction. Configuration and extraction may be coordinated and composed to achieve a pipelined context switch. Exceptions may differ qualitatively from configuration and extraction in that, rather than occurring at a specified time, they arise anywhere in the fabric at any point during runtime. Thus, in one embodiment, the exception micro-protocol may not be overlaid on the local network, which is occupied by the user program at runtime, and utilizes its own network. However, by nature, exceptions are rare and insensitive to latency and bandwidth. Thus, certain embodiments of CSA utilize a packet switched network to carry exceptions to the local mezzanine stop, e.g., where they are forwarded up the service hierarchy (e.g., as in FIG. 29). Packets in the local exception network may be extremely small. In many cases, a PE identification (ID) of only two to eight bits suffices as a complete packet, e.g., since the CSA may create a unique exception identifier as the packet traverses the exception service hierarchy. Such a scheme may be desirable because it also reduces the area overhead of producing exceptions at each PE.

4. Compilation

The ability to compile programs written in high-level languages onto a CSA may be essential for industry adoption. This section gives a high-level overview of compilation strategies for embodiments of a CSA. First is a proposal for a CSA software framework that illustrates the desired properties of an ideal production-quality toolchain. Next, a prototype compiler framework is discussed. A "control-to-dataflow conversion" is then discussed, e.g., to converts ordinary sequential control-flow code into CSA dataflow assembly code.

4.1 Example Production Framework

Figure 15:
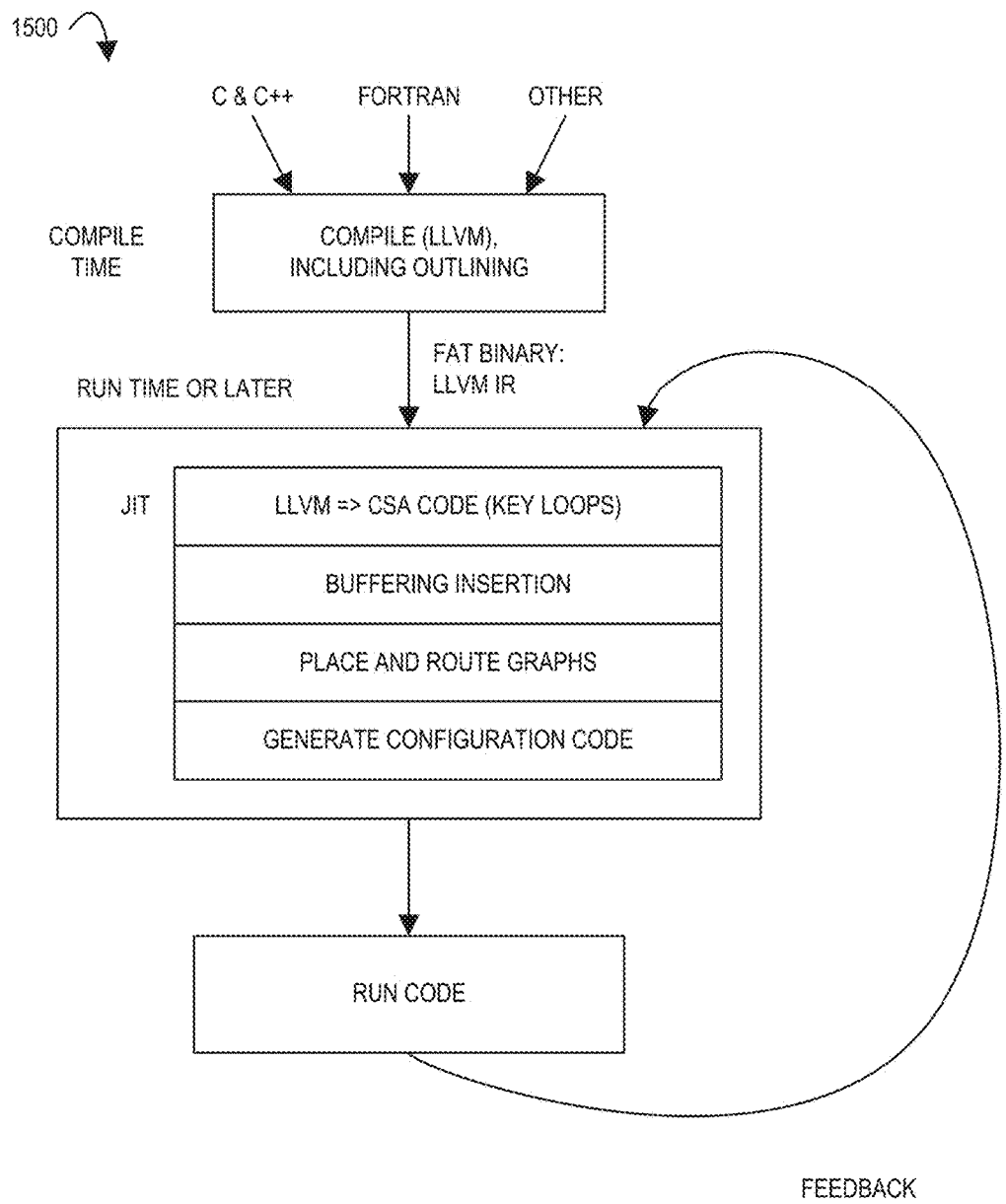
FIG. 15 illustrates a compilation toolchain for an accelerator according to embodiments of the disclosure.

FIG. 15 illustrates a compilation toolchain 1500 for an accelerator according to embodiments of the disclosure. This toolchain compiles high-level languages (such as C, C++, and Fortran) into a combination of host code (LLVM) intermediate representation (IR) for the specific regions to be accelerated. The CSA-specific portion of this compilation toolchain takes LLVM IR as its input, optimizes and compiles this IR into a CSA assembly, e.g., adding appropriate buffering on latency-insensitive channels for performance. It then places and routes the CSA assembly on the hardware fabric, and configures the PEs and network for execution. In one embodiment, the toolchain supports the CSA-specific compilation as a just-in-time (JIT), incorporating potential runtime feedback from actual executions. One of the key design characteristics of the framework is compilation of (LLVM) IR for the CSA, rather than using a higher-level language as input. While a program written in a high-level programming language designed specifically for the CSA might achieve maximal performance and/or energy efficiency, the adoption of new high-level languages or programming frameworks may be slow and limited in practice because of the difficulty of converting existing code bases. Using (LLVM) IR as input enables a wide range of existing programs to potentially execute on a CSA, e.g., without the need to create a new language or significantly modify the front-end of new languages that want to run on the CSA.

4.2 Prototype Compiler

Figure 16:
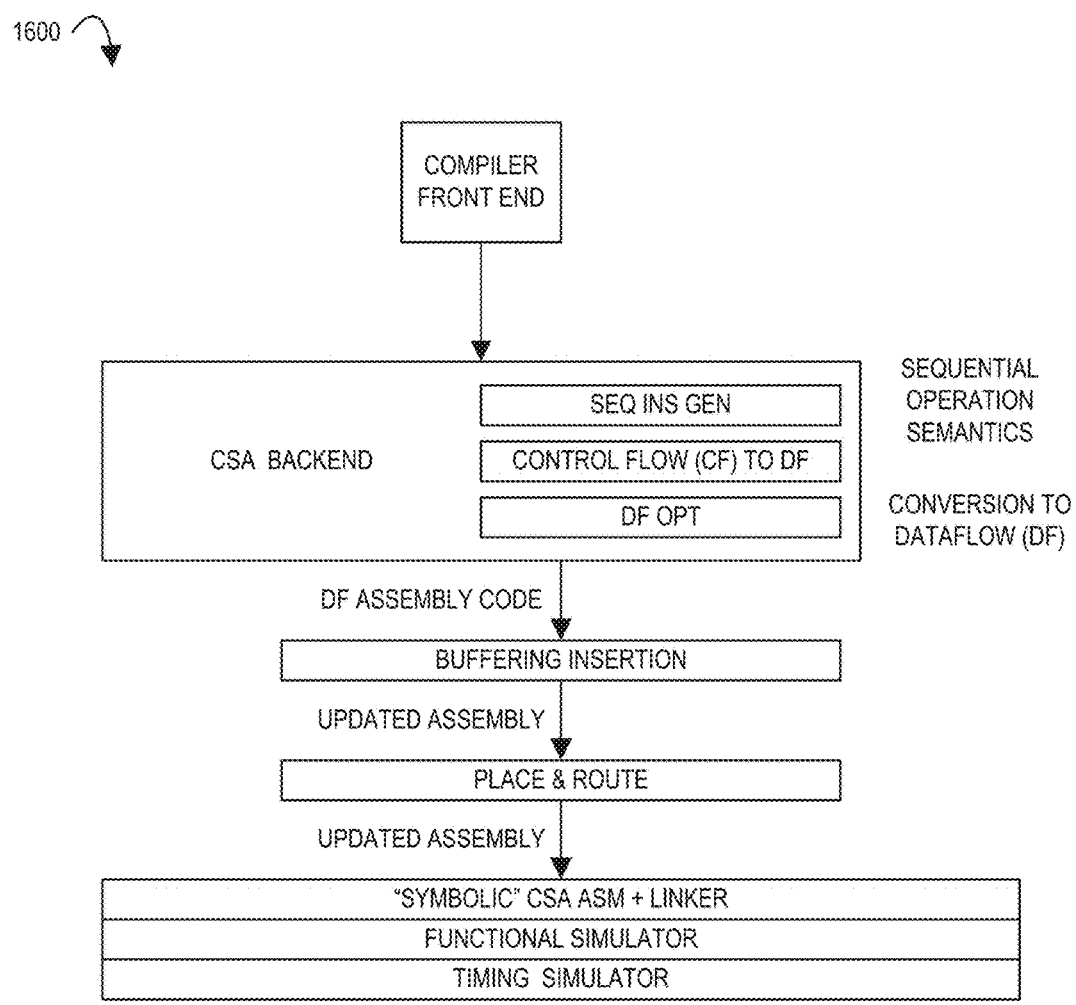
FIG. 16 illustrates a compiler for an accelerator according to embodiments of the disclosure.

FIG. 16 illustrates a compiler 1600 for an accelerator according to embodiments of the disclosure. Compiler 1600 initially focuses on ahead-of-time compilation of C and C++ through the (e.g., Clang) front-end. To compile (LLVM) IR, the compiler implements a CSA back-end target within LLVM with three main stages. First, the CSA back-end lowers LLVM IR into a target-specific machine instructions for the sequential unit, which implements most CSA operations combined with a traditional RISC-like control-flow architecture (e.g., with branches and a program counter). The sequential unit in the toolchain may serve as a useful aid for both compiler and application developers, since it enables an incremental transformation of a program from control flow (CF) to dataflow (DF), e.g., converting one section of code at a time from control-flow to dataflow and validating program correctness. The sequential unit may also provide a model for handling code that does not fit in the spatial array. Next, the compiler converts this control flow into dataflow operators (e.g., code) for the CSA. This phase is described later in Section 4.3. Then, the CSA back-end may run its own optimization passes on the dataflow operations. Finally, the compiler may dump the instructions in a CSA assembly format. This assembly format is taken as input to late-stage tools which place and route the dataflow operations on the actual CSA hardware.

4.3 Control to Dataflow Conversion

A key portion of the compiler may be implemented in the control-to-dataflow conversion pass, or dataflow conversion pass for short. This pass takes in a function represented in control flow form, e.g., a control-flow graph (CFG) with sequential machine instructions operating on virtual registers, and converts it into a dataflow function that is conceptually a graph of dataflow operations (instructions) connected by latency-insensitive channels (LICs). This section gives a high-level description of this pass, describing how it conceptually deals with memory operations, branches, and loops in certain embodiments.

Straight-Line Code

Figure 17C:
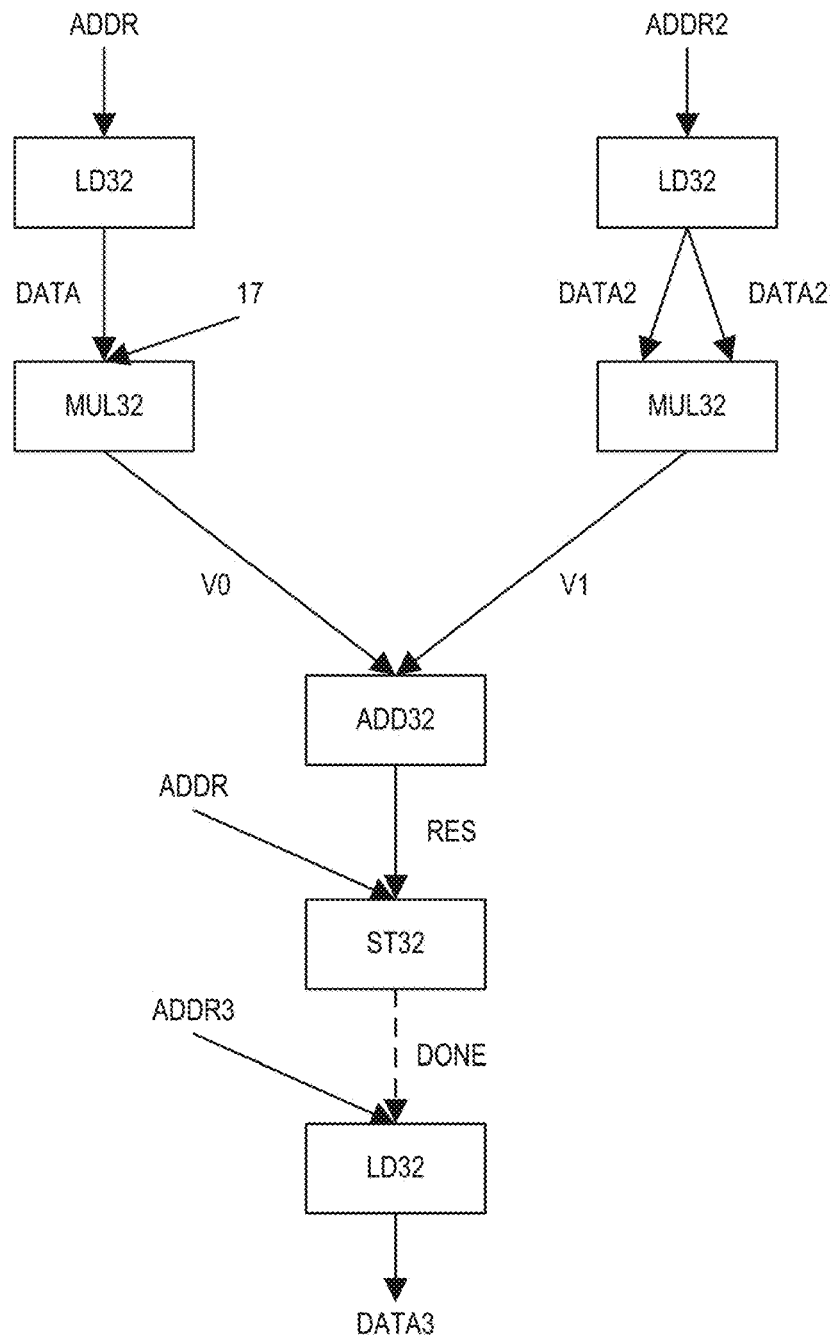
FIG. 17C illustrates a dataflow graph for the dataflow assembly code of FIG. 17B for an accelerator according to embodiments of the disclosure.

FIG. 17A illustrates sequential assembly code 1702 according to embodiments of the disclosure. FIG. 17B illustrates dataflow assembly code 1704 for the sequential assembly code 1702 of FIG. 17A according to embodiments of the disclosure. FIG. 17C illustrates a dataflow graph 1706 for the dataflow assembly code 1704 of FIG. 17B for an accelerator according to embodiments of the disclosure.

First, consider the simple case of converting straight-line sequential code to dataflow. The dataflow conversion pass may convert a basic block of sequential code, such as the code shown in FIG. 17A into CSA assembly code, shown in FIG. 17B. Conceptually, the CSA assembly in FIG. 17B represents the dataflow graph shown in FIG. 17C. In this example, each sequential instruction is translated into a matching CSA assembly. The .lic statements (e.g., for data) declare latency-insensitive channels which correspond to the virtual registers in the sequential code (e.g., Rdata). In practice, the input to the dataflow conversion pass may be in numbered virtual registers. For clarity, however, this section uses descriptive register names. Note that load and store operations are supported in the CSA architecture in this embodiment, allowing for many more programs to run than an architecture supporting only pure dataflow. Since the sequential code input to the compiler is in SSA (singlestatic assignment) form, for a simple basic block, the control-to-dataflow pass may convert each virtual register definition into the production of a single value on a latency-insensitive channel. The SSA form allows multiple uses of a single definition of a virtual register, such as in Rdata2). To support this model, the CSA assembly code supports multiple uses of the same LIC (e.g., data2), with the simulator implicitly creating the necessary copies of the LICs. One key difference between sequential code and dataflow code is in the treatment of memory operations. The code in FIG. 17A is conceptually serial, which means that the load32 (ld32) of addr3 should appear to happen after the st32 of addr, in case that addr and addr3 addresses overlap.

Branches

To convert programs with multiple basic blocks and conditionals to dataflow, the compiler generates special dataflow operators to replace the branches. More specifically, the compiler uses switch operators to steer outgoing data at the end of a basic block in the original CFG, and pick operators to select values from the appropriate incoming channel at the beginning of a basic block. As a concrete example, consider the code and corresponding dataflow graph in FIGS. 18A-18C, which conditionally computes a value of y based on several inputs: a i, x, and n. After computing the branch condition test, the dataflow code uses a switch operator (e.g., see FIGS. 3B-3C) steers the value in channel x to channel xF if test is 0, or channel xT if test is 1. Similarly, a pick operator (e.g., see FIGS. 3B-3C) is used to send channel yF to y if test is 0, or send channel yT toy if test is 1. In this example, it turns out that even though the value of a is only used in the true branch of the conditional, the CSA is to include a switch operator which steers it to channel aT when test is 1, and consumes (eats) the value when test is 0. This latter case is expressed by setting the false output of the switch to %ign. It may not be correct to simply connect channel a directly to the true path, because in the cases where execution actually takes the false path, this value of "a" will be left over in the graph, leading to incorrect value of a for the next execution of the function. This example highlights the property of control equivalence, a key property in embodiments of correct dataflow conversion.

Control Equivalence:

Consider a single-entry-single-exit control flow graph G with two basic blocks A and B. A and B are control-equivalent if all complete control flow paths through G visit A and B the same number of times.

Figure 18C:
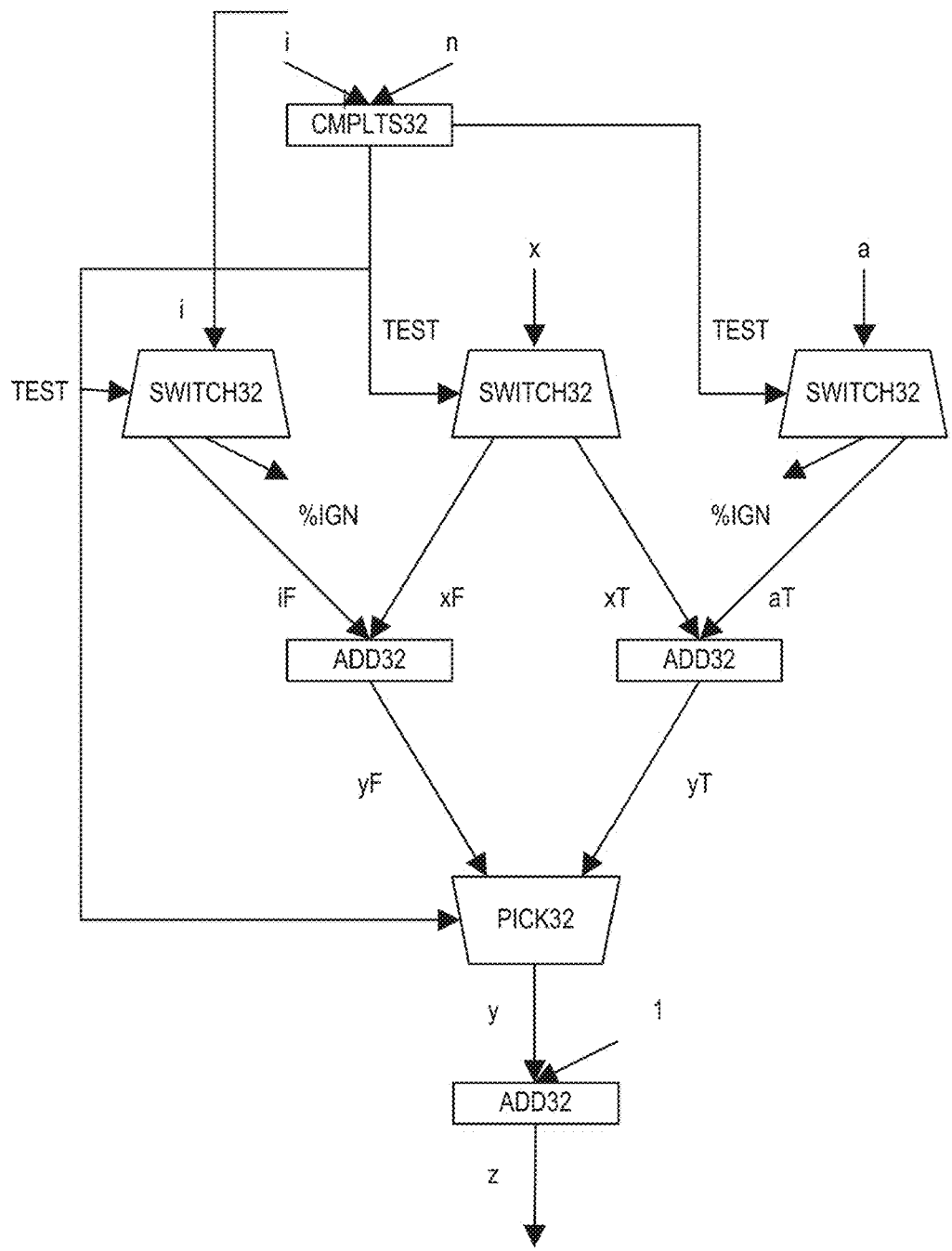
FIG. 18C illustrates a dataflow graph for the dataflow assembly code of FIG. 18B for an accelerator according to embodiments of the disclosure.

LIC Replacement:

In a control flow graph G, suppose an operation in basic block A defines a virtual register x, and an operation in basic block B that uses x. Then a correct control-to-dataflow transformation can replace x with a latency-insensitive channel only if A and B are control equivalent. The control-equivalence relation partitions the basic blocks of a CFG into strong control-dependence regions. FIG. 18A illustrates C source code 1802 according to embodiments of the disclosure. FIG. 18B illustrates dataflow assembly code 1804 for the C source code 1802 of FIG. 18A according to embodiments of the disclosure. FIG. 18C illustrates a dataflow graph 1806 for the dataflow assembly code 1804 of FIG. 18B for an accelerator according to embodiments of the disclosure. In the example in FIGS. 18A-18C, the basic block before and after the conditionals are control-equivalent to each other, but the basic blocks in the true and false paths are each in their own control dependence region. One correct algorithm for converting a CFG to dataflow is to have the compiler insert (1) switches to compensate for the mismatch in execution frequency for any values that flow between basic blocks which are not control equivalent, and (2) picks at the beginning of basic blocks to choose correctly from any incoming values to a basic block. Generating the appropriate control signals for these picks and switches may be the key part of dataflow conversion.

Loops

Figure 19C:
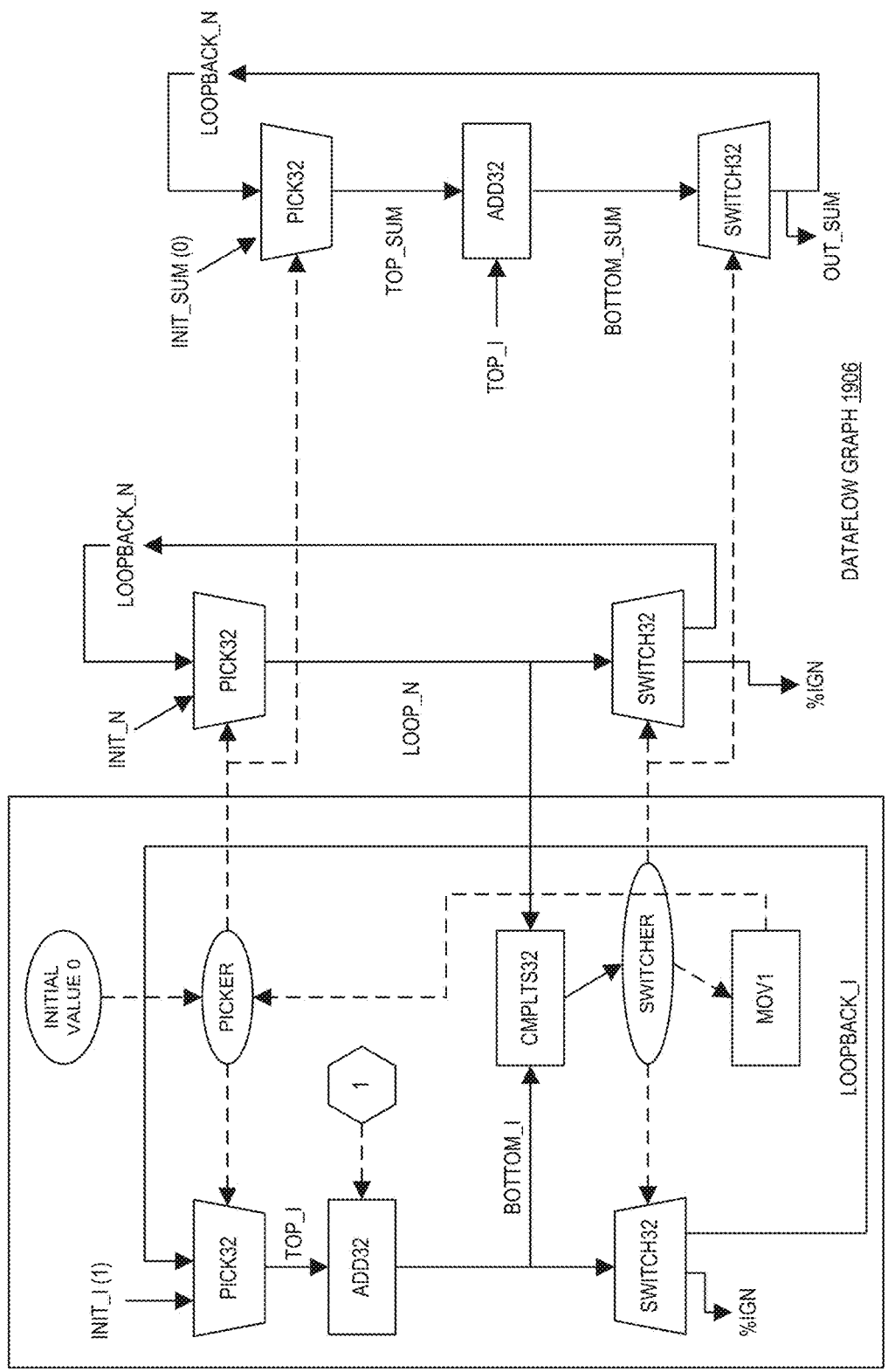
FIG. 19C illustrates a dataflow graph for the dataflow assembly code of FIG. 19B for an accelerator according to embodiments of the disclosure.

Another important class of CFGs in dataflow conversion are CFGs for single-entry-single-exit loops, a common form of loop generated in (LLVM) IR. These loops may be almost acyclic, except for a single back edge from the end of the loop back to a loop header block. The dataflow conversion pass may use same high-level strategy to convert loops as for branches, e.g., it inserts switches at the end of the loop to direct values out of the loop (either out the loop exit or around the back-edge to the beginning of the loop), and inserts picks at the beginning of the loop to choose between initial values entering the loop and values coming through the back edge. FIG. 19A illustrates C source code 1902 according to embodiments of the disclosure. FIG. 19B illustrates dataflow assembly code 1904 for the C source code 1902 of FIG. 19A according to embodiments of the disclosure. FIG. 19C illustrates a dataflow graph 1906 for the dataflow assembly code 1904 of FIG. 19B for an accelerator according to embodiments of the disclosure. FIGS. 19A-19C shows C and CSA assembly code for an example do-while loop that adds up values of a loop induction variable i, as well as the corresponding dataflow graph. For each variable that conceptually cycles around the loop (i and sum), this graph has a corresponding pick/switch pair that controls the flow of these values. Note that this example also uses a pick/switch pair to cycle the value of n around the loop, even though n is loop-invariant. This repetition of n enables conversion of n's virtual register into a LIC, since it matches the execution frequencies between a conceptual definition of n outside the loop and the one or more uses of n inside the loop. In general, for a correct dataflow conversion, registers that are live-in into a loop are to be repeated once for each iteration inside the loop body when the register is converted into a LIC. Similarly, registers that are updated inside a loop and are live-out from the loop are to be consumed, e.g., with a single final value sent out of the loop. Loops introduce a wrinkle into the dataflow conversion process, namely that the control for a pick at the top of the loop and the switch for the bottom of the loop are offset. For example, if the loop in FIG. 18A executes three iterations and exits, the control to picker should be 0, 1, 1, while the control to switcher should be 1, 1, 0. This control is implemented by starting the picker channel with an initial extra 0 when the function begins on cycle 0 (which is specified in the assembly by the directives .value 0 and .avail 0), and then copying the output switcher into picker. Note that the last 0 in switcher restores a final 0 into picker, ensuring that the final state of the dataflow graph matches its initial state.

Figure 20A:
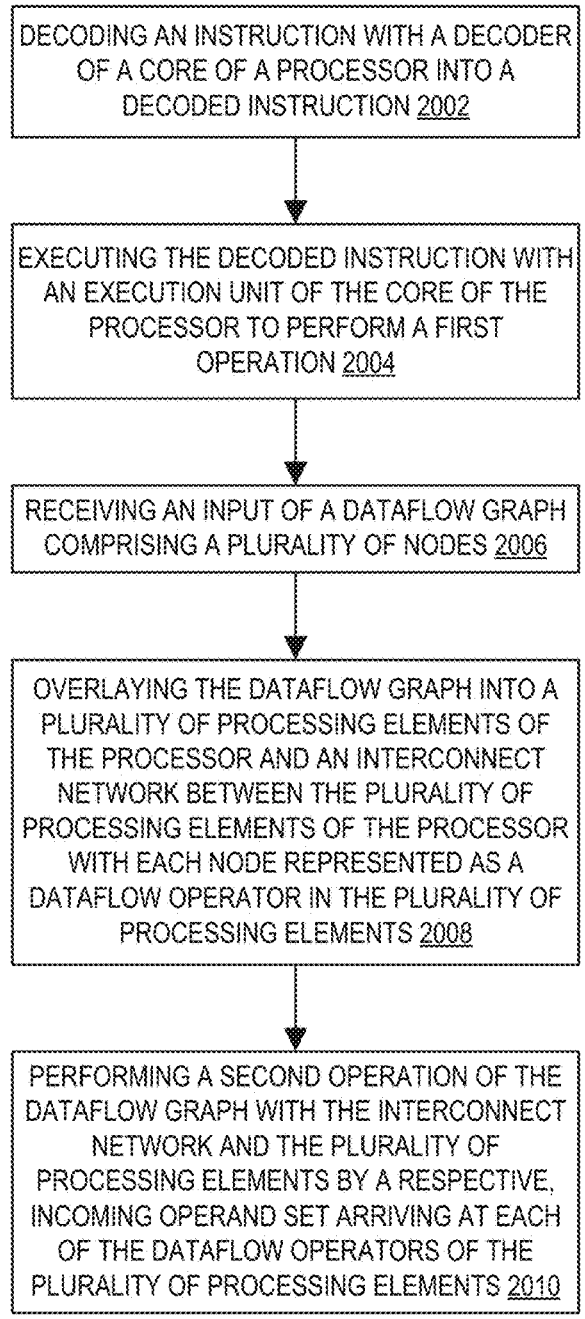
FIG. 20A illustrates a flow diagram according to embodiments of the disclosure.

FIG. 20A illustrates a flow diagram 2000 according to embodiments of the disclosure. Depicted flow 2000 includes decoding an instruction with a decoder of a core of a processor into a decoded instruction 2002; executing the decoded instruction with an execution unit of the core of the processor to perform a first operation 2004; receiving an input of a dataflow graph comprising a plurality of nodes 2006; overlaying the dataflow graph into a plurality of processing elements of the processor and an interconnect network between the plurality of processing elements of the processor with each node represented as a dataflow operator in the plurality of processing elements 2008; and performing a second operation of the dataflow graph with the interconnect network and the plurality of processing elements by a respective, incoming operand set arriving at each of the dataflow operators of the plurality of processing elements 2010.

Figure 20B:
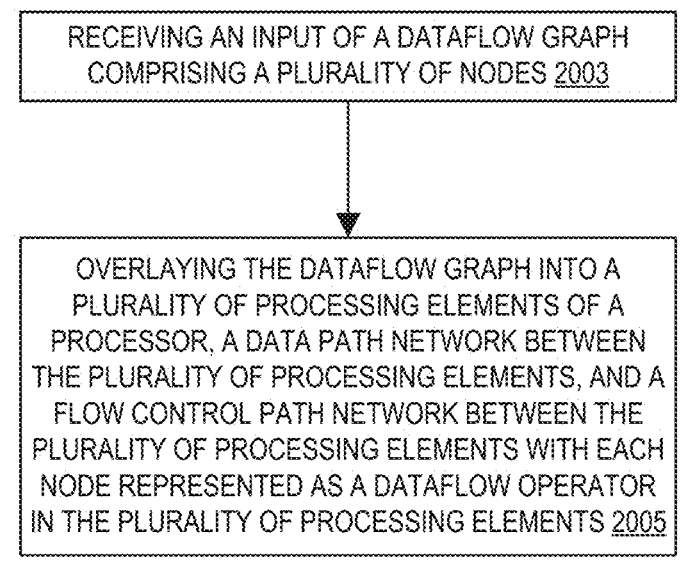
FIG. 20B illustrates a flow diagram according to embodiments of the disclosure.

FIG. 20B illustrates a flow diagram 2001 according to embodiments of the disclosure. Depicted flow 2001 includes receiving an input of a dataflow graph comprising a plurality of nodes 2003; and overlaying the dataflow graph into a plurality of processing elements of a processor, a data path network between the plurality of processing elements, and a flow control path network between the plurality of processing elements with each node represented as a dataflow operator in the plurality of processing elements 2005.

In one embodiment, the core writes a command into a memory queue and a CSA (e.g., the plurality of processing elements) monitors the memory queue and begins executing when the command is read. In one embodiment, the core executes a first part of a program and a CSA (e.g., the plurality of processing elements) executes a second part of the program. In one embodiment, the core does other work while the CSA is executing its operations.

5. CSA Advantages

In certain embodiments, the CSA architecture and microarchitecture provides profound energy, performance, and usability advantages over roadmap processor architectures and FPGAs. In this section, these architectures are compared to embodiments of the CSA and highlights the superiority of CSA in accelerating parallel dataflow graphs relative to each.

5.1 Processors

Figure 21:
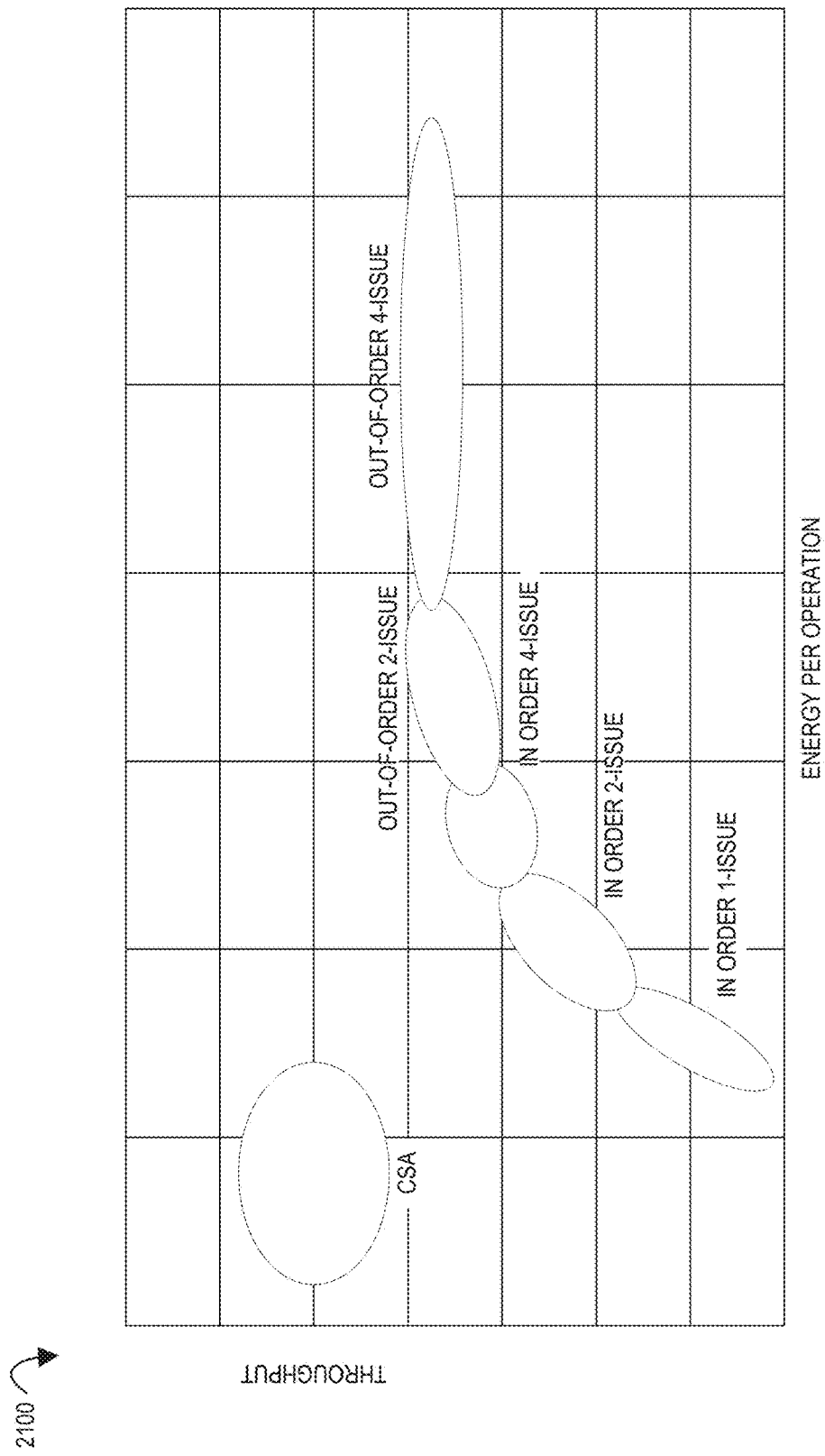
FIG. 21 illustrates a throughput versus energy per operation graph according to embodiments of the disclosure.

FIG. 21 illustrates a throughput versus energy per operation graph 2100 according to embodiments of the disclosure. As shown in FIG. 21, small cores are generally more energy efficient than large cores, and, in some workloads, this advantage may be translated to absolute performance through higher core counts. The CSA microarchitecture follows these observations to their conclusion and removes (e.g., most) energy-hungry control structures associated with von Neumann architectures, including most of the instruction-side microarchitecture. By removing these overheads and implementing simple, single operation PEs, embodiments of a CSA obtains a dense, efficient spatial array. Unlike small cores, which are usually quite serial, a CSA may gang its PEs together, e.g., via the circuit-switched local network, to form explicitly parallel aggregate dataflow graphs. The result is performance in not only parallel applications, but also serial applications as well. Unlike cores, which may pay dearly for performance in terms area and energy, a CSA is already parallel in its native execution model. In certain embodiments, a CSA neither requires speculation to increase performance nor does it need to repeatedly re-extract parallelism from a sequential program representation, thereby avoiding two of the main energy taxes in von Neumann architectures. Most structures in embodiments of a CSA are distributed, small, and energy efficient, as opposed to the centralized, bulky, energy hungry structures found in cores. Consider the case of registers in the CSA: each PE may have a few (e.g., 10 or less) storage registers. Taken individually, these registers may be more efficient that traditional register files. In aggregate, these registers may provide the effect of a large, in-fabric register file. As a result, embodiments of a CSA avoid most of stack spills and fills incurred by classical architectures, while using much less energy per state access. Of course, applications may still access memory. In embodiments of a CSA, memory access request and response are architecturally decoupled, enabling workloads to sustain many more outstanding memory accesses per unit of area and energy. This property yields substantially higher performance for cache-bound workloads and reduces the area and energy needed to saturate main memory in memory-bound workloads. Embodiments of a CSA expose new forms of energy efficiency which are unique to non-von Neumann architectures. One consequence of executing a single operation (e.g., instruction) at a (e.g., most) PEs is reduced operand entropy. In the case of an increment operation, each execution may result in a handful of circuit-level toggles and little energy consumption, a case examined in detail in Section 6.2. In contrast, von Neumann architectures are multiplexed, resulting in large numbers of bit transitions. The asynchronous style of embodiments of a CSA also enables microarchitectural optimizations, such as the floating-point optimizations described in Section 3.5 that are difficult to realize in tightly scheduled core pipelines. Because PEs may be relatively simple and their behavior in a particular dataflow graph be statically known, clock gating and power gating techniques may be applied more effectively than in coarser architectures. The graph-execution style, small size, and malleability of embodiments of CSA PEs and the network together enable the expression many kinds of parallelism: instruction, data, pipeline, vector, memory, thread, and task parallelism may all be implemented. For example, in embodiments of a CSA, one application may use arithmetic units to provide a high degree of address bandwidth, while another application may use those same units for computation. In many cases, multiple kinds of parallelism may be combined to achieve even more performance. Many key HPC operations may be both replicated and pipelined, resulting in orders-of-magnitude performance gains. In contrast, von Neumann-style cores typically optimize for one style of parallelism, carefully chosen by the architects, resulting in a failure to capture all important application kernels. Just as embodiments of a CSA expose and facilitates many forms of parallelism, it does not mandate a particular form of parallelism, or, worse, a particular subroutine be present in an application in order to benefit from the CSA. Many applications, including single-stream applications, may obtain both performance and energy benefits from embodiments of a CSA, e.g., even when compiled without modification. This reverses the long trend of requiring significant programmer effort to obtain a substantial performance gain in singlestream applications. Indeed, in some applications, embodiments of a CSA obtain more performance from functionally equivalent, but less "modern" codes than from their convoluted, contemporary cousins which have been tortured to target vector instructions.

5.2 Comparison of CSA Embodiments and FGPAs

The choice of dataflow operators as the fundamental architecture of embodiments of a CSA differentiates those CSAs from a FGPA, and particularly the CSA is as superior accelerator for HPC dataflow graphs arising from traditional programming languages. Dataflow operators are fundamentally asynchronous. This enables embodiments of a CSA not only to have great freedom of implementation in the microarchitecture, but it also enables them to simply and succinctly accommodate abstract architectural concepts. For example, embodiments of a CSA naturally accommodate many memory microarchitectures, which are essentially asynchronous, with a simple load-store interface. One need only examine an FPGA DRAM controller to appreciate the difference in complexity. Embodiments of a CSA also leverage asynchrony to provide faster and more-fully-featured runtime services like configuration and extraction, which are believed to be four to six orders of magnitude faster than an FPGA. By narrowing the architectural interface, embodiments of a CSA provide control over most timing paths at the microarchitectural level. This allows embodiments of a CSA to operate at a much higher frequency than the more general control mechanism offered in a FPGA. Similarly, clock and reset, which may be architecturally fundamental to FPGAs, are microarchitectural in the CSA, e.g., obviating the need to support them as programmable entities. Dataflow operators may be, for the most part, coarse-grained. By only dealing in coarse operators, embodiments of a CSA improve both the density of the fabric and its energy consumption: CSA executes operations directly rather than emulating them with look-up tables. A second consequence of coarseness is a simplification of the place and route problem. CSA dataflow graphs are many orders of magnitude smaller than FPGA net-lists and place and route time are commensurately reduced in embodiments of a CSA. The significant differences between embodiments of a CSA and a FPGA make the CSA superior as an accelerator, e.g., for dataflow graphs arising from traditional programming languages.

6. Evaluation

The CSA is a novel computer architecture with the potential to provide enormous performance and energy advantages relative to roadmap processors. Consider the case of computing a single strided address for walking across an array. This case may be important in HPC applications, e.g., which spend significant integer effort in computing address offsets. In address computation, and especially strided address computation, one argument is constant and the other varies only slightly per computation. Thus, only a handful of bits per cycle toggle in the majority of cases. Indeed, it may be shown, using a derivation similar to the bound on floating point carry bits described in Section 3.5, that less than two bits of input toggle per computation in average for a stride calculation, reducing energy by 50% over a random toggle distribution. Were a time-multiplexed approach used, much of this energy savings may be lost. In one embodiment, the CSA achieves approximately 3× energy efficiency over a core while delivering an 8× performance gain. The parallelism gains achieved by embodiments of a CSA may result in reduced program run times, yielding a proportionate, substantial reduction in leakage energy. At the PE level, embodiments of a CSA are extremely energy efficient. A second important question for the CSA is whether the CSA consumes a reasonable amount of energy at the tile level. Since embodiments of a CSA are capable of exercising every floating-point PE in the fabric at every cycle, it serves as a reasonable upper bound for energy and power consumption, e.g., such that most of the energy goes into floating point multiply and add.

7. Further CSA Details

This section discusses further details for configuration and exception handling.

7.1 Microarchitecture for Configuring a CSA

This section discloses examples of how to configure a CSA (e.g., fabric), how to achieve this configuration quickly, and how to minimize the resource overhead of configuration. Configuring the fabric quickly may be of preeminent importance in accelerating small portions of a larger algorithm, and consequently in broadening the applicability of a CSA. The section further discloses features that allow embodiments of a CSA to be programmed with configurations of different length.

Embodiments of a CSA (e.g., fabric) may differ from traditional cores in that they make use of a configuration step in which (e.g., large) parts of the fabric are loaded with program configuration in advance of program execution. An advantage of static configuration may be that very little energy is spent at runtime on the configuration, e.g., as opposed to sequential cores which spend energy fetching configuration information (an instruction) nearly every cycle. The previous disadvantage of configuration is that it was a coarse-grained step with a potentially large latency, which places an under-bound on the size of program that can be accelerated in the fabric due to the cost of context switching. This disclosure describes a scalable microarchitecture for rapidly configuring a spatial array in a distributed fashion, e.g., that avoids the previous disadvantages.

As discussed above, a CSA may include light-weight processing elements connected by an inter-PE network. Programs, viewed as control-dataflow graphs, are then mapped onto the architecture by configuring the configurable fabric elements (CFEs), for example PEs and the interconnect (fabric) networks. Generally, PEs may be configured as dataflow operators and once all input operands arrive at the PE, some operation occurs, and the results are forwarded to another PE or PEs for consumption or output. PEs may communicate over dedicated virtual circuits which are formed by statically configuring the circuit-switched communications network. These virtual circuits may be flow controlled and fully back-pressured, e.g., such that PEs will stall if either the source has no data or destination is full. At runtime, data may flow through the PEs implementing the mapped algorithm. For example, data may be streamed in from memory, through the fabric, and then back out to memory. Such a spatial architecture may achieve remarkable performance efficiency relative to traditional multicore processors: compute, in the form of PEs, may be simpler and more numerous than larger cores and communications may be direct, as opposed to an extension of the memory system.

Embodiments of a CSA may not utilize (e.g., software controlled) packet switching, e.g., packet switching that requires significant software assistance to realize, which slows configuration. Embodiments of a CSA include out-of-band signaling in the network (e.g., of only 2-3 bits, depending on the feature set supported) and a fixed configuration topology to avoid the need for significant software support.

One key difference between embodiments of a CSA and the approach used in FPGAs is that a CSA approach may use a wide data word, is distributed, and includes mechanisms to fetch program data directly from memory. Embodiments of a CSA may not utilize JTAG-style single bit communications in the interest of area efficiency, e.g., as that may require milliseconds to completely configure a large FPGA fabric.

Embodiments of a CSA include a distributed configuration protocol and microarchitecture to support this protocol. Initially, configuration state may reside in memory. Multiple (e.g., distributed) local configuration controllers (boxes) (LCCs) may stream portions of the overall program into their local region of the spatial fabric, e.g., using a combination of a small set of control signals and the fabric-provided network. State elements may be used at each CFE to form configuration chains, e.g., allowing individual CFEs to self-program without global addressing.

Embodiments of a CSA include specific hardware support for the formation of configuration chains, e.g., not software establishing these chains dynamically at the cost of increasing configuration time. Embodiments of a CSA are not purely packet-switched and do include extra out-of-band control wires (e.g., control is not sent through the data path requiring extra cycles to strobe this information and reserialize this information). Embodiments of a CSA decreases configuration latency by fixing the configuration ordering and by providing explicit out-of-band control (e.g., by at least a factor of two), while not significantly increasing network complexity.

Embodiments of a CSA do not use a serial mechanism for configuration in which data is streamed bit by bit into the fabric using a JTAG-like protocol. Embodiments of a CSA utilize a coarse-grained fabric approach. In certain embodiments, adding a few control wires or state elements to a 64 or 32-bit-oriented CSA fabric has a lower cost relative to adding those same control mechanisms to a 4 or 6 bit fabric.

Figure 22:
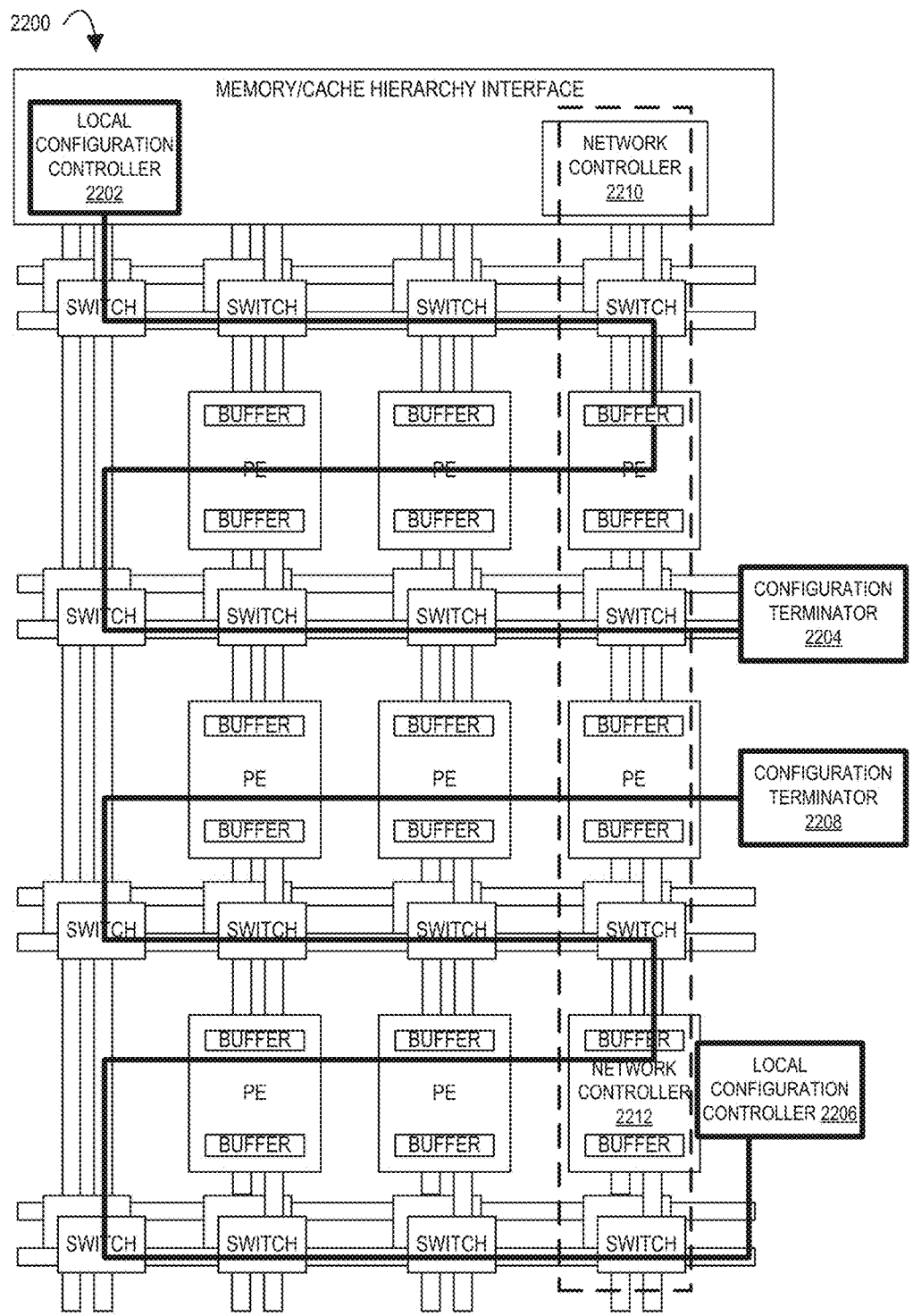
FIG. 22 illustrates an accelerator tile comprising an array of processing elements and a local configuration controller according to embodiments of the disclosure.

FIG. 22 illustrates an accelerator tile 2200 comprising an array of processing elements (PE) and a local configuration controller (2202, 2206) according to embodiments of the disclosure. Each PE, each network controller, and each switch may be a configurable fabric elements (CFEs), e.g., which are configured (e.g., programmed) by embodiments of the CSA architecture.

Embodiments of a CSA include hardware that provides for efficient, distributed, low-latency configuration of a heterogeneous spatial fabric. This may be achieved according to four techniques. First, a hardware entity, the local configuration controller (LCC) is utilized, for example, as in FIGS. 22-24. An LCC may fetch a stream of configuration information from (e.g., virtual) memory. Second, a configuration data path may be included, e.g., that is as wide as the native width of the PE fabric and which may be overlaid on top of the PE fabric. Third, new control signals may be received into the PE fabric which orchestrate the configuration process. Fourth, state elements may be located (e.g., in a register) at each configurable endpoint which track the status of adjacent CFEs, allowing each CFE to unambiguously self-configure without extra control signals. These four microarchitectural features may allow a CSA to configure chains of its CFEs. To obtain low configuration latency, the configuration may be partitioned by building many LCCs and CFE chains. At configuration time, these may operate independently to load the fabric in parallel, e.g., dramatically reducing latency. As a result of these combinations, fabrics configured using embodiments of a CSA architecture, may be completely configured (e.g., in hundreds of nanoseconds). In the following, the detailed the operation of the various components of embodiments of a CSA configuration network are disclosed.

Figure 23A:
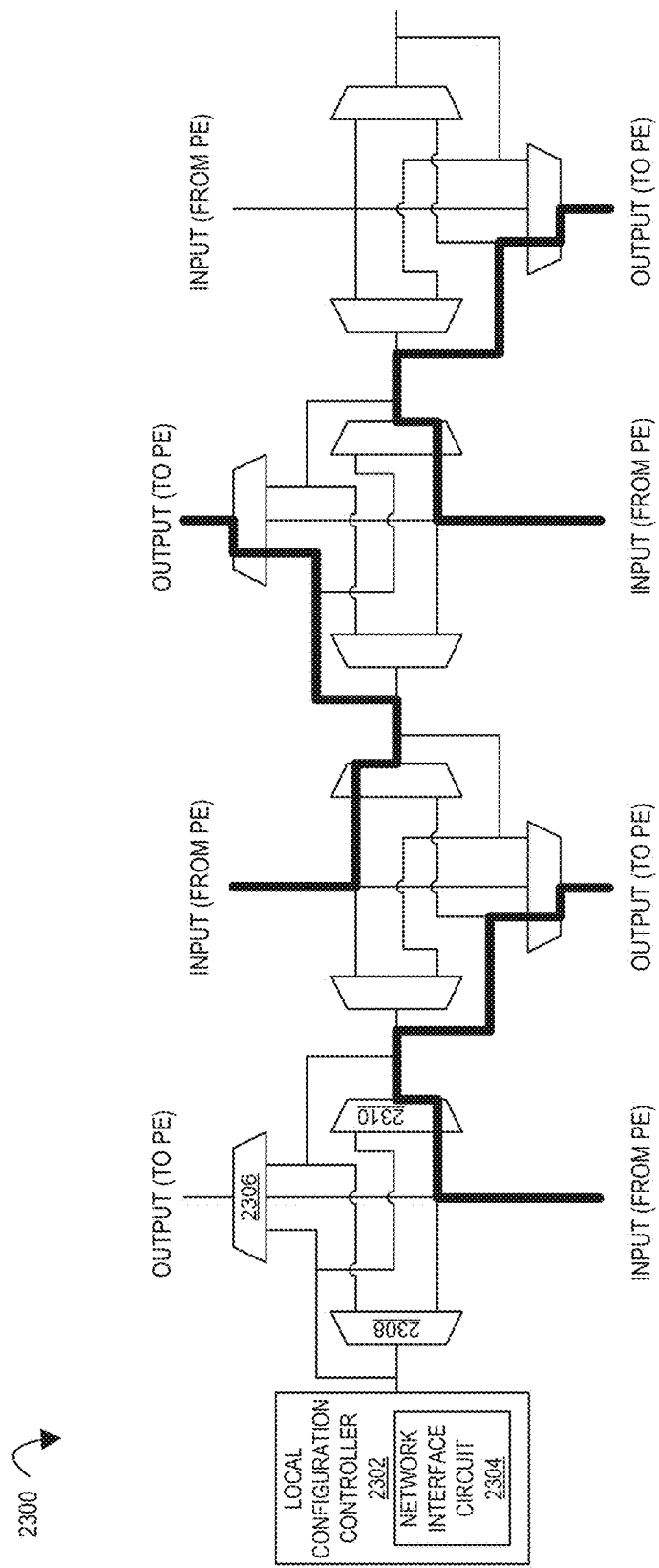
Figure 23B:
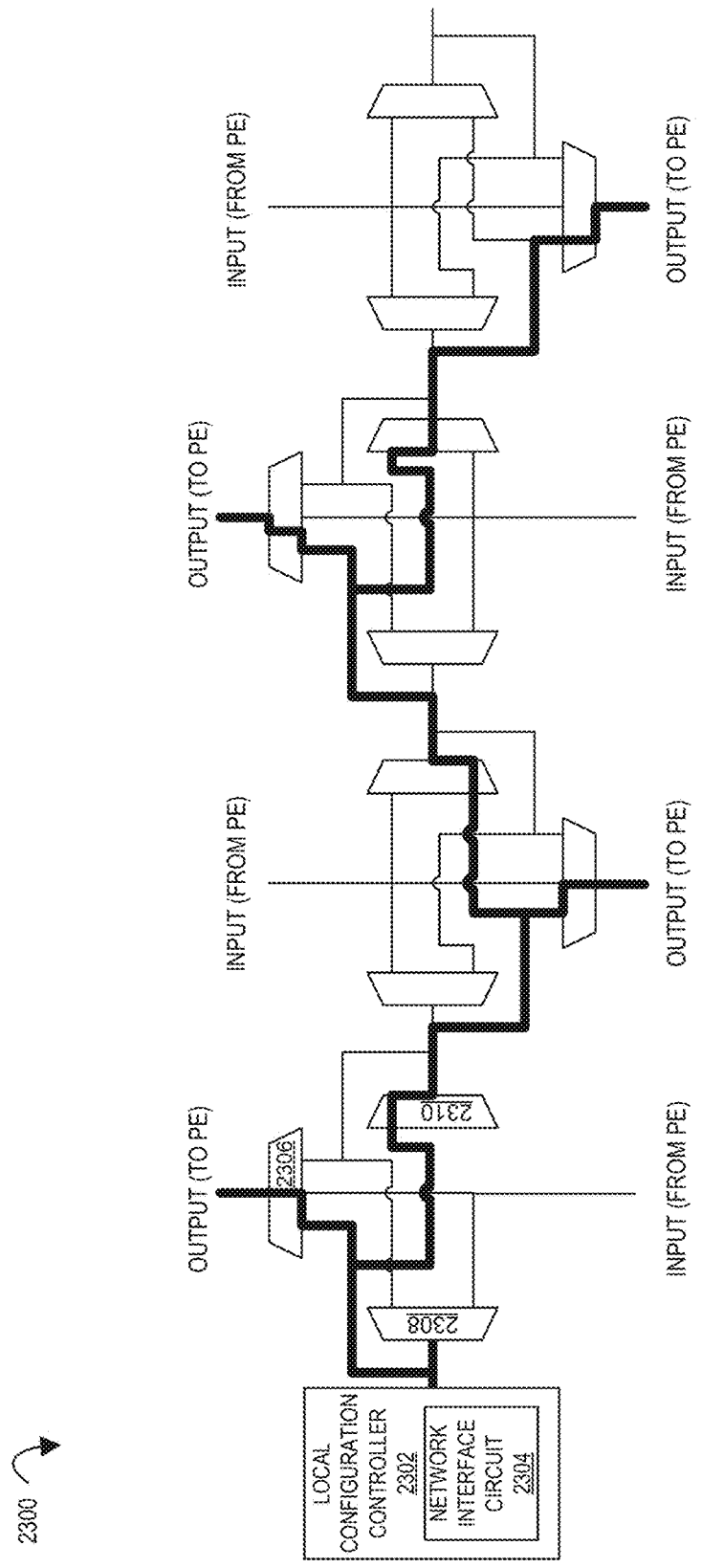

FIGS. 23A-23C illustrate a local configuration controller 2302 configuring a data path network according to embodiments of the disclosure. Depicted network includes a plurality of multiplexers (e.g., multiplexers 2306, 2308, 2310) that may be configured (e.g., via their respective control signals) to connect one or more data paths (e.g., from PEs) together. FIG. 23A illustrates the network 2300 (e.g., fabric) configured (e.g., set) for some previous operation or program. FIG. 23B illustrates the local configuration controller 2302 (e.g., including a network interface circuit 2304 to send and/or receive signals) strobing a configuration signal and the local network is set to a default configuration (e.g., as depicted) that allows the LCC to send configuration data to all configurable fabric elements (CFEs), e.g., muxes. FIG. 23C illustrates the LCC strobing configuration information across the network, configuring CFEs in a predetermined (e.g., silicon-defined) sequence. In one embodiment, when CFEs are configured they may begin operation immediately. In another embodiment, the CFEs wait to begin operation until the fabric has been completely configured (e.g., as signaled by configuration terminator (e.g., configuration terminator 2504 and configuration terminator 2508 in FIG. 25) for each local configuration controller). In one embodiment, the LCC obtains control over the network fabric by sending a special message, or driving a signal. It then strobes configuration data (e.g., over a period of many cycles) to the CFEs in the fabric. In these figures, the multiplexor networks are analogues of the "Switch" shown in certain Figures (e.g., FIG. 6).

Local Configuration Controller

Figure 24:
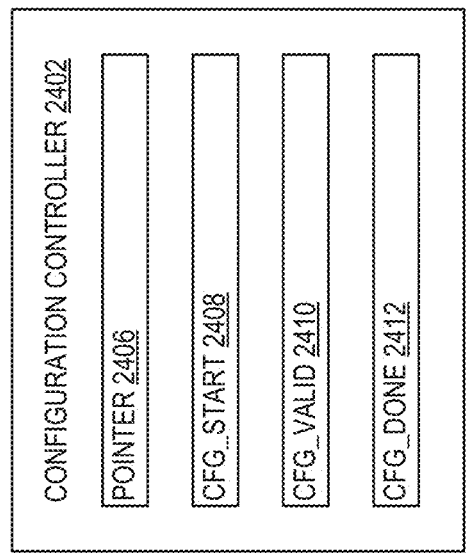
FIG. 24 illustrates a configuration controller according to embodiments of the disclosure.

FIG. 24 illustrates a (e.g., local) configuration controller 2402 according to embodiments of the disclosure. A local configuration controller (LCC) may be the hardware entity which is responsible for loading the local portions (e.g., in a subset of a tile or otherwise) of the fabric program, interpreting these program portions, and then loading these program portions into the fabric by driving the appropriate protocol on the various configuration wires. In this capacity, the LCC may be a special-purpose, sequential microcontroller.

LCC operation may begin when it receives a pointer to a code segment. Depending on the LCC microarchitecture, this pointer (e.g., stored in pointer register 2406) may come either over a network (e.g., from within the CSA (fabric) itself) or through a memory system access to the LCC. When it receives such a pointer, the LCC optionally drains relevant state from its portion of the fabric for context storage, and then proceeds to immediately reconfigure the portion of the fabric for which it is responsible. The program loaded by the LCC may be a combination of configuration data for the fabric and control commands for the LCC, e.g., which are lightly encoded. As the LCC streams in the program portion, it may interpret the program as a command stream and perform the appropriate encoded action to configure (e.g., load) the fabric.

Two different microarchitectures for the LCC are shown in FIG. 22, e.g., with one or both being utilized in a CSA. The first places the LCC 2202 at the memory interface. In this case, the LCC may make direct requests to the memory system to load data. In the second case, the LCC 2206 is placed on a memory network, in which it may make requests to the memory only indirectly. In both cases, the logical operation of the LCC is unchanged. In one embodiment, an LCCs is informed of the program to load, for example, by a set of (e.g., OS-visible) control-status-registers which will be used to inform individual LCCs of new program pointers, etc.

Extra Out-of-Band Control Channels (e.g., Wires)

In certain embodiments, configuration relies on 2-8 extra, out-of-band control channels to improve configuration speed, as defined below. For example, configuration controller 2402 may include the following control channels, e.g., CFG_START control channel 2408, CFG_VALID control channel 2410, and CFG_DONE control channel 2412, with examples of each discussed in Table 2 below.

TABLE 2

Control Channels

| | |
|---|---|
| CFC_START | Asserted at beginning of configuration. Sets configuration state at each CFE and sets the configuration bus. |
| CFG_VALID | Denotes validity of values on confiqurat on bus. |
| CFG_DONE | Optional. Denotes completion of the configuration of a particular CFE. This allows configuraton to be short circuited in case a CFE does not require additional configuration |

Generally, the handling of configuration information may be left to the implementer of a particular CFE. For example, a selectable function CFE may have a provision for setting registers using an existing data path, while a fixed function CFE might simply set a configuration register.

Due to long wire delays when programming a large set of CFEs, the CFG_VALID signal may be treated as a clock/latch enable for CFE components. Since this signal is used as a clock, in one embodiment the duty cycle of the line is at most 50%. As a result, configuration throughput is approximately halved. Optionally, a second CFG_VALID signal may be added to enable continuous programming.

In one embodiment, only CFG_START is strictly communicated on an independent coupling (e.g., wire), for example, CFG_VALID and CFG_DONE may be overlaid on top of other network couplings.

Reuse of Network Resources

To reduce the overhead of configuration, certain embodiments of a CSA make use of existing network infrastructure to communicate configuration data. A LCC may make use of both a chip-level memory hierarchy and a fabric-level communications networks to move data from storage into the fabric. As a result, in certain embodiments of a CSA, the configuration infrastructure adds no more than 2% to the overall fabric area and power.

Reuse of network resources in certain embodiments of a CSA may cause a network to have some hardware support for a configuration mechanism. Circuit switched networks of embodiments of a CSA cause an LCC to set their multiplexors in a specific way for configuration when the 'CFG_START' signal is asserted. Packet-switched networks do not require extension, although LCC endpoints (e.g., configuration terminators) use a specific address in the packet switched network. Network reuse is optional, and some embodiments may find dedicated configuration buses to be more convenient.

Per CFE State

Each CFE may maintain a bit denoting whether or not it has been configured (see, e.g., FIG. 13). This bit may be de-asserted when the configuration start signal is driven, and then asserted once the particular CFE has been configured. In one configuration protocol, CFEs are arranged to form chains with the CFE configuration state bit determining the topology of the chain. A CFE may read the configuration state bit of the immediately adjacent CFE. If this adjacent CFE is configured and the current CFE is not configured, the CFE may determine that any current configuration data is targeted at the current CFE. When the 'CFG_DONE' signal is asserted, the CFE may set its configuration bit, e.g., enabling upstream CFEs to configure. As a base case to the configuration process, a configuration terminator (e.g., configuration terminator 2204 for LCC 2202 or configuration terminator 2208 for LCC 2206 in FIG. 22) which asserts that it is configured may be included at the end of a chain.

Internal to the CFE, this bit may be used to drive flow control ready signals. For example, when the configuration bit is de-asserted, network control signals may automatically be clamped to a value that prevent data from flowing, while, within PEs, no operations or other actions will be scheduled.

Dealing with High-Delay Configuration Paths

One embodiment of an LCC may drive a signal over a long distance, e.g., through many multiplexors and with many loads. Thus, it may be difficult for a signal to arrive at a distant CFE within a short clock cycle. In certain embodiments, configuration signals are at some division (e.g., fraction of) of the main (e.g., CSA) clock frequency to ensure digital timing discipline at configuration. Clock division may be utilized in an out-of-band signaling protocol, and does not require any modification of the main clock tree.

Ensuring Consistent Fabric Behavior During Configuration

Since certain configuration schemes are distributed and have non-deterministic timing due to program and memory effects, different portions of the fabric may be configured at different times. As a result, certain embodiments of a CSA provide mechanisms to prevent inconsistent operation among configured and unconfigured CFEs. Generally, consistency is viewed as a property required of and maintained by CFEs themselves, e.g., using the internal CFE state. For example, when a CFE is in an unconfigured state, it may claim that its input buffers are full, and that its output is invalid. When configured, these values will be set to the true state of the buffers. As enough of the fabric comes out of configuration, these techniques may permit it to begin operation. This has the effect of further reducing context-switching latency, e.g., if long-latency memory requests are issued early.

Variable-Width Configuration

Different CFEs may have different configuration word widths. For smaller CFE configuration words, implementers may balance delay by equitably assigning CFE configuration loads across the network wires. To balance loading on network wires, one option is to assign configuration bits to different portions of network wires to limit the net delay on any one wire. Wide data words may be handled by using serialization/deserialization techniques. These decisions may be taken on a per-fabric basis to optimize the behavior of a specific CSA (e.g., fabric). Network controller (e.g., one or more of network controller 2210 and network controller 2212 may communicate with each domain (e.g., subset) of the CSA (e.g., fabric), for example, to send configuration information to one or more LCCs.

7.2 Microarchitecture for Low Latency Configuration of a CSA and for Timely Fetching of Configuration Data for a CSA Embodiments of a CSA may be an energy-efficient and high-performance means of accelerating user applications. When considering whether a program (e.g., a dataflow graph thereof) may be successfully accelerated by an accelerator, both the time to configure the accelerator and the time to run the program may be considered. If the run time is short, then the configuration time may play a large role in determining successful acceleration. Therefore, to maximize the domain of accelerable programs, in some embodiments the configuration time is made as short as possible. One or more configuration caches may be included in a CSA, e.g., such that the high bandwidth, low-latency store enables rapid reconfiguration. Next is a description of several embodiments of a configuration cache.

In one embodiment, during configuration, the configuration hardware (e.g., LCC) optionally accesses the configuration cache to obtain new configuration information. The configuration cache may operate either as a traditional address based cache, or in an OS managed mode, in which configurations are stored in the local address space and addressed by reference to that address space. If configuration state is located in the cache, then no requests to the backing store are to be made in certain embodiments. In certain embodiments, this configuration cache is separate from any (e.g., lower level) shared cache in the memory hierarchy.

Figure 25:
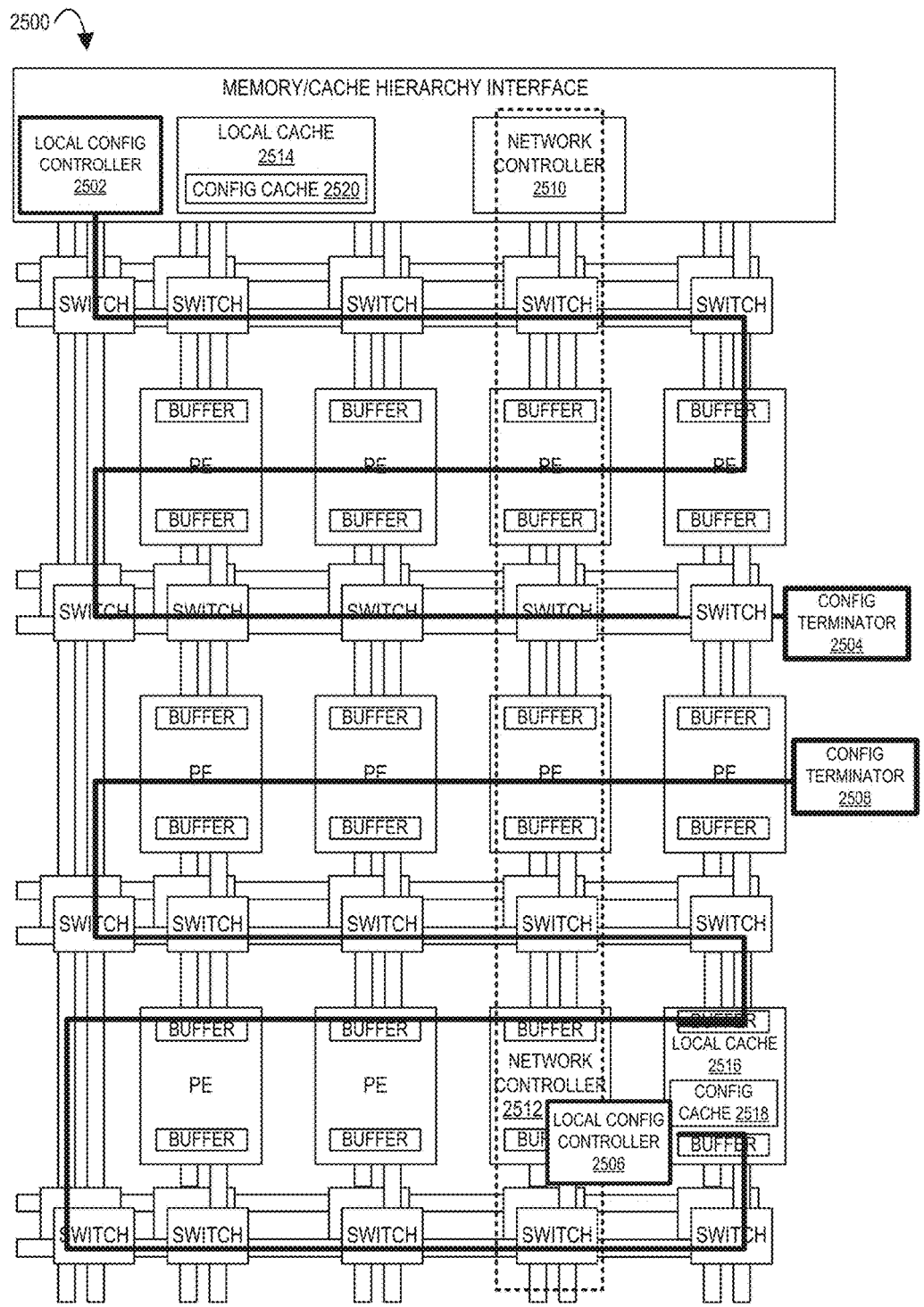
FIG. 25 illustrates an accelerator tile comprising an array of processing elements, a configuration cache, and a local configuration controller according to embodiments of the disclosure.

FIG. 25 illustrates an accelerator tile 2500 comprising an array of processing elements, a configuration cache (e.g., 2518 or 2520), and a local configuration controller (e.g., 2502 or 2506) according to embodiments of the disclosure. In one embodiment, configuration cache 2514 is co-located with local configuration controller 2502. In one embodiment, configuration cache 2518 is located in the configuration domain of local configuration controller 2506, e.g., with a first domain ending at configuration terminator 2504 and a second domain ending at configuration terminator 2508). A configuration cache may allow a local configuration controller may refer to the configuration cache during configuration, e.g., in the hope of obtaining configuration state with lower latency than a reference to memory. A configuration cache (storage) may either be dedicated or may be accessed as a configuration mode of an in-fabric storage element, e.g., local cache 2516.

Caching Modes

1. Demand Caching—In this mode, the configuration cache operates as a true cache. The configuration controller issues address-based requests, which are checked against tags in the cache. Misses are loaded into the cache and then may be re-referenced during future reprogramming.
2. In-Fabric Storage (Scratchpad) Caching—In this mode the configuration cache receives a reference to a configuration sequence in its own, small address space, rather than the larger address space of the host. This may improve memory density since the portion of cache used to store tags may instead be used to store configuration.

In certain embodiments, a configuration cache may have the configuration data pre-loaded into it, e.g., either by external direction or internal direction. This may allow reduction in the latency to load programs. Certain embodiments herein provide for an interface to a configuration cache which permits the loading of new configuration state into the cache, e.g., even if a configuration is running in the fabric already. The initiation of this load may occur from either an internal or external source. Embodiments of a pre-loading mechanism further reduce latency by removing the latency of cache loading from the configuration path.

Pre Fetching Modes

1. Explicit Prefetching—A configuration path is augmented with a new command, ConfigurationCachePrefetch. Instead of programming the fabric, this command simply causes a load of the relevant program configuration into a configuration cache, without programming the fabric. Since this mechanism piggybacks on the existing configuration infrastructure, it is exposed both within the fabric and externally, e.g., to cores and other entities accessing the memory space.
2. Implicit prefetching—A global configuration controller may maintain a prefetch predictor, and use this to initiate the explicit prefetching to a configuration cache, e.g., in an automated fashion.

7.3 Hardware for Rapid Reconfiguration of a CSA in Response to an Exception

Certain embodiments of a CSA (e.g., a spatial fabric) include large amounts of instruction and configuration state, e.g., which is largely static during the operation of the CSA. Thus, the configuration state may be vulnerable to soft errors. Rapid and error-free recovery of these soft errors may be critical to the long-term reliability and performance of spatial systems. Certain embodiments herein provide for a rapid configuration recovery loop, e.g., in which configuration errors are detected and portions of the fabric immediately reconfigured. Certain embodiments herein include a configuration controller, e.g., with reliability, availability, and serviceability (RAS) reprogramming features. Certain embodiments of CSA include circuitry for high-speed configuration, error reporting, and parity checking within the spatial fabric. Using a combination of these three features, and optionally, a configuration cache, a configuration/exception handling circuit may recover from soft errors in configuration. When detected, soft errors may be conveyed to a configuration cache which initiates an immediate reconfiguration of (e.g., that portion of) the fabric. Certain embodiments provide for a dedicated reconfiguration circuit, e.g., which is faster than any solution that would be indirectly implemented in the fabric. In certain embodiments, co-located exception and configuration circuit cooperates to reload the fabric on configuration error detection.

Figure 26:
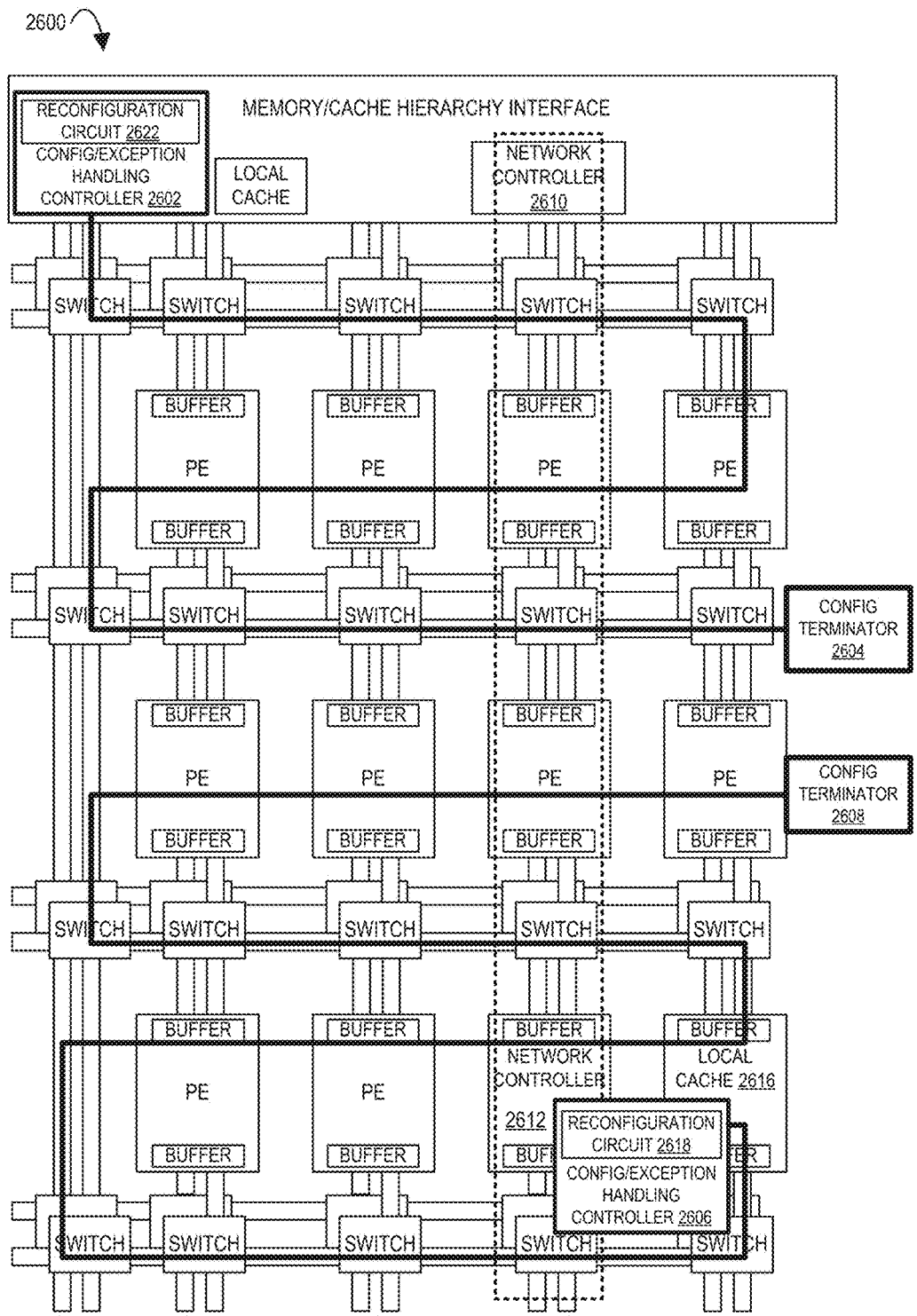
FIG. 26 illustrates an accelerator tile comprising an array of processing elements and a configuration and exception handling controller with a reconfiguration circuit according to embodiments of the disclosure.

FIG. 26 illustrates an accelerator tile 2600 comprising an array of processing elements and a configuration and exception handling controller (2602, 2606) with a reconfiguration circuit (2618, 2622) according to embodiments of the disclosure. In one embodiment, when a PE detects a configuration error through its local RAS features, it sends a (e.g., configuration error or reconfiguration error) message by its exception generator to the configuration and exception handling controller (e.g., 2602 or 2606). On receipt of this message, the configuration and exception handling controller (e.g., 2602 or 2606) initiates the co-located reconfiguration circuit (e.g., 2618 or 2622, respectively) to reload configuration state. The configuration microarchitecture proceeds and reloads (e.g., only) configurations state, and in certain embodiments, only the configuration state for the PE reporting the RAS error. Upon completion of reconfiguration, the fabric may resume normal operation. To decrease latency, the configuration state used by the configuration and exception handling controller (e.g., 2602 or 2606) may be sourced from a configuration cache. As a base case to the configuration or reconfiguration process, a configuration terminator (e.g., configuration terminator 2604 for configuration and exception handling controller 2602 or configuration terminator 2608 for configuration and exception handling controller 2606) in FIG. 26) which asserts that it is configured (or reconfigures) may be included at the end of a chain.

Figure 27:
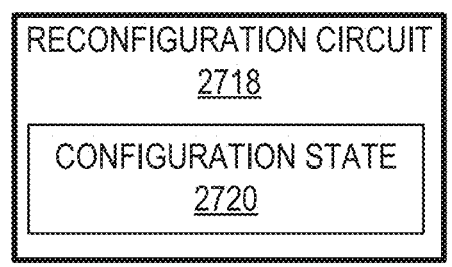
FIG. 27 illustrates a reconfiguration circuit according to embodiments of the disclosure.

FIG. 27 illustrates a reconfiguration circuit 2718 according to embodiments of the disclosure. Reconfiguration circuit 2718 includes a configuration state register 2720 to store the configuration state (or a pointer thereto).

7.4 Hardware for Fabric-Initiated Reconfiguration of a CSA

Some portions of an application targeting a CSA (e.g., spatial array) may be run infrequently or may be mutually exclusive with other parts of the program. To save area, to improve performance, and/or reduce power, it may be useful to time multiplex portions of the spatial fabric among several different parts of the program dataflow graph. Certain embodiments herein include an interface by which a CSA (e.g., via the spatial program) may request that part of the fabric be reprogrammed. This may enable the CSA to dynamically change itself according to dynamic control flow. Certain embodiments herein allow for fabric initiated reconfiguration (e.g., reprogramming). Certain embodiments herein provide for a set of interfaces for triggering configuration from within the fabric. In some embodiments, a PE issues a reconfiguration request based on some decision in the program dataflow graph. This request may travel a network to our new configuration interface, where it triggers reconfiguration. Once reconfiguration is completed, a message may optionally be returned notifying of the completion. Certain embodiments of a CSA thus provide for a program (e.g., dataflow graph) directed reconfiguration capability.

Figure 28:
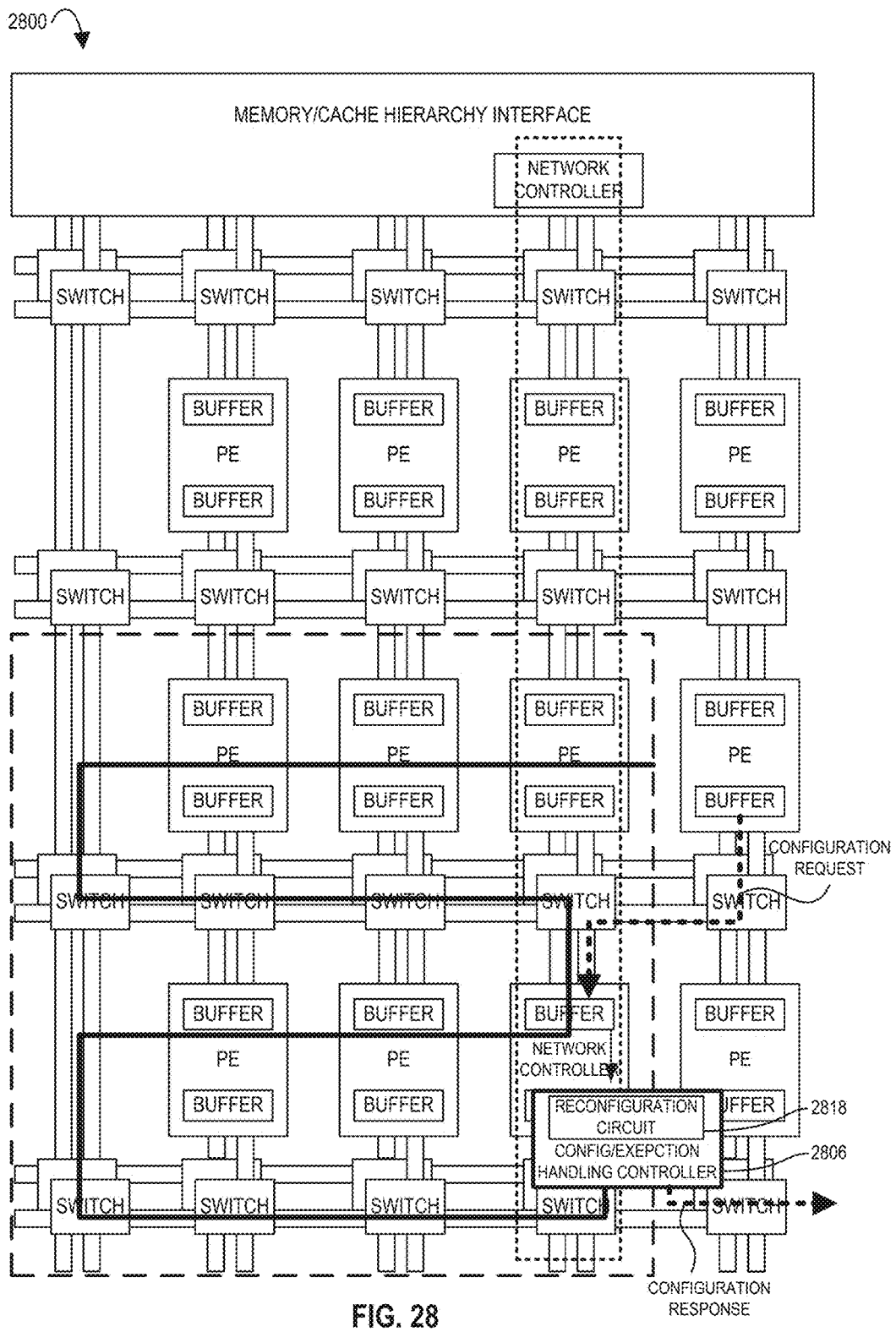
FIG. 28 illustrates an accelerator tile comprising an array of processing elements and a configuration and exception handling controller with a reconfiguration circuit according to embodiments of the disclosure.

FIG. 28 illustrates an accelerator tile 2800 comprising an array of processing elements and a configuration and exception handling controller 2806 with a reconfiguration circuit 2818 according to embodiments of the disclosure. Here, a portion of the fabric issues a request for (re)configuration to a configuration domain, e.g., of configuration and exception handling controller 2806 and/or reconfiguration circuit 2818. The domain (re)configures itself, and when the request has been satisfied, the configuration and exception handling controller 2806 and/or reconfiguration circuit 2818 issues a response to the fabric, to notify the fabric that (re)configuration is complete. In one embodiment, configuration and exception handling controller 2806 and/or reconfiguration circuit 2818 disables communication during the time that (re)configuration is ongoing, so the program has no consistency issues during operation.

Configuration Modes

Configure-by-address—In this mode, the fabric makes a direct request to load configuration data from a particular address.

Configure-by-reference—In this mode the fabric makes a request to load a new configuration, e.g., by a pre-determined reference ID. This may simplify the determination of the code to load, since the location of the code has been abstracted.

Configuring Multiple Domains

A CSA may include a higher level configuration controller to support a multicast mechanism to cast (e.g., via network indicated by the dotted box) configuration requests to multiple (e.g., distributed or local) configuration controllers. This may enable a single configuration request to be replicated across larger portions of the fabric, e.g., triggering a broad reconfiguration.

7.5 Exception Aggregators

Certain embodiments of a CSA may also experience an exception (e.g., exceptional condition), for example, floating point underflow. When these conditions occur, a special handler may be invoked to either correct the program or to terminate it. Certain embodiments herein provide for a system-level architecture for handling exceptions in spatial fabrics. Since certain spatial fabrics emphasize area efficiency, embodiments herein minimize total area while providing a general exception mechanism. Certain embodiments herein provides a low area means of signaling exceptional conditions occurring in within a CSA (e.g., a spatial array). Certain embodiments herein provide an interface and signaling protocol for conveying such exceptions, as well as a PE-level exception semantics. Certain embodiments herein are dedicated exception handling capabilities, e.g., and do not require explicit handling by the programmer.

Figure 29:
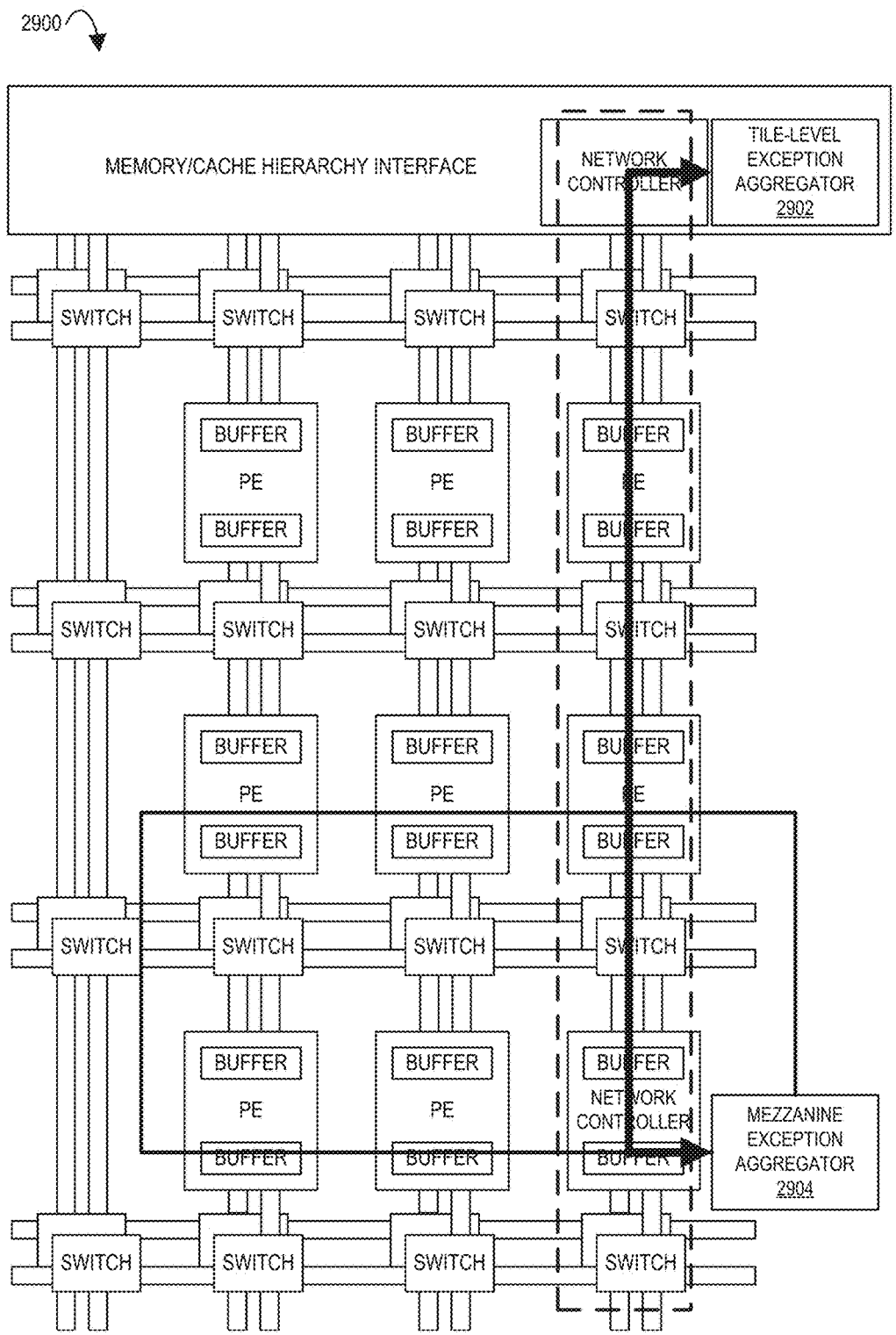
FIG. 29 illustrates an accelerator tile comprising an array of processing elements and a mezzanine exception aggregator coupled to a tile-level exception aggregator according to embodiments of the disclosure.
Figure 30:
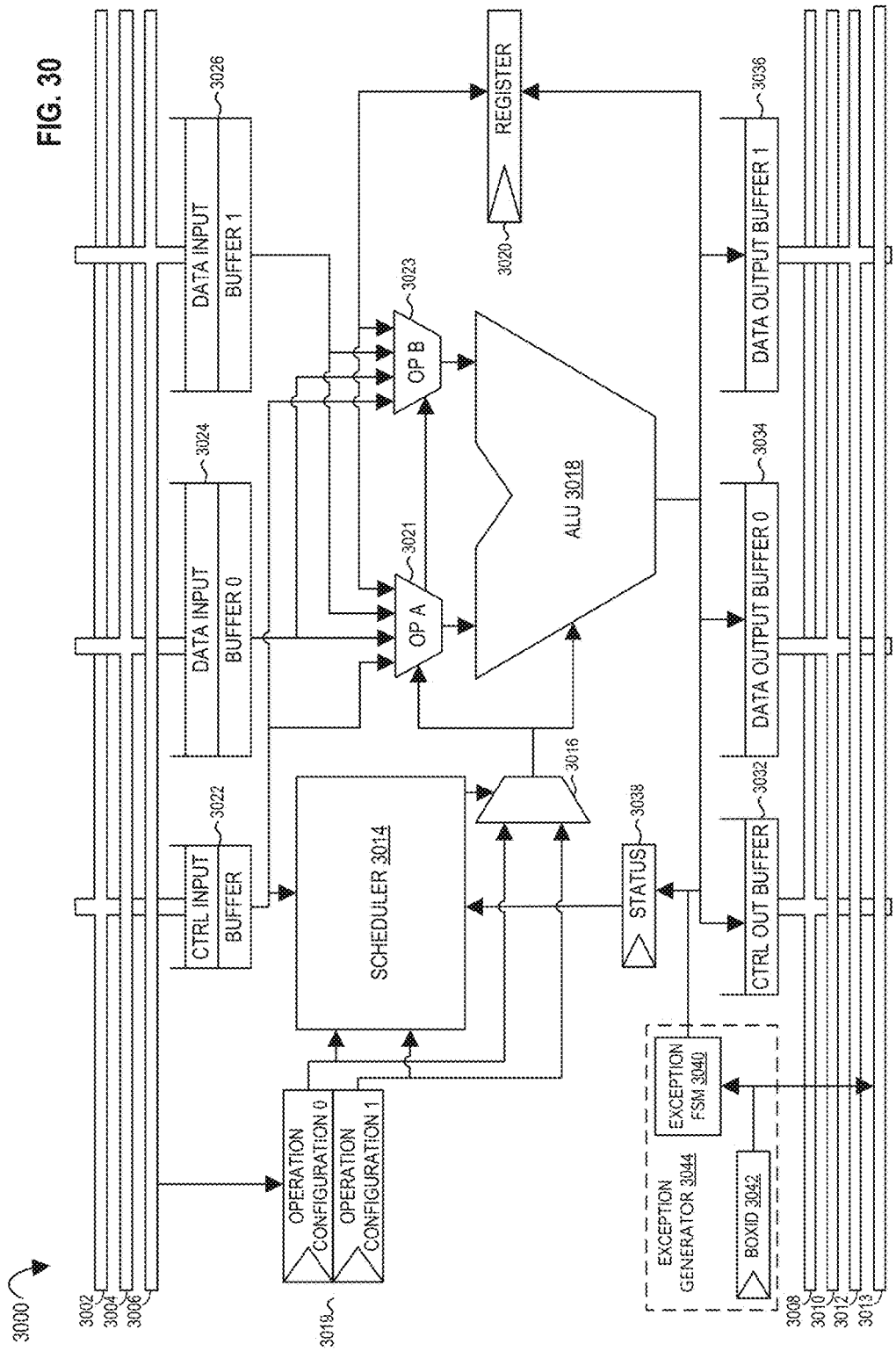
FIG. 30 illustrates a processing element with an exception generator according to embodiments of the disclosure.

One embodiment of a CSA exception architecture consists of four portions, e.g., shown in FIGS. 29-30. These portions may be arranged in a hierarchy, in which exceptions flow from the producer, and eventually up to the tile-level exception aggregator (e.g., handler), which may rendezvous with an exception servicer, e.g., of a core. The four portions may be:

1. PE Exception Generator
2. Local Exception Network
3. Mezzanine Exception Aggregator
4. Tile-Level Exception Aggregator FIG. 29 illustrates an accelerator tile 2900 comprising an array of processing elements and a mezzanine exception aggregator 2902 coupled to a tile-level exception aggregator 2904 according to embodiments of the disclosure. FIG. 30 illustrates a processing element 3000 with an exception generator 3044 according to embodiments of the disclosure.

PE Exception Generator

Processing element 3000 may include processing element 900 from FIG. 9A, for example, with similar numbers being similar components, e.g., local network 902 and local network 3002. Additional network 3013 (e.g., channel) may be an exception network. APE may implement an interface to an exception network (e.g., exception network 3013 (e.g., channel) on FIG. 30). For example, FIG. 30 shows the microarchitecture of such an interface, wherein the PE has an exception generator 3044 (e.g., initiate an exception finite state machine (FSM) 3040 to strobe an exception packet (e.g., BOXID 3042) out on to the exception network.

BOXID 3042 may be a unique identifier for an exception producing entity (e.g., a PE or box) within a local exception network. When an exception is detected, exception generator 3044 senses the exception network and strobes out the BOXID when the network is found to be free. Exceptions may be caused by many conditions, for example, but not limited to, arithmetic error, failed ECC check on state, etc. however, it may also be that an exception dataflow operation is introduced, with the idea of support constructs like breakpoints.

The initiation of the exception may either occur explicitly, by the execution of a programmer supplied instruction, or implicitly when a hardened error condition (e.g., a floating-point underflow) is detected. Upon an exception, the PE 3000 may enter a waiting state, in which it waits to be serviced by the eventual exception handler, e.g., external to the PE 3000. The contents of the exception packet depend on the implementation of the particular PE, as described below.

Local Exception Network

A (e.g., local) exception network steers exception packets from PE 3000 to the mezzanine exception network. Exception network (e.g., 3013) may be a serial, packet switched network consisting of a (e.g., single) control wire and one or more data wires, e.g., organized in a ring or tree topology, e.g., for a subset of PEs. Each PE may have a (e.g., ring) stop in the (e.g., local) exception network, e.g., where it can arbitrate to inject messages into the exception network.

PE endpoints needing to inject an exception packet may observe their local exception network egress point. If the control signal indicates busy, the PE is to wait to commence inject its packet. If the network is not busy, that is, the downstream stop has no packet to forward, then the PE will proceed commence injection.

Network packets may be of variable or fixed length. Each packet may begin with a fixed length header field identifying the source PE of the packet. This may be followed by a variable number of PE-specific field containing information, for example, including error codes, data values, or other useful status information.

Mezzanine Exception Aggregator

The mezzanine exception aggregator 2904 is responsible for assembling local exception network into larger packets and sending them to the tile-level exception aggregator 2902. The mezzanine exception aggregator 2904 may prepend the local exception packet with its own unique ID, e.g., ensuring that exception messages are unambiguous. The mezzanine exception aggregator 2904 may interface to a special exception-only virtual channel in the mezzanine network, e.g., ensuring the deadlock-freedom of exceptions.

The mezzanine exception aggregator 2904 may also be able to directly service certain classes of exception. For example, a configuration request from the fabric may be served out of the mezzanine network using caches local to the mezzanine network stop.

Tile-Level Exception Aggregator

The final stage of the exception system is the tile-level exception aggregator 2902. The tile-level exception aggregator 2902 is responsible for collecting exceptions from the various mezzanine-level exception aggregators (e.g., 2904) and forwarding them to the appropriate servicing hardware (e.g., core). As such, the tile-level exception aggregator 2902 may include some internal tables and controller to associate particular messages with handler routines. These tables may be indexed either directly or with a small state machine in order to steer particular exceptions.

Like the mezzanine exception aggregator, the tile-level exception aggregator may service some exception requests. For example, it may initiate the reprogramming of a large portion of the PE fabric in response to a specific exception.

7.6 Extraction Controllers

Certain embodiments of a CSA include an extraction controller(s) to extract data from the fabric. The below discusses embodiments of how to achieve this extraction quickly and how to minimize the resource overhead of data extraction. Data extraction may be utilized for such critical tasks as exception handling and context switching. Certain embodiments herein extract data from a heterogeneous spatial fabric by introducing features that allow extractable fabric elements (EFEs) (for example, PEs, network controllers, and/or switches) with variable and dynamically variable amounts of state to be extracted.

Embodiments of a CSA include a distributed data extraction protocol and microarchitecture to support this protocol. Certain embodiments of a CSA include multiple local extraction controllers (LECs) which stream program data out of their local region of the spatial fabric using a combination of a (e.g., small) set of control signals and the fabric-provided network. State elements may be used at each extractable fabric element (EFE) to form extraction chains, e.g., allowing individual EFEs to self-extract without global addressing.

Embodiments of a CSA do not use a local network to extract program data. Embodiments of a CSA include specific hardware support (e.g., an extraction controller) for the formation of extraction chains, for example, and do not rely on software to establish these chains dynamically, e.g., at the cost of increasing extraction time. Embodiments of a CSA are not purely packet-switched and do include extra out-of-band control wires (e.g., control is not sent through the data path requiring extra cycles to strobe and reserialize this information). Embodiments of a CSA decrease extraction latency by fixing the extraction ordering and by providing explicit out-of-band control (e.g., by at least a factor of two), while not significantly increasing network complexity.

Embodiments of a CSA do not use a serial mechanism for data extraction, in which data is streamed bit by bit from the fabric using a JTAG-like protocol. Embodiments of a CSA utilize a coarse-grained fabric approach. In certain embodiments, adding a few control wires or state elements to a 64 or 32-bit-oriented CSA fabric has a lower cost relative to adding those same control mechanisms to a 4 or 6 bit fabric.

Figure 31:
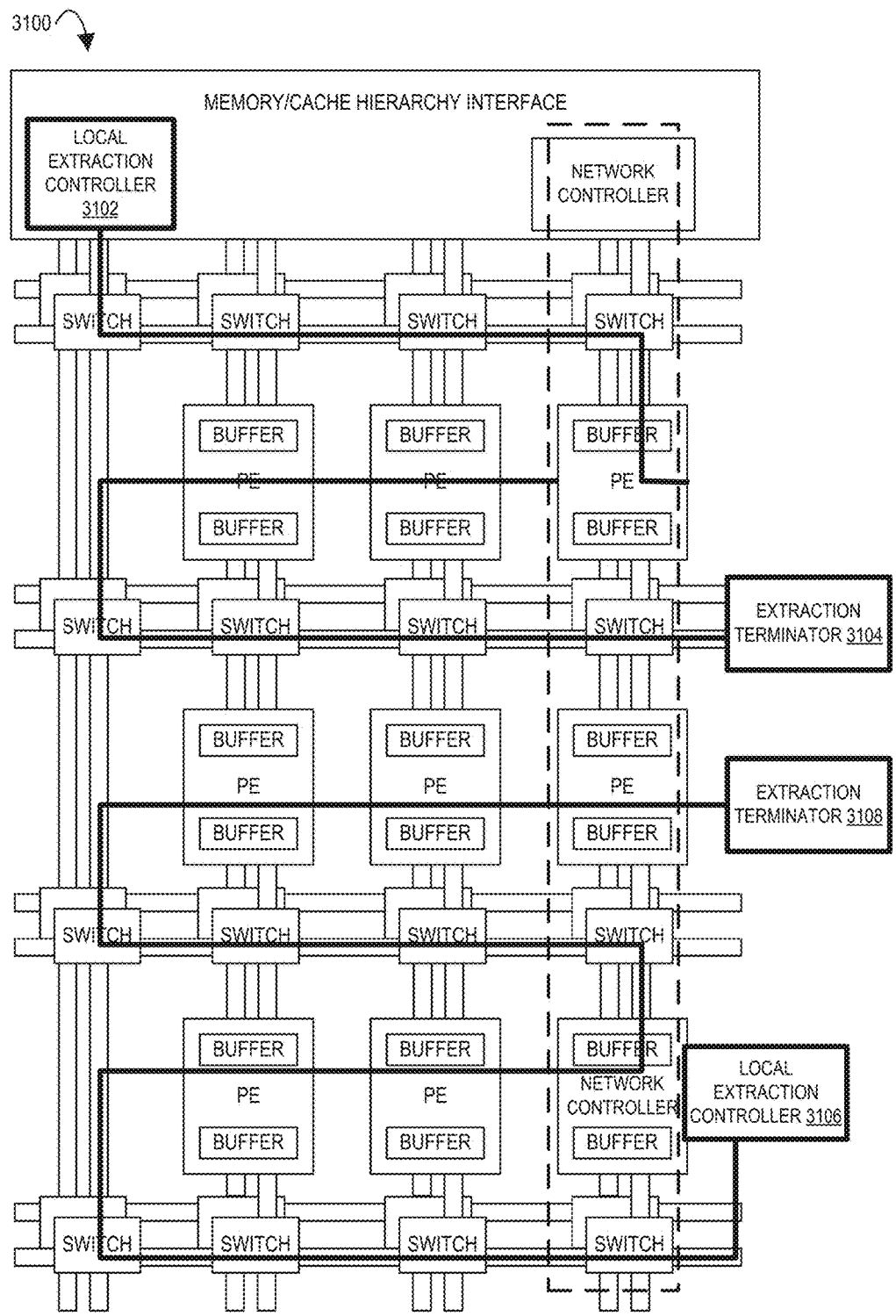
FIG. 31 illustrates an accelerator tile comprising an array of processing elements and a local extraction controller according to embodiments of the disclosure.

FIG. 31 illustrates an accelerator tile 3100 comprising an array of processing elements and a local extraction controller (3102, 3106) according to embodiments of the disclosure. Each PE, each network controller, and each switch may be an extractable fabric elements (EFEs), e.g., which are configured (e.g., programmed) by embodiments of the CSA architecture.

Embodiments of a CSA include hardware that provides for efficient, distributed, low-latency extraction from a heterogeneous spatial fabric. This may be achieved according to four techniques. First, a hardware entity, the local extraction controller (LEC) is utilized, for example, as in FIGS. 31-33. A LEC may accept commands from a host (for example, a processor core), e.g., extracting a stream of data from the spatial array, and writing this data back to virtual memory for inspection by the host. Second, an extraction data path may be included, e.g., that is as wide as the native width of the PE fabric and which may be overlaid on top of the PE fabric. Third, new control signals may be received into the PE fabric which orchestrate the extraction process. Fourth, state elements may be located (e.g., in a register) at each configurable endpoint which track the status of adjacent EFEs, allowing each EFE to unambiguously export its state without extra control signals. These four microarchitectural features may allow a CSA to extract data from chains of EFEs. To obtain low data extraction latency, certain embodiments may partition the data extraction problem by including multiple (e.g., many) LECs and EFE chains in the fabric. At extraction time, these chains may operate independently to extract data from the fabric in parallel, e.g., dramatically reducing latency. As a result of these combinations, a CSA may perform a complete state dump (e.g., in hundreds of nanoseconds).

Figure 32A:
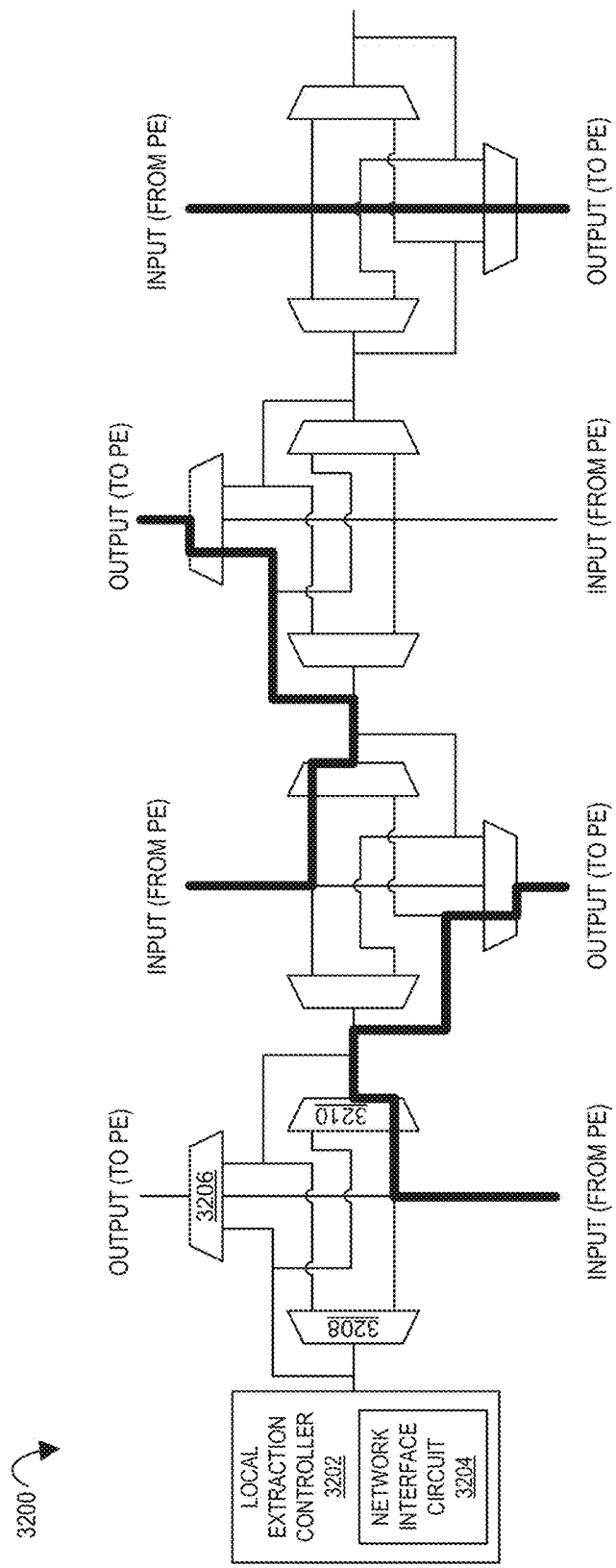
FIGS. 32A-32C illustrate a local extraction controller configuring a data path network according to embodiments of the disclosure.
Figure 32B:
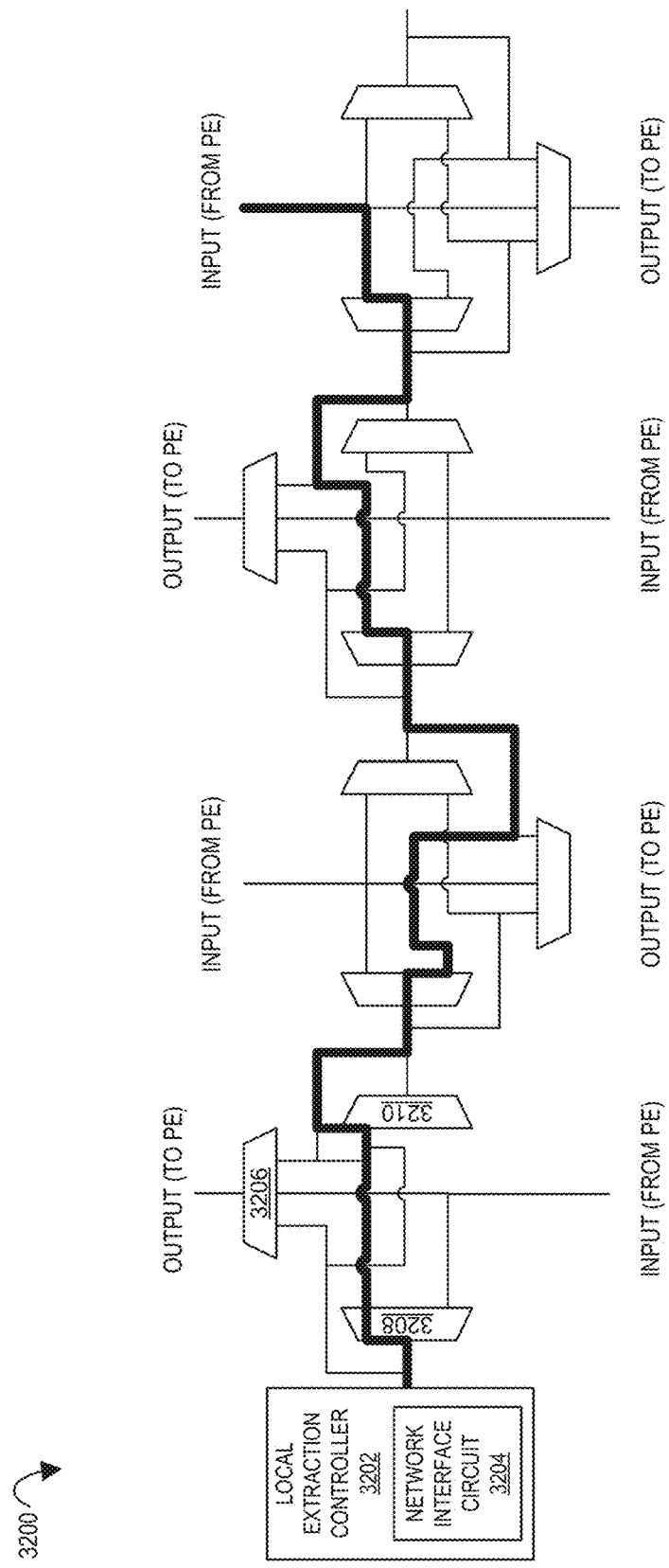
Figure 32C:
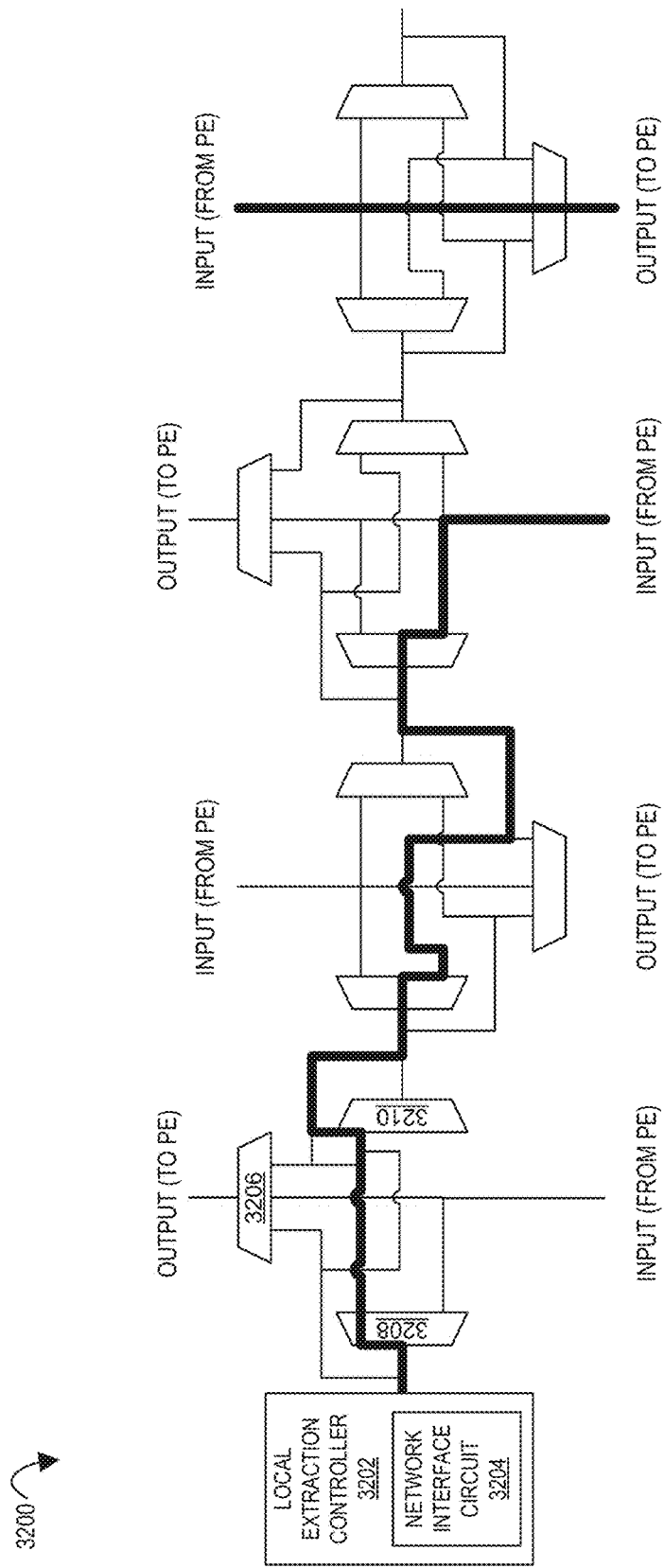

FIGS. 32A-32C illustrate a local extraction controller 3202 configuring a data path network according to embodiments of the disclosure. Depicted network includes a plurality of multiplexers (e.g., multiplexers 3206, 3208, 3210) that may be configured (e.g., via their respective control signals) to connect one or more data paths (e.g., from PEs) together. FIG. 32A illustrates the network 3200 (e.g., fabric) configured (e.g., set) for some previous operation or program. FIG. 32B illustrates the local extraction controller 3202 (e.g., including a network interface circuit 3204 to send and/or receive signals) strobing an extraction signal and all PEs controlled by the LEC enter into extraction mode. The last PE in the extraction chain (or an extraction terminator) may master the extraction channels (e.g., bus) and being sending data according to either (1) signals from the LEC or (2) internally produced signals (e.g., from a PE). Once completed, a PE may set its completion flag, e.g., enabling the next PE to extract its data. FIG. 32C illustrates the most distant PE has completed the extraction process and as a result it has set its extraction state bit or bits, e.g., which swing the muxes into the adjacent network to enable the next PE to begin the extraction process. The extracted PE may resume normal operation. In some embodiments, the PE may remain disabled until other action is taken. In these figures, the multiplexor networks are analogues of the "Switch" shown in certain Figures (e.g., FIG. 6).

The following sections describe the operation of the various components of embodiments of an extraction network.

Local Extraction Controller

Figure 33:
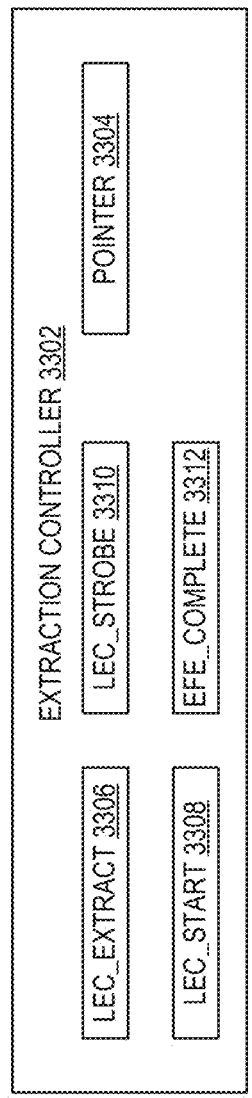
FIG. 33 illustrates an extraction controller according to embodiments of the disclosure.

FIG. 33 illustrates an extraction controller 3302 according to embodiments of the disclosure. A local extraction controller (LEC) may be the hardware entity which is responsible for accepting extraction commands, coordinating the extraction process with the EFEs, and/or storing extracted data, e.g., to virtual memory. In this capacity, the LEC may be a special-purpose, sequential microcontroller.

LEC operation may begin when it receives a pointer to a buffer (e.g., in virtual memory) where fabric state will be written, and, optionally, a command controlling how much of the fabric will be extracted. Depending on the LEC microarchitecture, this pointer (e.g., stored in pointer register 3304) may come either over a network or through a memory system access to the LEC. When it receives such a pointer (e.g., command), the LEC proceeds to extract state from the portion of the fabric for which it is responsible. The LEC may stream this extracted data out of the fabric into the buffer provided by the external caller.

Two different microarchitectures for the LEC are shown in FIG. 31. The first places the LEC 3102 at the memory interface. In this case, the LEC may make direct requests to the memory system to write extracted data. In the second case, the LEC 3106 is placed on a memory network, in which it may make requests to the memory only indirectly. In both cases, the logical operation of the LEC may be unchanged. In one embodiment, LECs are informed of the desire to extract data from the fabric, for example, by a set of (e.g., OS-visible) control-status-registers which will be used to inform individual LECs of new commands.

Extra Out-of-Band Control Channels (e.g., Wires)

In certain embodiments, extraction relies on 2-8 extra, out-of-band signals to improve configuration speed, as defined below. Signals driven by the LEC may be labelled LEC. Signals driven by the EFE (e.g., PE) may be labelled EFE. Configuration controller 3302 may include the following control channels, e.g., LEC_EXTRACT control channel 3406, LEC_START control channel 3308, LEC_STROBE control channel 3310, and EFE_COMPLETE control channel 3312, with examples of each discussed in Table 3 below.

TABLE 3

| Extraction Channels | |
|---|---|
| LEC_EXTRACT | Optional signal asserted by the LEC during extraction process. Lowering this signal causes normal operation to resume. |
| LEC_START | Signal denoting start of extraction, allowing setup of local EFE state |
| LEC_STROBE | Optional strobe signal for controlling extraction related state machines at EFEs. EFEs may generate this signal internally in some implementations. |
| EFE_COMPLETE | Optional signal strobed when EFE has completed dumping state. This helps LEC identify the completion of individual EFE dumps. |

Generally, the handling of extraction may be left to the implementer of a particular EFE. For example, selectable function EFE may have a provision for dumping registers using an existing data path, while a fixed function EFE might simply have a multiplexor.

Due to long wire delays when programming a large set of EFEs, the LEC_STROBE signal may be treated as a clock/latch enable for EFE components. Since this signal is used as a clock, in one embodiment the duty cycle of the line is at most 50%. As a result, extraction throughput is approximately halved. Optionally, a second LEC_STROBE signal may be added to enable continuous extraction.

In one embodiment, only LEC_START is strictly communicated on an independent coupling (e.g., wire), for example, other control channels may be overlayed on existing network (e.g., wires).

Reuse of Network Resources

To reduce the overhead of data extraction, certain embodiments of a CSA make use of existing network infrastructure to communicate extraction data. A LEC may make use of both a chip-level memory hierarchy and a fabric-level communications networks to move data from the fabric into storage. As a result, in certain embodiments of a CSA, the extraction infrastructure adds no more than 2% to the overall fabric area and power.

Reuse of network resources in certain embodiments of a CSA may cause a network to have some hardware support for an extraction protocol. Circuit switched networks require of certain embodiments of a CSA cause a LEC to set their multiplexors in a specific way for configuration when the 'TEC START' signal is asserted. Packet-switched networks do not require extension, although LEC endpoints (e.g., extraction terminators) use a specific address in the packet switched network. Network reuse is optional, and some embodiments may find dedicated configuration buses to be more convenient.

Per EFE State

Each EFE may maintain a bit denoting whether or not it has exported its state. This bit may de-asserted when the extraction start signal is driven, and then asserted once the particular EFE finished extraction. In one extraction protocol, EFEs are arranged to form chains with the EFE extraction state bit determining the topology of the chain. A EFE may read the extraction state bit of the immediately adjacent EFE. If this adjacent EFE has its extraction bit set and the current EFE does not, the EFE may determine that it owns the extraction bus. When an EFE dumps its last data value, it may drive the 'EFE DONE' signal and sets its extraction bit, e.g., enabling upstream EFEs to configure for extraction. The network adjacent to the EFE may observe this signal and also adjust its state to handle the transition. As a base case to the extraction process, an extraction terminator (e.g., extraction terminator 3104 for LEC 3102 or extraction terminator 3108 for LEC 3106 in FIG. 22) which asserts that extraction is complete may be included at the end of a chain.

Internal to the EFE, this bit may be used to drive flow control ready signals. For example, when the extraction bit is de-asserted, network control signals may automatically be clamped to a value that prevent data from flowing, while, within PEs, no operations or actions will be scheduled.

Dealing with High-Delay Paths

One embodiment of a LEC may drive a signal over a long distance, e.g., through many multiplexors and with many loads. Thus, it may be difficult for a signal to arrive at a distant EFE within a short clock cycle. In certain embodiments, extraction signals are at some division (e.g., fraction of) of the main (e.g., CSA) clock frequency to ensure digital timing discipline at extraction. Clock division may be utilized in an out-of-band signaling protocol, and does not require any modification of the main clock tree.

Ensuring Consistent Fabric Behavior During Extraction

Since certain extraction scheme are distributed and have non-deterministic timing due to program and memory effects, different members of the fabric may be under extraction at different times. While LEC_EXTRACT is driven, all network flow control signals may be driven logically low, e.g., thus freezing the operation of a particular segment of the fabric.

An extraction process may be non-destructive. Therefore, a set of PEs may be considered operational once extraction has completed. An extension to an extraction protocol may allow PEs to optionally be disabled post extraction. Alternatively, beginning configuration during the extraction process will have similar effect in embodiments.

Single PE Extraction

In some cases, it may be expedient to extract a single PE. In this case, an optional address signal may be driven as part of the commencement of the extraction process. This may enable the PE targeted for extraction to be directly enabled. Once this PE has been extracted, the extraction process may cease with the lowering of the LEC_EXTRACT signal. In this way, a single PE may be selectively extracted, e.g., by the local extraction controller.

Handling Extraction Backpressure

In an embodiment where the LEC writes extracted data to memory (for example, for post-processing, e.g., in software), it may be subject to limited memory bandwidth. In the case that the LEC exhausts its buffering capacity, or expects that it will exhaust its buffering capacity, it may stops strobing the LEC_STROBE signal until the buffering issue has resolved.

Note that in certain figures (e.g., FIGS. 22, 25, 26, 28, 29, and 31) communications are shown schematically. In certain embodiments, those communications may occur over the (e.g., interconnect) network.

7.7 Flow Diagrams

Figure 34:
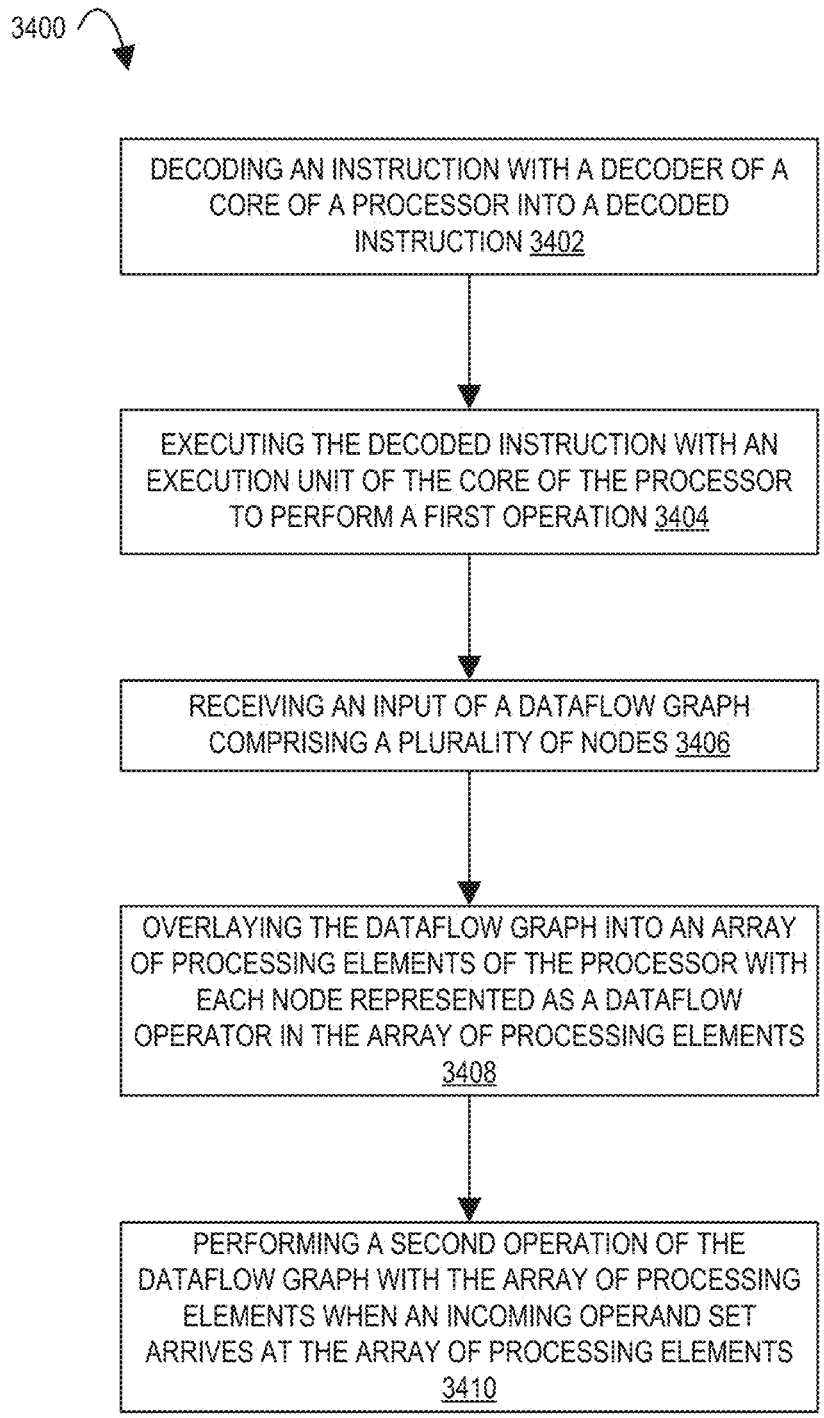
FIG. 34 illustrates a flow diagram according to embodiments of the disclosure.

FIG. 34 illustrates a flow diagram 3400 according to embodiments of the disclosure. Depicted flow 3400 includes decoding an instruction with a decoder of a core of a processor into a decoded instruction 3402; executing the decoded instruction with an execution unit of the core of the processor to perform a first operation 3404; receiving an input of a dataflow graph comprising a plurality of nodes 3406; overlaying the dataflow graph into an array of processing elements of the processor with each node represented as a dataflow operator in the array of processing elements 3408; and performing a second operation of the dataflow graph with the array of processing elements when an incoming operand set arrives at the array of processing elements 3410.

Figure 35:
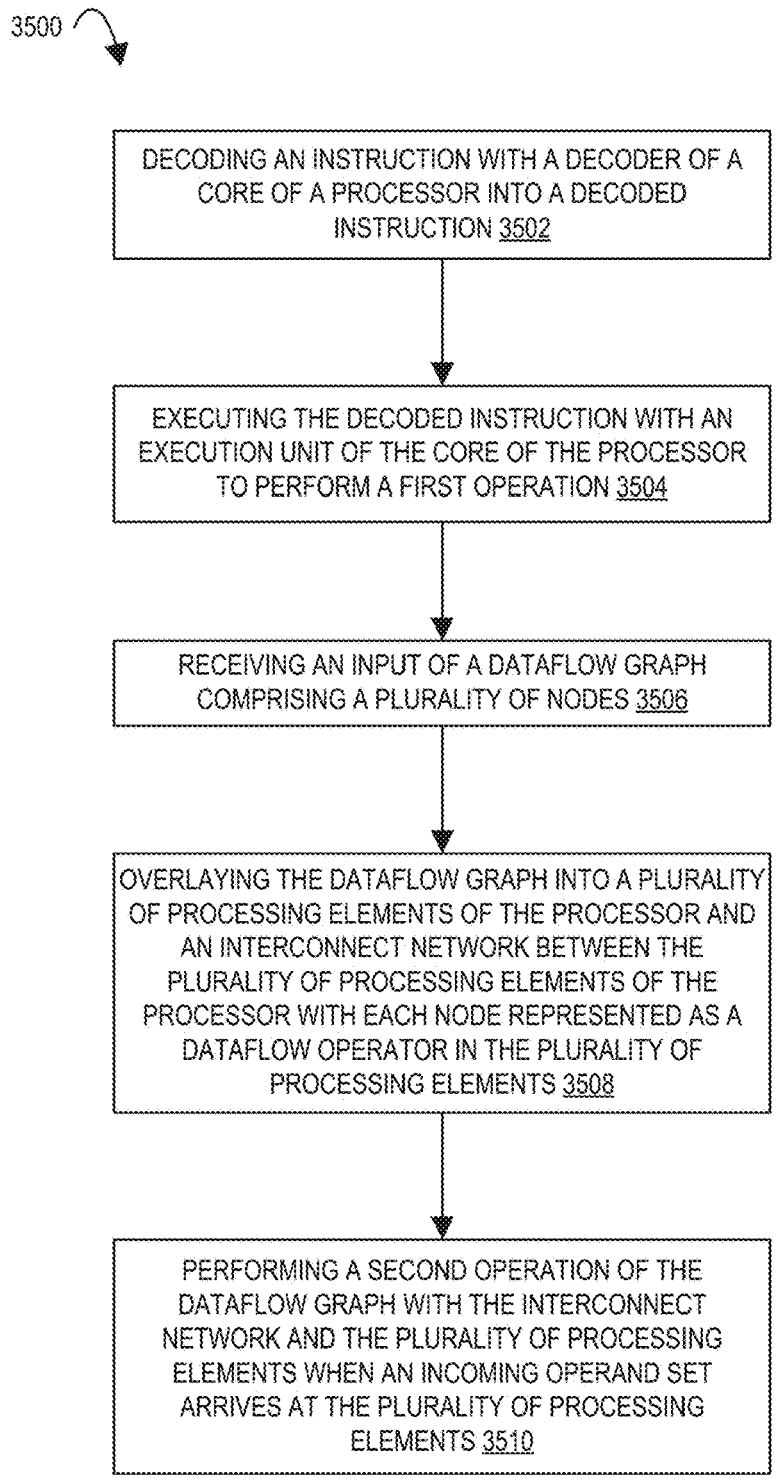
FIG. 35 illustrates a flow diagram according to embodiments of the disclosure.

FIG. 35 illustrates a flow diagram 3500 according to embodiments of the disclosure. Depicted flow 3500 includes decoding an instruction with a decoder of a core of a processor into a decoded instruction 3502; executing the decoded instruction with an execution unit of the core of the processor to perform a first operation 3504; receiving an input of a dataflow graph comprising a plurality of nodes 3506; overlaying the dataflow graph into a plurality of processing elements of the processor and an interconnect network between the plurality of processing elements of the processor with each node represented as a dataflow operator in the plurality of processing elements 3508; and performing a second operation of the dataflow graph with the interconnect network and the plurality of processing elements when an incoming operand set arrives at the plurality of processing elements 3510.

8. Summary

Supercomputing at the ExaFLOP scale may be a challenge in high-performance computing, a challenge which is not likely to be met by conventional von Neumann architectures. To achieve ExaFLOPs, embodiments of a CSA provide a heterogeneous spatial array that targets direct execution of (e.g., compiler-produced) dataflow graphs. In addition to laying out the architectural principles of embodiments of a CSA, the above also describes and evaluates embodiments of a CSA which showed performance and energy of larger than 10× over existing products. Compiler-generated code may have significant performance and energy gains over roadmap architectures. As a heterogeneous, parametric architecture, embodiments of a CSA may be readily adapted to all computing uses. For example, a mobile version of CSA might be tuned to 32-bits, while a machine-learning focused array might feature significant numbers of vectorized 8-bit multiplication units. The main advantages of embodiments of a CSA are high performance and extreme energy efficiency, characteristics relevant to all forms of computing ranging from supercomputing and datacenter to the internet-of-things.

In an embodiment, a processor includes a plurality of processing elements; and an interconnect network between the plurality of processing elements to receive an input of a dataflow graph comprising a plurality of nodes, wherein the dataflow graph is to be overlaid into the interconnect network and the plurality of processing elements with each node represented as a dataflow operator in the plurality of processing elements, and the plurality of processing elements is to perform an operation when an incoming operand set arrives at the plurality of processing elements. At least one of the plurality of processing elements includes a plurality of control inputs.

A first of the plurality of control inputs may be to process a first triggered instruction. A second of the plurality of control inputs may be to process a second triggered instruction. A second of the plurality of control inputs may be to process a first sequential instruction. A first of the plurality of control inputs may be to process a first sequential instruction. A second of the plurality of control inputs may be to process a second sequential instruction.

In an embodiment, a processor includes a plurality of processing elements; a plurality of buffer boxes; and an interconnect network between the plurality of processing elements and the plurality of buffer boxes to receive an input of a dataflow graph comprising a plurality of nodes, wherein the dataflow graph is to be overlaid into the interconnect network and the plurality of processing elements with each node represented as a dataflow operator in the plurality of processing elements, and the plurality of processing elements is to perform an operation when an incoming operand set arrives at the plurality of processing elements.

At least one of the plurality of buffer boxes may include two or more queues. The two or more queues may be individually configurable. At least a first of the two or more queues may be configurable into a first-in first-out mode. At least a first of the two or more queues may be configurable into a last-in first-out mode. At least a first of the two or more queues may be configurable into a read-only mode. At least a first of the two or more queues may be configurable into a scratchpad mode. At least a first of the two or more queues is configurable into a random-in serial-out mode.

In an embodiment, a processor includes a plurality of processing elements; a plurality of program ordering elements; and an interconnect network between the plurality of processing elements and the plurality of program ordering elements to receive an input of a dataflow graph comprising a plurality of nodes, wherein the dataflow graph is to be overlaid into the interconnect network and the plurality of processing elements with each node represented as a dataflow operator in the plurality of processing elements, and the plurality of processing elements is to perform an operation when an incoming operand set arrives at the plurality of processing elements.

The plurality of program ordering elements may include at least one path-reachability operation box. The plurality of program ordering elements may include at least one ordering operation box. The plurality of program ordering elements includes at least one memory-disambiguation operation box.

In an embodiment, a processor includes a plurality of processing elements; and an interconnect network between the plurality of processing elements to receive an input of a dataflow graph comprising a plurality of nodes, wherein the dataflow graph is to be overlaid into the interconnect network and the plurality of processing elements with each node represented as a dataflow operator in the plurality of processing elements, the plurality of processing elements is to perform an operation when an incoming operand set arrives at the plurality of processing elements, at least a first of the plurality of processing elements is configurable as a floating-point multiplier, at least a second of the plurality of processing elements is configurable as a floating-point adder, and the first and the second of the plurality of processing elements are programmably coupled together to perform a fused multiply-add.

In an embodiment, a processor includes a plurality of processing elements, wherein at least one of the processing elements is to perform a floating-point operation with selectable precision control; and an interconnect network between the plurality of processing elements to receive an input of a dataflow graph comprising a plurality of nodes, wherein the dataflow graph is to be overlaid into the interconnect network and the plurality of processing elements with each node represented as a dataflow operator in the plurality of processing elements, and the plurality of processing elements is to perform an operation when an incoming operand set arrives at the plurality of processing elements.

In one embodiment, a processor includes a plurality of processing elements; and an interconnect network between the plurality of processing elements to receive an input of a dataflow graph comprising a plurality of nodes, wherein the dataflow graph is to be overlaid into the interconnect network and the plurality of processing elements with each node represented as a dataflow operator in the plurality of processing elements, and the plurality of processing elements are to perform an operation by a respective, incoming operand set arriving at each of the dataflow operators of the plurality of processing elements. At least one of the plurality of processing elements includes a plurality of control inputs.

A processing element of the plurality of processing elements may stall execution when a backpressure signal from a downstream processing element indicates that storage in the downstream processing element is not available for an output of the processing element. The processor may include a flow control path network to carry the backpressure signal according to the dataflow graph. A dataflow token may cause an output from a dataflow operator receiving the dataflow token to be sent to an input buffer of a particular processing element of the plurality of processing elements. The operation may include a memory access and the plurality of processing elements comprises a memory-accessing dataflow operator that is not to perform the memory access until receiving a memory dependency token from a logically previous dataflow operator. The plurality of processing elements may include a first type of processing element and a second, different type of processing element.

In another embodiment, a method receiving an input of a dataflow graph comprising a plurality of nodes; overlaying the dataflow graph into a plurality of processing elements of the processor and an interconnect network between the plurality of processing elements of the processor with each node represented as a dataflow operator in the plurality of processing elements; and performing an operation of the dataflow graph with the interconnect network and the plurality of processing elements by a respective, incoming operand set arriving at each of the dataflow operators of the plurality of processing elements. At least one of the plurality of processing elements includes a plurality of control inputs.

The method may include stalling execution by a processing element of the plurality of processing elements when a backpressure signal from a downstream processing element indicates that storage in the downstream processing element is not available for an output of the processing element. The method may include sending the backpressure signal on a flow control path network according to the dataflow graph. A dataflow token may cause an output from a dataflow operator receiving the dataflow token to be sent to an input buffer of a particular processing element of the plurality of processing elements. The method may include not performing a memory access until receiving a memory dependency token from a logically previous dataflow operator, wherein the operation comprises the memory access and the plurality of processing elements comprises a memory-accessing dataflow operator. The method may include providing a first type of processing element and a second, different type of processing element of the plurality of processing elements.

In yet another embodiment, an apparatus includes a data path network between a plurality of processing elements; and a flow control path network between the plurality of processing elements, wherein the data path network and the flow control path network are to receive an input of a dataflow graph comprising a plurality of nodes, the dataflow graph is to be overlaid into the data path network, the flow control path network, and the plurality of processing elements with each node represented as a dataflow operator in the plurality of processing elements, and the plurality of processing elements are to perform an operation by a respective, incoming operand set arriving at each of the dataflow operators of the plurality of processing elements. At least one of the plurality of processing elements includes a plurality of control inputs.

The flow control path network may carry backpressure signals to a plurality of dataflow operators according to the dataflow graph. A dataflow token sent on the data path network to a dataflow operator may cause an output from the dataflow operator to be sent to an input buffer of a particular processing element of the plurality of processing elements on the data path network. The data path network may be a static, circuit-switched network to carry the respective, input operand set to each of the dataflow operators according to the dataflow graph. The flow control path network may transmit a backpressure signal according to the dataflow graph from a downstream processing element to indicate that storage in the downstream processing element is not available for an output of the processing element. At least one data path of the data path network and at least one flow control path of the flow control path network may form a channelized circuit with backpressure control. The flow control path network may pipeline at least two of the plurality of processing elements in series.

In another embodiment, a method includes receiving an input of a dataflow graph comprising a plurality of nodes; and overlaying the dataflow graph into a plurality of processing elements of a processor, a data path network between the plurality of processing elements, and a flow control path network between the plurality of processing elements with each node represented as a dataflow operator in the plurality of processing elements. At least one of the plurality of processing elements includes a plurality of control inputs.

The method may include carrying backpressure signals with the flow control path network to a plurality of dataflow operators according to the dataflow graph. The method may include sending a dataflow token on the data path network to a dataflow operator to cause an output from the dataflow operator to be sent to an input buffer of a particular processing element of the plurality of processing elements on the data path network. The method may include setting a plurality of switches of the data path network and/or a plurality of switches of the flow control path network to carry the respective, input operand set to each of the dataflow operators according to the dataflow graph, wherein the data path network is a static, circuit-switched network. The method may include transmitting a backpressure signal with the flow control path network according to the dataflow graph from a downstream processing element to indicate that storage in the downstream processing element is not available for an output of the processing element. The method may include forming a channelized circuit with backpressure control with at least one data path of the data path network and at least one flow control path of the flow control path network.

In yet another embodiment, a processor includes a plurality of processing elements; and a network means between the plurality of processing elements to receive an input of a dataflow graph comprising a plurality of nodes, wherein the dataflow graph is to be overlaid into the network means and the plurality of processing elements with each node represented as a dataflow operator in the plurality of processing elements, and the plurality of processing elements are to perform an operation by a respective, incoming operand set arriving at each of the dataflow operators of the plurality of processing elements. At least one of the plurality of processing elements includes a plurality of control inputs.

In another embodiment, an apparatus includes a data path means between a plurality of processing elements; and a flow control path means between the plurality of processing elements, wherein the data path means and the flow control path means are to receive an input of a dataflow graph comprising a plurality of nodes, the dataflow graph is to be overlaid into the data path means, the flow control path means, and the plurality of processing elements with each node represented as a dataflow operator in the plurality of processing elements, and the plurality of processing elements are to perform an operation by a respective, incoming operand set arriving at each of the dataflow operators of the plurality of processing elements. At least one of the plurality of processing elements includes a plurality of control inputs.

In one embodiment, a processor includes an array of processing elements to receive an input of a dataflow graph comprising a plurality of nodes, wherein the dataflow graph is to be overlaid into the array of processing elements with each node represented as a dataflow operator in the array of processing elements, and the array of processing elements is to perform an operation when an incoming operand set arrives at the array of processing elements. At least one of the plurality of processing elements includes a plurality of control inputs.

The array of processing elements may not perform the operation until the incoming operand set arrives at the array of processing elements and storage in the array of processing elements is available for output of the second operation. The array of processing elements may include a network (or channel(s)) to carry dataflow tokens and control tokens to a plurality of dataflow operators. The operation may include a memory access and the array of processing elements may include a memory-accessing dataflow operator that is not to perform the memory access until receiving a memory dependency token from a logically previous dataflow operator. Each processing element may perform only one or two operations of the dataflow graph.

In another embodiment, a method includes receiving an input of a dataflow graph comprising a plurality of nodes; overlaying the dataflow graph into an array of processing elements of the processor with each node represented as a dataflow operator in the array of processing elements; and performing an operation of the dataflow graph with the array of processing elements when an incoming operand set arrives at the array of processing elements. At least one of the plurality of processing elements includes a plurality of control inputs.

The array of processing elements may not perform the operation until the incoming operand set arrives at the array of processing elements and storage in the array of processing elements is available for output of the second operation. The array of processing elements may include a network carrying dataflow tokens and control tokens to a plurality of dataflow operators. The operation may include a memory access and the array of processing elements comprises a memory-accessing dataflow operator that is not to perform the memory access until receiving a memory dependency token from a logically previous dataflow operator. Each processing element may perform only one or two operations of the dataflow graph.

In yet another embodiment, a non-transitory machine readable medium that stores code that when executed by a machine causes the machine to perform a method including receiving an input of a dataflow graph comprising a plurality of nodes; overlaying the dataflow graph into an array of processing elements of the processor with each node represented as a dataflow operator in the array of processing elements; and performing an operation of the dataflow graph with the array of processing elements when an incoming operand set arrives at the array of processing elements. At least one of the plurality of processing elements includes a plurality of control inputs.

The array of processing element may not perform the operation until the incoming operand set arrives at the array of processing elements and storage in the array of processing elements is available for output of the second operation. The array of processing elements may include a network carrying dataflow tokens and control tokens to a plurality of dataflow operators. The operation may include a memory access and the array of processing elements comprises a memory-accessing dataflow operator that is not to perform the memory access until receiving a memory dependency token from a logically previous dataflow operator. Each processing element may perform only one or two operations of the dataflow graph.

In another embodiment, a processor includes means to receive an input of a dataflow graph comprising a plurality of nodes, wherein the dataflow graph is to be overlaid into the means with each node represented as a dataflow operator in the means, and the means is to perform an operation when an incoming operand set arrives at the means. At least one of the plurality of processing elements includes a plurality of control inputs.

In one embodiment, a processor includes a core with a decoder to decode an instruction into a decoded instruction and an execution unit to execute the decoded instruction to perform a first operation; a plurality of processing elements; and an interconnect network between the plurality of processing elements to receive an input of a dataflow graph comprising a plurality of nodes, wherein the dataflow graph is to be overlaid into the interconnect network and the plurality of processing elements with each node represented as a dataflow operator in the plurality of processing elements, and the plurality of processing elements is to perform a second operation when an incoming operand set arrives at the plurality of processing elements. At least one of the plurality of processing elements includes a plurality of control inputs.

The processor may further comprise a plurality of configuration controllers, each configuration controller is coupled to a respective subset of the plurality of processing elements, and each configuration controller is to load configuration information from storage and cause coupling of the respective subset of the plurality of processing elements according to the configuration information. The processor may include a plurality of configuration caches, and each configuration controller is coupled to a respective configuration cache to fetch the configuration information for the respective subset of the plurality of processing elements. The first operation performed by the execution unit may prefetch configuration information into each of the plurality of configuration caches. Each of the plurality of configuration controllers may include a reconfiguration circuit to cause a reconfiguration for at least one processing element of the respective subset of the plurality of processing elements on receipt of a configuration error message from the at least one processing element. Each of the plurality of configuration controllers may a reconfiguration circuit to cause a reconfiguration for the respective subset of the plurality of processing elements on receipt of a reconfiguration request message, and disable communication with the respective subset of the plurality of processing elements until the reconfiguration is complete. The processor may include a plurality of exception aggregators, and each exception aggregator is coupled to a respective subset of the plurality of processing elements to collect exceptions from the respective subset of the plurality of processing elements and forward the exceptions to the core for servicing. The processor may include a plurality of extraction controllers, each extraction controller is coupled to a respective subset of the plurality of processing elements, and each extraction controller is to cause state data from the respective subset of the plurality of processing elements to be saved to memory.

In another embodiment, a method includes decoding an instruction with a decoder of a core of a processor into a decoded instruction; executing the decoded instruction with an execution unit of the core of the processor to perform a first operation; receiving an input of a dataflow graph comprising a plurality of nodes; overlaying the dataflow graph into a plurality of processing elements of the processor and an interconnect network between the plurality of processing elements of the processor with each node represented as a dataflow operator in the plurality of processing elements; and performing a second operation of the dataflow graph with the interconnect network and the plurality of processing elements when an incoming operand set arrives at the plurality of processing elements. At least one of the plurality of processing elements includes a plurality of control inputs.

The method may include loading configuration information from storage for respective subsets of the plurality of processing elements and causing coupling for each respective subset of the plurality of processing elements according to the configuration information. The method may include fetching the configuration information for the respective subset of the plurality of processing elements from a respective configuration cache of a plurality of configuration caches. The first operation performed by the execution unit may be prefetching configuration information into each of the plurality of configuration caches. The method may include causing a reconfiguration for at least one processing element of the respective subset of the plurality of processing elements on receipt of a configuration error message from the at least one processing element. The method may include causing a reconfiguration for the respective subset of the plurality of processing elements on receipt of a reconfiguration request message; and disabling communication with the respective subset of the plurality of processing elements until the reconfiguration is complete. The method may include collecting exceptions from a respective subset of the plurality of processing elements; and forwarding the exceptions to the core for servicing. The method may include causing state data from a respective subset of the plurality of processing elements to be saved to memory.

In yet another embodiment, a non-transitory machine readable medium that stores code that when executed by a machine causes the machine to perform a method including decoding an instruction with a decoder of a core of a processor into a decoded instruction; executing the decoded instruction with an execution unit of the core of the processor to perform a first operation; receiving an input of a dataflow graph comprising a plurality of nodes; overlaying the dataflow graph into a plurality of processing elements of the processor and an interconnect network between the plurality of processing elements of the processor with each node represented as a dataflow operator in the plurality of processing elements; and performing a second operation of the dataflow graph with the interconnect network and the plurality of processing elements when an incoming operand set arrives at the plurality of processing elements. At least one of the plurality of processing elements includes a plurality of control inputs.

The method may include loading configuration information from storage for respective subsets of the plurality of processing elements and causing coupling for each respective subset of the plurality of processing elements according to the configuration information. The method may include fetching the configuration information for the respective subset of the plurality of processing elements from a respective configuration cache of a plurality of configuration caches. The first operation performed by the execution unit may be prefetching configuration information into each of the plurality of configuration caches. The method may include causing a reconfiguration for at least one processing element of the respective subset of the plurality of processing elements on receipt of a configuration error message from the at least one processing element. The method may include causing a reconfiguration for the respective subset of the plurality of processing elements on receipt of a reconfiguration request message; and disabling communication with the respective subset of the plurality of processing elements until the reconfiguration is complete. The method may include collecting exceptions from a respective subset of the plurality of processing elements; and forwarding the exceptions to the core for servicing. The method may include causing state data from a respective subset of the plurality of processing elements to be saved to memory.

In another embodiment, a processor includes a plurality of processing elements; and means between the plurality of processing elements to receive an input of a dataflow graph comprising a plurality of nodes, wherein the dataflow graph is to be overlaid into the m and the plurality of processing elements with each node represented as a dataflow operator in the plurality of processing elements, and the plurality of processing elements is to perform an operation when an incoming operand set arrives at the plurality of processing elements. At least one of the plurality of processing elements includes a plurality of control inputs.

In yet another embodiment, an apparatus comprises a data storage device that stores code that when executed by a hardware processor causes the hardware processor to perform any method disclosed herein. An apparatus may be as described in the detailed description. A method may be as described in the detailed description.

In another embodiment, a non-transitory machine readable medium that stores code that when executed by a machine causes the machine to perform a method comprising any method disclosed herein.

An instruction set (e.g., for execution by a core) may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of SIMD extensions referred to as the Advanced Vector Extensions (AVX) (AVX1 and AVX2) and using the Vector Extensions (VEX) coding scheme has been released and/or published (e.g., see Intel® 64 and IA-32 Architectures Software Developer's Manual, June 2016; and see Intel® Architecture Instruction Set Extensions Programming Reference, February 2016).

Exemplary Instruction Formats

Embodiments of the instruction(s) described herein may be embodied in different formats. Additionally, exemplary systems, architectures, and pipelines are detailed below. Embodiments of the instruction(s) may be executed on such systems, architectures, and pipelines, but are not limited to those detailed.

Generic Vector Friendly Instruction Format

A vector friendly instruction format is an instruction format that is suited for vector instructions (e.g., there are certain fields specific to vector operations). While embodiments are described in which both vector and scalar operations are supported through the vector friendly instruction format, alternative embodiments use only vector operations the vector friendly instruction format.

Figure 36A:
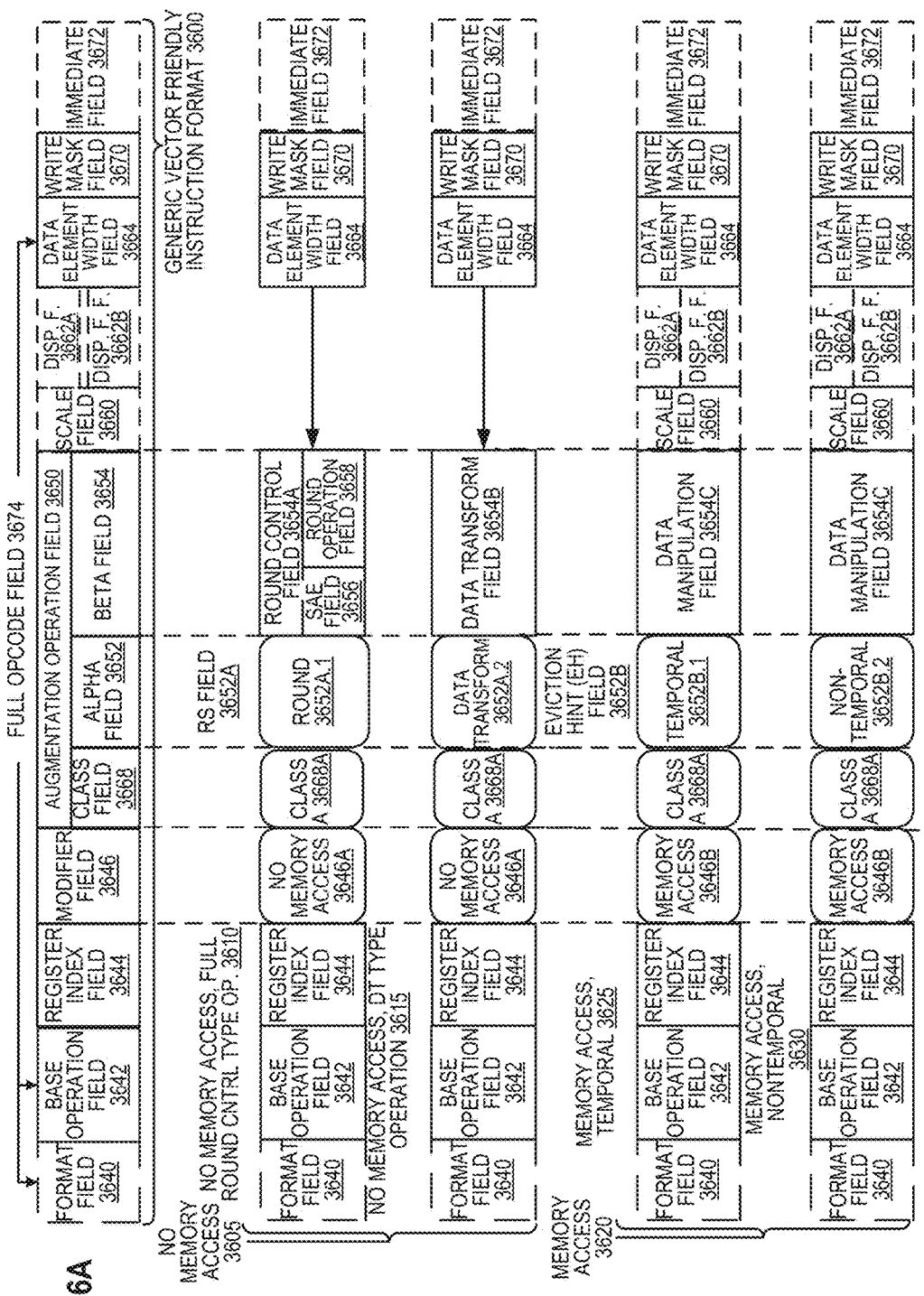
FIG. 36A is a block diagram illustrating a generic vector friendly instruction format and class A instruction templates thereof according to embodiments of the disclosure.
Figure 36B:
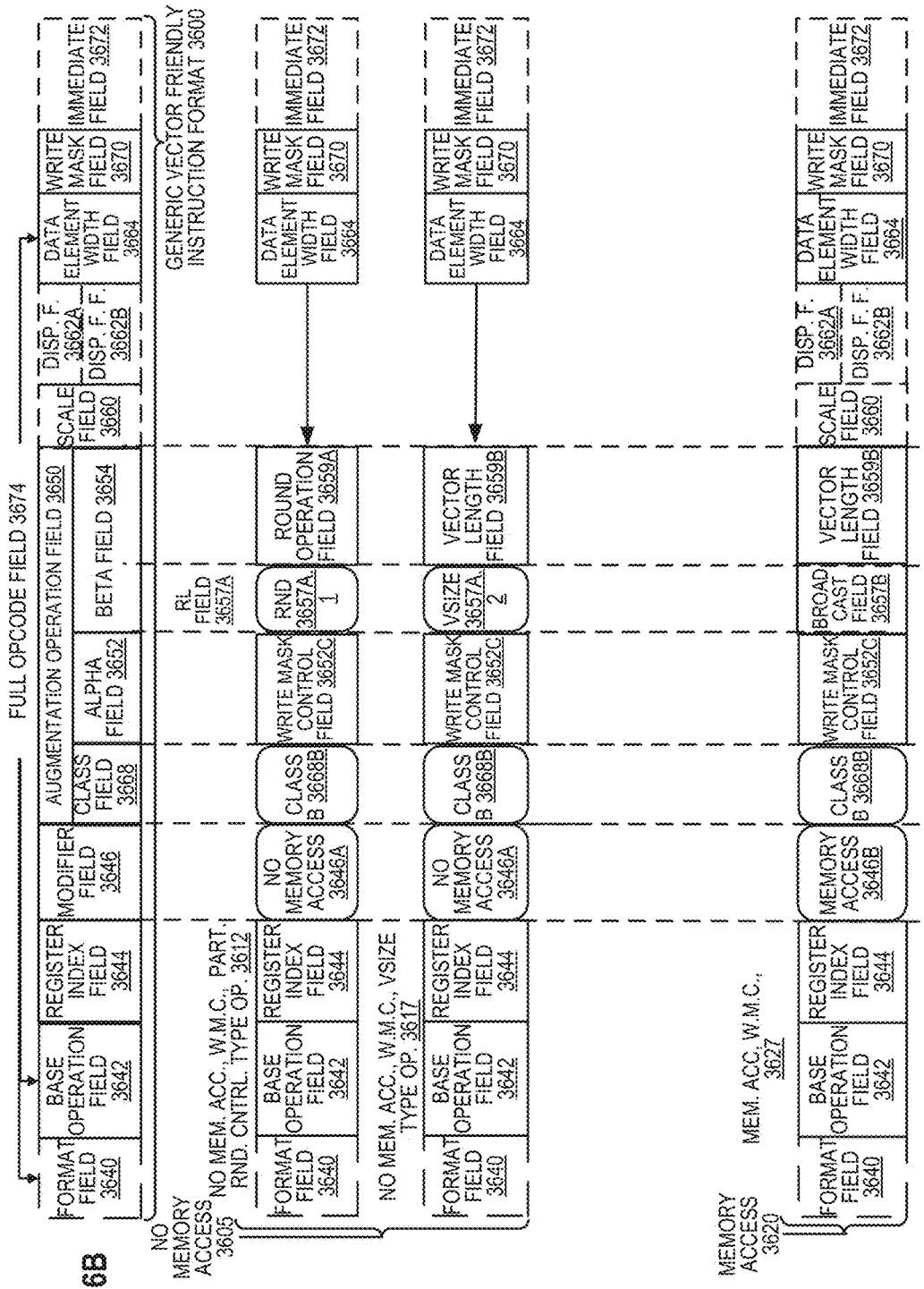
FIG. 36B is a block diagram illustrating the generic vector friendly instruction format and class B instruction templates thereof according to embodiments of the disclosure.

FIGS. 36A-36B are block diagrams illustrating a generic vector friendly instruction format and instruction templates thereof according to embodiments of the disclosure. FIG. 36A is a block diagram illustrating a generic vector friendly instruction format and class A instruction templates thereof according to embodiments of the disclosure; while FIG. 36B is a block diagram illustrating the generic vector friendly instruction format and class B instruction templates thereof according to embodiments of the disclosure. Specifically, a generic vector friendly instruction format 3600 for which are defined class A and class B instruction templates, both of which include no memory access 3605 instruction templates and memory access 3620 instruction templates. The term generic in the context of the vector friendly instruction format refers to the instruction format not being tied to any specific instruction set.

While embodiments of the disclosure will be described in which the vector friendly instruction format supports the following: a 64 byte vector operand length (or size) with 32 bit (4 byte) or 64 bit (8 byte) data element widths (or sizes) (and thus, a 64 byte vector consists of either 16 doubleword-size elements or alternatively, 8 quadword-size elements); a 64 byte vector operand length (or size) with 16 bit (2 byte) or 8 bit (1 byte) data element widths (or sizes); a 32 byte vector operand length (or size) with 32 bit (4 byte), 64 bit (8 byte), 16 bit (2 byte), or 8 bit (1 byte) data element widths (or sizes); and a 16 byte vector operand length (or size) with 32 bit (4 byte), 64 bit (8 byte), 16 bit (2 byte), or 8 bit (1 byte) data element widths (or sizes); alternative embodiments may support more, less and/or different vector operand sizes (e.g., 256 byte vector operands) with more, less, or different data element widths (e.g., 128 bit (16 byte) data element widths).

The class A instruction templates in FIG. 36A include: 1) within the no memory access 3605 instruction templates there is shown a no memory access, full round control type operation 3610 instruction template and a no memory access, data transform type operation 3615 instruction template; and 2) within the memory access 3620 instruction templates there is shown a memory access, temporal 3625 instruction template and a memory access, non-temporal 3630 instruction template. The class B instruction templates in FIG. 36B include: 1) within the no memory access 3605 instruction templates there is shown a no memory access, write mask control, partial round control type operation 3612 instruction template and a no memory access, write mask control, vsize type operation 3617 instruction template; and 2) within the memory access 3620 instruction templates there is shown a memory access, write mask control 3627 instruction template.

The generic vector friendly instruction format 3600 includes the following fields listed below in the order illustrated in FIGS. 36A-36B.

Format field 3640—a specific value (an instruction format identifier value) in this field uniquely identifies the vector friendly instruction format, and thus occurrences of instructions in the vector friendly instruction format in instruction streams. As such, this field is optional in the sense that it is not needed for an instruction set that has only the generic vector friendly instruction format.

Base operation field 3642—its content distinguishes different base operations.

Register index field 3644—its content, directly or through address generation, specifies the locations of the source and destination operands, be they in registers or in memory. These include a sufficient number of bits to select N registers from a P×Q (e.g. 32×512, 16×128, 32×1024, 64×1024) register file. While in one embodiment N may be up to three sources and one destination register, alternative embodiments may support more or less sources and destination registers (e.g., may support up to two sources where one of these sources also acts as the destination, may support up to three sources where one of these sources also acts as the destination, may support up to two sources and one destination).

Modifier field 3646—its content distinguishes occurrences of instructions in the generic vector instruction format that specify memory access from those that do not; that is, between no memory access 3605 instruction templates and memory access 3620 instruction templates. Memory access operations read and/or write to the memory hierarchy (in some cases specifying the source and/or destination addresses using values in registers), while non-memory access operations do not (e.g., the source and destinations are registers). While in one embodiment this field also selects between three different ways to perform memory address calculations, alternative embodiments may support more, less, or different ways to perform memory address calculations.

Augmentation operation field 3650—its content distinguishes which one of a variety of different operations to be performed in addition to the base operation. This field is context specific. In one embodiment of the disclosure, this field is divided into a class field 3668, an alpha field 3652, and a beta field 3654. The augmentation operation field 3650 allows common groups of operations to be performed in a single instruction rather than 2, 3, or 4 instructions.

Scale field 3660—its content allows for the scaling of the index field's content for memory address generation (e.g., for address generation that uses $2^{scale}$*index+base).

Displacement Field 3662A—its content is used as part of memory address generation (e.g., for address generation that uses $2^{scale}$*index+base+displacement).

Displacement Factor Field 3662B (note that the juxtaposition of displacement field 3662A directly over displacement factor field 3662B indicates one or the other is used)—its content is used as part of address generation; it specifies a displacement factor that is to be scaled by the size of a memory access (N)—where N is the number of bytes in the memory access (e.g., for address generation that uses $2^{scale}$*index+base+scaled displacement). Redundant low-order bits are ignored and hence, the displacement factor field's content is multiplied by the memory operands total size (N) in order to generate the final displacement to be used in calculating an effective address. The value of N is determined by the processor hardware at runtime based on the full opcode field 3674 (described later herein) and the data manipulation field 3654C. The displacement field 3662A and the displacement factor field 3662B are optional in the sense that they are not used for the no memory access 3605 instruction templates and/or different embodiments may implement only one or none of the two.

Data element width field 3664—its content distinguishes which one of a number of data element widths is to be used (in some embodiments for all instructions; in other embodiments for only some of the instructions). This field is optional in the sense that it is not needed if only one data element width is supported and/or data element widths are supported using some aspect of the opcodes.

Write mask field 3670—its content controls, on a per data element position basis, whether that data element position in the destination vector operand reflects the result of the base operation and augmentation operation. Class A instruction templates support merging-writemasking, while class B instruction templates support both merging- and zeroing-writemasking. When merging, vector masks allow any set of elements in the destination to be protected from updates during the execution of any operation (specified by the base operation and the augmentation operation); in other one embodiment, preserving the old value of each element of the destination where the corresponding mask bit has a 0. In contrast, when zeroing vector masks allow any set of elements in the destination to be zeroed during the execution of any operation (specified by the base operation and the augmentation operation); in one embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the write mask field 3670 allows for partial vector operations, including loads, stores, arithmetic, logical, etc. While embodiments of the disclosure are described in which the write mask field's 3670 content selects one of a number of write mask registers that contains the write mask to be used (and thus the write mask field's 3670 content indirectly identifies that masking to be performed), alternative embodiments instead or additional allow the mask write field's 3670 content to directly specify the masking to be performed.

Immediate field 3672—its content allows for the specification of an immediate. This field is optional in the sense that is it not present in an implementation of the generic vector friendly format that does not support immediate and it is not present in instructions that do not use an immediate.

Class field 3668—its content distinguishes between different classes of instructions. With reference to FIGS. 36A-B, the contents of this field select between class A and class B instructions. In FIGS. 36A-B, rounded corner squares are used to indicate a specific value is present in a field (e.g., class A 3668A and class B 3668B for the class field 3668 respectively in FIGS. 36A-B).

Instruction Templates of Class A

In the case of the non-memory access 3605 instruction templates of class A, the alpha field 3652 is interpreted as an RS field 3652A, whose content distinguishes which one of the different augmentation operation types are to be performed (e.g., round 3652A.1 and data transform 3652A.2 are respectively specified for the no memory access, round type operation 3610 and the no memory access, data transform type operation 3615 instruction templates), while the beta field 3654 distinguishes which of the operations of the specified type is to be performed. In the no memory access 3605 instruction templates, the scale field 3660, the displacement field 3662A, and the displacement scale filed 3662B are not present.

No-Memory Access Instruction Templates—Full Round Control Type Operation

In the no memory access full round control type operation 3610 instruction template, the beta field 3654 is interpreted as a round control field 3654A, whose content(s) provide static rounding. While in the described embodiments of the disclosure the round control field 3654A includes a suppress all floating-point exceptions (SAE) field 3656 and a round operation control field 3658, alternative embodiments may support may encode both these concepts into the same field or only have one or the other of these concepts/fields (e.g., may have only the round operation control field 3658).

SAE field 3656—its content distinguishes whether or not to disable the exception event reporting; when the SAE field's 3656 content indicates suppression is enabled, a given instruction does not report any kind of floating-point exception flag and does not raise any floating-point exception handler.

Round operation control field 3658—its content distinguishes which one of a group of rounding operations to perform (e.g., Round-up, Round-down, Round-towards-zero and Round-to-nearest). Thus, the round operation control field 3658 allows for the changing of the rounding mode on a per instruction basis. In one embodiment of the disclosure where a processor includes a control register for specifying rounding modes, the round operation control field's 3650 content overrides that register value.

No Memory Access Instruction Templates—Data Transform Type Operation

In the no memory access data transform type operation 3615 instruction template, the beta field 3654 is interpreted as a data transform field 3654B, whose content distinguishes which one of a number of data transforms is to be performed (e.g., no data transform, swizzle, broadcast).

In the case of a memory access 3620 instruction template of class A, the alpha field 3652 is interpreted as an eviction hint field 3652B, whose content distinguishes which one of the eviction hints is to be used (in FIG. 36A, temporal 3652B.1 and non-temporal 3652B.2 are respectively specified for the memory access, temporal 3625 instruction template and the memory access, non-temporal 3630 instruction template), while the beta field 3654 is interpreted as a data manipulation field 3654C, whose content distinguishes which one of a number of data manipulation operations (also known as primitives) is to be performed (e.g., no manipulation; broadcast; up conversion of a source; and down conversion of a destination). The memory access 3620 instruction templates include the scale field 3660, and optionally the displacement field 3662A or the displacement scale field 3662B.

Vector memory instructions perform vector loads from and vector stores to memory, with conversion support. As with regular vector instructions, vector memory instructions transfer data from/to memory in a data element-wise fashion, with the elements that are actually transferred is dictated by the contents of the vector mask that is selected as the write mask.

Memory Access Instruction Templates—Temporal

Temporal data is data likely to be reused soon enough to benefit from caching. This is, however, a hint, and different processors may implement it in different ways, including ignoring the hint entirely.

Memory Access Instruction Templates—Non-Temporal

Non-temporal data is data unlikely to be reused soon enough to benefit from caching in the 1st-level cache and should be given priority for eviction. This is, however, a hint, and different processors may implement it in different ways, including ignoring the hint entirely.

Instruction Templates of Class B

In the case of the instruction templates of class B, the alpha field 3652 is interpreted as a write mask control (Z) field 3652C, whose content distinguishes whether the write masking controlled by the write mask field 3670 should be a merging or a zeroing.

In the case of the non-memory access 3605 instruction templates of class B, part of the beta field 3654 is interpreted as an RL field 3657A, whose content distinguishes which one of the different augmentation operation types are to be performed (e.g., round 3657A.1 and vector length (VSIZE) 3657A.2 are respectively specified for the no memory access, write mask control, partial round control type operation 3612 instruction template and the no memory access, write mask control, VSIZE type operation 3617 instruction template), while the rest of the beta field 3654 distinguishes which of the operations of the specified type is to be performed. In the no memory access 3605 instruction templates, the scale field 3660, the displacement field 3662A, and the displacement scale filed 3662B are not present.

In the no memory access, write mask control, partial round control type operation 3610 instruction template, the rest of the beta field 3654 is interpreted as a round operation field 3659A and exception event reporting is disabled (a given instruction does not report any kind of floating-point exception flag and does not raise any floating-point exception handler).

Round operation control field 3659A—just as round operation control field 3658, its content distinguishes which one of a group of rounding operations to perform (e.g., Round-up, Round-down, Round-towards-zero and Round-to-nearest). Thus, the round operation control field 3659A allows for the changing of the rounding mode on a per instruction basis. In one embodiment of the disclosure where a processor includes a control register for specifying rounding modes, the round operation control field's 3650 content overrides that register value.

In the no memory access, write mask control, VSIZE type operation 3617 instruction template, the rest of the beta field 3654 is interpreted as a vector length field 3659B, whose content distinguishes which one of a number of data vector lengths is to be performed on (e.g., 128, 256, or 512 byte).

In the case of a memory access 3620 instruction template of class B, part of the beta field 3654 is interpreted as a broadcast field 3657B, whose content distinguishes whether or not the broadcast type data manipulation operation is to be performed, while the rest of the beta field 3654 is interpreted the vector length field 3659B. The memory access 3620 instruction templates include the scale field 3660, and optionally the displacement field 3662A or the displacement scale field 3662B.

With regard to the generic vector friendly instruction format 3600, a full opcode field 3674 is shown including the format field 3640, the base operation field 3642, and the data element width field 3664. While one embodiment is shown where the full opcode field 3674 includes all of these fields, the full opcode field 3674 includes less than all of these fields in embodiments that do not support all of them. The full opcode field 3674 provides the operation code (opcode).

The augmentation operation field 3650, the data element width field 3664, and the write mask field 3670 allow these features to be specified on a per instruction basis in the generic vector friendly instruction format.

The combination of write mask field and data element width field create typed instructions in that they allow the mask to be applied based on different data element widths.

The various instruction templates found within class A and class B are beneficial in different situations. In some embodiments of the disclosure, different processors or different cores within a processor may support only class A, only class B, or both classes. For instance, a high performance general purpose out-of-order core intended for general-purpose computing may support only class B, a core intended primarily for graphics and/or scientific (throughput) computing may support only class A, and a core intended for both may support both (of course, a core that has some mix of templates and instructions from both classes but not all templates and instructions from both classes is within the purview of the disclosure). Also, a single processor may include multiple cores, all of which support the same class or in which different cores support different class. For instance, in a processor with separate graphics and general purpose cores, one of the graphics cores intended primarily for graphics and/or scientific computing may support only class A, while one or more of the general purpose cores may be high performance general purpose cores with out of order execution and register renaming intended for general-purpose computing that support only class B. Another processor that does not have a separate graphics core, may include one more general purpose in-order or out-of-order cores that support both class A and class B. Of course, features from one class may also be implement in the other class in different embodiments of the disclosure. Programs written in a high level language would be put (e.g., just in time compiled or statically compiled) into an variety of different executable forms, including: 1) a form having only instructions of the class(es) supported by the target processor for execution; or 2) a form having alternative routines written using different combinations of the instructions of all classes and having control flow code that selects the routines to execute based on the instructions supported by the processor which is currently executing the code.

Exemplary Specific Vector Friendly Instruction Format

FIG. 37 is a block diagram illustrating an exemplary specific vector friendly instruction format according to embodiments of the disclosure. FIG. 37 shows a specific vector friendly instruction format 3700 that is specific in the sense that it specifies the location, size, interpretation, and order of the fields, as well as values for some of those fields. The specific vector friendly instruction format 3700 may be used to extend the x86 instruction set, and thus some of the fields are similar or the same as those used in the existing x86 instruction set and extension thereof (e.g., AVX). This format remains consistent with the prefix encoding field, real opcode byte field, MOD R/M field, SIB field, displacement field, and immediate fields of the existing x86 instruction set with extensions. The fields from FIG. 36 into which the fields from FIG. 37 map are illustrated.

It should be understood that, although embodiments of the disclosure are described with reference to the specific vector friendly instruction format 3700 in the context of the generic vector friendly instruction format 3600 for illustrative purposes, the disclosure is not limited to the specific vector friendly instruction format 3700 except where claimed. For example, the generic vector friendly instruction format 3600 contemplates a variety of possible sizes for the various fields, while the specific vector friendly instruction format 3700 is shown as having fields of specific sizes. By way of specific example, while the data element width field 3664 is illustrated as a one bit field in the specific vector friendly instruction format 3700, the disclosure is not so limited (that is, the generic vector friendly instruction format 3600 contemplates other sizes of the data element width field 3664).

The generic vector friendly instruction format 3600 includes the following fields listed below in the order illustrated in FIG. 37A.

EVEX Prefix (Bytes 0-3) 3702—is encoded in a four-byte form.

Format Field 3640 (EVEX Byte 0, bits [7:0])—the first byte (EVEX Byte 0) is the format field 3640 and it contains 0x62 (the unique value used for distinguishing the vector friendly instruction format in one embodiment of the disclosure).

The second-fourth bytes (EVEX Bytes 1-3) include a number of bit fields providing specific capability.

REX field 3705 (EVEX Byte 1, bits [7-5])—consists of a EVEX.R bit field (EVEX Byte 1, bit [7]-R), EVEX.X bit field (EVEX byte 1, bit [6]-X), and 3657BEX byte 1, bit[5]-B). The EVEX.R, EVEX.X, and EVEX.B bit fields provide the same functionality as the corresponding VEX bit fields, and are encoded using is complement form, i.e. ZMM0 is encoded as 1111B, ZMM15 is encoded as 0000B. Other fields of the instructions encode the lower three bits of the register indexes as is known in the art (rrr, xxx, and bbb), so that Rrrr, Xxxx, and Bbbb may be formed by adding EVEX.R, EVEX.X, and EVEX.B.

REX' field 3610—this is the first part of the REX' field 3610 and is the EVEX.R' bit field (EVEX Byte 1, bit [4]-R') that is used to encode either the upper 16 or lower 16 of the extended 32 register set. In one embodiment of the disclosure, this bit, along with others as indicated below, is stored in bit inverted format to distinguish (in the well-known x86 32-bit mode) from the BOUND instruction, whose real opcode byte is 62, but does not accept in the MOD R/M field (described below) the value of 11 in the MOD field; alternative embodiments of the disclosure do not store this and the other indicated bits below in the inverted format. A value of 1 is used to encode the lower 16 registers. In other words, R'Rrrr is formed by combining EVEX.R', EVEX.R, and the other RRR from other fields.

Opcode map field 3715 (EVEX byte 1, bits [3:0]-mmmm)—its content encodes an implied leading opcode byte (0F, 0F 38, or 0F 3).

Data element width field 3664 (EVEX byte 2, bit [7]-W)—is represented by the notation EVEX.W. EVEX.W is used to define the granularity (size) of the datatype (either 32-bit data elements or 64-bit data elements).

EVEX.vvvv 3720 (EVEX Byte 2, bits [6:3]-vvvv)—the role of EVEX.vvvv may include the following: 1) EVEX.vvvv encodes the first source register operand, specified in inverted (1s complement) form and is valid for instructions with 2 or more source operands; 2) EVEX.vvvv encodes the destination register operand, specified in is complement form for certain vector shifts; or 3) EVEX.vvvv does not encode any operand, the field is reserved and should contain 1111b. Thus, EVEX.vvvv field 3720 encodes the 4 low-order bits of the first source register specifier stored in inverted (1s complement) form. Depending on the instruction, an extra different EVEX bit field is used to extend the specifier size to 32 registers.

EVEX.U 3668 Class field (EVEX byte 2, bit [2]-U)—If EVEX.U=0, it indicates class A or EVEX.U0; if EVEX.U=1, it indicates class B or EVEX.U1.

Prefix encoding field 3725 (EVEX byte 2, bits [1:0]-pp)—provides additional bits for the base operation field. In addition to providing support for the legacy SSE instructions in the EVEX prefix format, this also has the benefit of compacting the SIMD prefix (rather than requiring a byte to express the SIMD prefix, the EVEX prefix requires only 2 bits). In one embodiment, to support legacy SSE instructions that use a SIMD prefix (66H, F2H, F3H) in both the legacy format and in the EVEX prefix format, these legacy SIMD prefixes are encoded into the SIMD prefix encoding field; and at runtime are expanded into the legacy SIMD prefix prior to being provided to the decoder's PLA (so the PLA can execute both the legacy and EVEX format of these legacy instructions without modification). Although newer instructions could use the EVEX prefix encoding field's content directly as an opcode extension, certain embodiments expand in a similar fashion for consistency but allow for different meanings to be specified by these legacy SIMD prefixes. An alternative embodiment may redesign the PLA to support the 2 bit SIMD prefix encodings, and thus not require the expansion.

Alpha field 3652 (EVEX byte 3, bit [7]-EH; also known as EVEX.EH, EVEX.rs, EVEX.RL, EVEX.write mask control, and EVEX.N; also illustrated with a)—as previously described, this field is context specific.

Beta field 3654 (EVEX byte 3, bits [6:4]-SSS, also known as EVEX.$s_{2-0}$, EVEX.$r_{2-0}$, EVEX.rr1, EVEX.LL0, EVEX.LLB; also illustrated with PP(3)—as previously described, this field is context specific.

REX' field 3610—this is the remainder of the REX' field and is the EVEX.V' bit field (EVEX Byte 3, bit [3]-V') that may be used to encode either the upper 16 or lower 16 of the extended 32 register set. This bit is stored in bit inverted format. A value of 1 is used to encode the lower 16 registers. In other words, V'VVVV is formed by combining EVEX.V', EVEX.vvvv.

Write mask field 3670 (EVEX byte 3, bits [2:0]-kkk)—its content specifies the index of a register in the write mask registers as previously described. In one embodiment of the disclosure, the specific value EVEX.kkk=000 has a special behavior implying no write mask is used for the particular instruction (this may be implemented in a variety of ways including the use of a write mask hardwired to all ones or hardware that bypasses the masking hardware).

Real Opcode Field 3730 (Byte 4) is also known as the opcode byte. Part of the opcode is specified in this field.

MOD R/M Field 3740 (Byte 5) includes MOD field 3742, Reg field 3744, and R/M field 3746. As previously described, the MOD field's 3742 content distinguishes between memory access and non-memory access operations. The role of Reg field 3744 can be summarized to two situations: encoding either the destination register operand or a source register operand, or be treated as an opcode extension and not used to encode any instruction operand. The role of R/M field 3746 may include the following: encoding the instruction operand that references a memory address, or encoding either the destination register operand or a source register operand.

Scale, Index, Base (SIB) Byte (Byte 6)—As previously described, the scale field's 3650 content is used for memory address generation. SIB.xxx 3754 and SIB.bbb 3756—the contents of these fields have been previously referred to with regard to the register indexes Xxxx and Bbbb.

Displacement field 3662A (Bytes 7-10)—when MOD field 3742 contains 10, bytes 7-10 are the displacement field 3662A, and it works the same as the legacy 32-bit displacement (disp32) and works at byte granularity.

Displacement factor field 3662B (Byte 7)—when MOD field 3742 contains 01, byte 7 is the displacement factor field 3662B. The location of this field is that same as that of the legacy x86 instruction set 8-bit displacement (disp8), which works at byte granularity. Since disp8 is sign extended, it can only address between −128 and 127 bytes offsets; in terms of 64 byte cache lines, disp8 uses 8 bits that can be set to only four really useful values −128, −64, 0, and 64; since a greater range is often needed, disp32 is used; however, disp32 requires 4 bytes. In contrast to disp8 and disp32, the displacement factor field 3662B is a reinterpretation of disp8; when using displacement factor field 3662B, the actual displacement is determined by the content of the displacement factor field multiplied by the size of the memory operand access (N). This type of displacement is referred to as disp8*N. This reduces the average instruction length (a single byte of used for the displacement but with a much greater range). Such compressed displacement is based on the assumption that the effective displacement is multiple of the granularity of the memory access, and hence, the redundant low-order bits of the address offset do not need to be encoded. In other words, the displacement factor field 3662B substitutes the legacy x86 instruction set 8-bit displacement. Thus, the displacement factor field 3662B is encoded the same way as an x86 instruction set 8-bit displacement (so no changes in the ModRM/SIB encoding rules) with the only exception that disp8 is overloaded to disp8*N. In other words, there are no changes in the encoding rules or encoding lengths but only in the interpretation of the displacement value by hardware (which needs to scale the displacement by the size of the memory operand to obtain a byte-wise address offset). Immediate field 3672 operates as previously described.

Full Opcode Field

FIG. 37B is a block diagram illustrating the fields of the specific vector friendly instruction format 3700 that make up the full opcode field 3674 according to one embodiment of the disclosure. Specifically, the full opcode field 3674 includes the format field 3640, the base operation field 3642, and the data element width (W) field 3664. The base operation field 3642 includes the prefix encoding field 3725, the opcode map field 3715, and the real opcode field 3730.

Register Index Field

FIG. 37C is a block diagram illustrating the fields of the specific vector friendly instruction format 3700 that make up the register index field 3644 according to one embodiment of the disclosure. Specifically, the register index field 3644 includes the REX field 3705, the REX' field 3710, the MODR/M.reg field 3744, the MODR/M.r/m field 3746, the VVVV field 3720, xxx field 3754, and the bbb field 3756.

Augmentation Operation Field

Figure 37D:
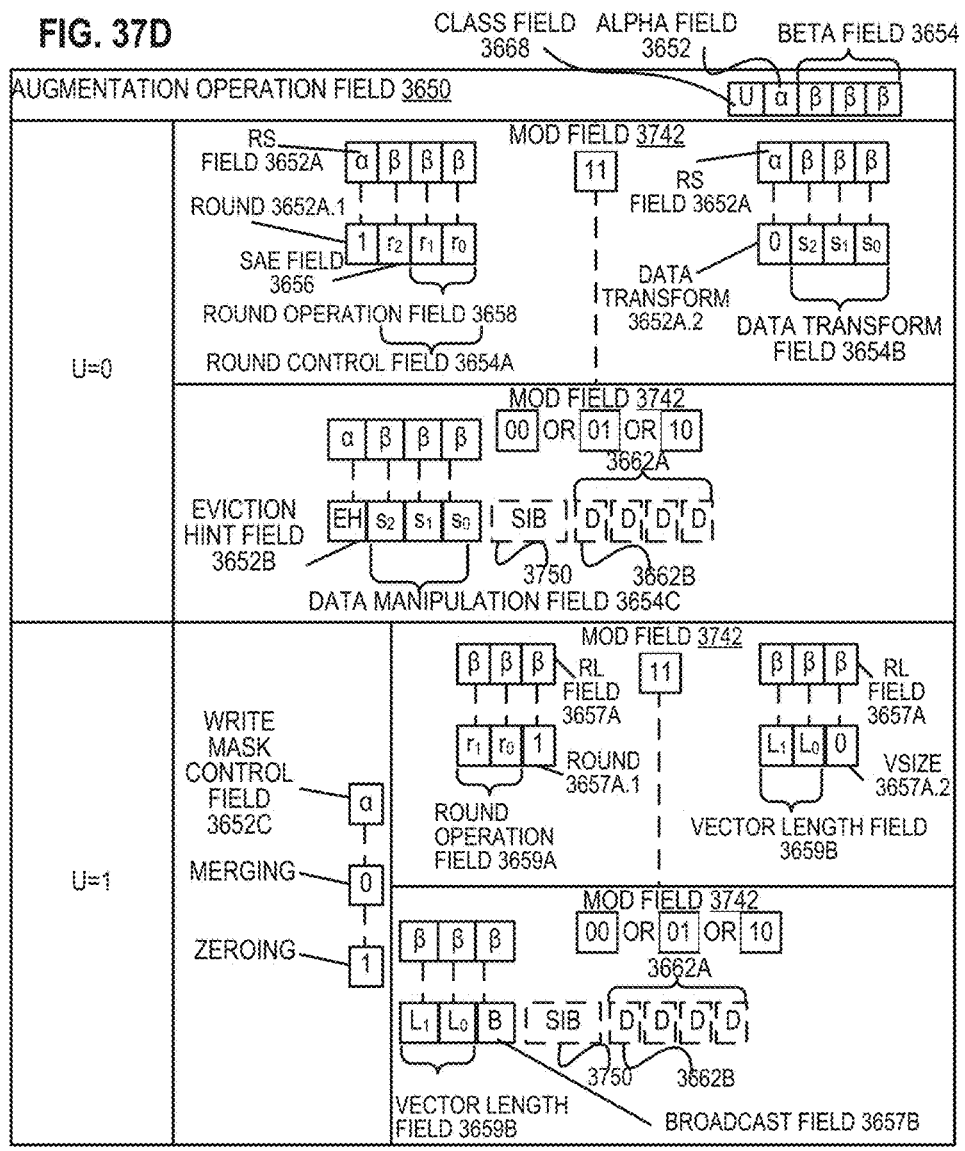
FIG. 37D is a block diagram illustrating the fields of the specific vector friendly instruction format in FIG. 37A that make up the augmentation operation field 3650 according to one embodiment of the disclosure.

FIG. 37D is a block diagram illustrating the fields of the specific vector friendly instruction format 3700 that make up the augmentation operation field 3650 according to one embodiment of the disclosure. When the class (U) field 3668 contains 0, it signifies EVEX.U0 (class A 3668A); when it contains 1, it signifies EVEX.U1 (class B 3668B). When U=0 and the MOD field 3742 contains 11 (signifying a no memory access operation), the alpha field 3652 (EVEX byte 3, bit [7]-EH) is interpreted as the rs field 3652A. When the rs field 3652A contains a 1 (round 3652A.1), the beta field 3654 (EVEX byte 3, bits [6:4]-SSS) is interpreted as the round control field 3654A. The round control field 3654A includes a one bit SAE field 3656 and a two bit round operation field 3658. When the rs field 3652A contains a 0 (data transform 3652A.2), the beta field 3654 (EVEX byte 3, bits [6:4]-SSS) is interpreted as a three bit data transform field 3654B. When U=0 and the MOD field 3742 contains 00, 01, or 10 (signifying a memory access operation), the alpha field 3652 (EVEX byte 3, bit [7]-EH) is interpreted as the eviction hint (EH) field 3652B and the beta field 3654 (EVEX byte 3, bits [6:4]-SSS) is interpreted as a three bit data manipulation field 3654C.

When U=1, the alpha field 3652 (EVEX byte 3, bit [7]-EH) is interpreted as the write mask control (Z) field 3652C. When U=1 and the MOD field 3742 contains 11 (signifying a no memory access operation), part of the beta field 3654 (EVEX byte 3, bit [4]-$S_0$) is interpreted as the RL field 3657A; when it contains a 1 (round 3657A.1) the rest of the beta field 3654 (EVEX byte 3, bit [6-5]-$S_{2-1}$) is interpreted as the round operation field 3659A, while when the RL field 3657A contains a 0 (VSIZE 3657.A2) the rest of the beta field 3654 (EVEX byte 3, bit [6-5]-$S_{2-1}$) is interpreted as the vector length field 3659B (EVEX byte 3, bit [6-5]-$L_{1-0}$). When U=1 and the MOD field 3742 contains 00, 01, or 10 (signifying a memory access operation), the beta field 3654 (EVEX byte 3, bits [6:4]-SSS) is interpreted as the vector length field 3659B (EVEX byte 3, bit [6-5]-$L_{1-0}$) and the broadcast field 3657B (EVEX byte 3, bit [4]-B).

Exemplary Register Architecture

Figure 38:
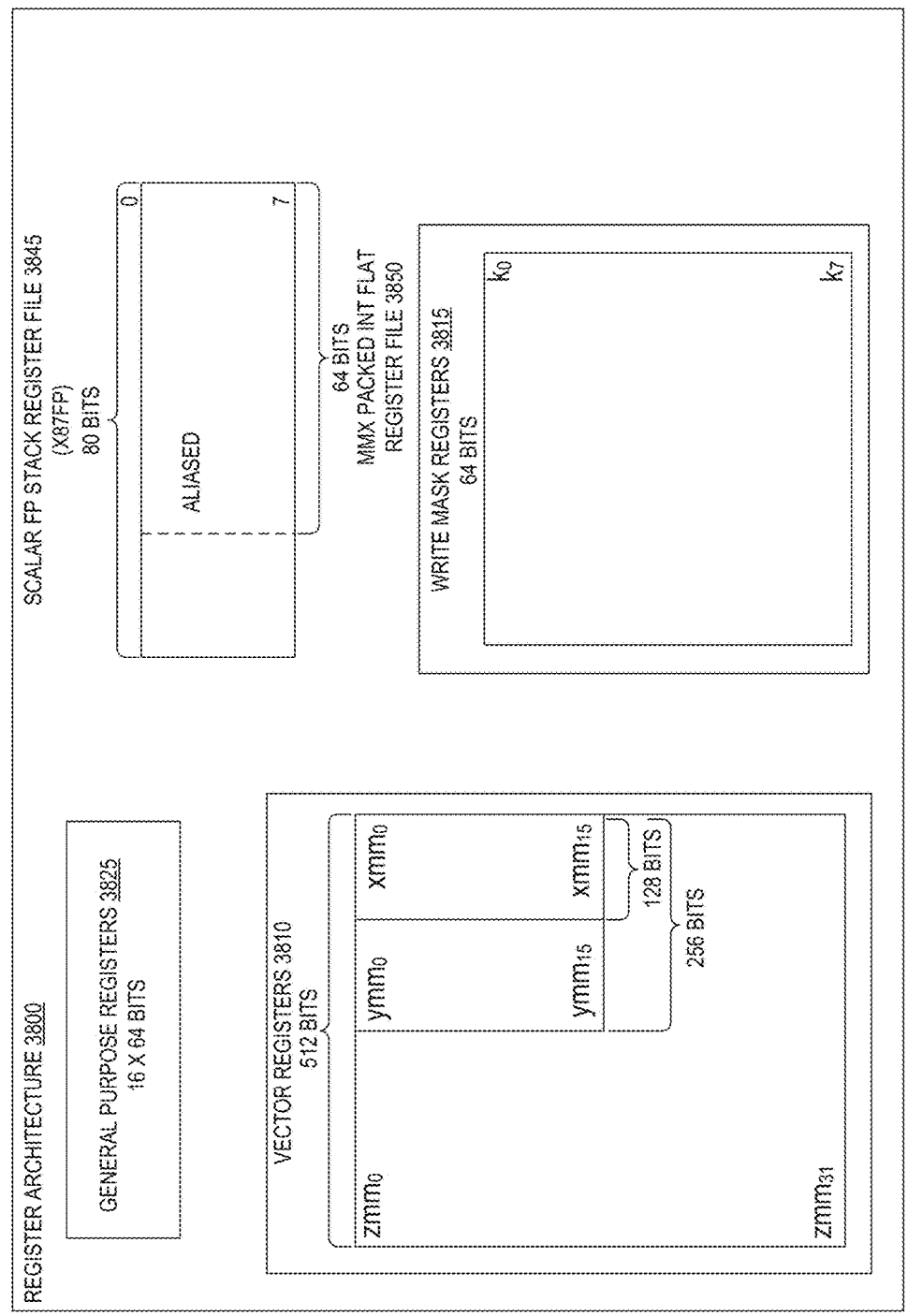
FIG. 38 is a block diagram of a register architecture according to one embodiment of the disclosure

FIG. 38 is a block diagram of a register architecture 3800 according to one embodiment of the disclosure. In the embodiment illustrated, there are 32 vector registers 3810 that are 512 bits wide; these registers are referenced as zmm0 through zmm31. The lower order 256 bits of the lower 16 zmm registers are overlaid on registers ymm0-16. The lower order 128 bits of the lower 16 zmm registers (the lower order 128 bits of the ymm registers) are overlaid on registers xmm0-15. The specific vector friendly instruction format 3700 operates on these overlaid register file as illustrated in the below tables.

| Adjustable Vector Length | Class | Operations | Registers |
|---|---|---|---|
| Instruction Templates that do not include the vector length field 3659B | A (FIG. 36A; U = 0) | 3610, 3615, 3625, 3630 | zmm registers (the vector length is 64 byte) |
| | B (FIG. 36B; U = 1) | 3612 | zmm registers (the vector length is 64 byte) |
| Instruction templates that do include the vector length field 3659B | B (FIG. 36B; U = 1) | 3617, 3627 | zmm, ymm, or xmm registers (the vector length is 64 byte, 32 byte, or 16 byte) depending on the vector length field 3659B |

In other words, the vector length field 3659B selects between a maximum length and one or more other shorter lengths, where each such shorter length is half the length of the preceding length; and instructions templates without the vector length field 3659B operate on the maximum vector length. Further, in one embodiment, the class B instruction templates of the specific vector friendly instruction format 3700 operate on packed or scalar single/double-precision floating point data and packed or scalar integer data. Scalar operations are operations performed on the lowest order data element position in an zmm/ymm/xmm register; the higher order data element positions are either left the same as they were prior to the instruction or zeroed depending on the embodiment.

Write mask registers 3815—in the embodiment illustrated, there are 8 write mask registers (k0 through k7), each 64 bits in size. In an alternate embodiment, the write mask registers 3815 are 16 bits in size. As previously described, in one embodiment of the disclosure, the vector mask register k0 cannot be used as a write mask; when the encoding that would normally indicate k0 is used for a write mask, it selects a hardwired write mask of 0xFFFF, effectively disabling write masking for that instruction.

General-purpose registers 3825—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 3845, on which is aliased the MMX packed integer flat register file 3850—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments of the disclosure may use wider or narrower registers. Additionally, alternative embodiments of the disclosure may use more, less, or different register files and registers.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 39A is a block diagram illustrating both an exemplary in-order pipeline and an exemplary register renaming, out-of-order issue/execution pipeline according to embodiments of the disclosure. FIG. 39B is a block diagram illustrating both an exemplary embodiment of an in-order architecture core and an exemplary register renaming, out-of-order issue/execution architecture core to be included in a processor according to embodiments of the disclosure. The solid lined boxes in FIGS. 39A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 39A, a processor pipeline 3900 includes a fetch stage 3902, a length decode stage 3904, a decode stage 3906, an allocation stage 3908, a renaming stage 3910, a scheduling (also known as a dispatch or issue) stage 3912, a register read/memory read stage 3914, an execute stage 3916, a write back/memory write stage 3918, an exception handling stage 3922, and a commit stage 3924.

FIG. 39B shows processor core 3990 including a front end unit 3930 coupled to an execution engine unit 3950, and both are coupled to a memory unit 3970. The core 3990 may be a reduced instruction set computing (RISC) core, a complex instruction set computing (CISC) core, a very long instruction word (VLIW) core, or a hybrid or alternative core type. As yet another option, the core 3990 may be a special-purpose core, such as, for example, a network or communication core, compression engine, coprocessor core, general purpose computing graphics processing unit (GPGPU) core, graphics core, or the like.

The front end unit 3930 includes a branch prediction unit 3932 coupled to an instruction cache unit 3934, which is coupled to an instruction translation lookaside buffer (TLB) 3936, which is coupled to an instruction fetch unit 3938, which is coupled to a decode unit 3940. The decode unit 3940 (or decoder or decoder unit) may decode instructions (e.g., macro-instructions), and generate as an output one or more micro-operations, micro-code entry points, micro-instructions, other instructions, or other control signals, which are decoded from, or which otherwise reflect, or are derived from, the original instructions. The decode unit 3940 may be implemented using various different mechanisms. Examples of suitable mechanisms include, but are not limited to, look-up tables, hardware implementations, programmable logic arrays (PLAs), microcode read only memories (ROMs), etc. In one embodiment, the core 3990 includes a microcode ROM or other medium that stores microcode for certain macro-instructions (e.g., in decode unit 3940 or otherwise within the front end unit 3930). The decode unit 3940 is coupled to a rename/allocator unit 3952 in the execution engine unit 3950.

The execution engine unit 3950 includes the rename/allocator unit 3952 coupled to a retirement unit 3954 and a set of one or more scheduler unit(s) 3956. The scheduler unit(s) 3956 represents any number of different schedulers, including reservations stations, central instruction window, etc. The scheduler unit(s) 3956 is coupled to the physical register file(s) unit(s) 3958. Each of the physical register file(s) units 3958 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 3958 comprises a vector registers unit, a write mask registers unit, and a scalar registers unit. These register units may provide architectural vector registers, vector mask registers, and general purpose registers. The physical register file(s) unit(s) 3958 is overlapped by the retirement unit 3954 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 3954 and the physical register file(s) unit(s) 3958 are coupled to the execution cluster(s) 3960. The execution cluster(s) 3960 includes a set of one or more execution units 3962 and a set of one or more memory access units 3964. The execution units 3962 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 3956, physical register file(s) unit(s) 3958, and execution cluster(s) 3960 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 3964). It should also be understood that where separate pipelines are used, one or more of these pipelines may be out-of-order issue/execution and the rest in-order.

The set of memory access units 3964 is coupled to the memory unit 3970, which includes a data TLB unit 3972 coupled to a data cache unit 3974 coupled to a level 2 (L2) cache unit 3976. In one exemplary embodiment, the memory access units 3964 may include a load unit, a store address unit, and a store data unit, each of which is coupled to the data TLB unit 3972 in the memory unit 3970. The instruction cache unit 3934 is further coupled to a level 2 (L2) cache unit 3976 in the memory unit 3970. The L2 cache unit 3976 is coupled to one or more other levels of cache and eventually to a main memory.

By way of example, the exemplary register renaming, out-of-order issue/execution core architecture may implement the pipeline 3900 as follows: 1) the instruction fetch 3938 performs the fetch and length decoding stages 3902 and 3904; 2) the decode unit 3940 performs the decode stage 3906; 3) the rename/allocator unit 3952 performs the allocation stage 3908 and renaming stage 3910; 4) the scheduler unit(s) 3956 performs the schedule stage 3912; 5) the physical register file(s) unit(s) 3958 and the memory unit 3970 perform the register read/memory read stage 3914; the execution cluster 3960 perform the execute stage 3916; 6) the memory unit 3970 and the physical register file(s) unit(s) 3958 perform the write back/memory write stage 3918; 7) various units may be involved in the exception handling stage 3922; and 8) the retirement unit 3954 and the physical register file(s) unit(s) 3958 perform the commit stage 3924.

The core 3990 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 3990 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 3934/3974 and a shared L2 cache unit 3976, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 40B:
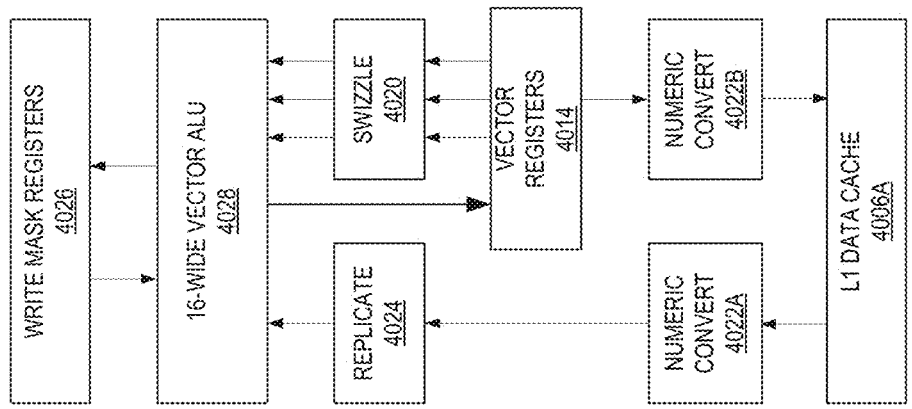
FIG. 40B is an expanded view of part of the processor core in FIG. 40A according to embodiments of the disclosure.
Figure 40A:
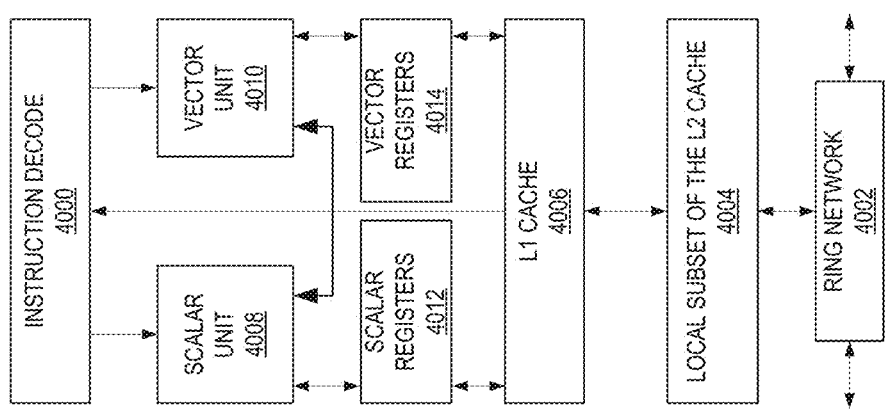
FIG. 40A is a block diagram of a single processor core, along with its connection to the on-die interconnect network and with its local subset of the Level 2 (L2) cache, according to embodiments of the disclosure.

FIGS. 40A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 40A is a block diagram of a single processor core, along with its connection to the on-die interconnect network 4002 and with its local subset of the Level 2 (L2) cache 4004, according to embodiments of the disclosure. In one embodiment, an instruction decode unit 4000 supports the x86 instruction set with a packed data instruction set extension. An L1 cache 4006 allows low-latency accesses to cache memory into the scalar and vector units. While in one embodiment (to simplify the design), a scalar unit 4008 and a vector unit 4010 use separate register sets (respectively, scalar registers 4012 and vector registers 4014) and data transferred between them is written to memory and then read back in from a level 1 (L1) cache 4006, alternative embodiments of the disclosure may use a different approach (e.g., use a single register set or include a communication path that allow data to be transferred between the two register files without being written and read back).

The local subset of the L2 cache 4004 is part of a global L2 cache that is divided into separate local subsets, one per processor core. Each processor core has a direct access path to its own local subset of the L2 cache 4004. Data read by a processor core is stored in its L2 cache subset 4004 and can be accessed quickly, in parallel with other processor cores accessing their own local L2 cache subsets. Data written by a processor core is stored in its own L2 cache subset 4004 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 40B is an expanded view of part of the processor core in FIG. 40A according to embodiments of the disclosure. FIG. 40B includes an L1 data cache 4006A part of the L1 cache 4004, as well as more detail regarding the vector unit 4010 and the vector registers 4014. Specifically, the vector unit 4010 is a 16-wide vector processing unit (VPU) (see the 16-wide ALU 4028), which executes one or more of integer, single-precision float, and double-precision float instructions. The VPU supports swizzling the register inputs with swizzle unit 4020, numeric conversion with numeric convert units 4022A-B, and replication with replication unit 4024 on the memory input. Write mask registers 4026 allow predicating resulting vector writes.

Figure 41:
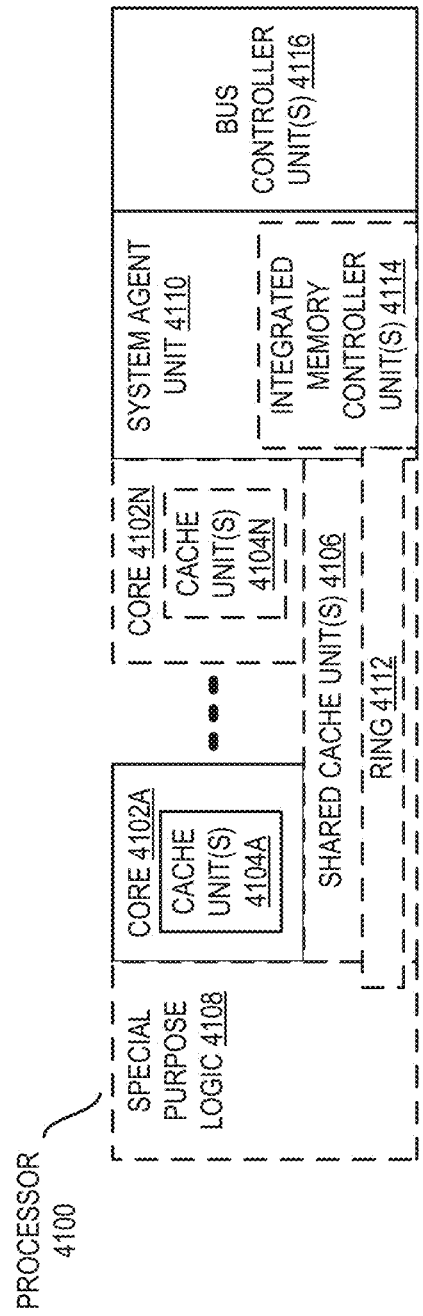
FIG. 41 is a block diagram of a processor that may have more than one core, may have an integrated memory controller, and may have integrated graphics according to embodiments of the disclosure.

FIG. 41 is a block diagram of a processor 4100 that may have more than one core, may have an integrated memory controller, and may have integrated graphics according to embodiments of the disclosure. The solid lined boxes in FIG. 41 illustrate a processor 4100 with a single core 4102A, a system agent 4110, a set of one or more bus controller units 4116, while the optional addition of the dashed lined boxes illustrates an alternative processor 4100 with multiple cores 4102A-N, a set of one or more integrated memory controller unit(s) 4114 in the system agent unit 4110, and special purpose logic 4108.

Thus, different implementations of the processor 4100 may include: 1) a CPU with the special purpose logic 4108 being integrated graphics and/or scientific (throughput) logic (which may include one or more cores), and the cores 4102A-N being one or more general purpose cores (e.g., general purpose in-order cores, general purpose out-of-order cores, a combination of the two); 2) a coprocessor with the cores 4102A-N being a large number of special purpose cores intended primarily for graphics and/or scientific (throughput); and 3) a coprocessor with the cores 4102A-N being a large number of general purpose in-order cores. Thus, the processor 4100 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 4100 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 4106, and external memory (not shown) coupled to the set of integrated memory controller units 4114. The set of shared cache units 4106 may include one or more mid-level caches, such as level 2 (L2), level 3 (L3), level 4 (L4), or other levels of cache, a last level cache (LLC), and/or combinations thereof. While in one embodiment a ring based interconnect unit 4112 interconnects the integrated graphics logic 4108, the set of shared cache units 4106, and the system agent unit 4110/integrated memory controller unit(s) 4114, alternative embodiments may use any number of well-known techniques for interconnecting such units. In one embodiment, coherency is maintained between one or more cache units 4106 and cores 4102-A-N.

In some embodiments, one or more of the cores 4102A-N are capable of multi-threading. The system agent 4110 includes those components coordinating and operating cores 4102A-N. The system agent unit 4110 may include for example a power control unit (PCU) and a display unit. The PCU may be or include logic and components needed for regulating the power state of the cores 4102A-N and the integrated graphics logic 4108. The display unit is for driving one or more externally connected displays.

The cores 4102A-N may be homogenous or heterogeneous in terms of architecture instruction set; that is, two or more of the cores 4102A-N may be capable of execution the same instruction set, while others may be capable of executing only a subset of that instruction set or a different instruction set.

Exemplary Computer Architectures

FIGS. 42-45 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 42:
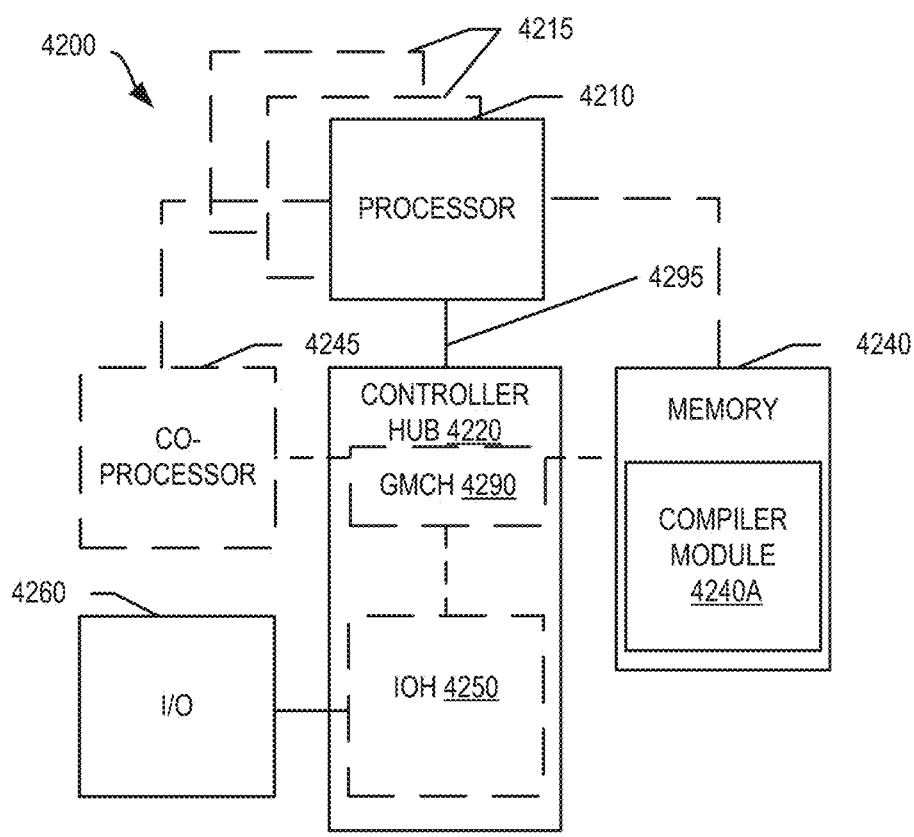
FIG. 42 is a block diagram of a system in accordance with one embodiment of the present disclosure.

Referring now to FIG. 42, shown is a block diagram of a system 4200 in accordance with one embodiment of the present disclosure. The system 4200 may include one or more processors 4210, 4215, which are coupled to a controller hub 4220. In one embodiment, the controller hub 4220 includes a graphics memory controller hub (GMCH) 4290 and an Input/Output Hub (IOH) 4250 (which may be on separate chips); the GMCH 4290 includes memory and graphics controllers to which are coupled memory 4240 and a coprocessor 4245; the IOH 4250 is couples input/output (I/O) devices 4260 to the GMCH 4290. Alternatively, one or both of the memory and graphics controllers are integrated within the processor (as described herein), the memory 4240 and the coprocessor 4245 are coupled directly to the processor 4210, and the controller hub 4220 in a single chip with the IOH 4250. Memory 4240 may include a compiler module 4240A, for example, to store code that when executed causes a processor to perform any method of this disclosure.

The optional nature of additional processors 4215 is denoted in FIG. 42 with broken lines. Each processor 4210, 4215 may include one or more of the processing cores described herein and may be some version of the processor 4100.

The memory 4240 may be, for example, dynamic random access memory (DRAM), phase change memory (PCM), or a combination of the two. For at least one embodiment, the controller hub 4220 communicates with the processor(s) 4210, 4215 via a multi-drop bus, such as a frontside bus (FSB), point-to-point interface such as QuickPath Interconnect (QPI), or similar connection 4295.

In one embodiment, the coprocessor 4245 is a special-purpose processor, such as, for example, a high-throughput MIC processor, a network or communication processor, compression engine, graphics processor, GPGPU, embedded processor, or the like. In one embodiment, controller hub 4220 may include an integrated graphics accelerator.

There can be a variety of differences between the physical resources 4210, 4215 in terms of a spectrum of metrics of merit including architectural, microarchitectural, thermal, power consumption characteristics, and the like.

In one embodiment, the processor 4210 executes instructions that control data processing operations of a general type. Embedded within the instructions may be coprocessor instructions. The processor 4210 recognizes these coprocessor instructions as being of a type that should be executed by the attached coprocessor 4245. Accordingly, the processor 4210 issues these coprocessor instructions (or control signals representing coprocessor instructions) on a coprocessor bus or other interconnect, to coprocessor 4245. Coprocessor(s) 4245 accept and execute the received coprocessor instructions.

Figure 43:
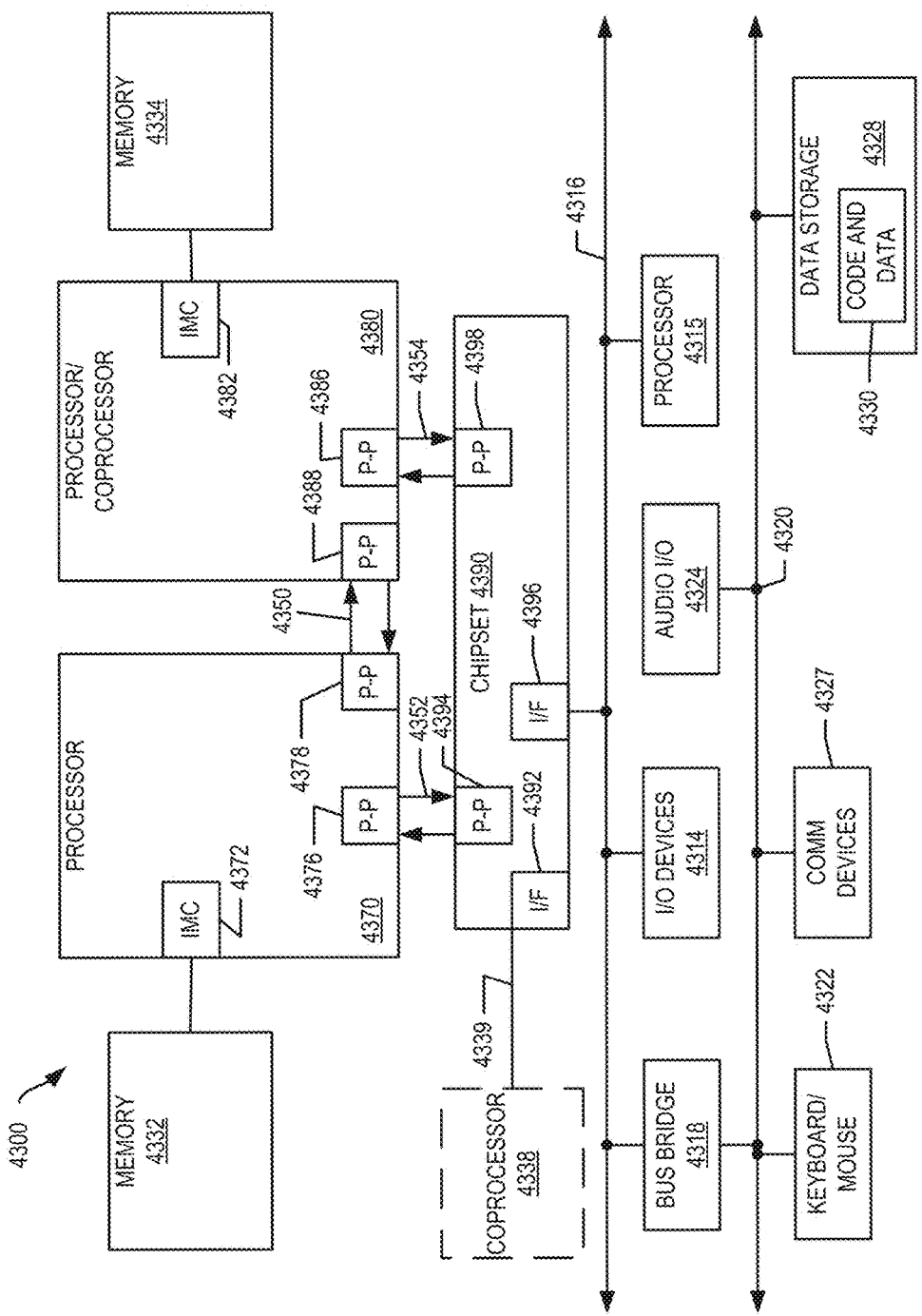
FIG. 43 is a block diagram of a more specific exemplary system in accordance with an embodiment of the present disclosure.

Referring now to FIG. 43, shown is a block diagram of a first more specific exemplary system 4300 in accordance with an embodiment of the present disclosure. As shown in FIG. 43, multiprocessor system 4300 is a point-to-point interconnect system, and includes a first processor 4370 and a second processor 4380 coupled via a point-to-point interconnect 4350. Each of processors 4370 and 4380 may be some version of the processor 4100. In one embodiment of the disclosure, processors 4370 and 4380 are respectively processors 4210 and 4215, while coprocessor 4338 is coprocessor 4245. In another embodiment, processors 4370 and 4380 are respectively processor 4210 coprocessor 4245.

Processors 4370 and 4380 are shown including integrated memory controller (IMC) units 4372 and 4382, respectively. Processor 4370 also includes, as part of its bus controller units, point-to-point (P-P) interfaces 4376 and 4378; similarly, second processor 4380 includes P-P interfaces 4386 and 4388. Processors 4370, 4380 may exchange information via a point-to-point (P-P) interface 4350 using P-P interface circuits 4378, 4388. As shown in FIG. 43, IMCs 4372 and 4382 couple the processors to respective memories, namely a memory 4332 and a memory 4334, which may be portions of main memory locally attached to the respective processors.

Processors 4370, 4380 may each exchange information with a chipset 4390 via individual P-P interfaces 4352, 4354 using point to point interface circuits 4376, 4394, 4386, 4398. Chipset 4390 may optionally exchange information with the coprocessor 4338 via a high-performance interface 4339. In one embodiment, the coprocessor 4338 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 4390 may be coupled to a first bus 4316 via an interface 4396. In one embodiment, first bus 4316 may be a Peripheral Component Interconnect (PCI) bus, or a bus such as a PCI Express bus or another third generation I/O interconnect bus, although the scope of the present disclosure is not so limited.

As shown in FIG. 43, various I/O devices 4314 may be coupled to first bus 4316, along with a bus bridge 4318 which couples first bus 4316 to a second bus 4320. In one embodiment, one or more additional processor(s) 4315, such as coprocessors, high-throughput MIC processors, GPGPU's, accelerators (such as, e.g., graphics accelerators or digital signal processing (DSP) units), field programmable gate arrays, or any other processor, are coupled to first bus 4316. In one embodiment, second bus 4320 may be a low pin count (LPC) bus. Various devices may be coupled to a second bus 4320 including, for example, a keyboard and/or mouse 4322, communication devices 4327 and a storage unit 4328 such as a disk drive or other mass storage device which may include instructions/code and data 4330, in one embodiment. Further, an audio I/O 4324 may be coupled to the second bus 4320. Note that other architectures are possible. For example, instead of the point-to-point architecture of FIG. 43, a system may implement a multi-drop bus or other such architecture.

Figure 44:
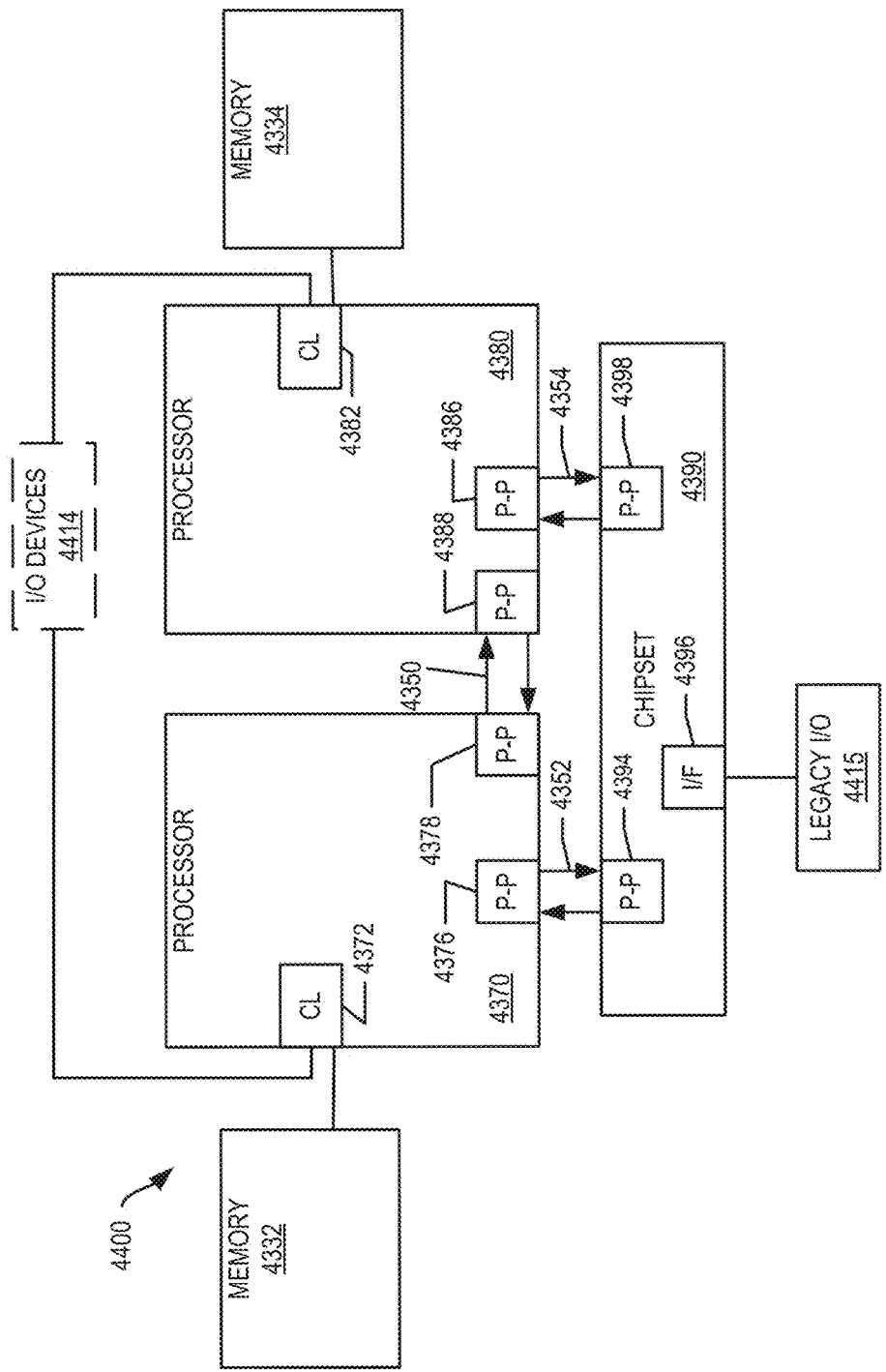
FIG. 44, shown is a block diagram of a second more specific exemplary system in accordance with an embodiment of the present disclosure.

Referring now to FIG. 44, shown is a block diagram of a second more specific exemplary system 4400 in accordance with an embodiment of the present disclosure. Like elements in FIGS. 43 and 44 bear like reference numerals, and certain aspects of FIG. 43 have been omitted from FIG. 44 in order to avoid obscuring other aspects of FIG. 44.

FIG. 44 illustrates that the processors 4370, 4380 may include integrated memory and I/O control logic ("CL") 4372 and 4382, respectively. Thus, the CL 4372, 4382 include integrated memory controller units and include I/O control logic. FIG. 44 illustrates that not only are the memories 4332, 4334 coupled to the CL 4372, 4382, but also that I/O devices 4414 are also coupled to the control logic 4372, 4382. Legacy I/O devices 4415 are coupled to the chipset 4390.

Figure 45:
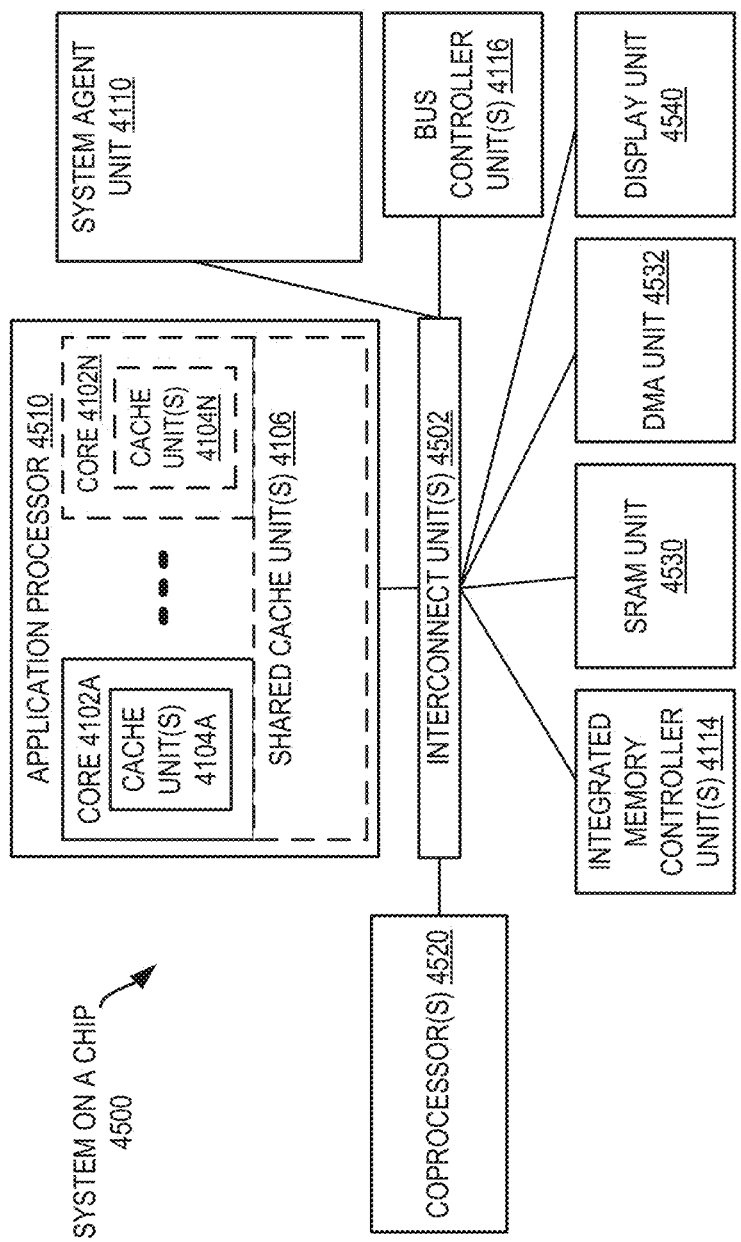
FIG. 45, shown is a block diagram of a system on a chip (SoC) in accordance with an embodiment of the present disclosure.

Referring now to FIG. 45, shown is a block diagram of a SoC 4500 in accordance with an embodiment of the present disclosure. Similar elements in FIG. 41 bear like reference numerals. Also, dashed lined boxes are optional features on more advanced SoCs. In FIG. 45, an interconnect unit(s) 4502 is coupled to: an application processor 4510 which includes a set of one or more cores 202A-N and shared cache unit(s) 4106; a system agent unit 4110; a bus controller unit(s) 4116; an integrated memory controller unit(s) 4114; a set or one or more coprocessors 4520 which may include integrated graphics logic, an image processor, an audio processor, and a video processor; an static random access memory (SRAM) unit 4530; a direct memory access (DMA) unit 4532; and a display unit 4540 for coupling to one or more external displays. In one embodiment, the coprocessor(s) 4520 include a special-purpose processor, such as, for example, a network or communication processor, compression engine, GPGPU, a high-throughput MIC processor, embedded processor, or the like.

Embodiments (e.g., of the mechanisms) disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code, such as code 4330 illustrated in FIG. 43, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the disclosure also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 46:
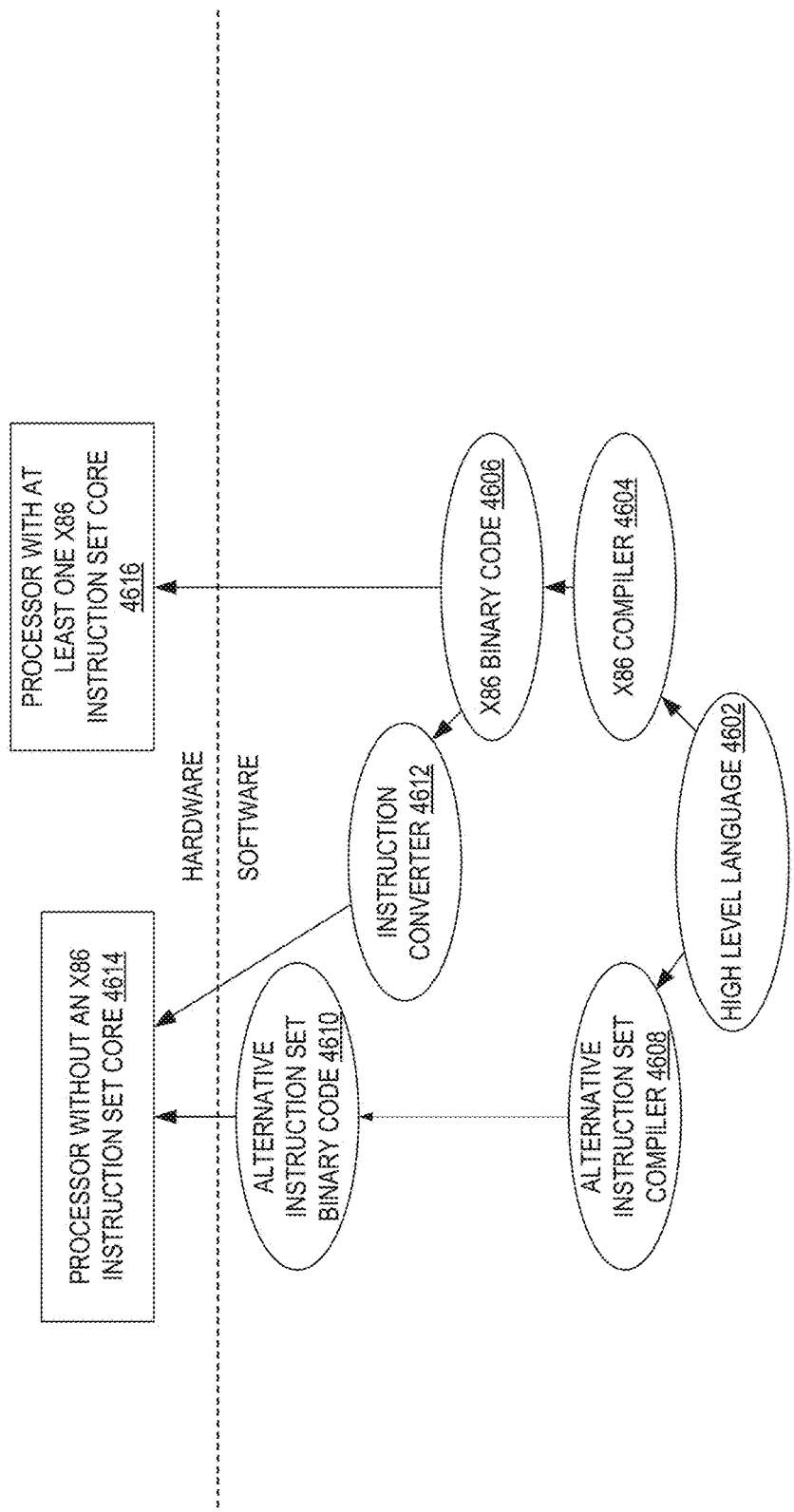
FIG. 46 is a block diagram contrasting the use of a software instruction converter to convert binary instructions in a source instruction set to binary instructions in a target instruction set according to embodiments of the disclosure.

FIG. 46 is a block diagram contrasting the use of a software instruction converter to convert binary instructions in a source instruction set to binary instructions in a target instruction set according to embodiments of the disclosure. In the illustrated embodiment, the instruction converter is a software instruction converter, although alternatively the instruction converter may be implemented in software, firmware, hardware, or various combinations thereof. FIG. 46 shows a program in a high level language 4602 may be compiled using an x86 compiler 4604 to generate x86 binary code 4606 that may be natively executed by a processor with at least one x86 instruction set core 4616. The processor with at least one x86 instruction set core 4616 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 4604 represents a compiler that is operable to generate x86 binary code 4606 (e.g., object code) that can, with or without additional linkage processing, be executed on the processor with at least one x86 instruction set core 4616. Similarly, FIG. 46 shows the program in the high level language 4602 may be compiled using an alternative instruction set compiler 4608 to generate alternative instruction set binary code 4610 that may be natively executed by a processor without at least one x86 instruction set core 4614 (e.g., a processor with cores that execute the MIPS instruction set of MIPS Technologies of Sunnyvale, Calif. and/or that execute the ARM instruction set of ARM Holdings of Sunnyvale, Calif.). The instruction converter 4612 is used to convert the x86 binary code 4606 into code that may be natively executed by the processor without an x86 instruction set core 4614. This converted code is not likely to be the same as the alternative instruction set binary code 4610 because an instruction converter capable of this is difficult to make; however, the converted code will accomplish the general operation and be made up of instructions from the alternative instruction set. Thus, the instruction converter 4612 represents software, firmware, hardware, or a combination thereof that, through emulation, simulation or any other process, allows a processor or other electronic device that does not have an x86 instruction set processor or core to execute the x86 binary code 4606.

What is claimed is:

1. A processor comprising:
a plurality of processing elements, wherein at least one of the processing elements is to perform a floating-point operation with selectable precision control; and
an interconnect network between the plurality of processing elements to receive an input of a dataflow graph comprising a plurality of nodes, wherein the dataflow graph is to be overlaid into the interconnect network and the plurality of processing elements with each node represented as a dataflow operator in the plurality of processing elements, and the plurality of processing elements is to perform an operation when an incoming operand set arrives at the plurality of processing elements.

2. The processor of claim 1, wherein:
the at least one of the plurality of processing elements is configurable as a floating-point multiplier, at least an other of the plurality of processing elements is configurable as a floating-point adder, and the at least one and the at least an other of the plurality of processing elements are coupled together to perform a fused multiply-add.

\* \* \* \* \*